(12) United States Patent
Hellberg

(10) Patent No.: US 9,954,492 B2
(45) Date of Patent: Apr. 24, 2018

(54) AMPLIFIER CIRCUIT AND METHOD

(71) Applicant: Telefonaktiebolaget LM Ericsson (publ), Stockholm (SE)

(72) Inventor: Richard Hellberg, Huddinge (SE)

(73) Assignee: TELEFONAKTIEBOLAGET LM ERICSSON (PUBL), Stockholm (SE)

(*) Notice: Subject to any disclaimer, the term of this patent is extended or adjusted under 35 U.S.C. 154(b) by 0 days.

(21) Appl. No.: 15/127,223

(22) PCT Filed: Mar. 19, 2014

(86) PCT No.: PCT/EP2014/055526
§ 371 (c)(1),
(2) Date: Sep. 19, 2016

(87) PCT Pub. No.: WO2015/139746
PCT Pub. Date: Sep. 24, 2015

(65) Prior Publication Data
US 2017/0237401 A1    Aug. 17, 2017

(51) Int. Cl.
*H03F 3/68* (2006.01)
*H03F 1/02* (2006.01)
(Continued)

(52) U.S. Cl.
CPC ........... *H03F 1/0288* (2013.01); *H03F 3/189* (2013.01); *H03F 3/602* (2013.01); *H03F 2200/451* (2013.01)

(58) Field of Classification Search
CPC . H03F 3/60; H03F 3/602; H03F 3/605; H03F 3/68; H03F 1/0288
(Continued)

(56) References Cited

U.S. PATENT DOCUMENTS 3,593,174 A    7/1971  White
4,631,492 A *  12/1986 Magarshack ............. H03F 3/16
                                              330/277
(Continued)

FOREIGN PATENT DOCUMENTS

EP    2403135 A1    1/2012
WO    0205421 A1    1/2002
(Continued)

OTHER PUBLICATIONS

Chireix, H, "High Power Outphasing Modulation", Proceedings of the Institute of Radio Engineers, vol. 23, Issue 11, Nov. 1935, pp. 1370-1392.
(Continued)

*Primary Examiner* — Steven J Mottola
(74) *Attorney, Agent, or Firm* — Murphy, Bilak & Homiller, PLLC

(57) ABSTRACT

An amplifier arrangement comprises N amplifier stages, wherein N is an integer equal or greater than five. The amplifier arrangement comprises a first cascade of quarter wavelength transmission line segments coupled to receive a first set of amplifier stages, and at least a second cascade of quarter wavelength transmission line segments coupled to receive a second set of amplifier stages. The first cascade and second cascade are connected to a common node, for example in parallel to an output node, or in parallel to an intermediate node.

9 Claims, 106 Drawing Sheets

(51) Int. Cl.
*H03F 3/60* (2006.01)
*H03F 3/189* (2006.01)

(58) Field of Classification Search
USPC ............................ 330/54, 124 R, 286, 295
See application file for complete search history.

(56) References Cited

U.S. PATENT DOCUMENTS

| | | |
|---|---|---|
| 5,025,225 A | 6/1991 | Tajima et al. |
| 5,543,751 A | 8/1996 | Stedman et al. |
| 7,221,219 B2 | 5/2007 | Hellberg et al. |
| 8,022,760 B2 | 9/2011 | Gajadharsing et al. |
| 8,095,092 B2 | 1/2012 | Muller et al. |
| 8,737,527 B2 | 5/2014 | Lozhkin et al. |
| 2004/0263242 A1 | 12/2004 | Hellberg et al. |
| 2006/0192615 A1 | 8/2006 | Fraysse |
| 2007/0080747 A1 | 4/2007 | Klingberg et al. |
| 2009/0021301 A1 | 1/2009 | Hellberg et al. |
| 2009/0163154 A1 | 6/2009 | Fondén et al. |
| 2011/0260771 A1 | 10/2011 | Hirota et al. |
| 2012/0056669 A1 | 3/2012 | Fraysse et al. |
| 2013/0154731 A1 | 6/2013 | Gajadharsing |
| 2013/0321084 A1 | 12/2013 | Hellberg |
| 2014/0118063 A1 | 5/2014 | Briffa et al. |

FOREIGN PATENT DOCUMENTS

| | | |
|---|---|---|
| WO | 03061115 A1 | 7/2003 |
| WO | 2004023647 A1 | 3/2004 |
| WO | 2004057755 A1 | 7/2004 |
| WO | 2005031966 A1 | 4/2005 |
| WO | 2010068152 A1 | 6/2010 |
| WO | 2014193275 A1 | 12/2014 |
| WO | 2014206501 A1 | 12/2014 |
| WO | 2014206502 A1 | 12/2014 |
| WO | 2015139745 A1 | 9/2015 |

OTHER PUBLICATIONS

Doherty, W. H., "A New High Efficiency Power Amplifier for Modulated Waves", Proceedings of the Institute of Radio Engineers, vol. 24, No. 9, Sep. 1936, pp. 1163-1182.

Raab, Frederick H., "Efficiency of Doherty RF Power-Amplifier Systems", IEEE Transactions on Broadcasting, vol. BC-33, No. 3, Sep. 1987, 77-83.

* cited by examiner

Output amplitude

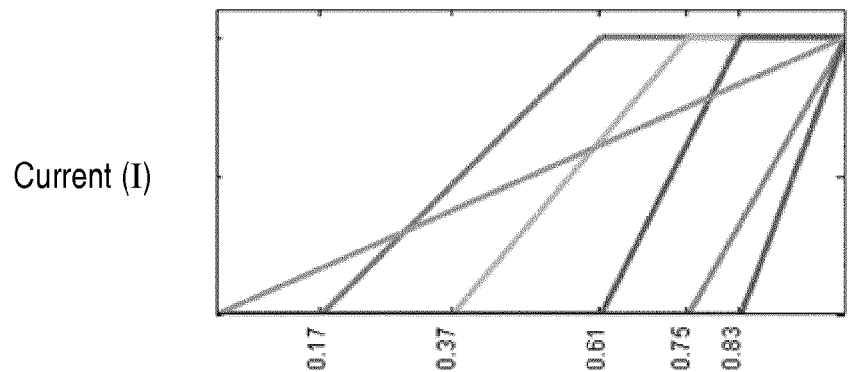
Current (I)    Fig. 3a
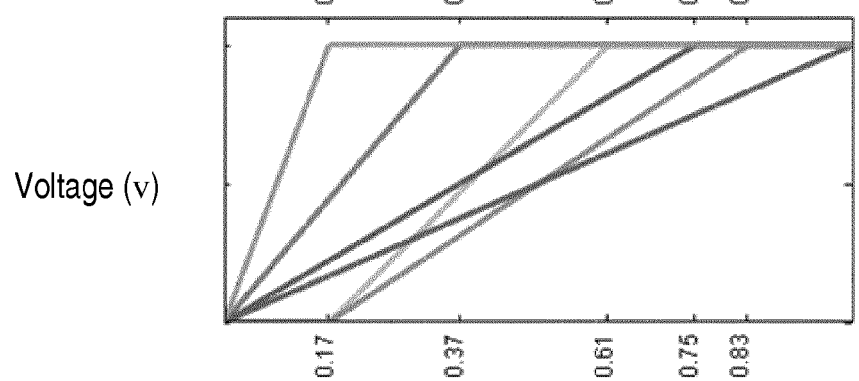
Voltage (v)    Fig. 3b
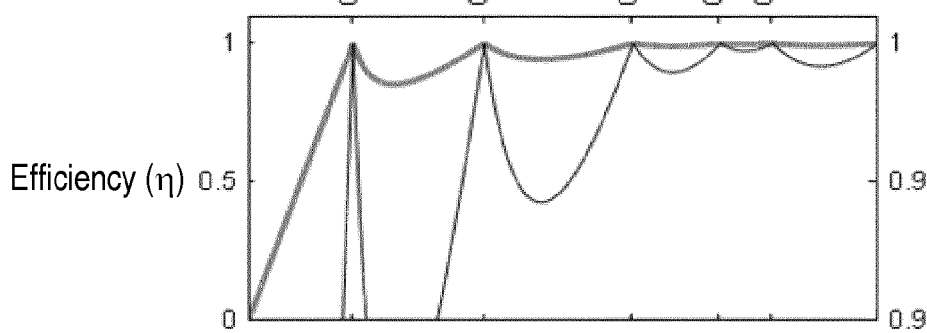
Efficiency (η)    Fig. 3c
Output amplitude Current (I)

Voltage (v)

Efficiency (η)

Output amplitude

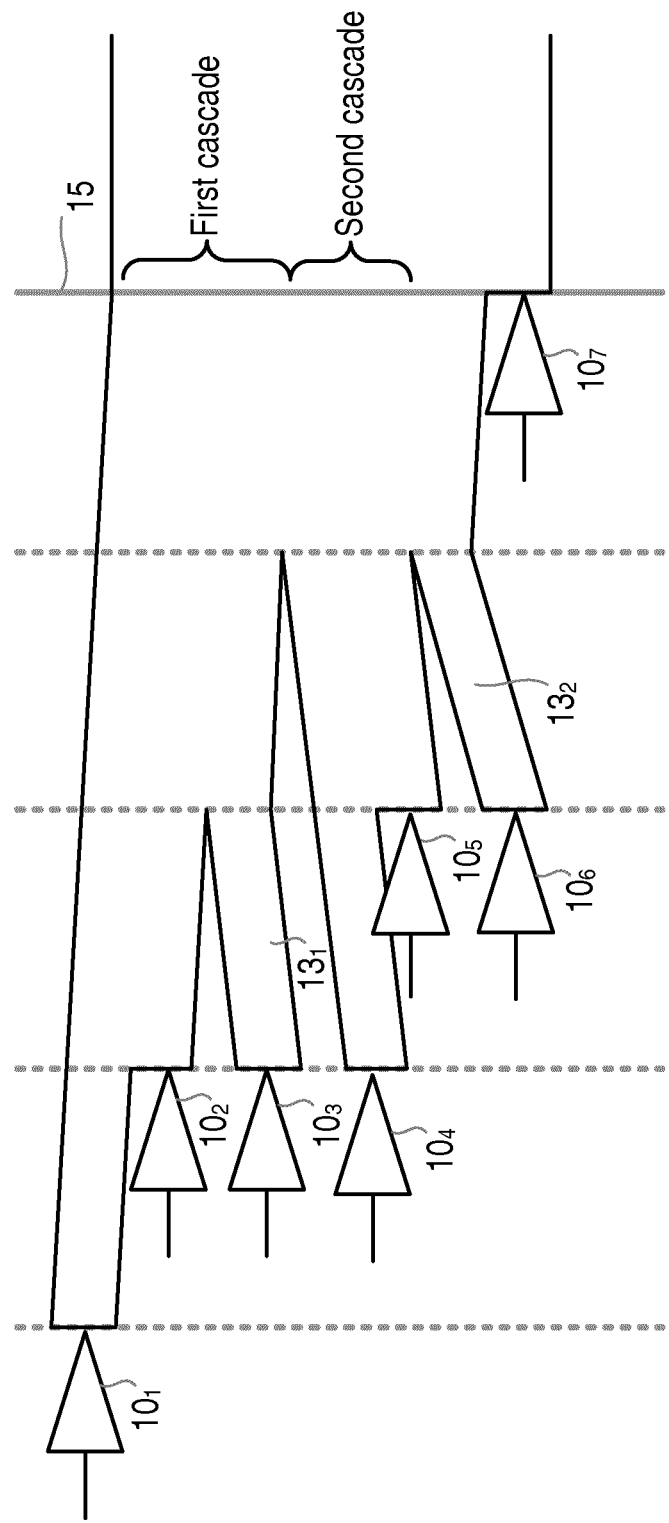

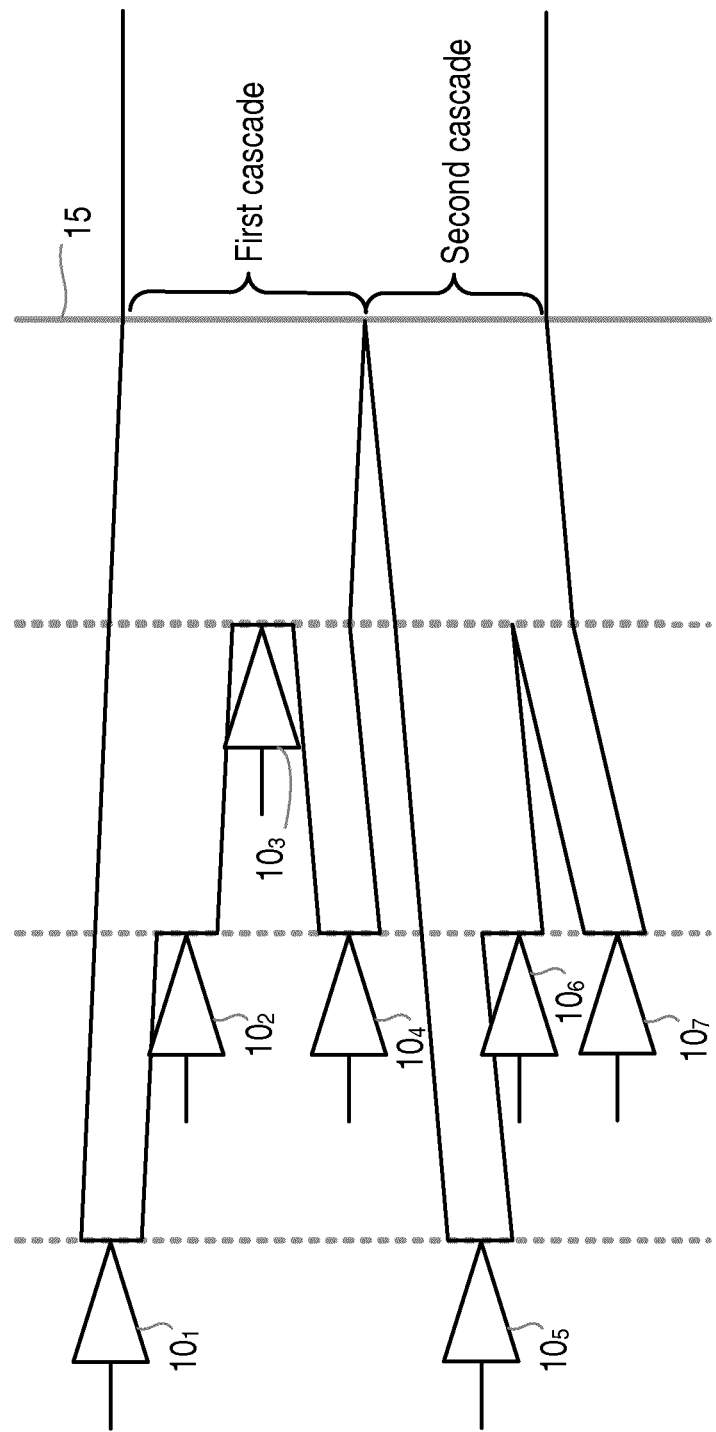

Output amplitude

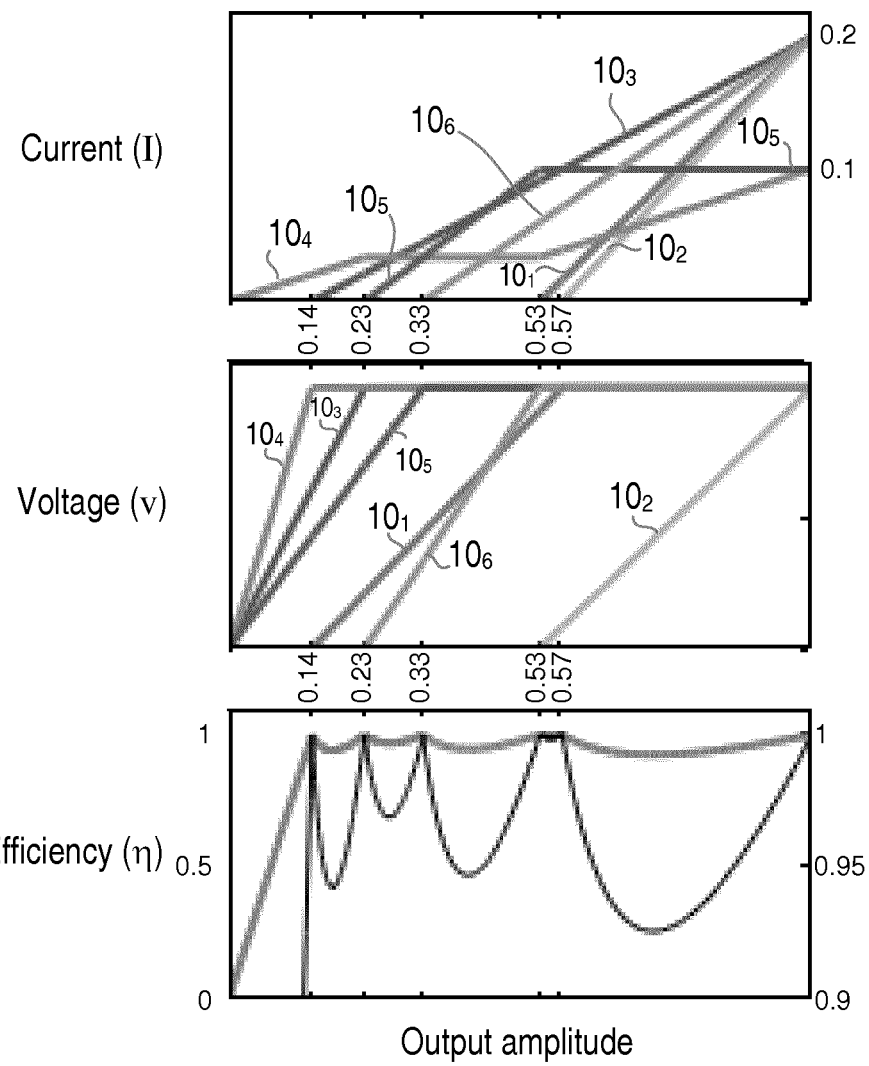

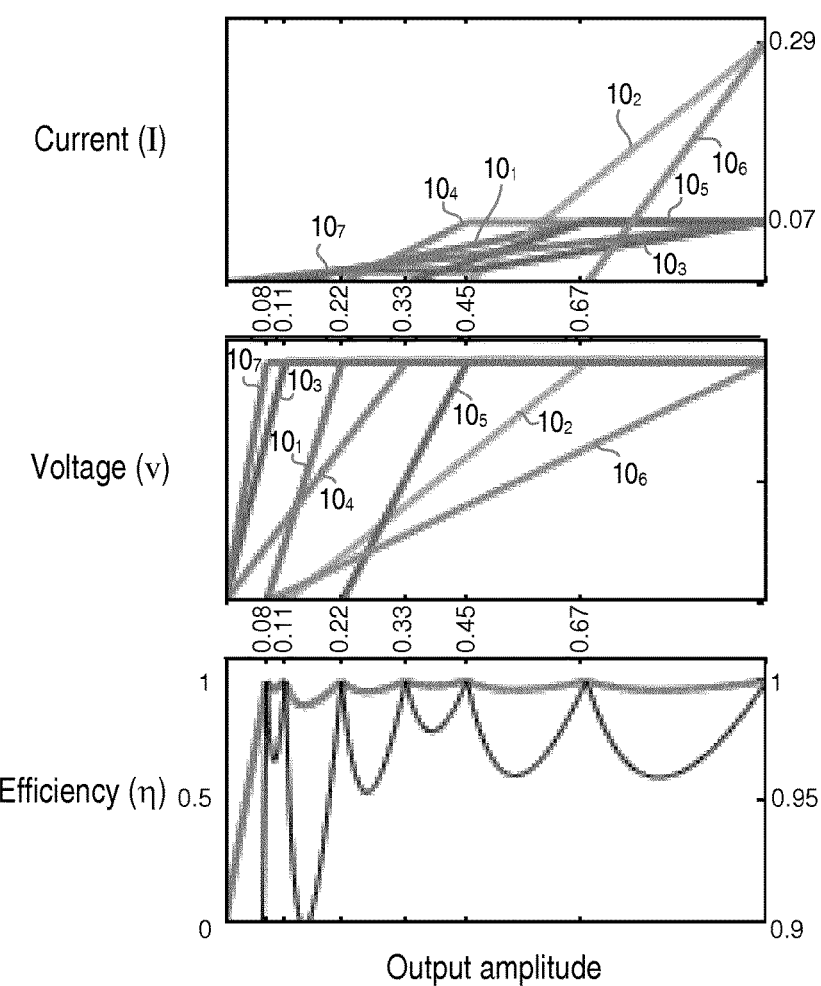

AMPLIFIER CIRCUIT AND METHOD

TECHNICAL FIELD

The present invention relates generally to an amplifier circuit and method, and more particularly to an amplifier circuit and method which provides improved efficiency, for example an amplifier circuit comprising at least first and second amplifiers configured to operate in a Doherty mode of operation.

BACKGROUND

Power amplifiers in wideband radio systems are often used to amplify wideband signals or signal combinations with high peak to average power ratio, PAR. The amplifiers must then be able to repeatedly output very high power for very short periods, even though the bulk of the output power is generated at the much lower average power level. In systems with random phase combinations of many signals (without any dominating ones) the amplitude of the signal follows a Rayleigh distribution.

A conventional single-transistor power amplifier (for example a class B, AB or F power amplifier) has a fixed radio frequency (RF) load resistance and a fixed voltage supply. The bias in class B or AB amplifiers causes the output current to have a form close to that of a pulse train of half wave rectified sinusoid current pulses. The direct current (DC) current (and hence DC power) is therefore largely proportional to the RF output current amplitude (and voltage). The output power, however, is proportional to the RF output current squared. The efficiency, i.e. output power divided by DC power, is therefore also proportional to the output amplitude. The average efficiency of a power amplifier is consequently low when amplifying signals that on average have a low output amplitude (or power) compared to the maximum required output amplitude (or power), i.e. high PAR.

An example of a Doherty amplifier is described in "A new high efficiency power amplifier for modulated waves,", W. H. Doherty, Proc. IRE, vol. 24, no. 9, pp. 1163-1182, September 1936. Doherty amplifiers such as this have high average efficiency for amplitude-modulated signals with high peak-to-average ratio (PAR) since they have a much lower average sum of RF output current magnitudes from the transistors at low amplitudes. This causes high average efficiency since the DC currents drawn by the transistors are largely proportional to the RF current magnitudes.

Reduced RF output currents are obtained by having high transimpedance from at least one transistor to the output, while having the possibility of in-phase combining all transistor outputs to obtain full output power. Higher transimpedance means higher voltage at the output for the same amount of current. This is achieved in the Doherty amplifier by having the main transistor ("carrier amplifier") displaced from the output node by a quarter wavelength transmission line of characteristic impedance Ropt, (where a transistor's Ropt is the optimal load resistance for achieving maximum output power).

Since the load Rload has a lower value than Ropt (typically Rload=Ropt/2) this line acts as a quarterwave transformer. The transimpedance to the output from the main transistor is equal to the characteristic impedance of the quarterwave line (i.e. Ropt), instead of Rload as would be the case for one transistor coupled directly to the load. The self-impedance at the main transistor is increased quadratically to the characteristic impedance squared divided by Rload (aka "impedance inversion" of the load). If the peak transistor (also known as "auxiliary amplifier" or "peaking amplifier") has an Ropt that in parallel combination with the Ropt of the main transistor gives Rload, full combined output power will be possible by in-phase combining (i.e. adjusting the phase (time, electrical length) difference between the main and peak drive signals so the output waves from both are in phase at the output Rload).

The carrier amplifier output current is linear in amplitude, i.e. follows the desired output signal. The peaking amplifier output current is zero for low amplitudes, and rises (piecewise) linearly from the transition point. The transition point for a 2-stage Doherty designed for two equal size transistors is at half the maximum output amplitude. The shaping of the output RF current amplitude is in some cases done by biasing the gate low and increasing the RF drive voltage, known as class C operation. This shaping can also be done, wholly or partially, earlier in the processing chain, by analog or digital signal shaping circuits.

A first way to extend the Doherty amplifier to more stages (transistors, constituent amplifiers) was shown by F. H. Raab in a paper entitled "Efficiency of Doherty RF Power Amplifier Systems", IEEE Trans. Broadcasting, vol. BC-33, no. 3, pp. 77-83, September 1987. These amplifiers can be described as having a cascade of quarterwave transmission lines with successively lower characteristic impedance towards the output (load), where RF transistors are connected at the junctions between the transmission lines. The resulting amplifier makes it possible to have high efficiency in a wider range of back off.

U.S. Pat. No. 8,022,760 discloses an alternative arrangement for 3-transistor Doherty amplifiers, whose main benefit is better placement of the transition points (corresponding to high points in the efficiency vs. amplitude curve) for equal-sized transistors. Higher order versions of the 3-transistor Doherty amplifier in U.S. Pat. No. 8,022,760 consist of having a higher order quarterwave cascade multistage Doherty as a peaking amplifier. Only the ones with an odd total number, N, of transistors (5, 7, 9 etc . . . ) work, i.e. those that have quarterwave cascades with an even number, N−1, of quarterwave lines.

EP2,403,135 discloses a four-transistor Doherty amplifier. This is basically the 3-stage amplifier of U.S. Pat. No. 8,022,760 with an added peaking amplifier at the output node and has largely the same advantages as U.S. Pat. No. 8,022,760 regarding transistor sizes. Higher order versions of EP2,403,135 consist of even numbers, N, of transistors, with both a directly connected and a quarterwave-connected transistor at the output node. The quarterwave cascade in the peaking amplifier branch will therefore have the total length, N−2, i.e. the same lengths as for the amplifiers in U.S. Pat. No. 8,022,760.

The multistage Doherty amplifiers by Raab generally have their transition points too high to give good average efficiency with high-PAR signals if the transistor stages are of equal size. FIGS. 1a, 1b and 1c show the curves for a 4-stage implementation, in which the lowest transition point is at 0.37 of full output. The amplifiers with higher numbers of stages generally have the same problem, as do arrangements in which a small number of different transistor sizes are available.

The requirement for several different amplitude-limited drive signals can pose a problem in some implementation technologies, for example increased implementation complexity.

Referring to FIGS. 2a to 2c, the 5-stage amplifier according to U.S. Pat. No. 8,022,760 has advantages over those of Raab for use with high-PAR signals, since the lowest transition point with five equal sized transistors is at 0.2 of full output amplitude (−14 dB). However, it has a sparse distribution of transition points at low amplitude.

For six and higher numbers of stages, implementations with equal size transistors of U.S. Pat. No. 8,022,760 and EP2,403,135 all suffer from too sparse transition points at low output amplitudes, as illustrated by FIGS. 3a to 3c for a 6-stage arrangement according to EP2,403,135 and FIGS. 4a to 4c for a 7-stage amplifier according to U.S. Pat. No. 8,022,760.

Thus, each of the amplifier arrangements described in FIGS. 2, 3 and 4 have the disadvantage of requiring several amplitude limited drive signals, and also have the disadvantage of having a poor distribution of transition points.

SUMMARY

It is an aim of the present invention to provide a method and apparatus which obviate or reduce at least one or more of the disadvantages mentioned above.

According to a first aspect of the present invention there is provided an amplifier arrangement comprising N amplifier stages, wherein N is an integer equal or greater than five. The amplifier arrangement comprises a first cascade of quarter wavelength transmission line segments coupled to receive a first set of amplifier stages, and at least a second cascade of quarter wavelength transmission line segments coupled to receive a second set of amplifier stages. The first cascade and second cascade are connected to a common node in the amplifier arrangement.

The common node may either be a common output node of the amplifier arrangement, or an intermediate junction within a cascade of quarter wavelength transmission line segments.

The amplifier stages may be directly connected to the quarter wavelength cascades, or be connected via connecting quarter wavelength transmission lines, or any combination thereof.

BRIEF DESCRIPTION OF THE DRAWINGS

For a better understanding of examples of the present invention, and to show more clearly how the examples may be carried into effect, reference will now be made, by way of example only, to the following drawings in which:

FIGS. 3a to 3c show current, voltage and efficiency curves for a known amplifier arrangement;

FIGS. 5b to 5d show current, voltage and efficiency curves for the amplifier arrangement of FIG. 5a;

FIGS. 6b to 6d show current, voltage and efficiency curves for the amplifier arrangement of FIG. 6a;

FIG. 6e shows a schematic diagram of the amplifier arrangement according to an embodiment of FIGS. 5a (and 6a including the portion in dotted lines);

FIGS. 7b to 7d show current, voltage and efficiency curves for the amplifier arrangement of FIG. 7a;

FIGS. 8b to 8d show current, voltage and efficiency curves for the amplifier arrangement of FIG. 8a;

FIGS. 9b to 9d show current, voltage and efficiency curves for the amplifier arrangement of FIG. 9a;

FIGS. 10b to 10d show current, voltage and efficiency curves for the amplifier arrangement of FIG. 10a;

FIGS. 11b to 11d show current, voltage and efficiency curves for the amplifier arrangement of FIG. 11a;

FIGS. 12b to 12d show current, voltage and efficiency curves for the amplifier arrangement of FIG. 12a;

FIGS. 13b to 13d show current, voltage and efficiency curves for the amplifier arrangement of FIG. 13a;

FIGS. 14b to 14d show current, voltage and efficiency curves for the amplifier arrangement of FIG. 14a;

FIGS. 15a to 44a show examples of amplifier arrangements according to other embodiments of the present invention;

FIGS. 15b to 15d, to 44b to 44d, show current, voltage and efficiency curves for the amplifier arrangements of FIGS. 15a to 44a;

FIGS. 45b to 45d show current, voltage and efficiency curves for the amplifier arrangement of FIG. 45a;

FIGS. 46a to 55a show examples of amplifier arrangements according to other embodiments of the present invention, having non-equal sized amplifiers; and FIGS. 46b to 46d, to 55b to 55d, show current, voltage and efficiency curves for the amplifier arrangements of FIGS. 46a to 55a.

DETAILED DESCRIPTION

The embodiments of the invention, as described herein, relate to a large class of multistage amplifiers, for example Doherty amplifiers, that contain multiple quarter wavelength cascades, either connected to an output node of a multistage amplifier, or branching out from the same junction in a quarter wavelength cascade. In some embodiments the quarter wavelength cascades have only directly connected sub-amplifiers and in some embodiments they have quarter wavelength-connected sub-amplifiers, as will be described in greater detail in the various examples below.

The embodiments will be described in relation to two 5-stage variants, six 6-stage variants and thirty 7-stage variants of the invention, and it is noted that amplifiers built in accordance with the embodiments of the invention make up the majority of higher order variants.

Figure 1A:
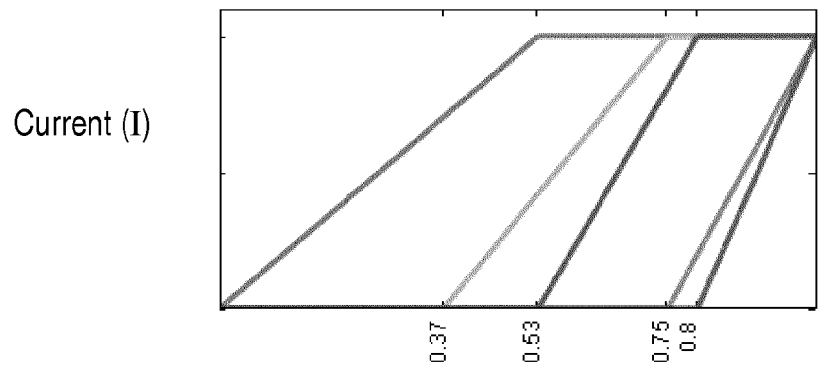
FIGS. 1a to 1c show current, voltage and efficiency curves for a known amplifier arrangement.
Figure 1B:
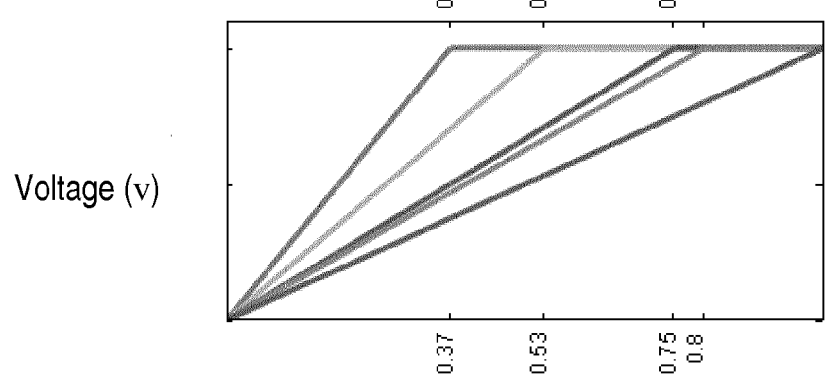
Figure 1C:
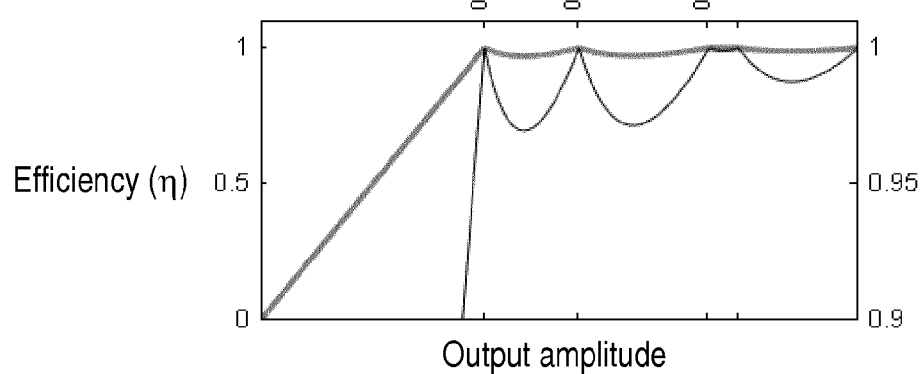
Figure 2A:
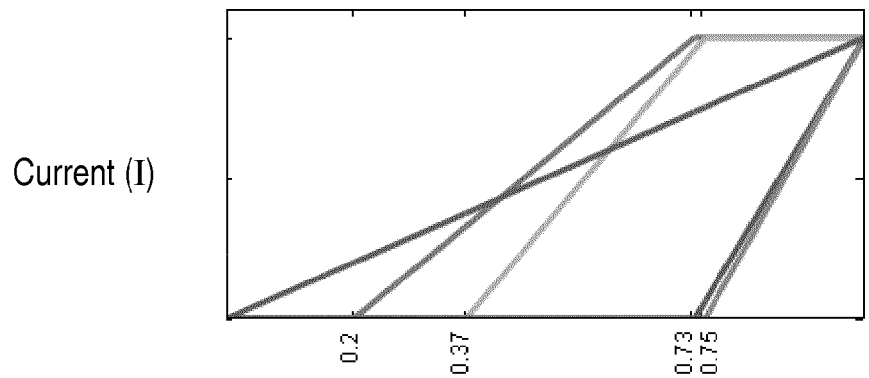
FIGS. 2a to 2c show current, voltage and efficiency curves for a known amplifier arrangement.
Figure 2B:
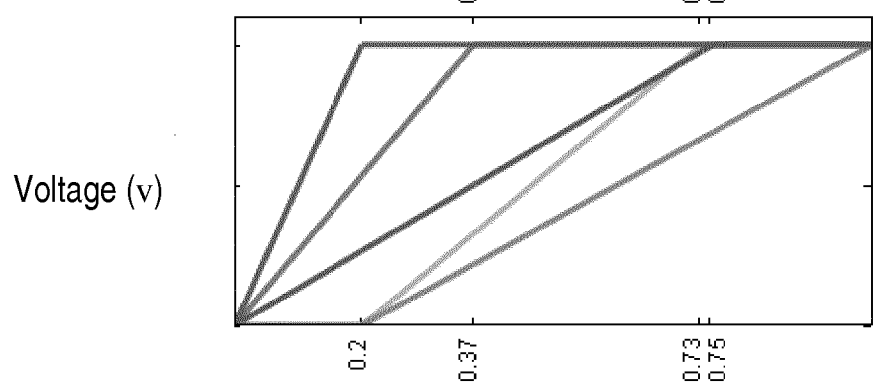
Figure 2C:
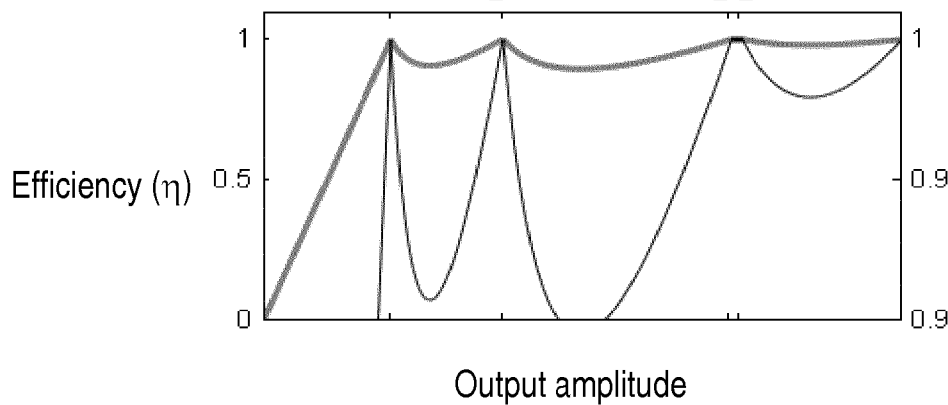
Figure 4A:
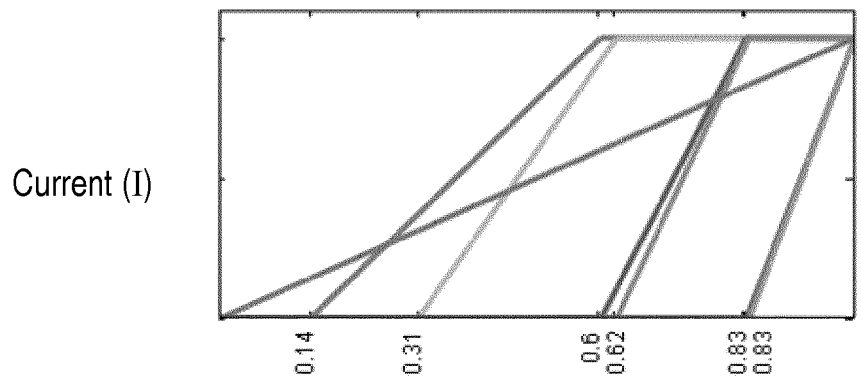
FIGS. 4a to 4c show current, voltage and efficiency curves for a known amplifier arrangement.
Figure 4B:
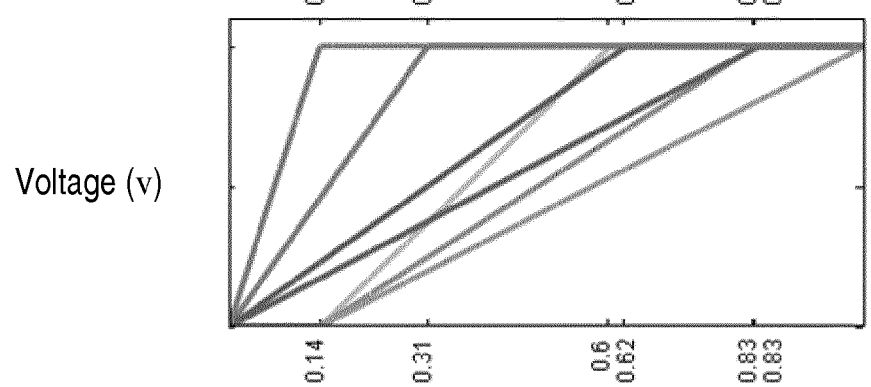
Figure 4C:
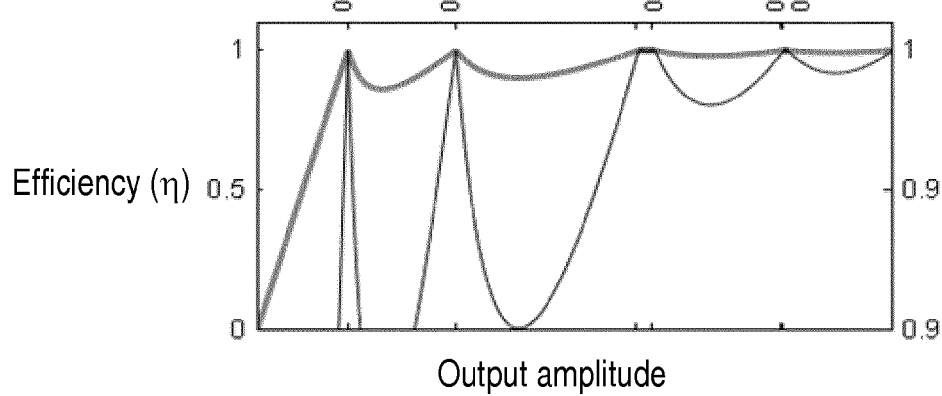
Figure 5A:
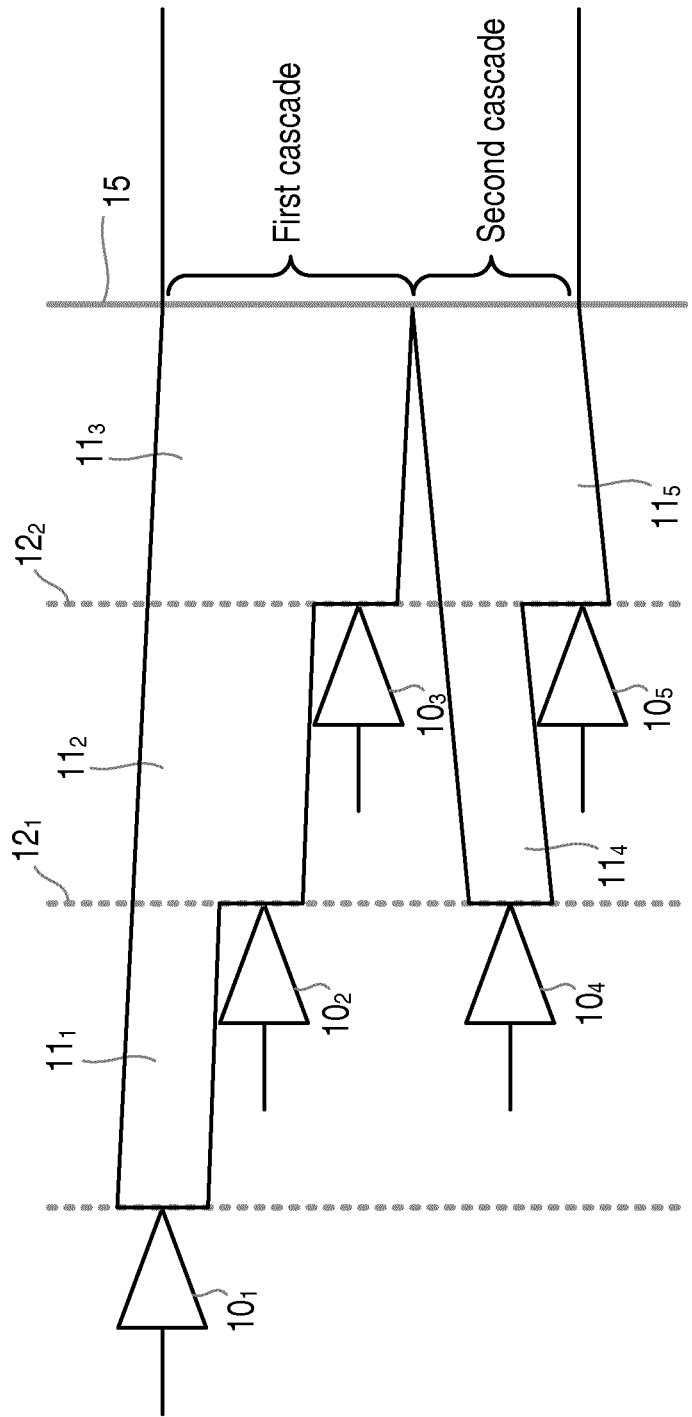
FIG. 5a shows an amplifier arrangement according to an embodiment of the present invention.

FIG. 5a shows an amplifier arrangement according to a first aspect of the present invention. In the example the amplifier arrangement comprises 5 amplifier stages, $10_1$ to $10_5$, although as will be described below the amplifier arrangement can comprise any higher number of amplifier stages, including both even and odd numbers of amplifier stages.

The five amplifier stages $10_1$ to $10_5$ are divided into a first quarter wavelength cascade of transmission lines comprising three amplifier stages (i.e. amplifier stages $10_1$ to $10_3$), and a second quarter wavelength cascade of transmission lines comprising two amplifier stages (i.e. amplifier stages $10_4$ to $10_5$). In the example of FIG. 5a both the first cascade and the second cascade are connected to a common output node 15. Both the first and second quarter wavelength cascades of transmission lines have only directly connected amplifiers to the respective junctions of each cascade in this example (i.e. connected to the quarter wavelength cascade by transmission line lengths that are only multiples of a half wavelength, including zero). The example of FIG. 5a further comprises amplifiers of substantially equal size.

The amplifier according to the embodiment of FIG. 5a, comprising five amplifier stages ($10_1$ to $10_5$), is therefore configured such that the first cascade comprises three quarter wavelength transmission line segments ($11_1$ to $11_3$) having three amplifier stages ($10_1$ to $10_3$) coupled thereto, and a second cascade comprising two quarter wavelength transmission line segments ($11_4$ to $11_5$) comprising two amplifier states ($10_4$ and $10_5$) coupled thereto, wherein the first and second cascades are each coupled to the common output node 15.

The quarter wavelength transmission line segments $11_1$ to $11_3$ of the first cascade, and quarter wavelength transmission line segments $11_4$ to $11_5$ of the second cascade are configured such that a characteristic impedance of each successive segment in the cascade of quarter wavelength transmission line segments is reduced towards the common output node 15 in relation to the parallel combination of preceding transmission lines, whereby the characteristic impedance of each successive segment is reduced to 1/M of the impedance of the transmission line from a single amplifier, whereby M relates to the number of preceding amplifiers. This applies to other embodiments described herein having equal sized amplifiers.

A condition for the embodiment of FIG. 5a, and the other embodiments described herein, is that only one of the quarter wavelength cascades connected to the same point can have low impedance in the common connection point, i.e. output node 15 in this example. In this example the first quarter wavelength cascade (upper cascade) has this property since it has an odd number of quarter wavelength lines, which transforms the high impedance of the leftmost amplifier stage $10_1$ into a low impedance at the connection point 15.

Figure 5B:
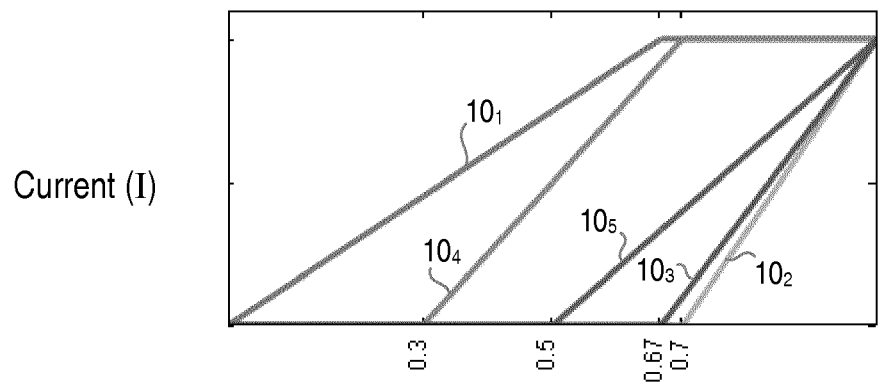
Figure 5C:
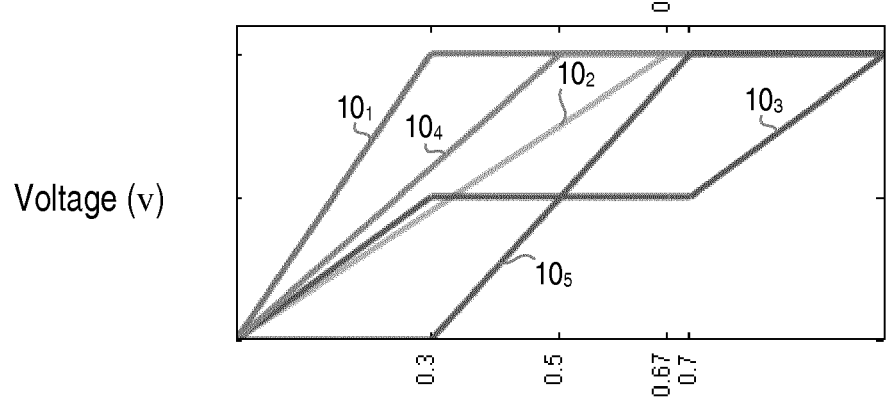
Figure 5D:
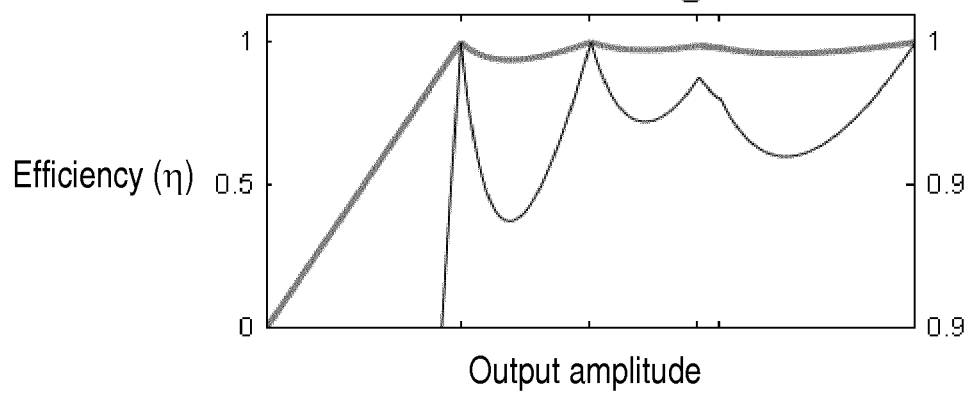

The starting amplifier (the one active at the lowest output amplitudes, also referred to as a "main" or "carrier" amplifier in Doherty nomenclature) is provided in the branch comprising an odd number of quarter wavelength transmission lines, since the output of the other branch is short circuited by it. Similarly to the cascaded Doherty amplifiers in Raab, the starting amplifier is the one farthest out in the chain (i.e. the first amplifier stage $10_1$). The first two "peaking" amplifiers (i.e. the next two ones in the "starting order" from low to high amplitudes) are with this dimensioning the ones in the second quarter wavelength cascade (i.e. the lower cascade), although in general terms this is not necessarily so (as we will explained in later embodiments). This dimensioning is not optimal, since the third and fourth transition points have efficiency peaks that do not reach the highest possible efficiency, and are clustered together, as shown in FIGS. 5b to 5d below. Another peculiarity due to this "starting order" is the behavior of the voltage amplitude at the third amplifier stage $10_3$, which is held constant at an intermediate level in the middle range, as shown in FIG. 5c.

FIG. 5b shows a plot of current against output amplitude for the five-stage embodiment of the present invention as shown in FIG. 5a. The order of the amplifier starting points in this example is amplifier $10_1$ starting at zero, amplifier $10_4$ starting at 0.3 of full output amplitude, amplifier $10_4$ starting at 0.5 of full output amplitude, amplifier $10_3$ starting at 0.67 of full output amplitude, and amplifier $10_2$ starting at 0.7 of full output amplitude.

FIG. 5c shows a plot of voltage against output amplitude for the five-stage embodiment of the present invention as shown in FIG. 5a which, as mentioned above, has a peculiarity due to this "starting order" whereby the voltage amplitude at the third amplifier stage $10_3$ is held constant at an intermediate level in the middle range. FIG. 5d shows a plot of efficiency against output amplitude for the five-stage embodiment of the present invention as shown in FIG. 5a.

Although the embodiments described herein will be described as having a cascade of quarter wavelength transmission line segments with decreasing characteristic impedance towards the output node, it is noted that transformations may be provided in a network, as described later in the application, for providing the same effect as a deceasing characteristic impedance. The use of such transformations in the network might be beneficial when physical constraints are imposed on the amplifier arrangement, for example because of the physical size of the transmission lines required to give a particular characteristic impedance.

This arrangement has the advantage of providing good efficiency for high PAR signals even with equal size transistors, due to high density of transition points at low output amplitudes.

Figure 6A:
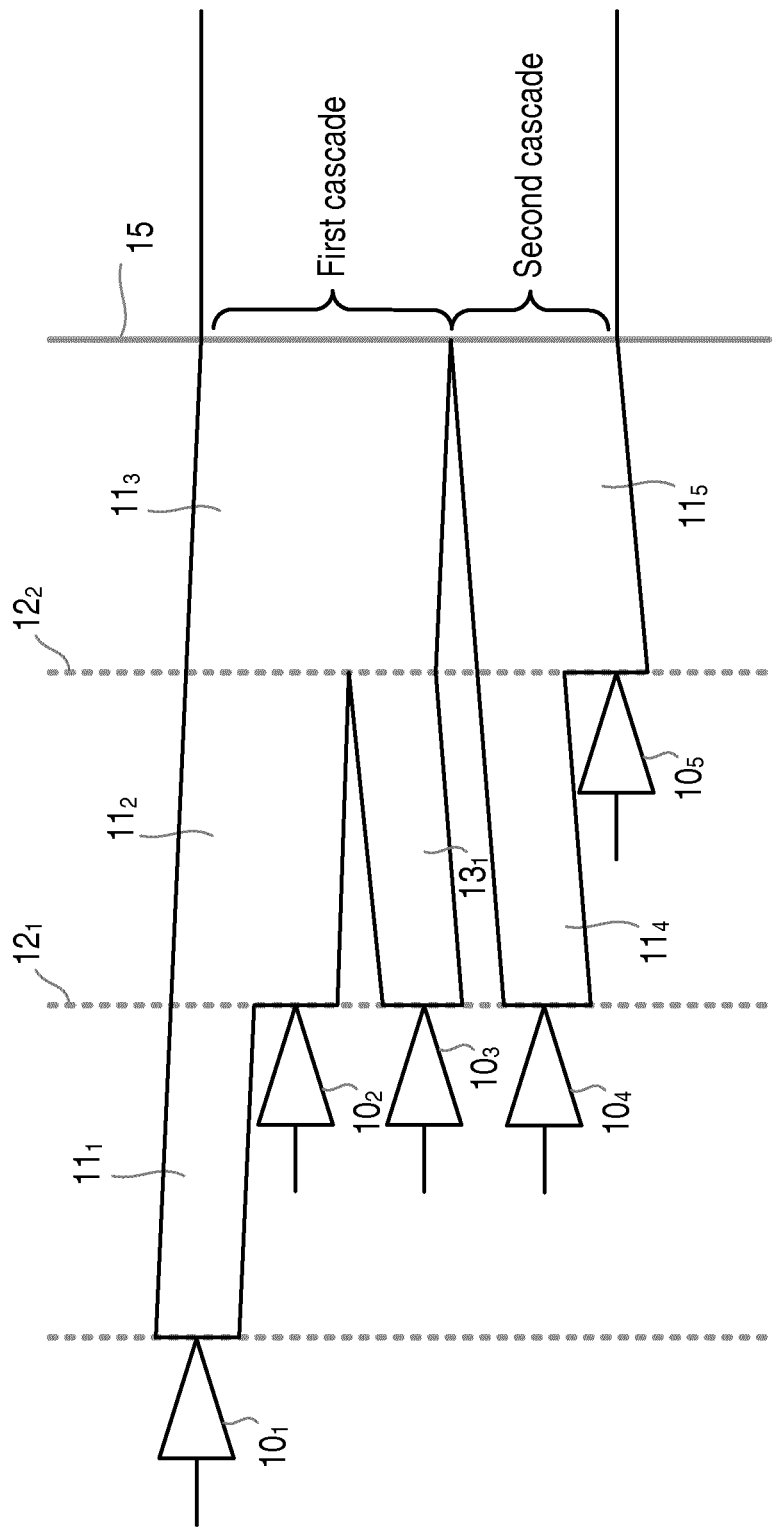
FIG. 6a shows an amplifier arrangement according to another embodiment of the present invention.

The embodiment of FIG. 6a is similar to that of FIG. 5a in that it shows an amplifier arrangement comprising five amplifier stages, $10_1$ to $10_5$. The amplifier arrangement comprises a first cascade of quarter wavelength transmission line segments $11_1$ to $11_3$ having three amplifier stages $10_1$ to $10_3$ coupled thereto, and a second cascade of quarter wavelength transmission line segments $11_4$ to $11_5$ comprising two amplifier stages $10_4$ and $10_5$ coupled thereto, wherein the first and second cascades are each coupled to the common output node 15.

However, in the example of FIG. 6a, rather than each amplifier stage being directly coupled to its respective junction of a cascade, the amplifier of the third stage $10_3$ (i.e. third amplifier from the top) is connected by a connecting quarter wavelength transmission line $13_1$ to its respective junction of the cascade, i.e. the last junction in the first cascade (i.e. the last junction of the three-stage quarter wavelength cascade).

This third amplifier stage $10_3$ is the starting amplifier with the dimensioning of this example. Just like with the equal-sized version of the previous amplifier arrangement shown in FIG. 5a, this equal-sized dimensioning is not optimal since the first and second transition points are forced to an amplitude which is lower than desired, due to the wrong voltages reaching maximum prematurely, so that another amplifier (transistor) must start at this lower amplitude. The corresponding efficiency peaks at these transition points do not therefore reach the highest possible efficiency. Instead of a flat voltage, it is the output current of the third amplifier stage $10_3$ that is held constant at an intermediate level in the middle range, as shown in FIG. 6b below.

Figure 6B:
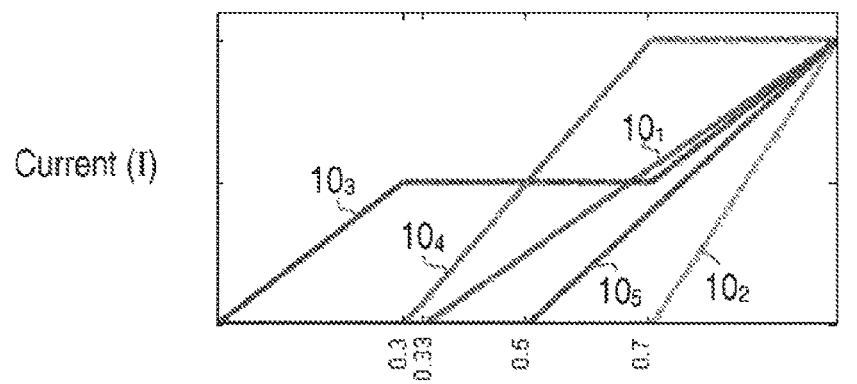

FIG. 6b shows a plot of current against output amplitude for the five-stage embodiment of the present invention as shown in FIG. 6a. The order of the amplifier starting points in this example is amplifier $10_3$ starting at zero, amplifier $10_4$ starting at 0.3 of full output amplitude, amplifier $10_1$ starting at 0.33 of full output amplitude, amplifier $10_5$ starting at 0.5 of full output amplitude, and amplifier $10_2$ starting at 0.7 of full output amplitude. As mentioned above, it can be seen that the output current of the third amplifier stage $10_3$ is held constant at an intermediate level in the middle range.

Figure 6C:
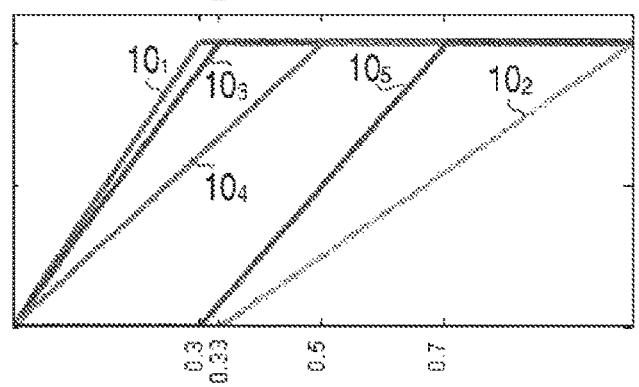
Figure 6D:
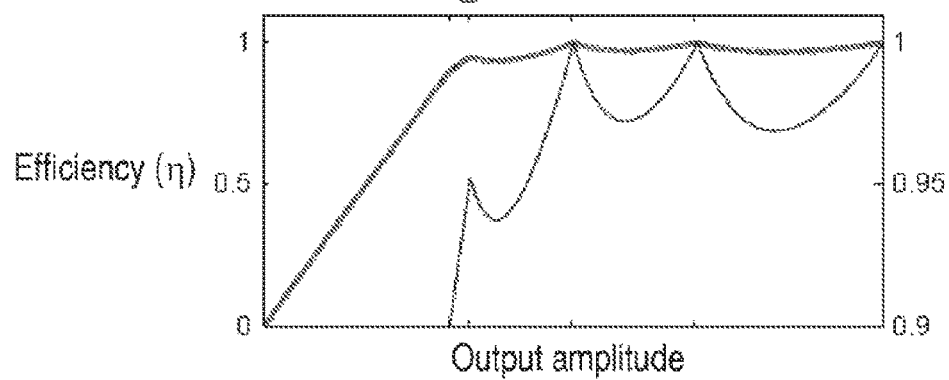

FIG. 6c shows a plot of voltage against output amplitude for the five-stage embodiment of the present invention as shown in FIG. 6a. FIG. 6d shows a plot of efficiency against output amplitude for the five-stage embodiment of the present invention as shown in FIG. 6a.

The examples of FIGS. 5a and 6a are therefore similar, although 5a has each amplifier coupled directly to a cascade, and FIG. 6a has all amplifiers coupled directly apart from one. In FIGS. 5a and 6a each of the amplifiers is substantially of the same size.

Figure 7A:
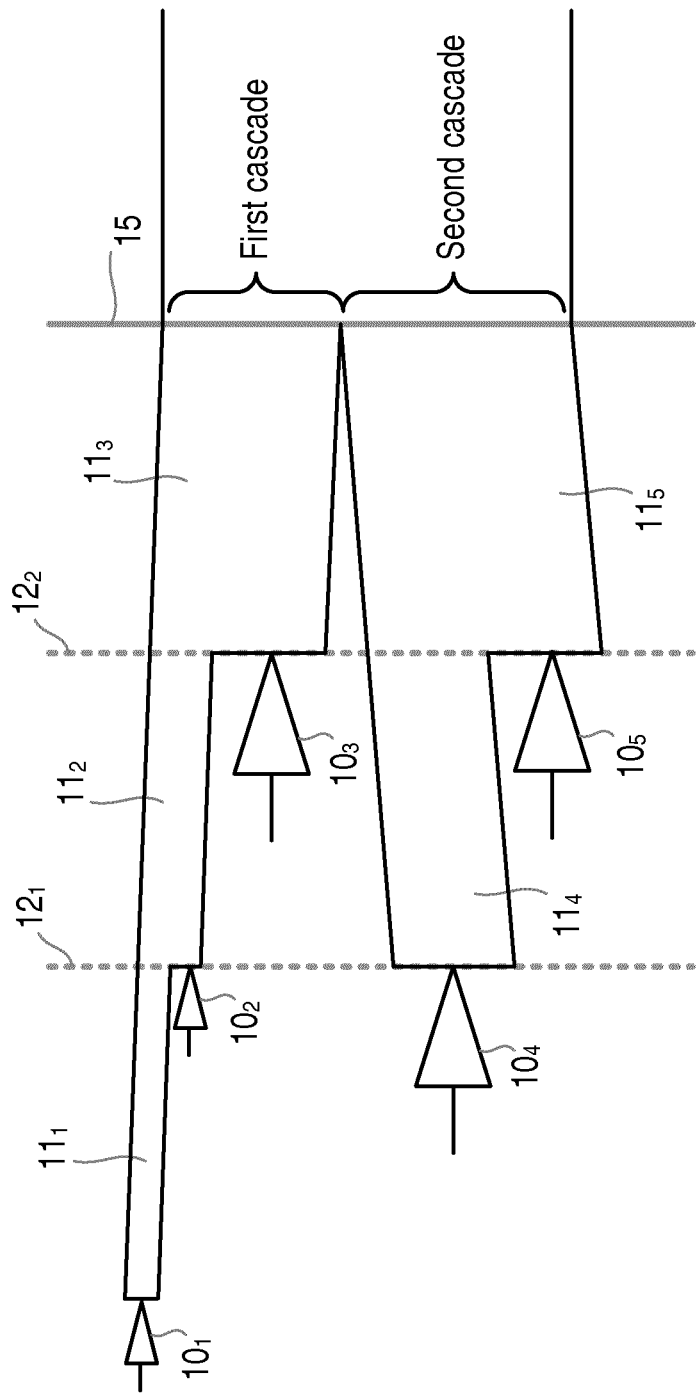
FIG. 7a shows an amplifier arrangement according to another embodiment of the present invention.
Figure 8A:
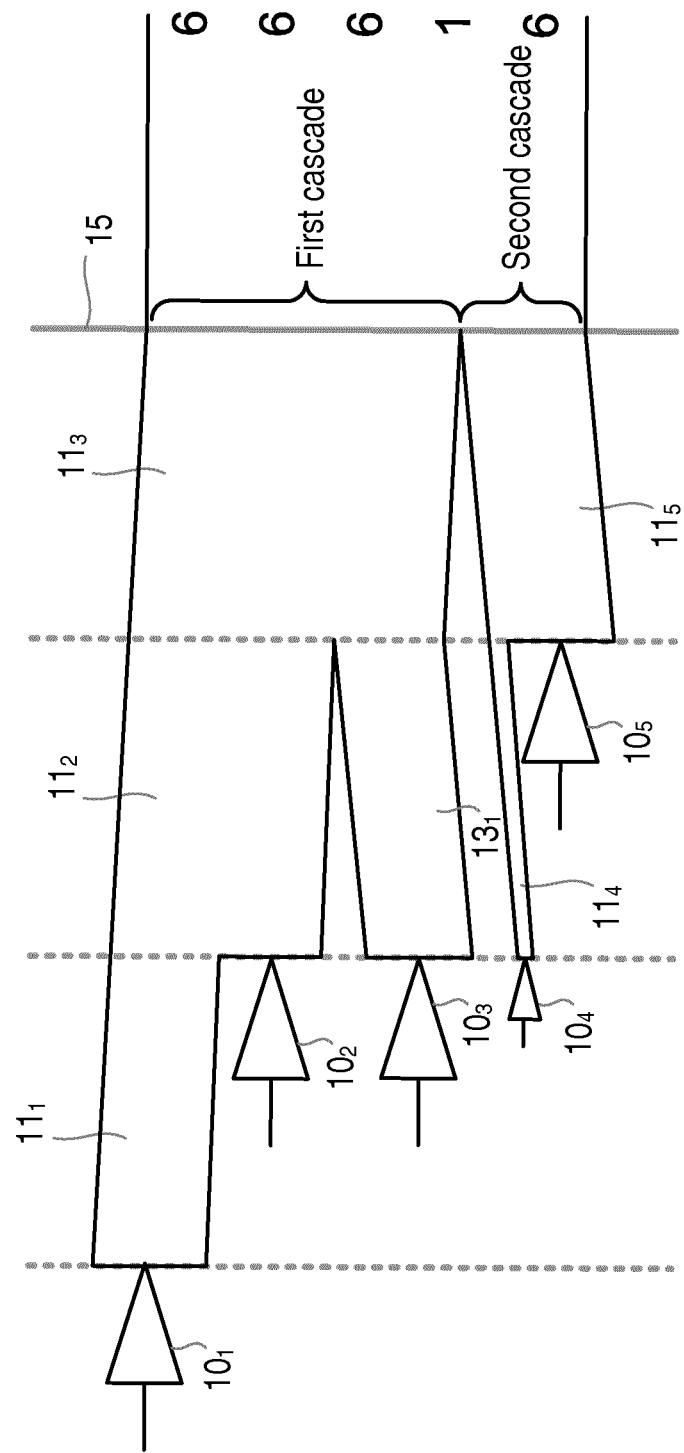
FIG. 8a shows an amplifier arrangement according to another embodiment of the present invention.

FIGS. 7a and 8a described below relate to amplifier arrangements having structures similar to that of FIGS. 5a and 6a respectively, but whereby different sized amplifiers are available.

For example, in FIG. 7a the basic structure is similar to that of FIG. 5a, but whereby the amplifier arrangement is dimensioned such that the first two amplifiers in the upper quarter wavelength cascade (i.e. the first and second amplifier stages $10_1$, $10_2$ of the first cascade) are about one fourth of the size of the remaining three amplifier stages $10_3$ to $10_5$. The transmission line impedances are increased correspondingly for these segments $11_1$, $11_2$ of the cascade. In this example the entire upper branch (the first cascade) is alone active in the lower range, while the lower branch (second cascade) then contains the last two peaking amplifiers. In this example all efficiency peaks reach the highest efficiency, and no voltage has a flat intermediate level range (not that such a flat voltage range is necessarily a disadvantage).

Figure 7B:
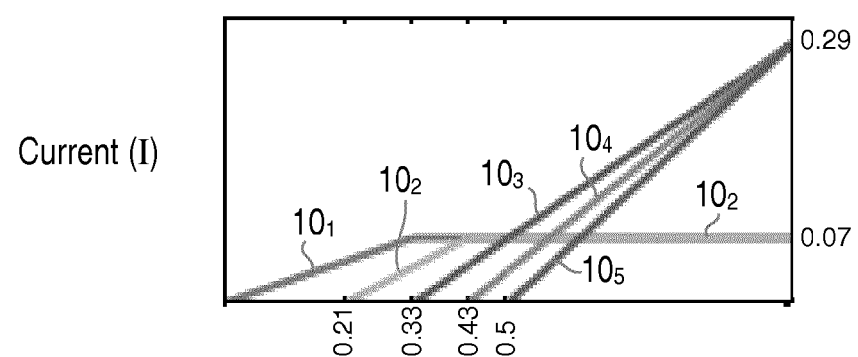

FIG. 7b shows a plot of current against output amplitude for the five-stage embodiment of the present invention as shown in FIG. 7a. The order of the amplifier starting points in this example is amplifier $10_1$ starting at zero, amplifier $10_2$ starting at 0.21 of full output amplitude, amplifier $10_3$ starting at 0.33 of full output amplitude, amplifier $10_4$ starting at 0.43 of full output amplitude, and amplifier $10_5$ starting at 0.5 of full output amplitude.

Figure 7C:
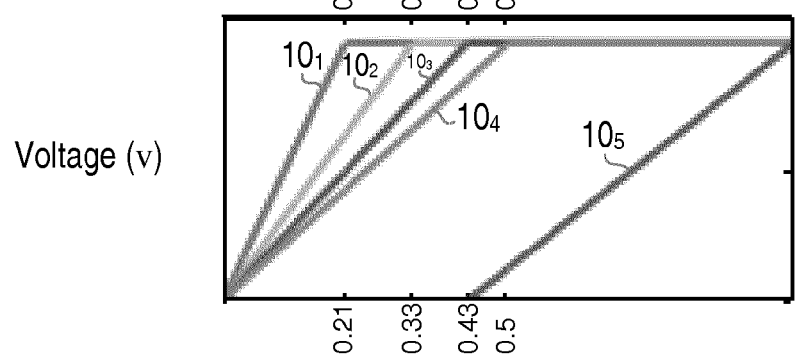
Figure 7D:
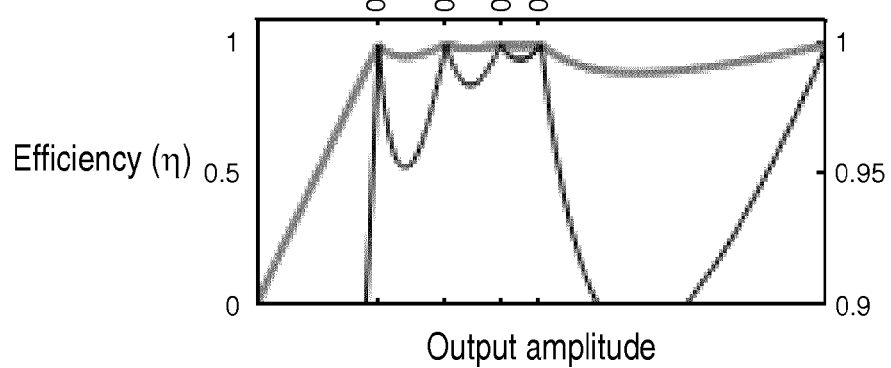

FIG. 7c shows a plot of voltage against output amplitude for the five-stage embodiment of the present invention as shown in FIG. 7a. FIG. 7d shows a plot of efficiency against output amplitude for the five-stage embodiment of the present invention as shown in FIG. 7a.

In FIG. 8a the basic structure is similar to that of FIG. 6a, but whereby the amplifier arrangement is dimensioned such that the fourth amplifier stage $10_4$ (fourth amplifier from the top), or the first amplifier in the second cascade (i.e. the first amplifier in the 2-stage cascade) can be the starting amplifier. In the example of FIG. 8a the basic structure of FIG. 6a is dimensioned so that the first amplifier in the second quarter wavelength transmission line cascade is about one sixth of the size of the other amplifiers. In this case the entire second cascade (lower cascade) is alone active (delivering RF current) in the lowest range and the first cascade (upper branch) then contains the last three peaking amplifiers. Only the starting amplifier (i.e. the fourth amplifier stage $10_4$) has a range with amplitude-limited RF current. All efficiency peaks reach the highest efficiency, and it is noted that their distribution is improved compared with an arrangement comprising equal sized amplifier stages.

Figures 8B, 8C, 8D:
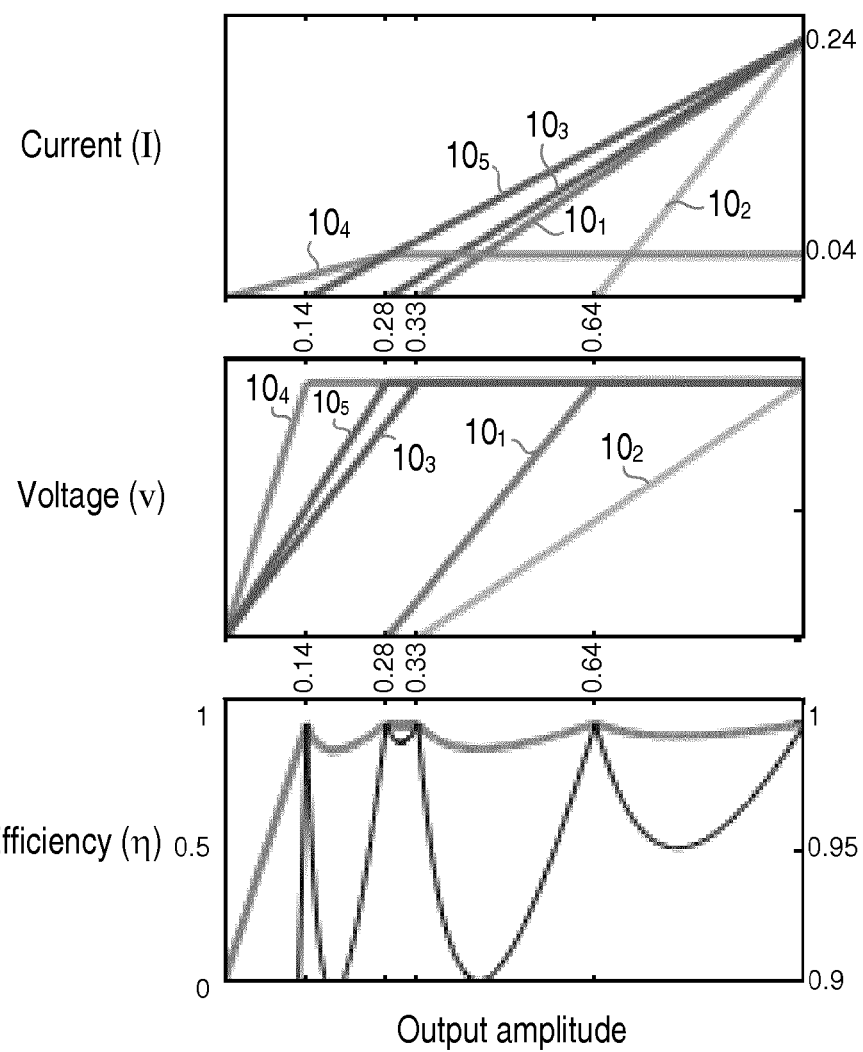

FIG. 8b shows a plot of current against output amplitude for the five-stage embodiment of the present invention as shown in FIG. 8a. The order of the amplifier starting points in this example is amplifier $10_4$ starting at zero, amplifier $10_5$ starting at 0.14 of full output amplitude, amplifier $10_3$ starting at 0.28 of full output amplitude, amplifier $10_1$ starting at 0.33 of full output amplitude, and amplifier $10_2$ starting at 0.64 of full output amplitude.

FIG. 8c shows a plot of voltage against output amplitude for the five-stage embodiment of the present invention as shown in FIG. 8a. FIG. 8d shows a plot of efficiency against output amplitude for the five-stage embodiment of the present invention as shown in FIG. 8a.

Next, examples of amplifier arrangements comprising six amplifier stages will be described.

Examples of six canonical six-stage amplifier arrangements will be described having two quarter wavelength cascades. The examples are built with the five-stage amplifier arrangements described above in relation to FIGS. 5 to 8.

Figure 9A:
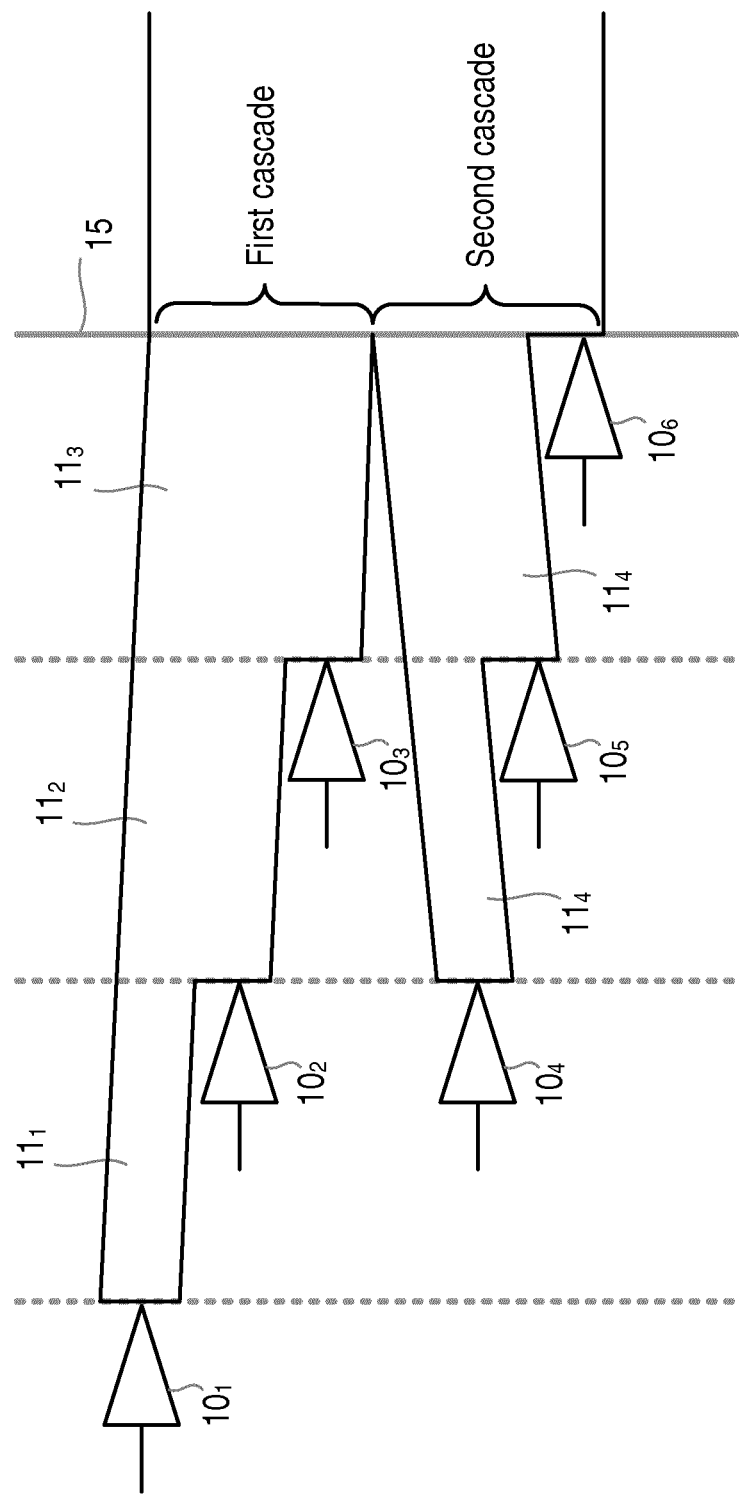
FIG. 9a shows an amplifier arrangement according to another embodiment of the present invention.
Figure 10A:
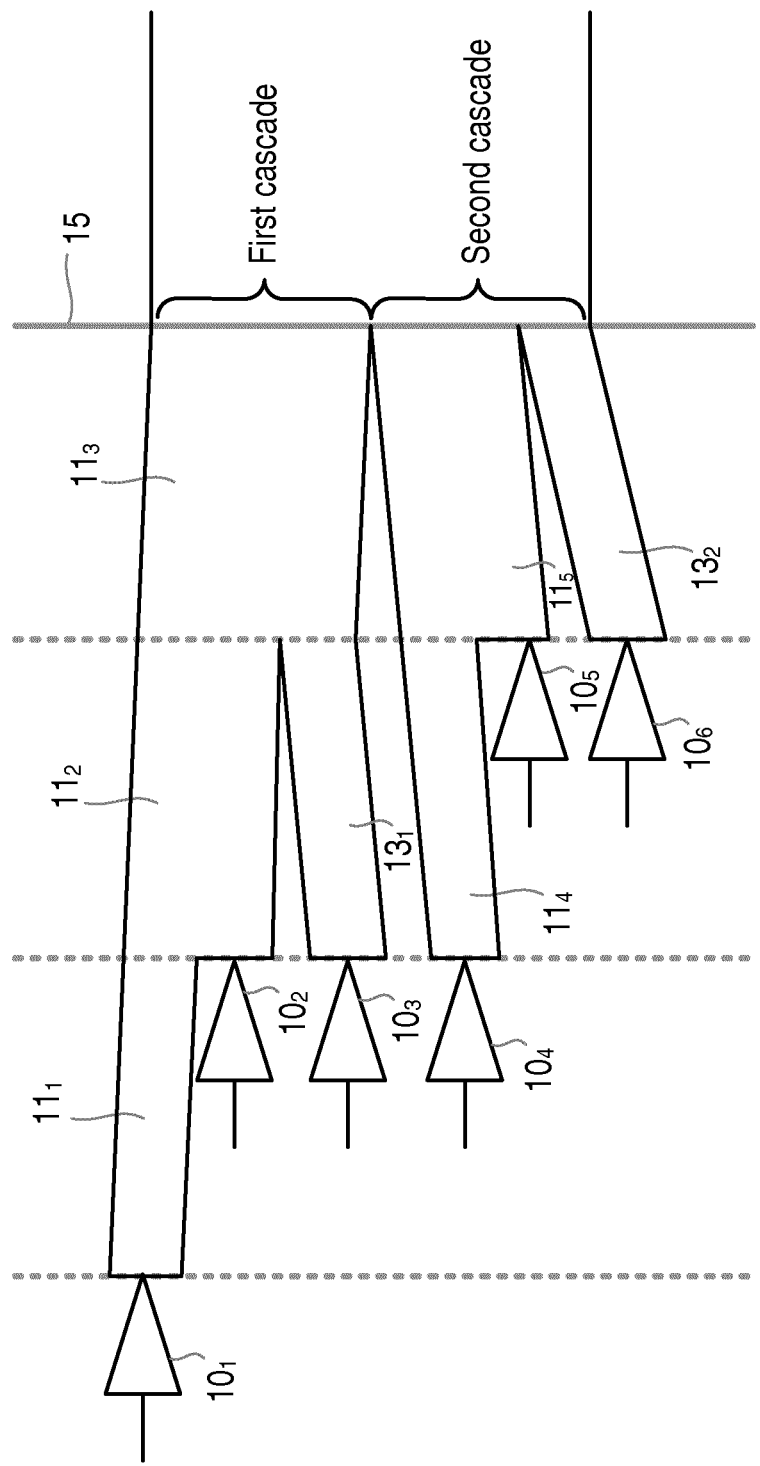
FIG. 10a shows an amplifier arrangement according to another embodiment of the present invention.

FIGS. 9a and 10a below describe examples similar to those above, complemented with an additional amplifier, a sixth amplifier $10_6$, connected to the common output 15.

In FIG. 9a the amplifier arrangement is based on FIG. 5a, with a first cascade comprising three quarter wavelength transmission lines in the upper cascade, which short circuits the output node 15, so the sixth amplifier stage $10_6$ is connected directly to the common output node 15. The sixth amplifier stage $10_6$ functions as the last peaking amplifier, and is active in the topmost amplitude range. It is noted that the addition of the sixth amplifier stage $10_6$ removes the situation whereby the efficiency peaks do not reach a maximum. The flat intermediate voltage amplitude range at the third amplifier stage $10_3$ remains present.

Figure 9B:
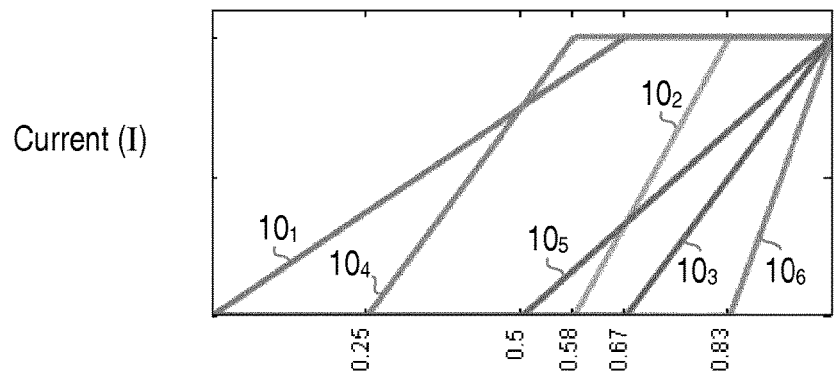

FIG. 9b shows a plot of current against output amplitude for the six-stage embodiment of the present invention as shown in FIG. 9a. The order of the amplifier starting points in this example is amplifier $10_1$ starting at zero, amplifier $10_4$ starting at 0.25 of full output amplitude, amplifier $10_5$ starting at 0.5 of full output amplitude, amplifier $10_2$ starting at 0.58 of full output amplitude, amplifier $10_3$ starting at 0.67 of full output amplitude, and amplifier $10_6$ starting at 0.83 of full output amplitude.

Figure 9C:
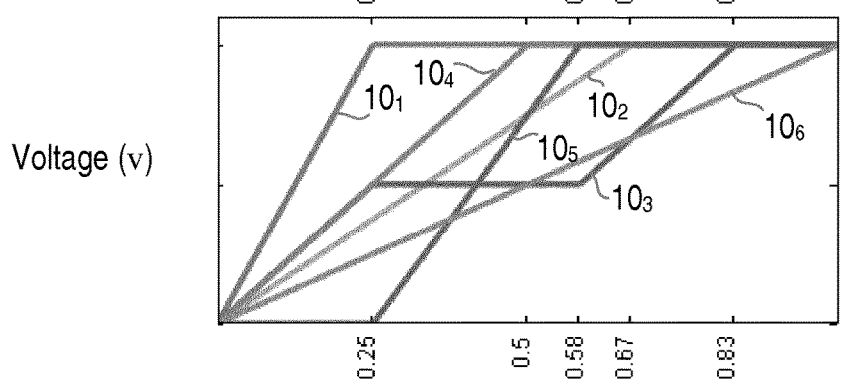
Figure 9D:
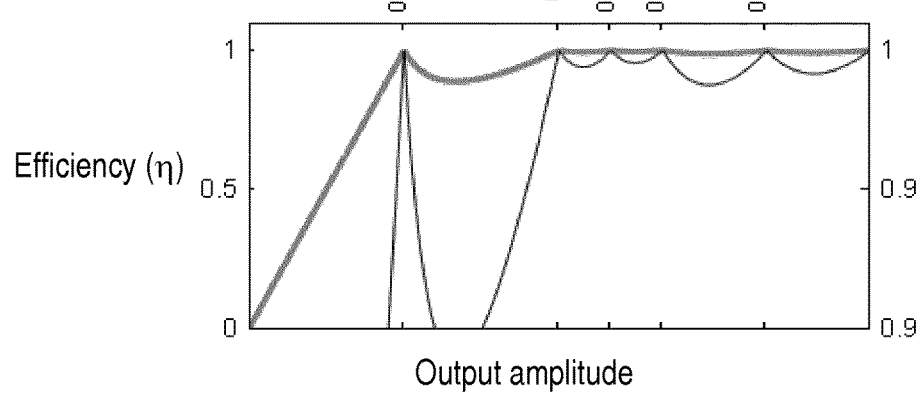

FIG. 9c shows a plot of voltage against output amplitude for the six-stage embodiment of the present invention as shown in FIG. 9a. FIG. 9d shows a plot of efficiency against output amplitude for the six-stage embodiment of the present invention as shown in FIG. 9a.

In FIG. 10a the amplifier arrangement is based on FIG. 6a, i.e. whereby the third amplifier stage $10_3$ (the final amplifier stage of the first cascade) is coupled by a connecting quarter wavelength transmission line $13_1$ to its junction with the cascade. Both the first and second quarter wavelength cascades in this embodiment present high impedance to the common output node 15, and the sixth amplifier stage $10_6$ is connected by a connecting quarter wavelength transmission line $13_2$ to the common output node. It will therefore function as the starting amplifier (or "main" or "carrier" amplifier). As for the five-stage amplifier section, the RF output current of the third amplifier stage $10_3$ is held constant at an intermediate level in the middle range. The efficiency curve for this equal size dimensioning has all peaks reaching maximum, and their distribution is quite effective for medium to high PAR amplitude distributions.

Figure 10B:
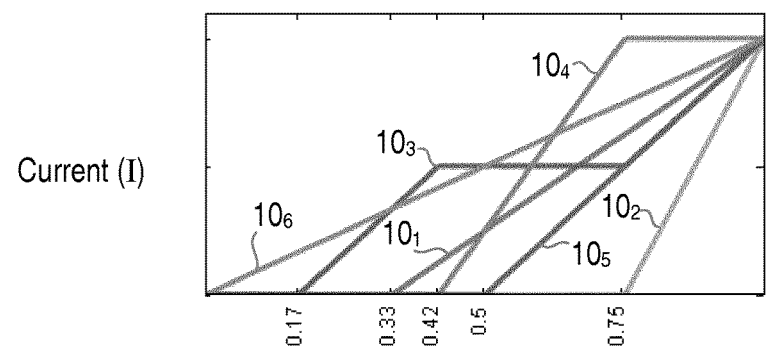

FIG. 10b shows a plot of current against output amplitude for the six-stage embodiment of the present invention as shown in FIG. 10a. The order of the amplifier starting points in this example is amplifier $10_6$ starting at zero, amplifier $10_3$ starting at 0.17 of full output amplitude, amplifier $10_1$ starting at 0.33 of full output amplitude, amplifier $10_4$ starting at 0.42 of full output amplitude, amplifier $10_5$ starting at 0.5 of full output amplitude, and amplifier $10_2$ starting at 0.75 of full output amplitude.

Figure 10C:
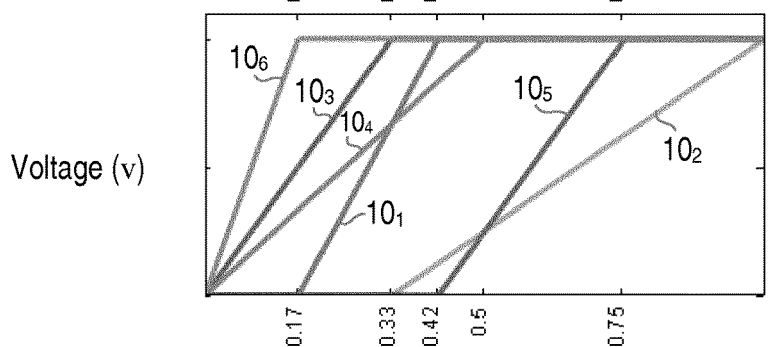
Figure 10D:
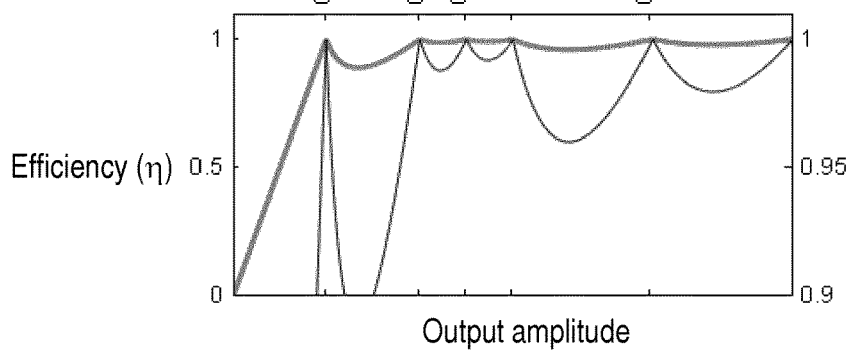

FIG. 10c shows a plot of voltage against output amplitude for the six-stage embodiment of the present invention as shown in FIG. 10a. FIG. 10d shows a plot of efficiency against output amplitude for the six-stage embodiment of the present invention as shown in FIG. 10a.

Figure 11A:
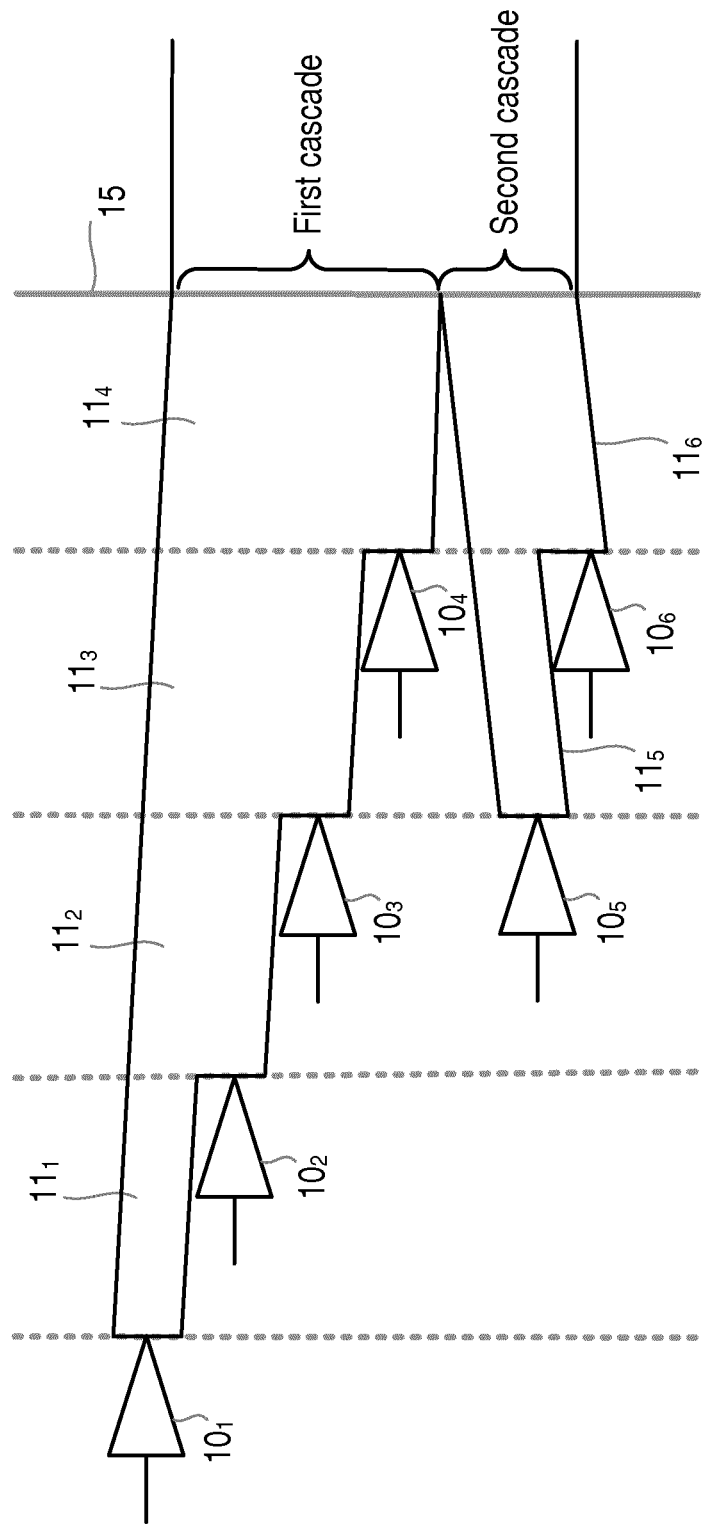
FIG. 11a shows an amplifier arrangement according to another embodiment of the present invention.
Figure 12A:
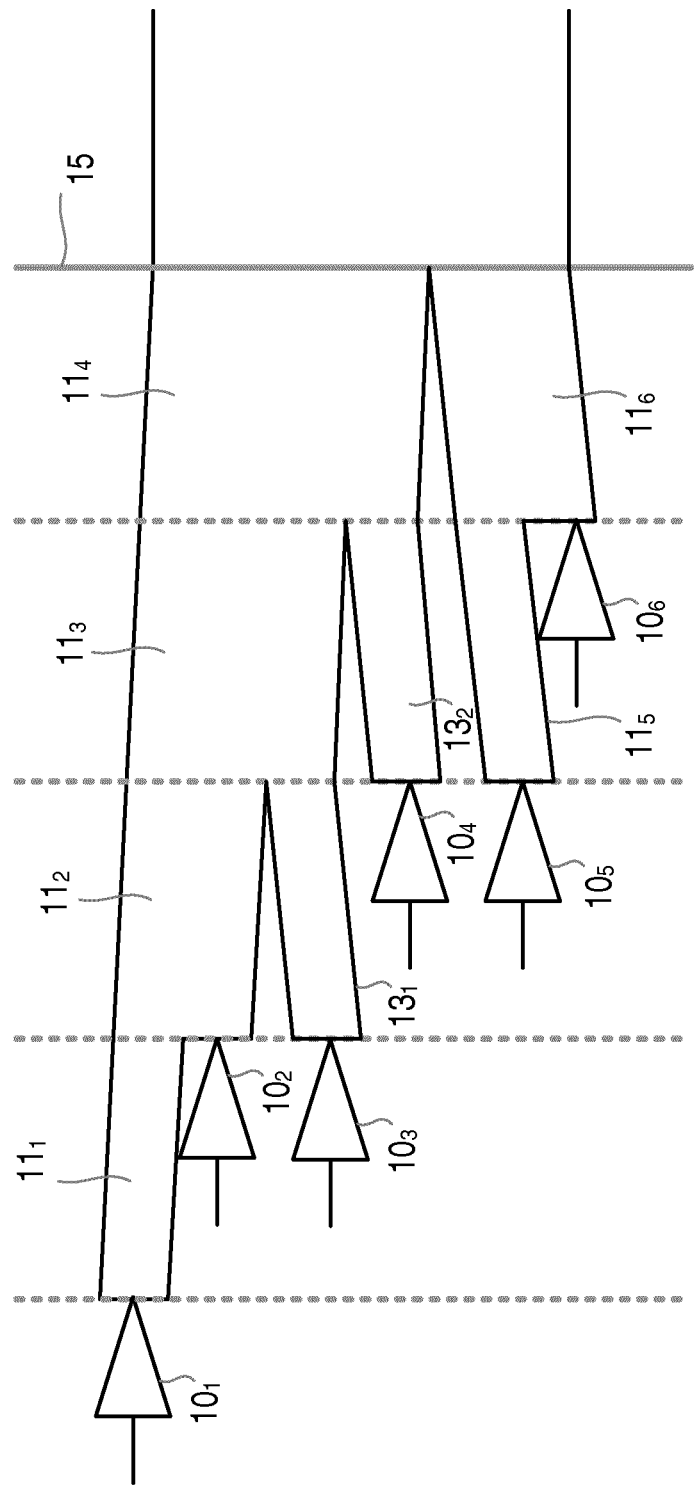
FIG. 12a shows an amplifier arrangement according to another embodiment of the present invention.

The examples of FIGS. 11a and 12a describe two six-stage amplifier arrangements which are configured with a combination of a full-length 4-stage quarter wavelength cascade as the first cascade, and a 2-stage quarter wavelength cascade as the second cascade. The two-stage cascade in these examples is of the same type, but there are two possibilities for the 4-stage cascade.

The example of FIG. 11a shows a amplifier arrangement in which all amplifiers stages are connected directly to the 4-stage quarter wavelength cascade, i.e. the first cascade. The fifth and sixth amplifiers stages $10_5$, $10_6$ are also connected directly to the 2-stage quarter wavelength cascade, i.e. the second cascade. It is noted, as shown in FIG. 11c below, that this amplifier arrangement also has a flat intermediate voltage amplitude range, at the fourth amplifier stage $10_4$. The two uppermost efficiency peaks do not reach full efficiency, and the efficiency peaks are more closely clustered than is desirable. It is noted that with other amplifier stage sizes and corresponding transmission line impedances, the starting order of the amplifier stages can be changed as desired.

Figure 11B:
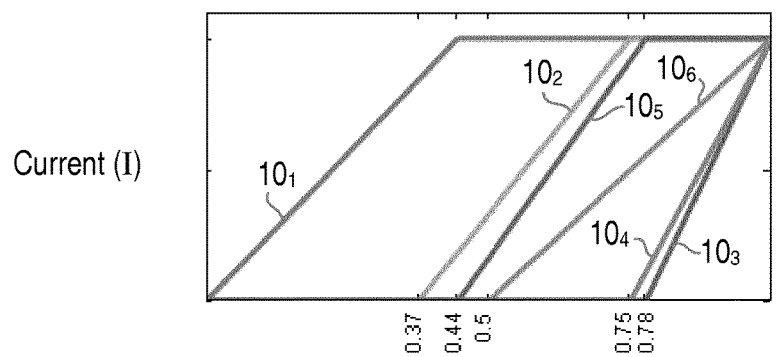
Figure 11C:
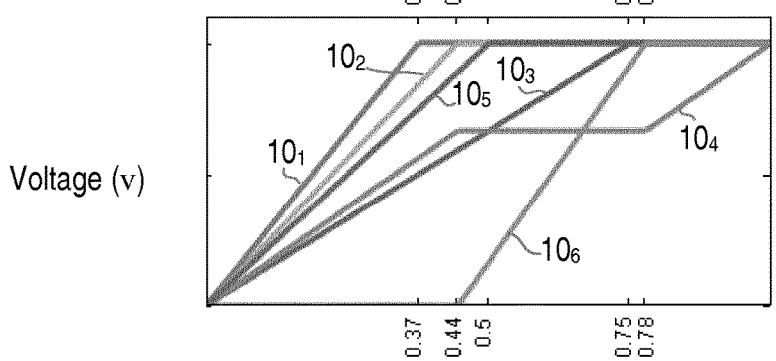

FIG. 11b shows a plot of current against output amplitude for the six-stage embodiment of the present invention as shown in FIG. 11a. The order of the amplifier output starting points in this example is amplifier $10_1$ starting at zero, amplifier $10_2$ starting at 0.37 of full amplitude, amplifier $10_5$ starting at 0.44 of full output amplitude, amplifier $10_6$ starting at 0.5 of full output amplitude, amplifier $10_4$ starting at 0.75 of full output amplitude, and amplifier $10_3$ starting at 0.78 of full output amplitude.

Figure 11D:
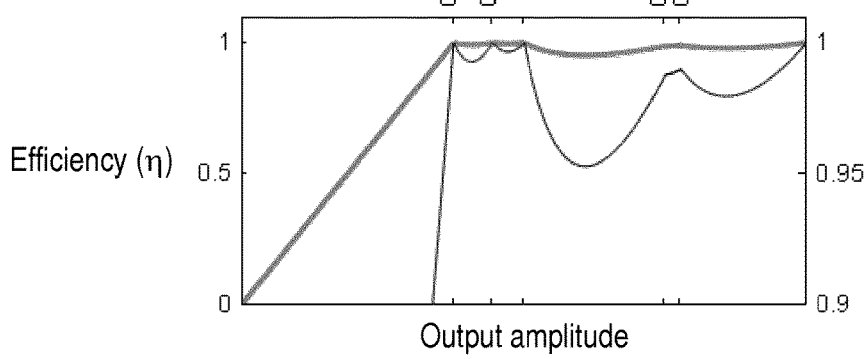

FIG. 11c shows a plot of voltage against output amplitude for the six-stage embodiment of the present invention as shown in FIG. 11a. FIG. 11d shows a plot of efficiency against output amplitude for the six-stage embodiment of the present invention as shown in FIG. 11a.

The example of FIG. 12a shows a amplifier arrangement which is similar to the example of FIG. 11a, but in which the two last amplifiers of the 4-stage quarter wavelength cascade (i.e. the third amplifier stage $10_3$ and fourth amplifier stage $10_4$ in the first cascade) are connected via connecting quarter wavelength transmission lines, $13_1$ and $13_2$ respectively, to their respective junctions in the cascade. The RF output current of the starting ("main") amplifier, the fourth amplifier stage $10_4$ in this example, is held constant at an intermediate level in the middle range. The two lowermost efficiency peaks do not reach full efficiency, and it can be seen that the efficiency peaks are clustered more closely than might be desirable.

Figure 12B:
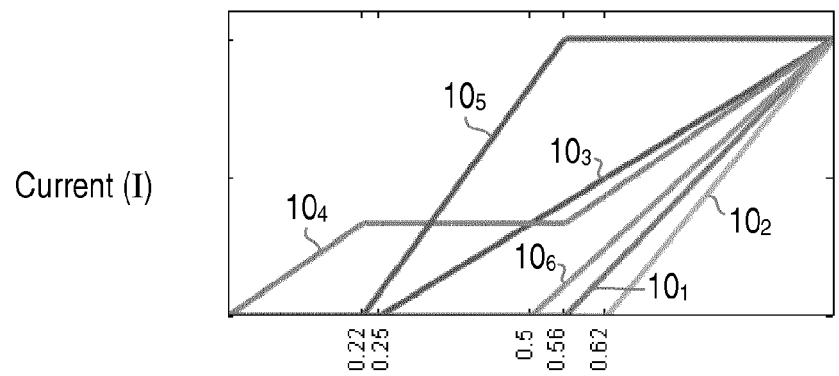

FIG. 12b shows a plot of current against output amplitude for the six-stage embodiment of the present invention as shown in FIG. 12a. The order of the amplifier starting points in this example is amplifier $10_4$ starting at zero, amplifier $10_5$ starting at 0.22 of full output amplitude, amplifier $10_3$ starting at 0.25 of full output amplitude, amplifier $10_6$ starting at 0.5 of full output amplitude, amplifier $10_1$ starting at 0.56 of full output amplitude, and amplifier $10_2$ starting at 0.62 of full output amplitude.

Figure 12C:
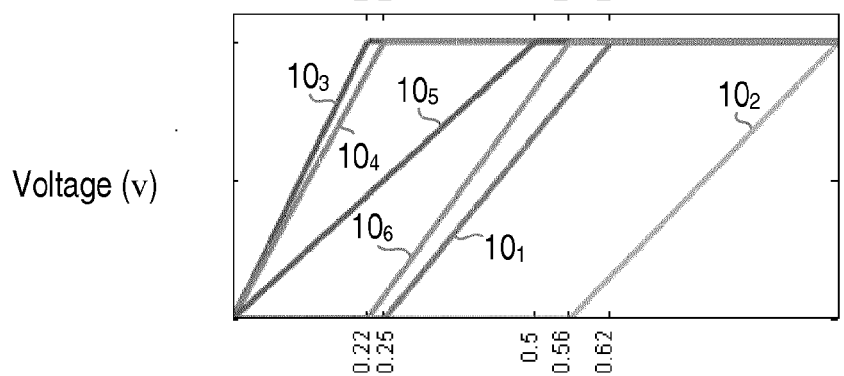
Figure 12D:
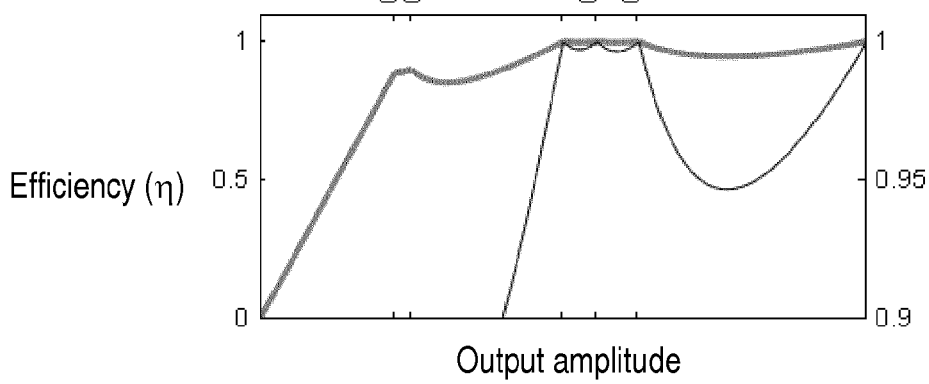

FIG. 12c shows a plot of voltage against output amplitude for the six-stage embodiment of the present invention as shown in FIG. 12a. FIG. 12d shows a plot of efficiency against output amplitude for the six-stage embodiment of the present invention as shown in FIG. 12a.

Figure 13A:
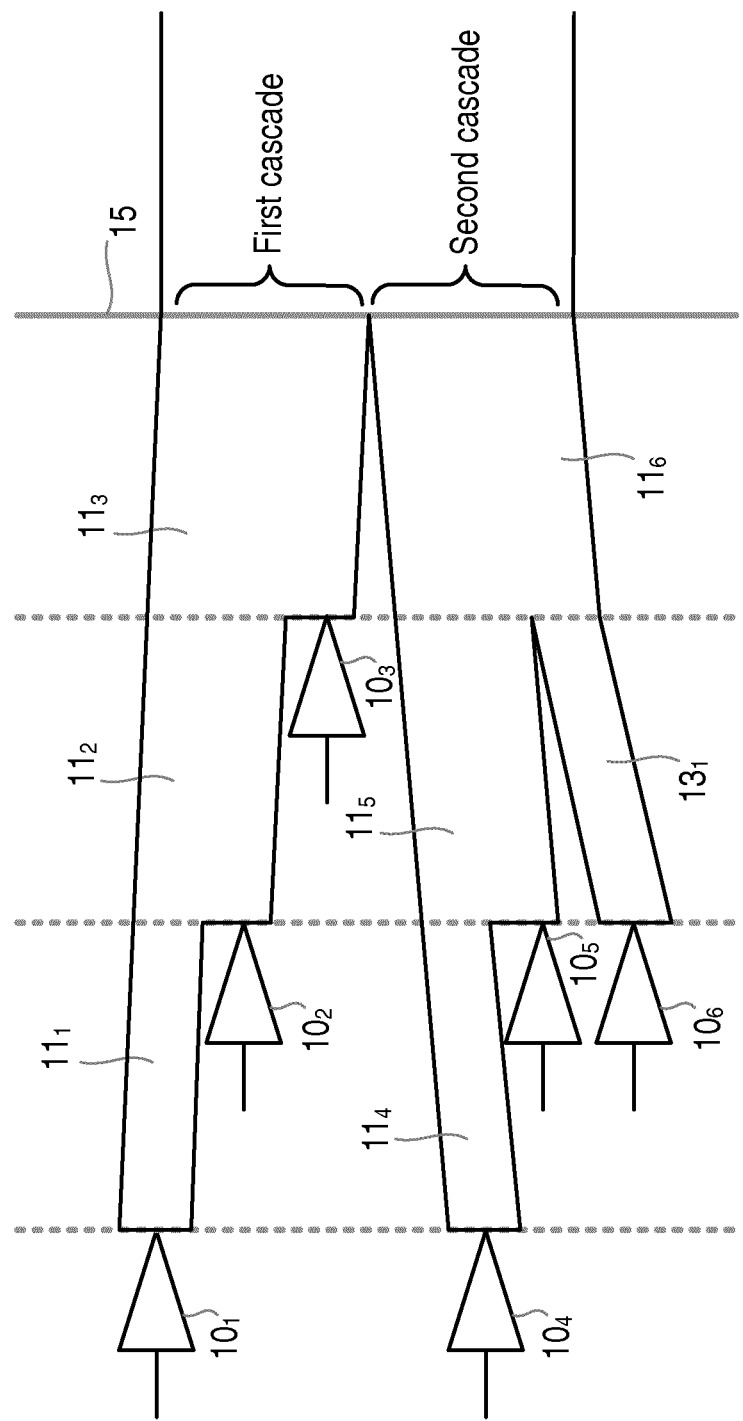
FIG. 13a shows an amplifier arrangement according to another embodiment of the present invention.
Figure 14A:
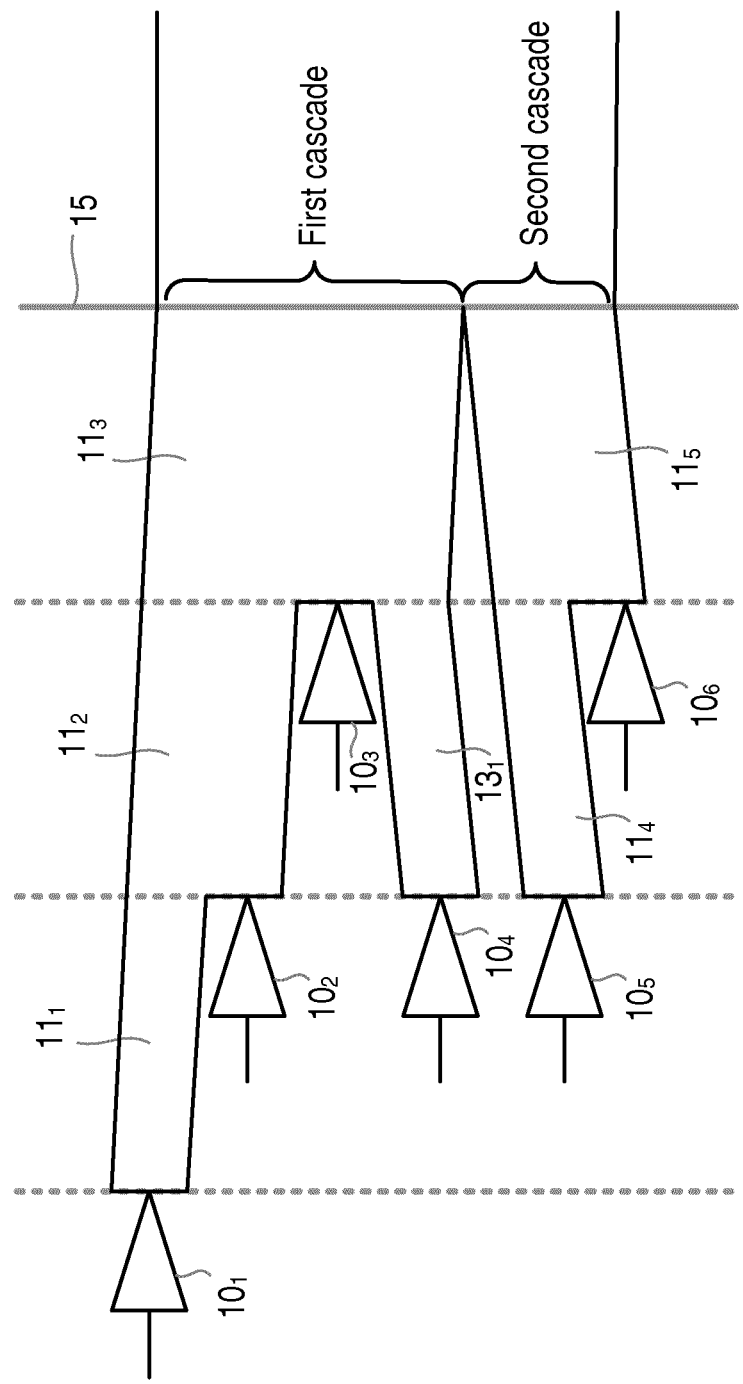
FIG. 14a shows an amplifier arrangement according to another embodiment of the present invention.

FIGS. 13a and 14a describe examples of six-stage amplifier arrangements that are configured differently and which operate differently, but with equal sized amplifier stages they have the same (rather good) distribution of efficiency peaks.

The example of FIG. 13a shows an amplifier arrangement comprising first and second cascades, each of the first and second cascades comprising three-stage quarter wavelength cascades, i.e. each having three amplifier stages coupled thereto. The example shows one of each kind used in the previously described five- and six-stage amplifier arrangements. Since it has an odd number of quarter wavelengths without any junction being short-circuited by an amplifier quarter wavelength combination, the first cascade comprising only directly connected amplifiers stages $10_1$, $10_2$ and $10_3$ hosts the starting amplifier, namely the first amplifier stage $10_1$. Dimensioned for equal sized amplifiers stages, this amplifier arrangement has a flat voltage middle amplitude region at the third amplifier stage $10_3$, and a flat current region at the sixth amplifier stage $10_6$.

Figure 13B:
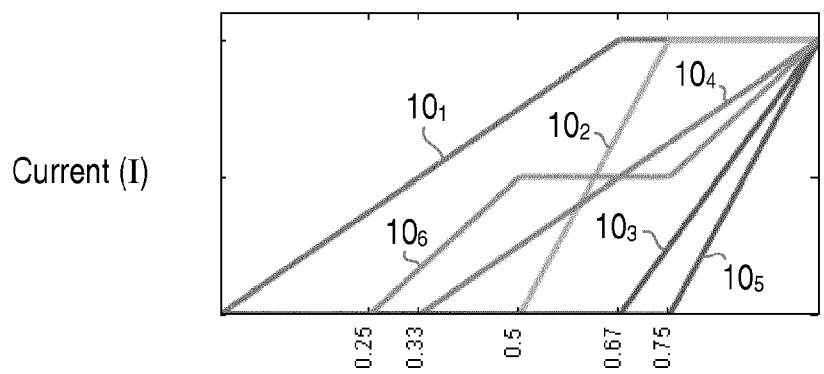

FIG. 13b shows a plot of current against output amplitude for the six-stage embodiment of the present invention as shown in FIG. 13a. The order of the amplifier starting points in this example is amplifier $10_1$ starting at zero, amplifier $10_6$ starting at 0.25 of full output amplitude, amplifier $10_4$ starting at 0.33 of full output amplitude, amplifier $10_2$ starting at 0.5 of full output amplitude, amplifier $10_3$ starting at 0.67 of full output amplitude, and amplifier $10_5$ starting at 0.75 of full output amplitude.

Figure 13C:
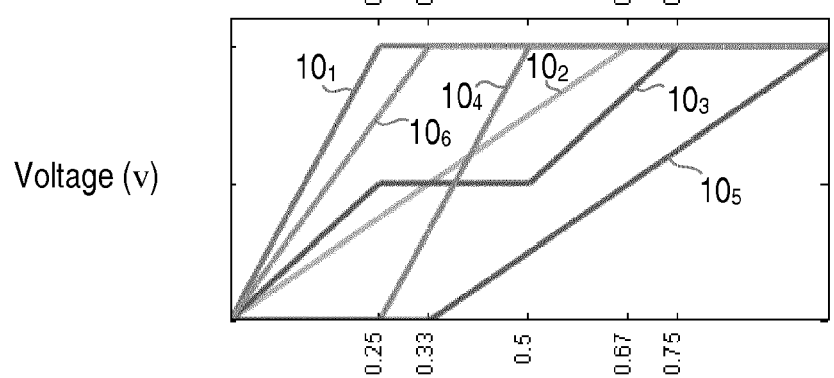
Figure 13D:
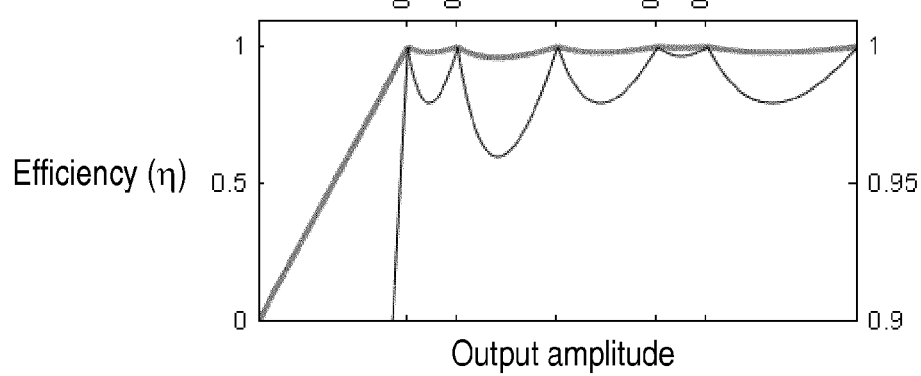

FIG. 13c shows a plot of voltage against output amplitude for the six-stage embodiment of the present invention as shown in FIG. 13a. FIG. 13d shows a plot of efficiency against output amplitude for the six-stage embodiment of the present invention as shown in FIG. 13a.

The example of FIG. 14a shows an amplifier arrangement comprising first and second quarter wavelength cascades, the first cascade having four amplifier stages $10_1$ to $10_4$ coupled thereto, and the second cascade having two amplifier stages $10_5$ and $10_6$ coupled thereto. The arrangement comprises a first cascade with three quarter wavelength segments with both a directly connected and a quarter wavelength connected amplifier at the same junction. In other words, the third amplifier stage $10_3$ is connected directly to the same junction as the fourth amplifier stage $10_4$ (the fourth amplifier stage $10_4$ being connected to that junction via a connecting quarter wavelength transmission line $13_1$). When dimensioned with equal sized amplifier stages, this amplifier arrangement has a flat voltage middle amplitude region at the third amplifier stage $10_3$, and a flat current region at the fourth amplifier stage $10_4$, as shown in FIGS. 14b and 14c below.

Figure 14B:
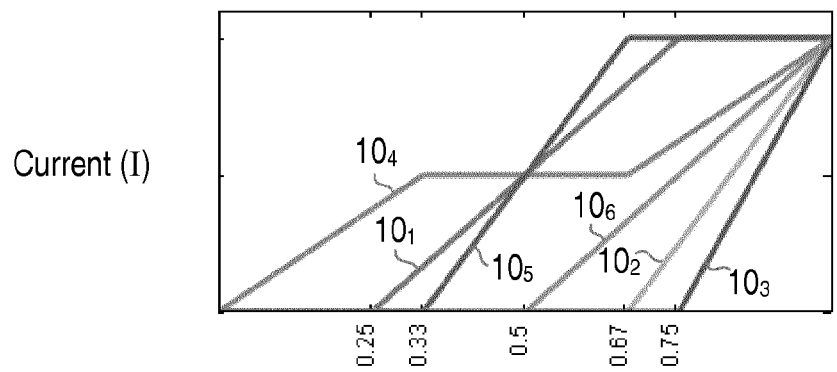

FIG. 14b shows a plot of current against output amplitude for the six-stage embodiment of the present invention as shown in FIG. 14a. The order of the amplifier starting points in this example is amplifier $10_4$ starting at zero, amplifier $10_1$ starting at 0.25 of full output amplitude, amplifier $10_5$ starting at 0.33 of full output amplitude, amplifier $10_6$ starting at 0.5 of full output amplitude, amplifier $10_2$ starting at 0.67 of full output amplitude, and amplifier $10_3$ starting at 0.75 of full output amplitude.

Figure 14C:
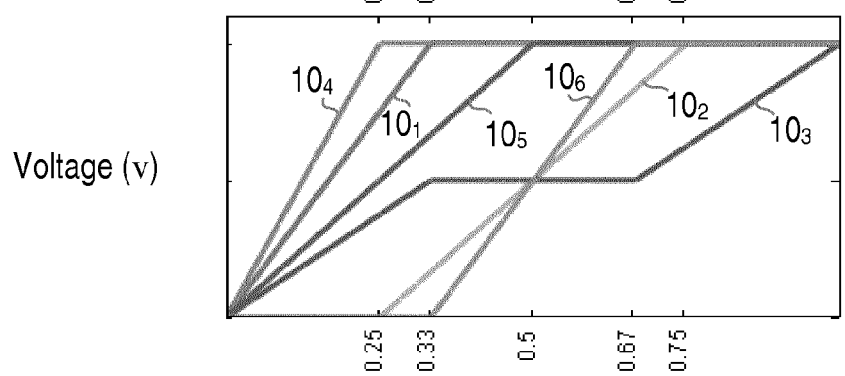
Figure 14D:
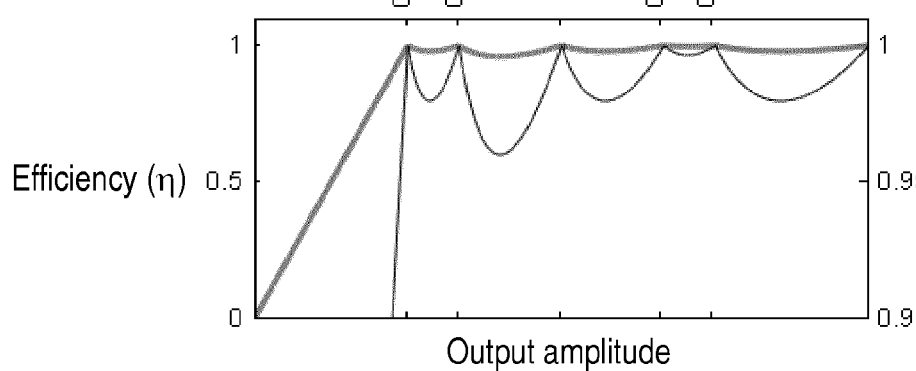

FIG. 14c shows a plot of voltage against output amplitude for the six-stage embodiment of the present invention as shown in FIG. 14a. FIG. 14d shows a plot of efficiency against output amplitude for the six-stage embodiment of the present invention as shown in FIG. 14a.

It is noted that with other transistor sizes and corresponding transmission line impedances other voltage and current shapes are possible. For example, it is possible for the fifth amplifier stage $10_5$ to be configured as the starting amplifier, since the first (upper) quarter wavelength cascade does not short circuit the output for the second (lower) quarter wavelength cascade.

In the previous examples of amplifier arrangements with five or six amplifier stages, it can be seen that each quarter wavelength cascade is connected to the common output node 15. With 7-stage amplifier arrangements, two quarter wavelength cascades can merge at another junction other than the common output node, for example an intermediate node in the cascade of quarter wavelength transmission lines, and there can also be more than two quarter wavelength cascades, as will be described in the examples below.

Figure 15A:
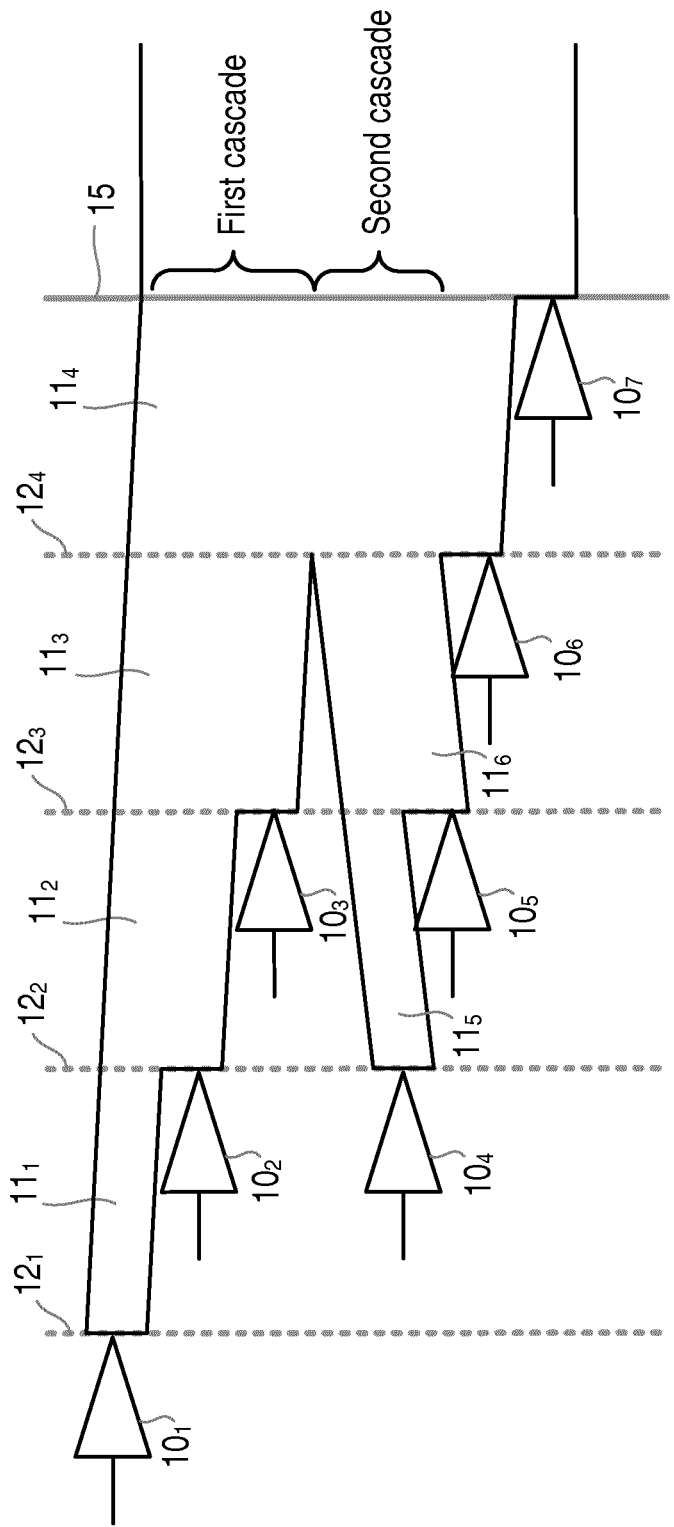
Figure 16A:
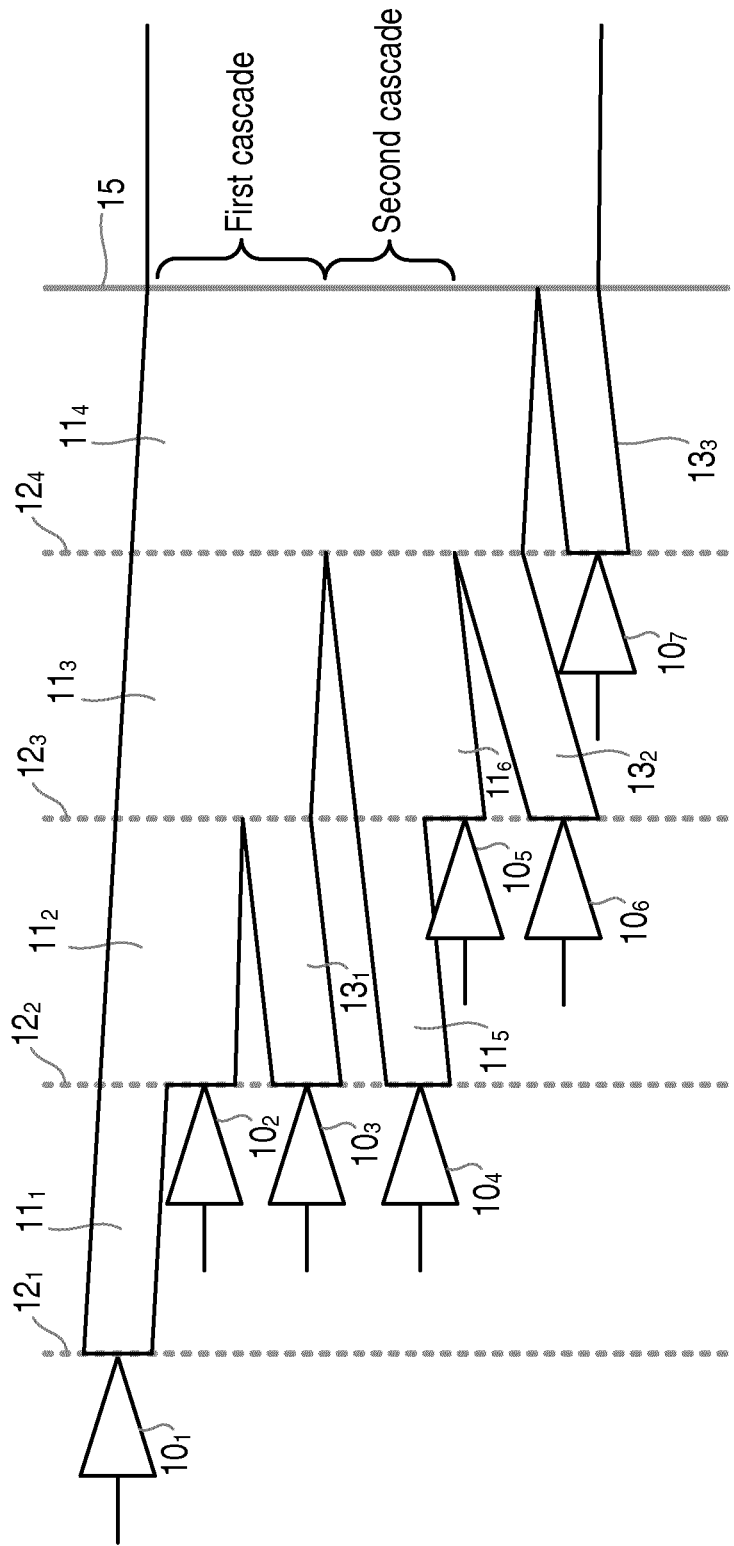

FIGS. 15a and 16a show examples of first and second quarter wavelength cascades merging at a junction in a quarter wavelength cascade, at a junction other than an output node, for example at a junction $12_4$ prior to the output node.

The amplifier arrangements shown in the examples of FIGS. 15a and 16a both have a three-stage cascade (first cascade) and a two-stage cascade (second cascade) merging at the junction $12_4$ prior to the output node (and amplifier stages $10_6$ and $10_7$ connected to junction $12_4$ and the output node 15, respectively).

In FIG. 15a, no amplifier stages, other than the first ones of each cascade, are connected by connecting quarter wavelength transmission lines to the cascade.

Figure 15B:
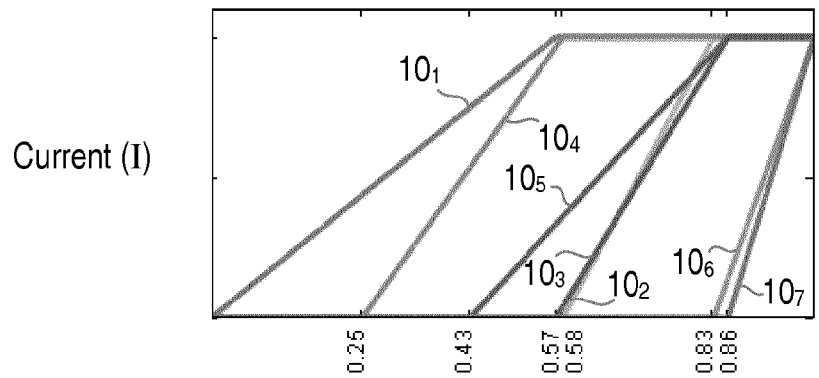

FIG. 15b shows a plot of current against output amplitude for the seven-stage embodiment of the present invention as shown in FIG. 15a. The order of the amplifier starting points in this example is amplifier $10_1$ starting at zero, amplifier $10_4$ starting at 0.25 of full output amplitude, amplifier $10_5$ starting at 0.43 of full output amplitude, amplifier $10_3$ starting at 0.57 of full output amplitude, amplifier $10_2$ starting at 0.58 of full output amplitude, amplifier $10_6$ starting at 0.83 of full output amplitude, and amplifier $10_7$ starting at 0.86 of full output amplitude.

Figure 15C:
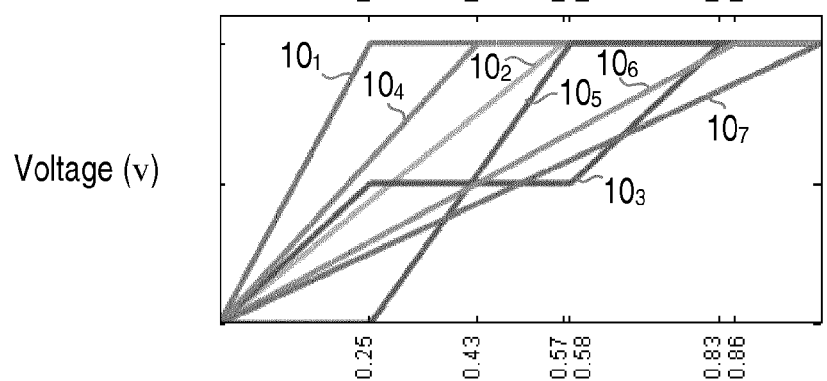
Figure 15D:
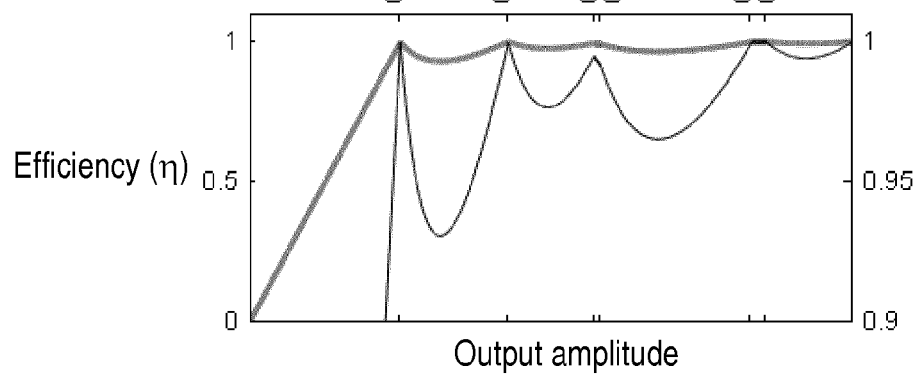

FIG. 15c shows a plot of voltage against output amplitude for the six-stage embodiment of the present invention as shown in FIG. 15a. FIG. 15d shows a plot of efficiency against output amplitude for the six-stage embodiment of the present invention as shown in FIG. 15a.

In FIG. 16a, three other amplifier stages $10_3$, $10_6$ and $10_7$ are shown as being connected via connecting quarter wavelength transmission lines $13_1$, $13_2$ and $13_3$, respectively, to their junctions. It is noted that any number of the other amplifier stages may be connected via connecting quarter wavelength transmission lines, preferably as many amplifier stages as possible.

Figure 16B:
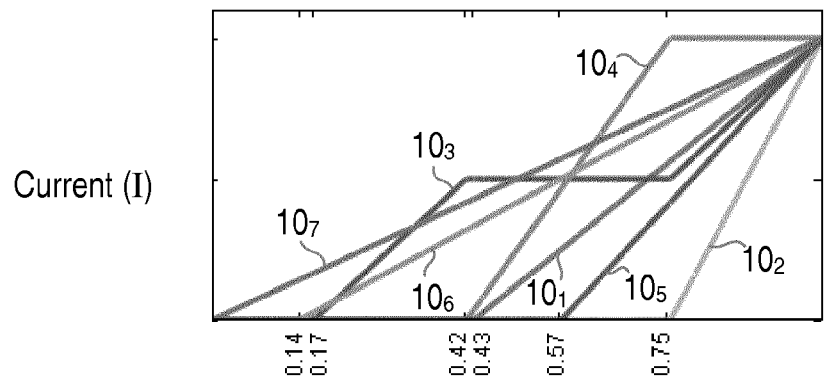

FIG. 16b shows a plot of current against output amplitude for the seven-stage embodiment of the present invention as shown in FIG. 16a. The order of the amplifier starting points in this example is amplifier $10_7$ starting at zero, amplifier $10_6$ starting at 0.14 of full output amplitude, amplifier $10_3$ starting at 0.17 of full output amplitude, amplifier $10_4$ starting at 0.42 of full output amplitude, amplifier $10_1$ starting at 0.43 of full output amplitude, amplifier $10_5$ starting at 0.57 of full output amplitude, and amplifier $10_2$ starting at 0.75 of full output amplitude.

Figure 16C:
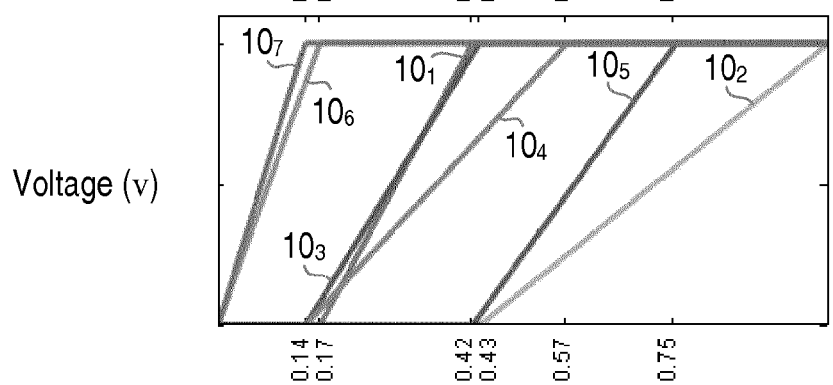
Figure 16D:
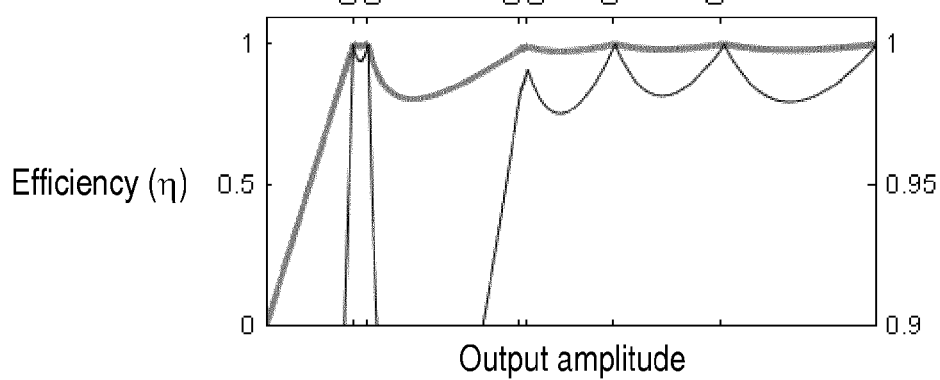

FIG. 16c shows a plot of voltage against output amplitude for the six-stage embodiment of the present invention as shown in FIG. 16a. FIG. 16d shows a plot of efficiency against output amplitude for the six-stage embodiment of the present invention as shown in FIG. 16a.

The next six examples shown in FIGS. 17a, 18a, 19a, 20a, 21a and 22a are of the same basic structure (i.e. having a first three-stage cascade and a second two-stage cascade merging at the junction $12_4$ prior to the output node, and amplifier stages $10_6$ and $10_7$ coupled to junction $12_4$ and the output node 15, respectively), but with other combinations of directly and quarter wavelength connected amplifier stages.

Figure 17A:
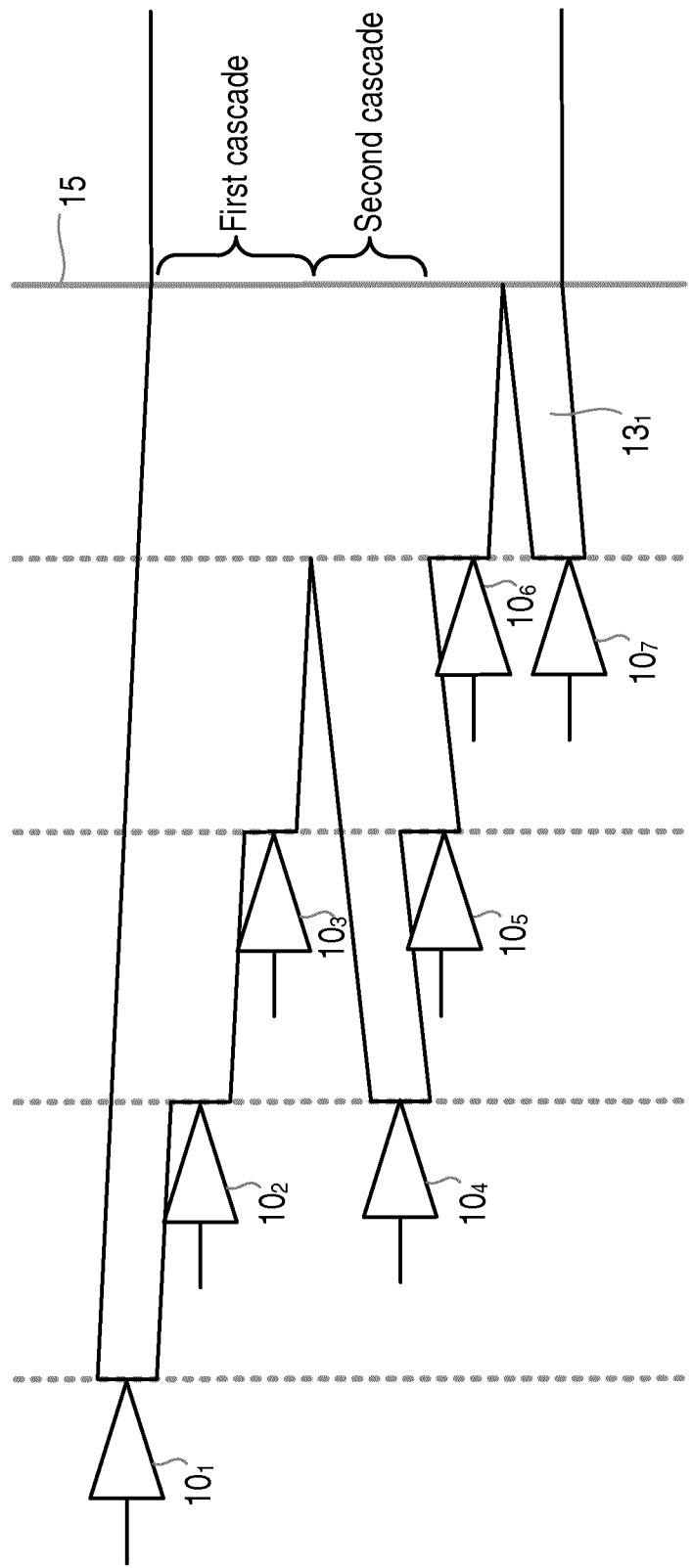

In the example of FIG. 17a, each of the amplifier stages is connected directly to its corresponding junction of a cascade, apart from the seventh amplifier stage $10_7$, which is connected via a connecting quarter wavelength transmission line $13_1$.

Figure 17B:
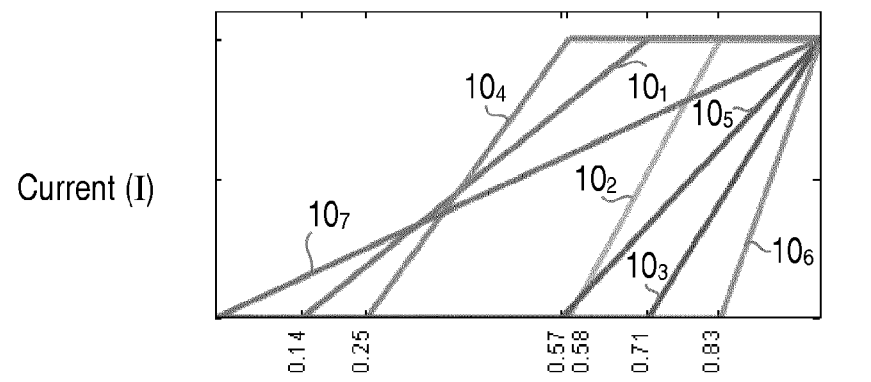

FIG. 17b shows a plot of current against output amplitude for the seven-stage embodiment of the present invention as shown in FIG. 17a. The order of the amplifier starting points in this example is amplifier $10_7$ starting at zero, amplifier $10_1$ starting at 0.14 of full output amplitude, amplifier $10_4$ starting at 0.25 of full output amplitude, amplifier $10_5$ starting at 0.57 of full output amplitude, amplifier $10_2$ starting at 0.58 of full output amplitude, amplifier $10_3$ starting at 0.71 of full output amplitude, and amplifier $10_6$ starting at 0.83 of full output amplitude.

Figure 17C:
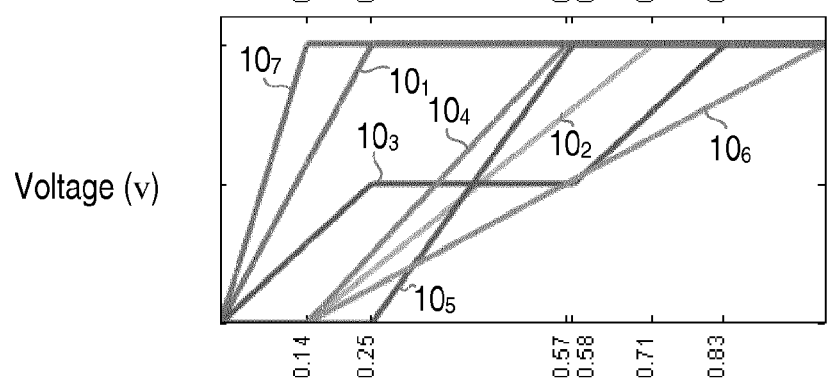
Figure 17D:
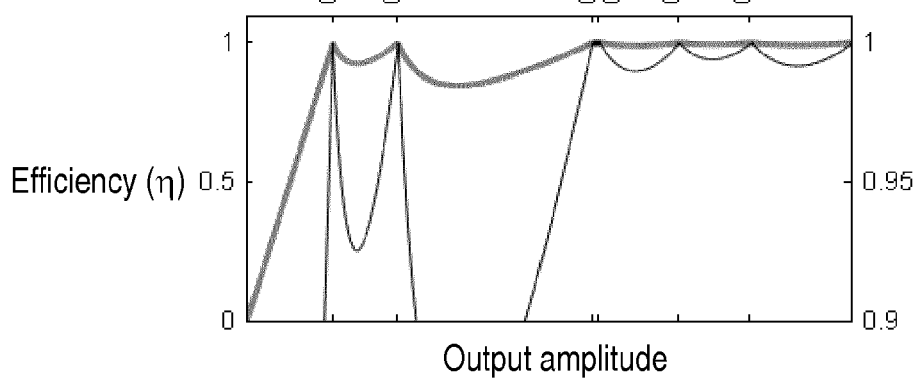

FIG. 17c shows a plot of voltage against output amplitude for the seven-stage embodiment of the present invention as shown in FIG. 17a. FIG. 17d shows a plot of efficiency against output amplitude for the seven-stage embodiment of the present invention as shown in FIG. 17a.

Figure 18B:
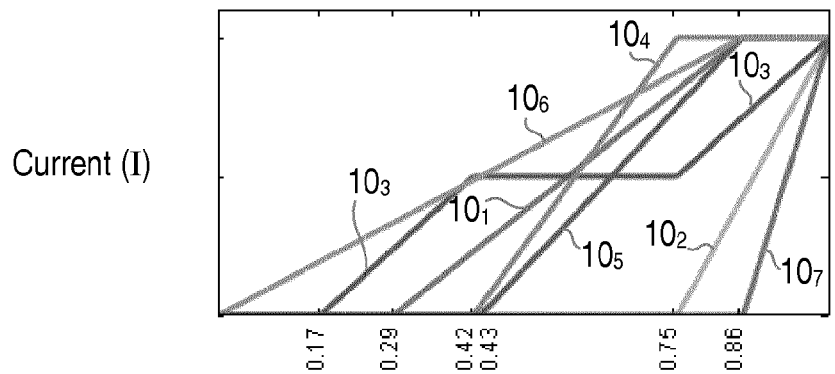

In the example of FIG. 18a, each of the amplifier stages is connected directly to its corresponding junction of a cascade, apart from the third and sixth amplifier stages $10_3$, and $10_6$, which are connected via connecting quarter wavelength transmission lines $13_1$ and $13_2$ FIG. 18b shows a plot of current against output amplitude for the seven-stage embodiment of the present invention as shown in FIG. 18a. The order of the amplifier starting points in this example is amplifier $10_6$ starting at zero, amplifier $10_3$ starting at 0.17 of full output amplitude, amplifier $10_1$ starting at 0.29 of full output amplitude, amplifier $10_4$ starting at 0.42 of full output amplitude, amplifier $10_5$ starting at 0.43 of full output amplitude, amplifier $10_2$ starting at 0.75 of full output amplitude, and amplifier $10_7$ starting at 0.86 of full output amplitude.

Figure 18C:
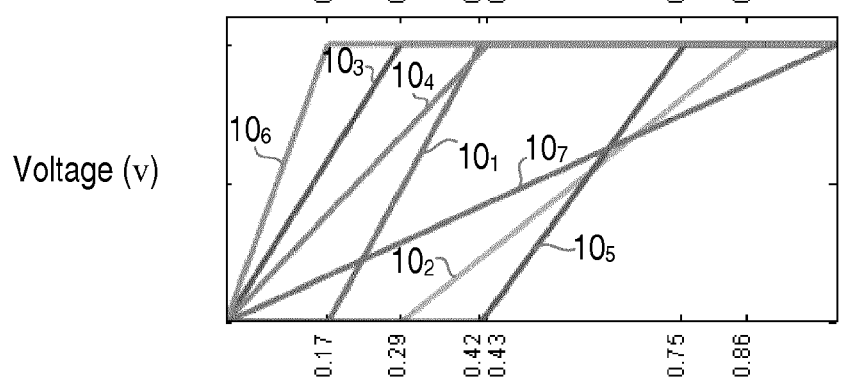
Figure 18D:
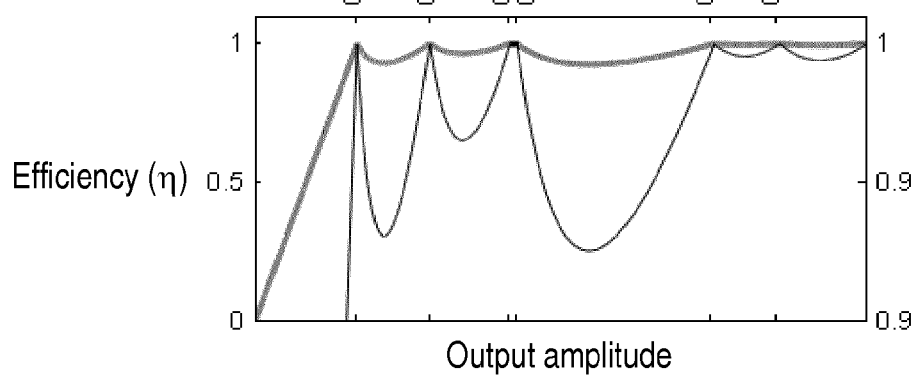

FIG. 18c shows a plot of voltage against output amplitude for the seven-stage embodiment of the present invention as shown in FIG. 18a. FIG. 18d shows a plot of efficiency against output amplitude for the seven-stage embodiment of the present invention as shown in FIG. 18a.

Figure 19A:
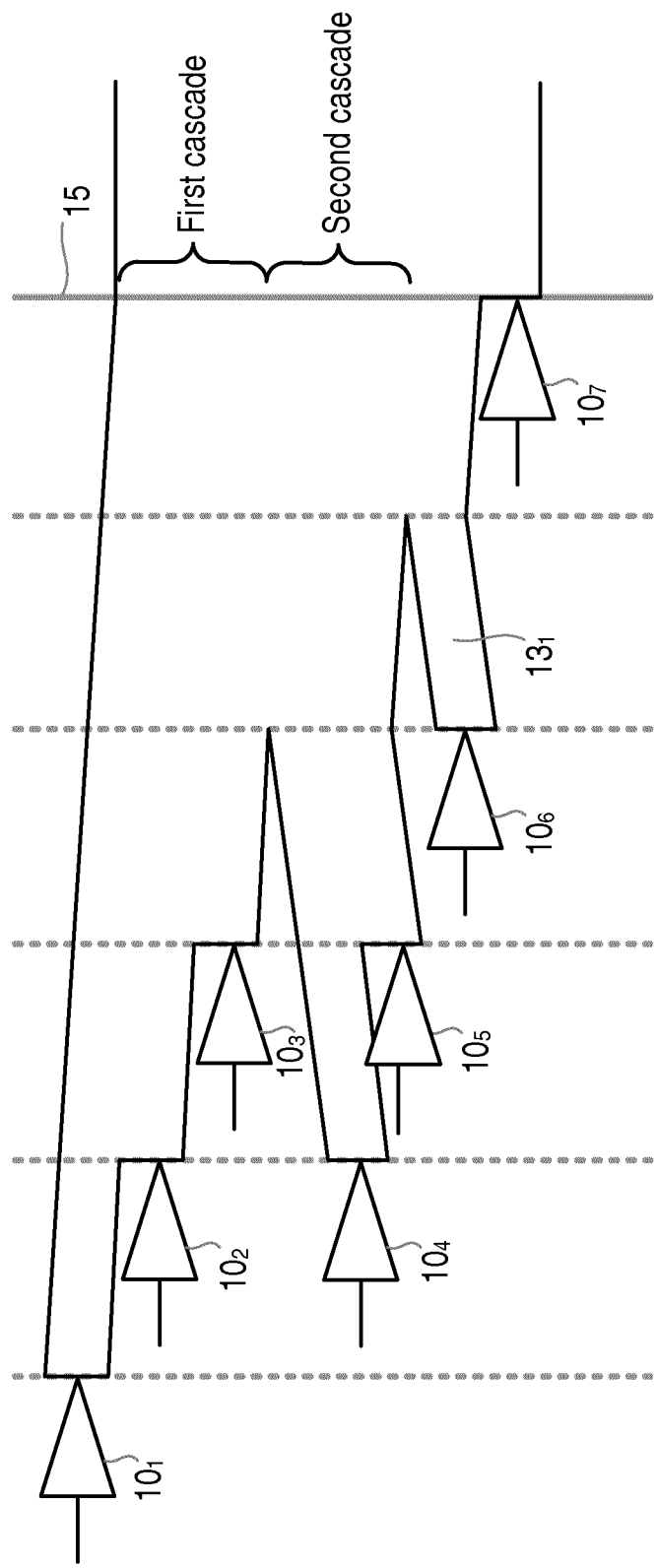

In the example of FIG. 19a, each of the amplifier stages is connected directly to its corresponding junction of a cascade, apart from the sixth amplifier stage $10_6$, which is connected via connecting quarter wavelength transmission line $13_1$.

Figure 19B:
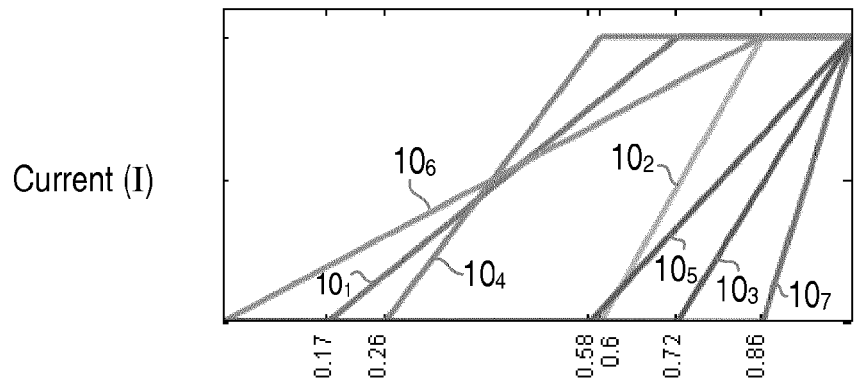

FIG. 19b shows a plot of current against output amplitude for the seven-stage embodiment of the present invention as shown in FIG. 19a. The order of the amplifier starting points in this example is amplifier $10_6$ starting at zero, amplifier $10_1$ starting at 0.17 of full output amplitude, amplifier $10_4$ starting at 0.26 of full output amplitude, amplifier $10_5$ starting at 0.58 of full output amplitude, amplifier $10_2$ starting at 0.6 of full output amplitude, amplifier $10_3$ starting at 0.72 of full output amplitude, and amplifier $10_7$ starting at 0.86 of full output amplitude.

Figure 19C:
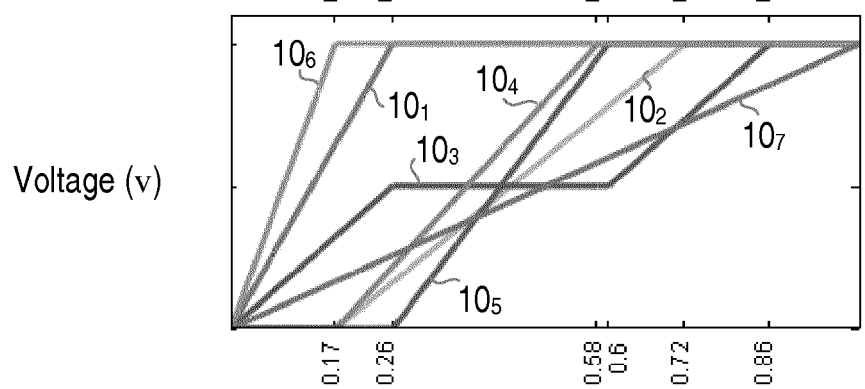
Figure 19D:
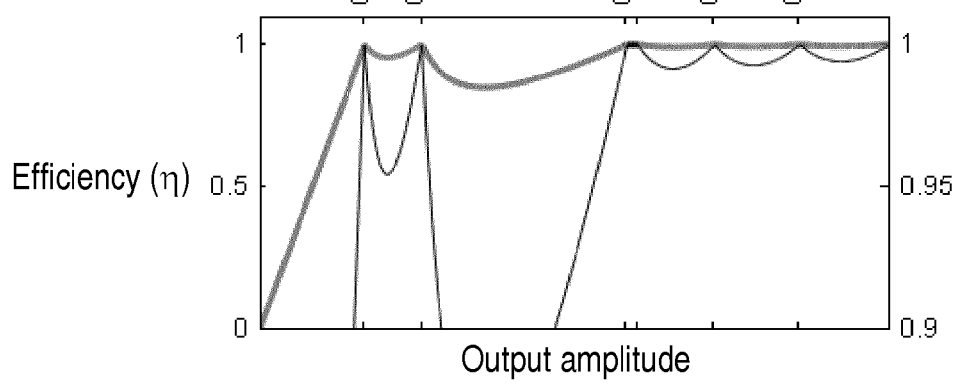

FIG. 19c shows a plot of voltage against output amplitude for the seven-stage embodiment of the present invention as shown in FIG. 19a. FIG. 19d shows a plot of efficiency against output amplitude for the seven-stage embodiment of the present invention as shown in FIG. 19a.

Figure 20A:
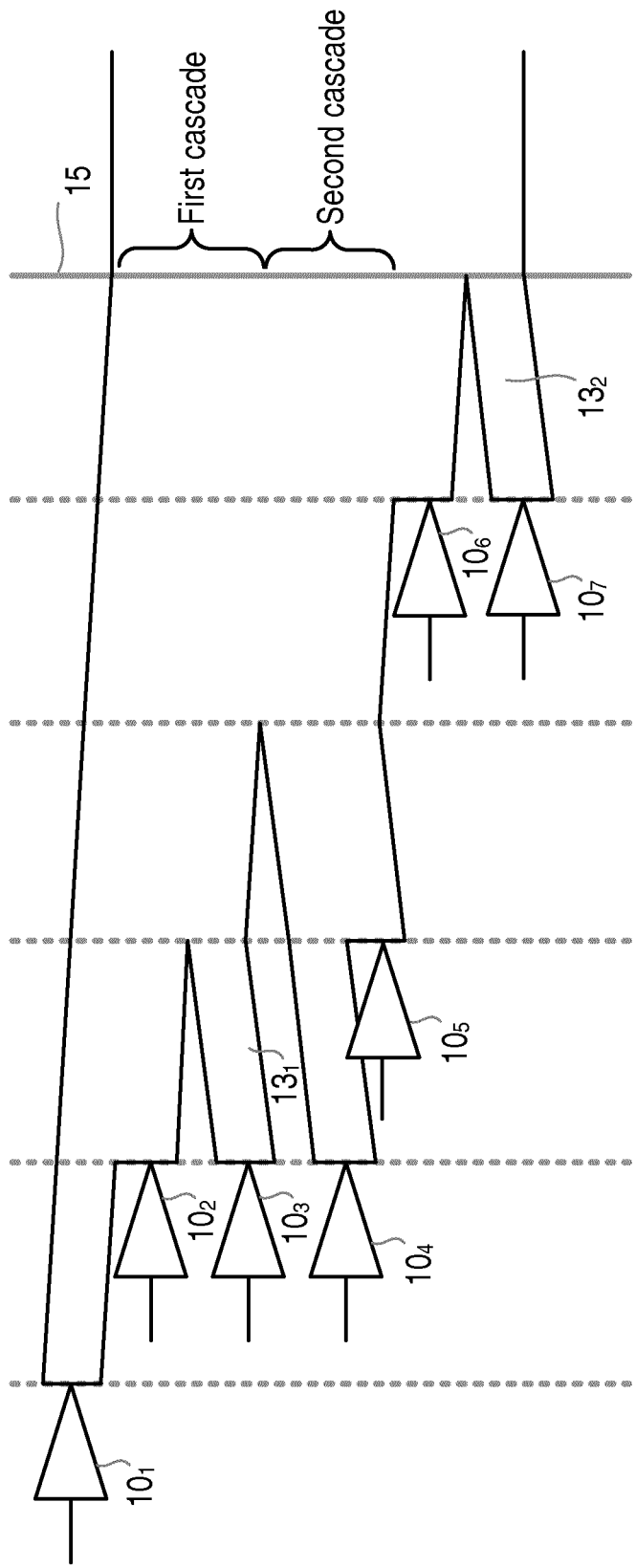

In the example of FIG. 20a, each of the amplifier stages is connected directly to its corresponding junction of a cascade, apart from the third and seventh amplifier stages $10_3$ and $10_7$, which are connected via connecting quarter wavelength transmission lines $13_1$ and $13_2$.

Figure 20B:
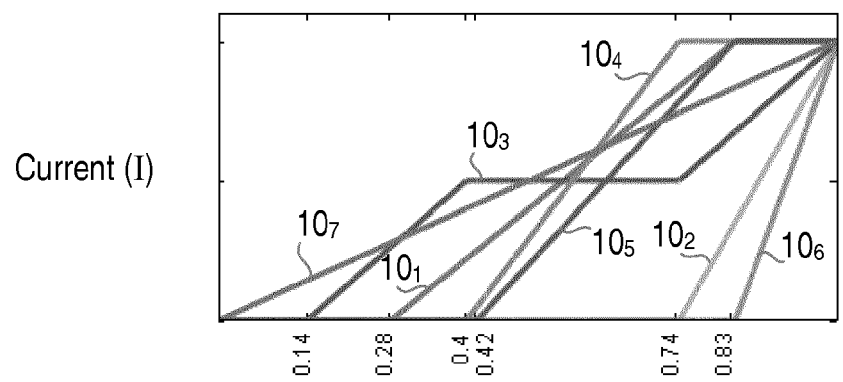

FIG. 20b shows a plot of current against output amplitude for the seven-stage embodiment of the present invention as shown in FIG. 20a. The order of the amplifier starting points in this example is amplifier $10_7$ starting at zero, amplifier $10_3$ starting at 0.14 of full output amplitude, amplifier $10_1$ starting at 0.28 of full output amplitude, amplifier $10_4$ starting at 0.4 of full output amplitude, amplifier $10_5$ starting at 0.42 of full output amplitude, amplifier $10_2$ starting at 0.74 of full output amplitude, and amplifier $10_6$ starting at 0.83 of full output amplitude.

Figure 20C:
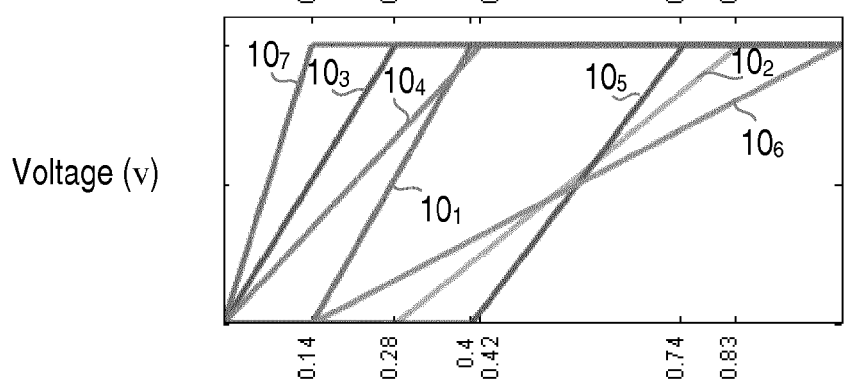
Figure 20D:
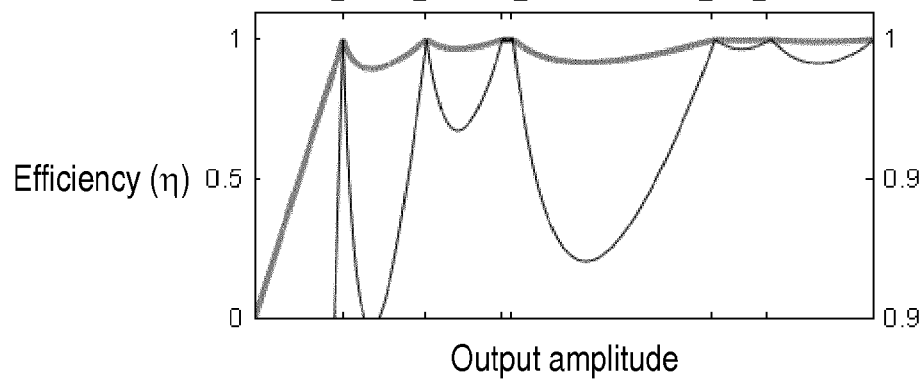

FIG. 20c shows a plot of voltage against output amplitude for the seven-stage embodiment of the present invention as shown in FIG. 20a. FIG. 20d shows a plot of efficiency against output amplitude for the seven-stage embodiment of the present invention as shown in FIG. 20a.

Figure 21A:
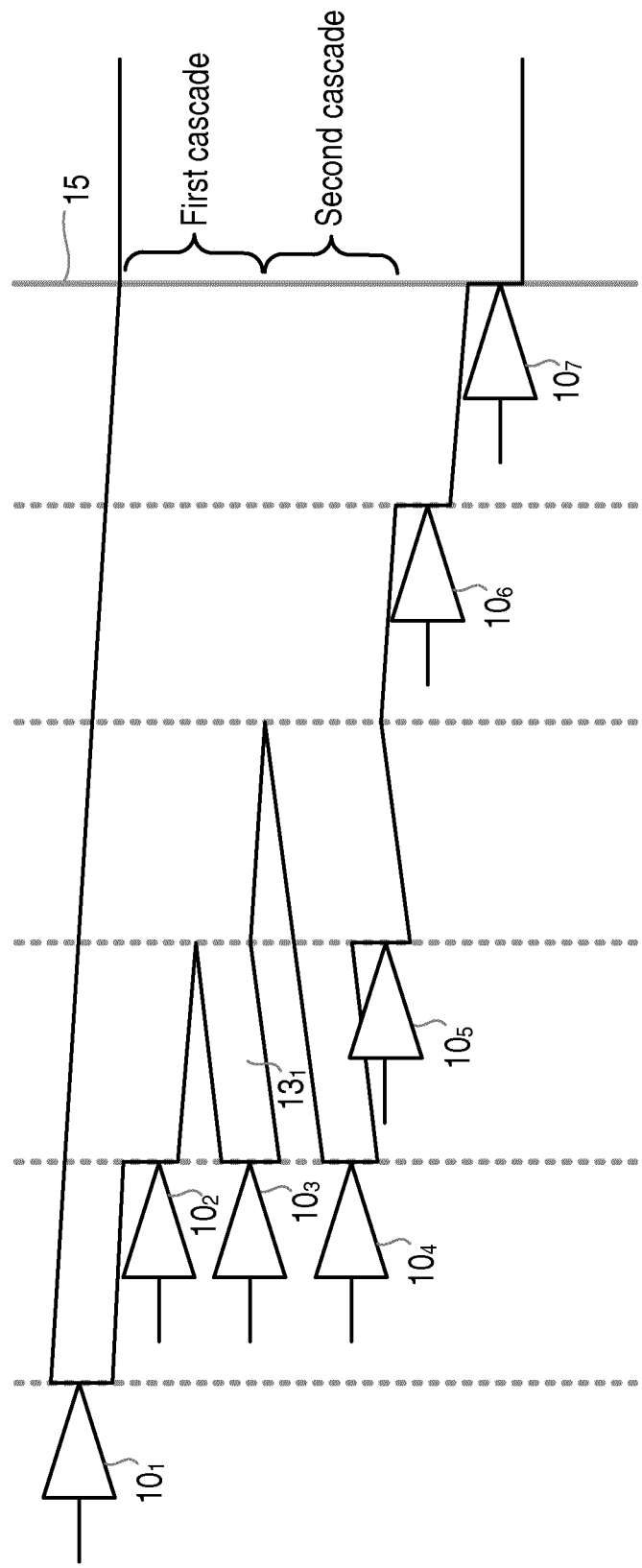

In the example of FIG. 21a, each of the amplifier stages is connected directly to its corresponding junction of a cascade, apart from the third amplifier stage $10_3$, which is connected via connecting quarter wavelength transmission line $13_1$.

Figure 21B:
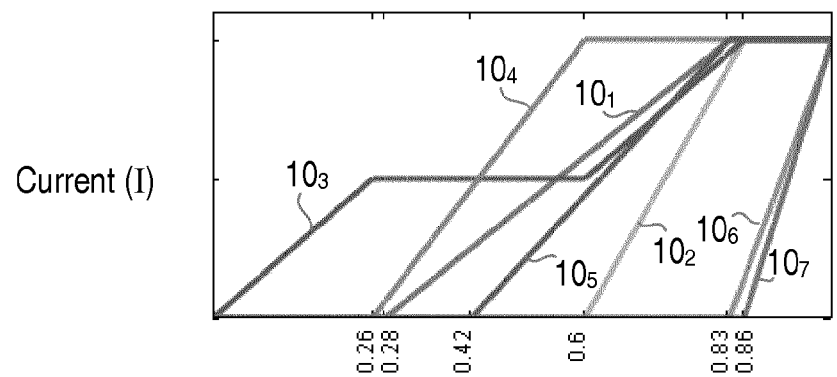

FIG. 21b shows a plot of current against output amplitude for the seven-stage embodiment of the present invention as shown in FIG. 21a. The order of the amplifier starting points in this example is amplifier $10_3$ starting at zero, amplifier $10_4$ starting at 0.26 of full output amplitude, amplifier $10_1$ starting at 0.28 of full output amplitude, amplifier $10_5$ starting at 0.42 of full output amplitude, amplifier $10_2$ starting at 0.6 of full output amplitude, amplifier $10_6$ starting at 0.83 of full output amplitude, and amplifier $10_7$ starting at 0.86 of full output amplitude.

Figure 21C:
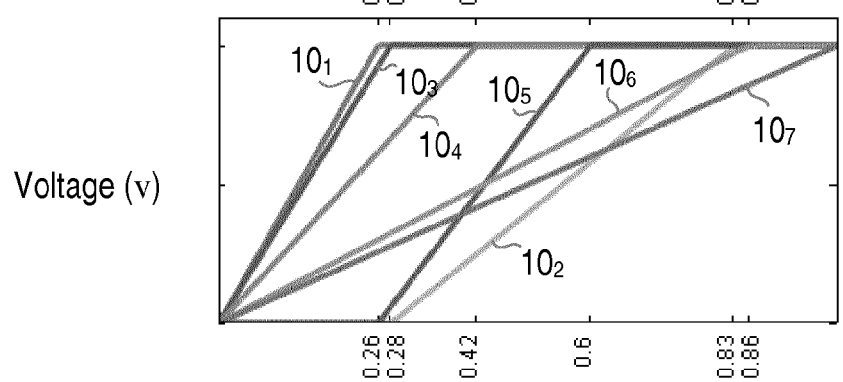
Figure 21D:
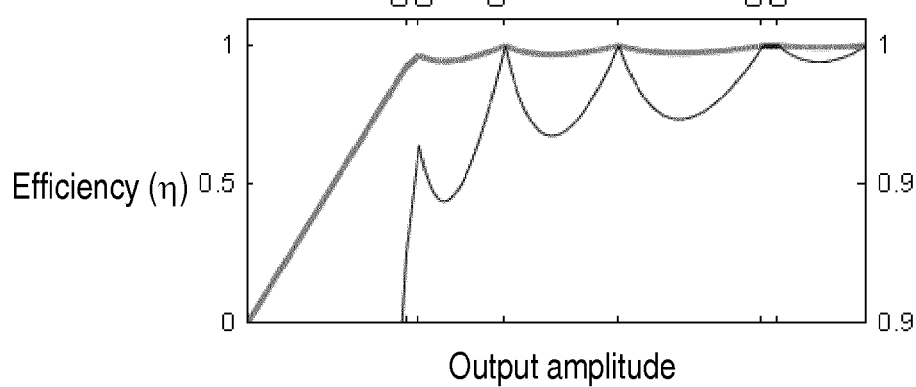

FIG. 21c shows a plot of voltage against output amplitude for the seven-stage embodiment of the present invention as shown in FIG. 21a. FIG. 21d shows a plot of efficiency against output amplitude for the seven-stage embodiment of the present invention as shown in FIG. 21a.

Figure 22A:
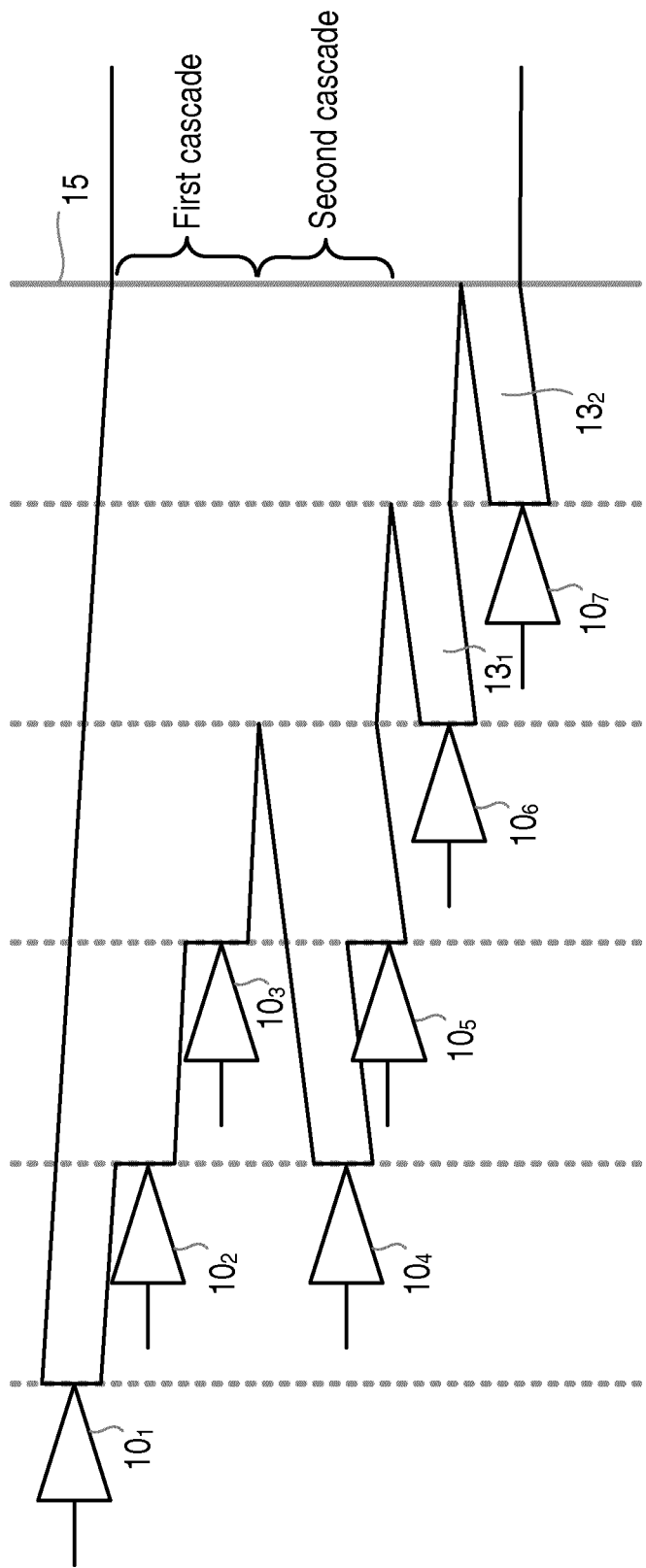

In the example of FIG. 22a, each of the amplifier stages is connected directly to its corresponding junction of a cascade, apart from the sixth and seventh amplifier stages $10_6$ and $10_7$, which are connected via connecting quarter wavelength transmission lines $13_1$ and $13_2$.

Figures 22B, 22C, 22D:
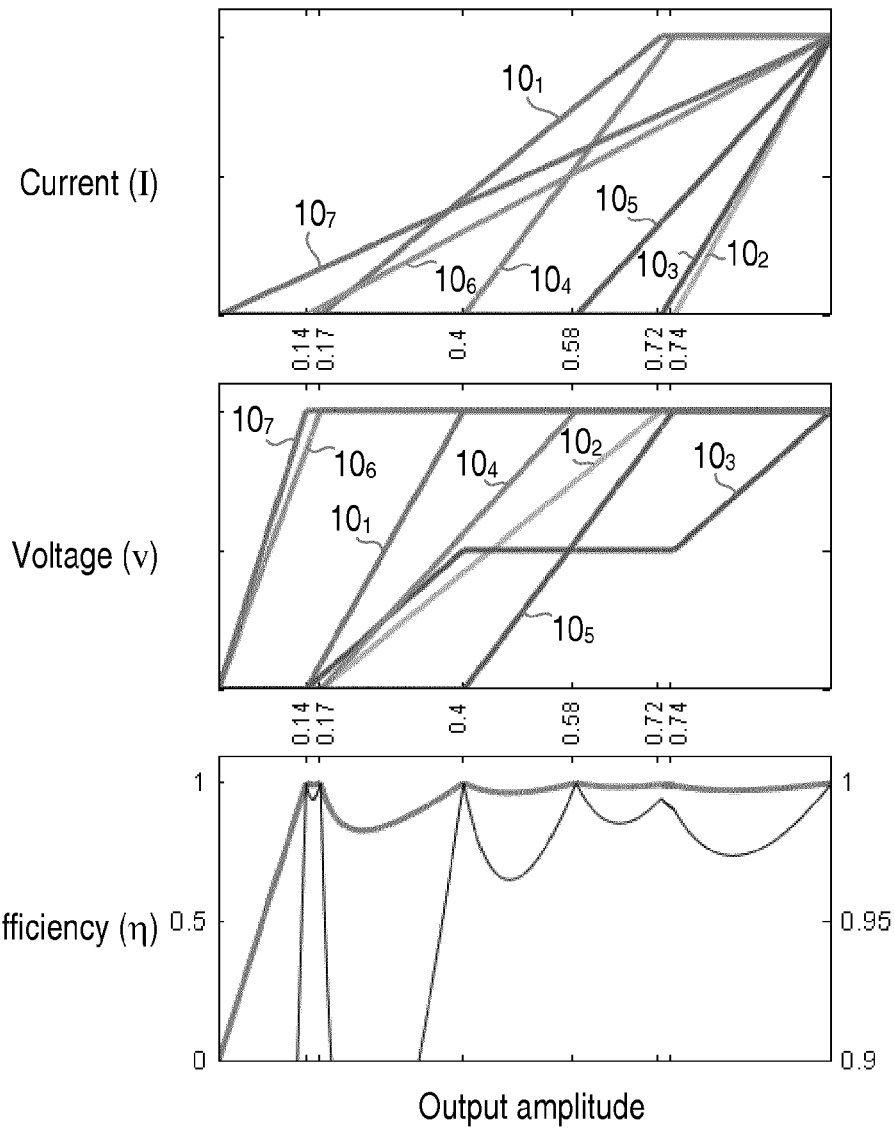

FIG. 22b shows a plot of current against output amplitude for the seven-stage embodiment of the present invention as shown in FIG. 22a. The order of the amplifier starting points in this example is amplifier $10_7$ starting at zero, amplifier $10_6$ starting at 0.14 of full output amplitude, amplifier $10_1$ starting at 0.17 of full output amplitude, amplifier $10_4$ starting at 0.4 of full output amplitude, amplifier $10_5$ starting at 0.58 of full output amplitude, amplifier $10_3$ starting at 0.72 of full output amplitude, and amplifier $10_2$ starting at 0.74 of full output amplitude.

FIG. 22c shows a plot of voltage against output amplitude for the seven-stage embodiment of the present invention as shown in FIG. 22a. FIG. 22d shows a plot of efficiency against output amplitude for the seven-stage embodiment of the present invention as shown in FIG. 22a.

From the examples of FIGS. 17a, 18a, 19a, 20a, 21a and 22a, it is noted that the operation of an amplifier arrangement having a combination of a first cascade comprising three stages, and a second cascade comprising two stages, both coupled to the same junction, can be altered by changing which amplifier stages are connected directly to a junction of a cascade, and which are connected via connecting quarter wavelength transmission lines. In this manner the distribution of starting points can be changed, and the starting orders of the various amplifier stages. It is noted that other combinations may also be provided, in addition to the examples described above.

Figure 23A:
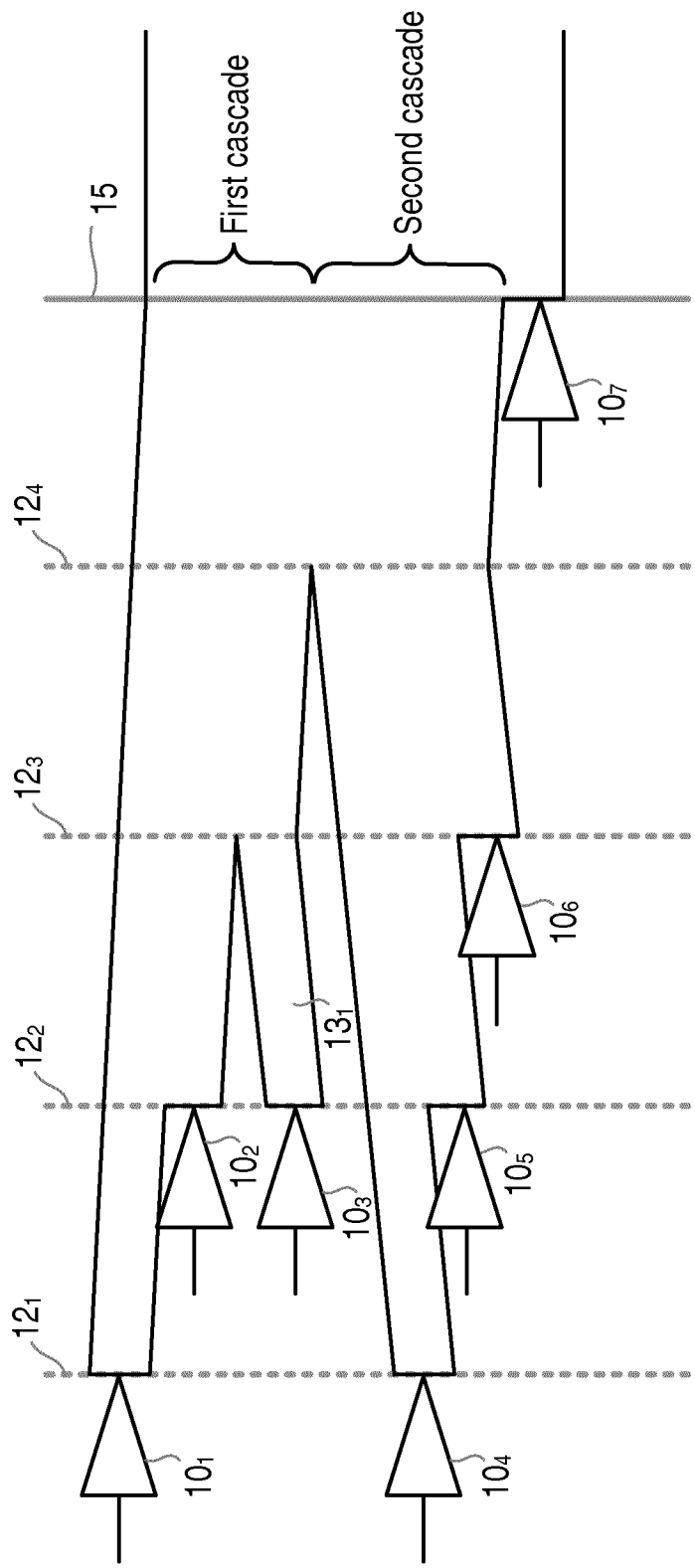
Figure 24A:
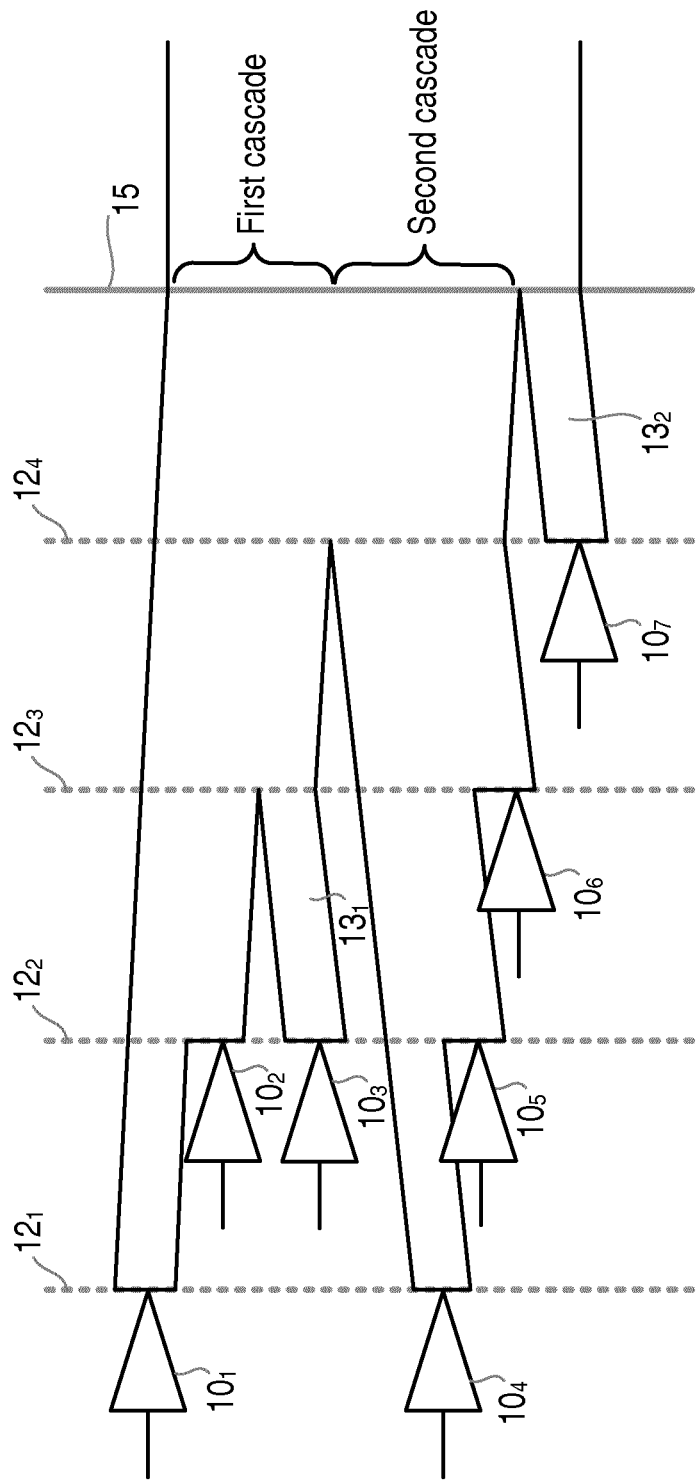

The next two examples shown in FIGS. 23a and 24a are of amplifier arrangements comprising two three-stage quarter wavelength cascades connected at the junction $12_4$ before the output node 15, i.e. first and second cascades each comprising three stages connected at junction $12_4$, (each of the first and second cascades having three amplifier stages coupled thereto), and a seventh amplifier either coupled directly to the output node 15 (as shown in FIG. 23a) or via a connecting quarter wavelength transmission line $13_2$ (as shown in FIG. 24a).

In the examples of FIGS. 23a and 24a, each of the amplifier stages $10_1$ to $10_6$ are connected directly to their respective junctions, apart from the third amplifier stage $10_3$, which is connected via a connecting quarter wavelength transmission line $13_1$.

Figure 23B:
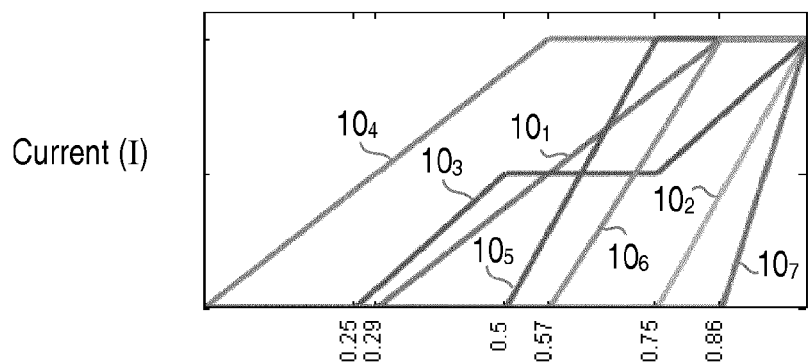

FIG. 23b shows a plot of current against output amplitude for the seven-stage embodiment of the present invention as shown in FIG. 23a. The order of the amplifier starting points in this example is amplifier $10_4$ starting at zero, amplifier $10_3$ starting at 0.25 of full output amplitude, amplifier $10_1$ starting at 0.29 of full output amplitude, amplifier $10_5$ starting at 0.5 of full output amplitude, amplifier $10_6$ starting at 0.57 of full output amplitude, amplifier $10_2$ starting at 0.75 of full output amplitude, and amplifier $10_7$ starting at 0.86 of full output amplitude.

Figure 23C:
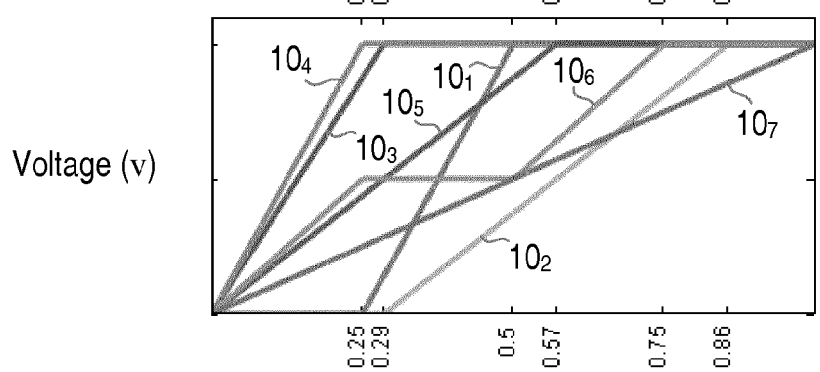
Figure 23D:
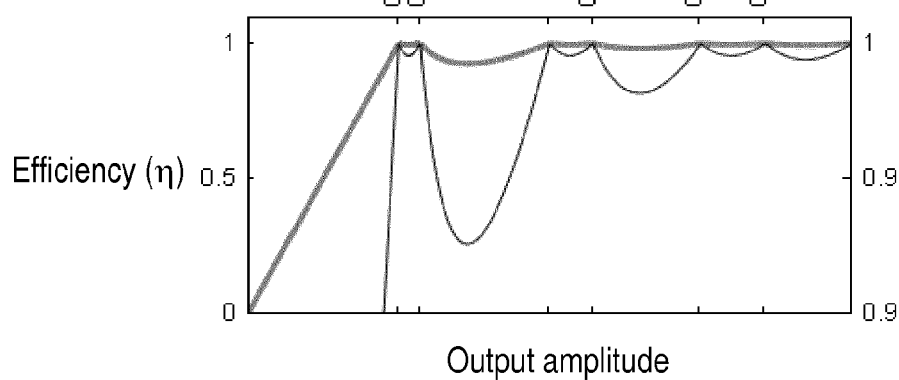

FIG. 23c shows a plot of voltage against output amplitude for the seven-stage embodiment of the present invention as shown in FIG. 23a. FIG. 23d shows a plot of efficiency against output amplitude for the seven-stage embodiment of the present invention as shown in FIG. 23a.

Figure 24B:
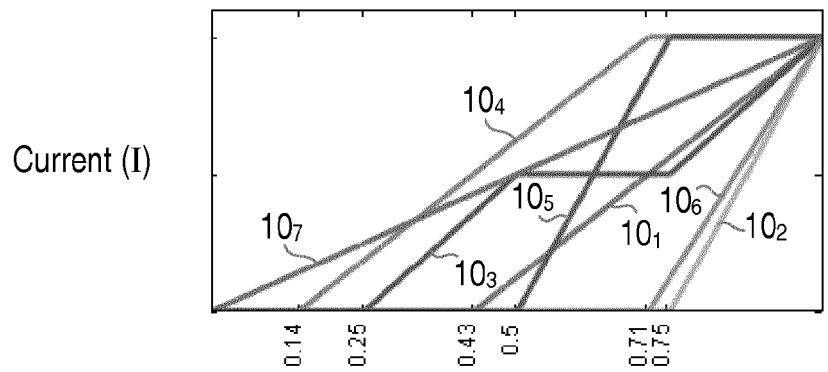

FIG. 24b shows a plot of current against output amplitude for the seven-stage embodiment of the present invention as shown in FIG. 24a. The order of the amplifier starting points in this example is amplifier $10_7$ starting at zero, amplifier $10_4$ starting at 0.14 of full output amplitude, amplifier $10_3$ starting at 0.25 of full output amplitude, amplifier $10_1$ starting at 0.43 of full output amplitude, amplifier $10_5$ starting at 0.5 of full output amplitude, amplifier $10_6$ starting at 0.71 of full output amplitude, and amplifier $10_2$ starting at 0.75 of full output amplitude.

Figure 24C:
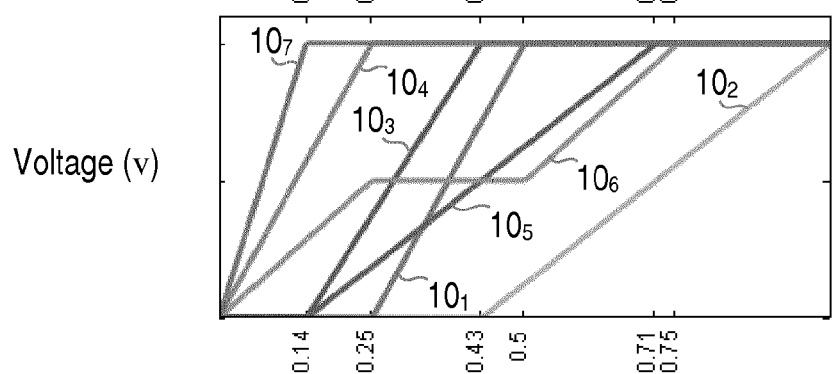
Figure 24D:
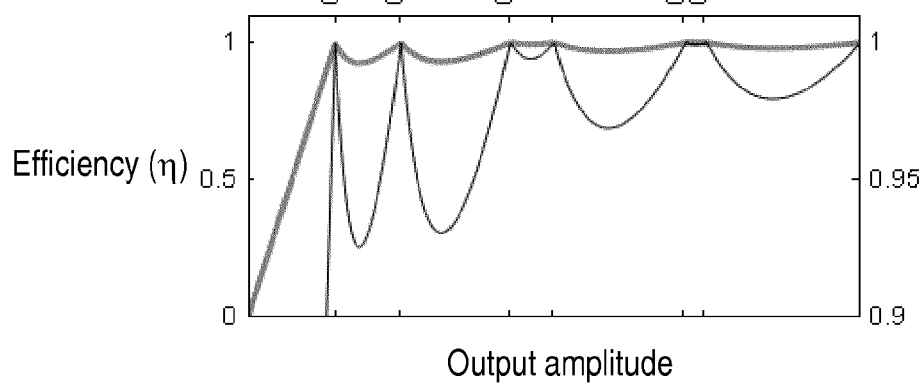

FIG. 24c shows a plot of voltage against output amplitude for the seven-stage embodiment of the present invention as shown in FIG. 24a. FIG. 24d shows a plot of efficiency against output amplitude for the seven-stage embodiment of the present invention as shown in FIG. 24a.

Figure 25A:
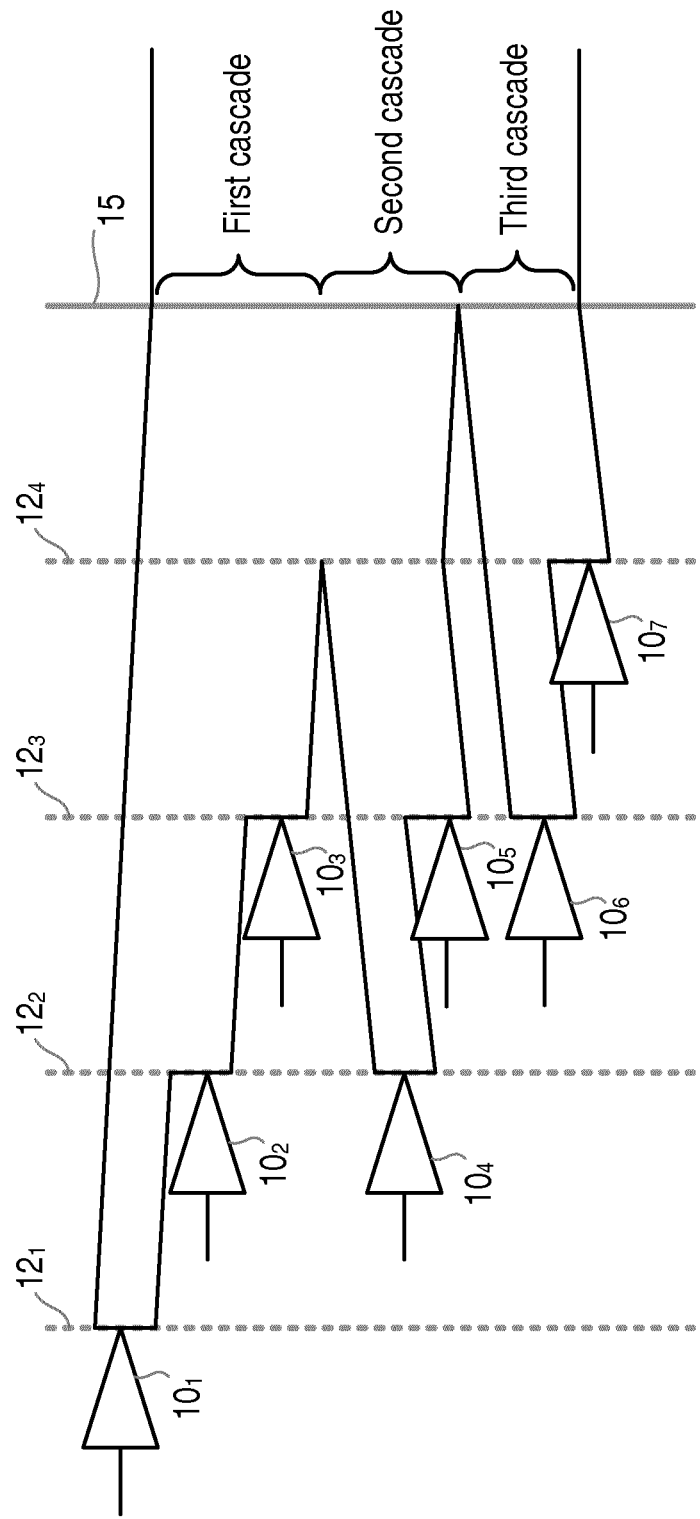
Figure 26A:
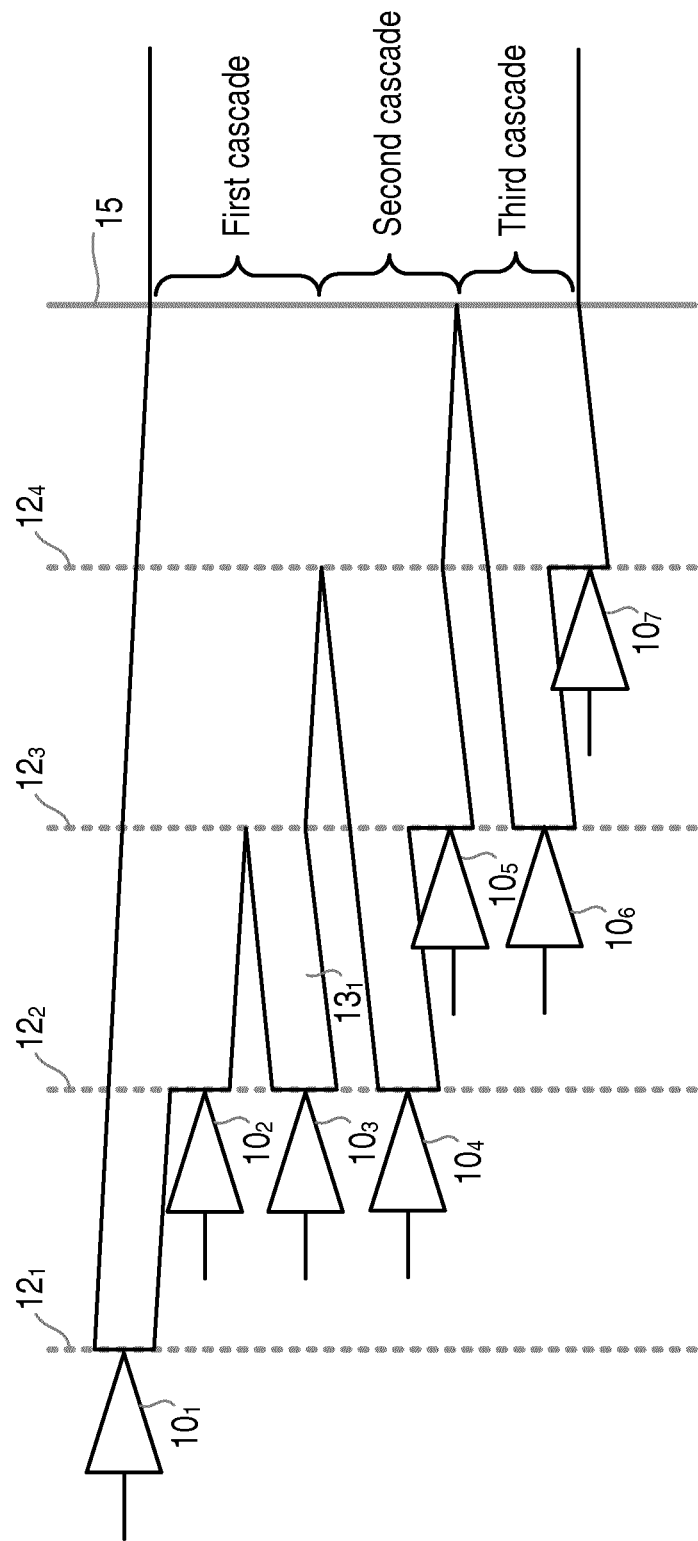

The following two examples of FIGS. 25a and 26a are of seven-stage amplifier arrangements comprising three quarter wavelength cascades. A three-stage quarter wavelength cascade (comprising amplifier stages $10_1$ to $10_3$) and a two-stage quarter wavelength cascade (comprising amplifier stages $10_4$ to $10_5$) are configured to merge at a junction $12_4$ prior to the output node 15, with a two-stage quarter wavelength cascade (comprising amplifier stages $10_6$ to $10_7$) connected to the common output node 15.

In the example of FIG. 25a, no amplifiers other than the first ones of each cascade are connected by quarter wavelength lines.

In the example of FIG. 26a, the third amplifier stage $10_3$ of the first cascade is connected by a connecting quarter wavelength transmission line $13_1$ to its respective junction of the cascade, while the remaining amplifier stages are connected directly to their respective junctions of their cascades. It is noted that this is the only possible location in this example, since the two-stage cascades cannot have their respective second amplifiers connected in this way due to the junction being short-circuited by the first amplifier plus quarter wavelength line.

It is noted that there are two voltages with different flat-amplitude middle regions in the example of FIG. 25a (i.e. those corresponding to the second and third amplifier stages $10_2$ and $10_3$), and two currents with that feature in the example of FIG. 26a, as shown below.

Figure 25B:
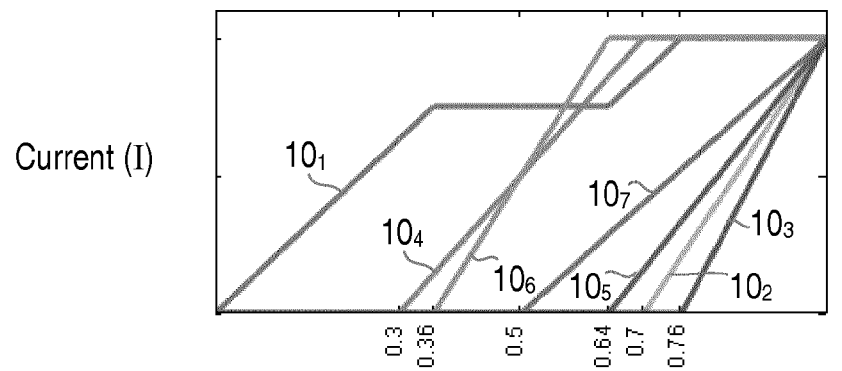

FIG. 25b shows a plot of current against output amplitude for the seven-stage embodiment of the present invention as shown in FIG. 25a. The order of the amplifier starting points in this example is amplifier $10_1$ starting at zero, amplifier $10_4$ starting at 0.3 of full output amplitude, amplifier $10_6$ starting at 0.36 of full output amplitude, amplifier $10_7$ starting at 0.5 of full output amplitude, amplifier $10_5$ starting at 0.64 of full output amplitude, amplifier $10_2$ starting at 0.7 of full output amplitude, and amplifier $10_3$ starting at 0.76 of full output amplitude.

Figure 25C:
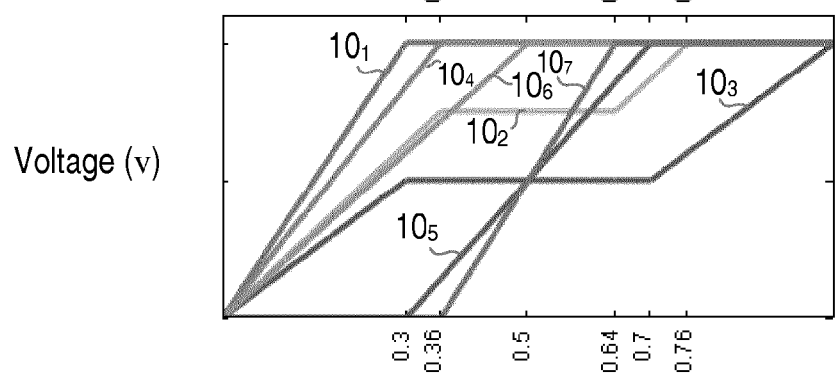
Figure 25D:
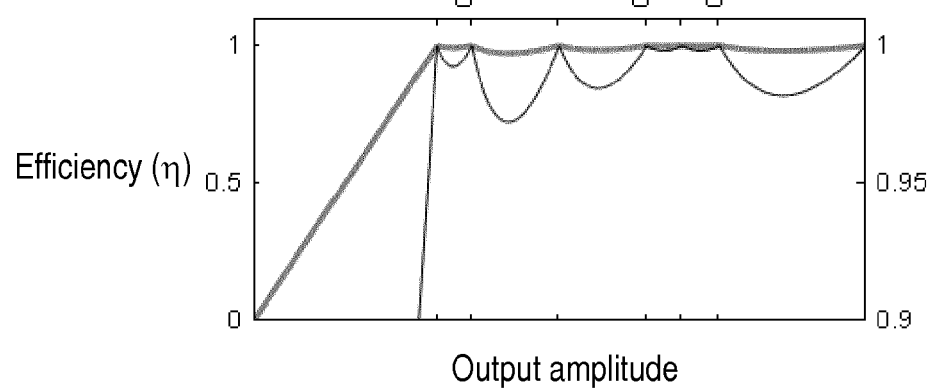

FIG. 25c shows a plot of voltage against output amplitude for the seven-stage embodiment of the present invention as shown in FIG. 25a. FIG. 25d shows a plot of efficiency against output amplitude for the seven-stage embodiment of the present invention as shown in FIG. 25a.

Figure 26B:
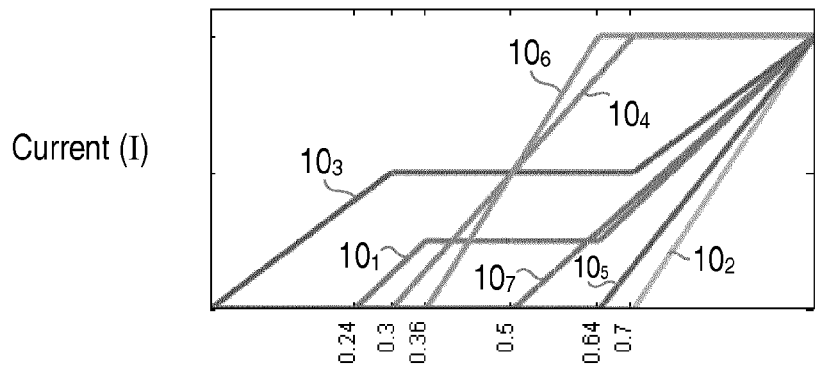

FIG. 26b shows a plot of current against output amplitude for the seven-stage embodiment of the present invention as shown in FIG. 26a. The order of the amplifier starting points in this example is amplifier $10_3$ starting at zero, amplifier $10_1$ starting at 0.24 of full output amplitude, amplifier $10_4$ starting at 0.3 of full output amplitude, amplifier $10_6$ starting at 0.36 of full output amplitude, amplifier $10_7$ starting at 0.5 of full output amplitude, amplifier $10_5$ starting at 0.64 of full output amplitude, and amplifier $10_2$ starting at 0.7 of full output amplitude.

Figure 26C:
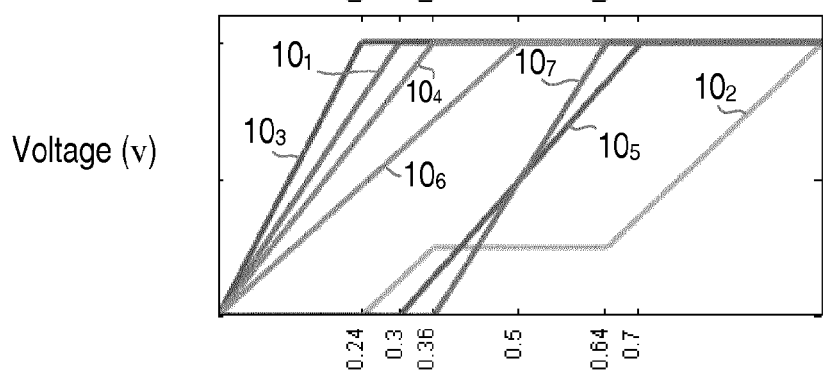

FIG. 26c shows a plot of voltage against output amplitude for the seven-stage embodiment of the present invention as shown in FIG. 26a.

Figure 26D:
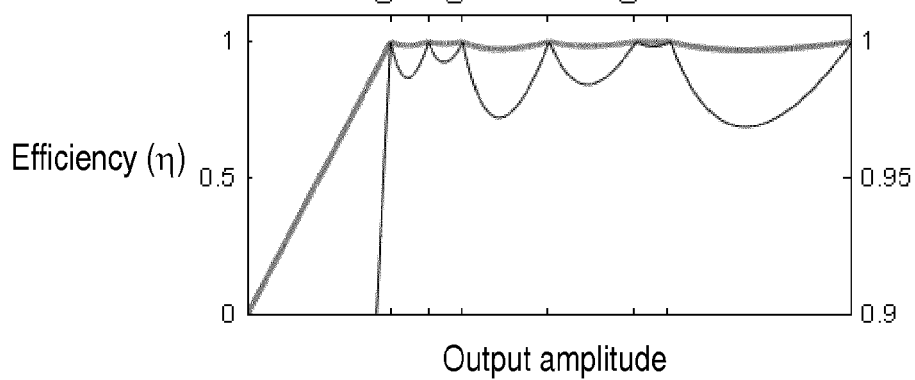

FIG. 26d shows a plot of efficiency against output amplitude for the seven-stage embodiment of the present invention as shown in FIG. 26a.

The examples shown in FIGS. 27a and 28a below are of seven-stage amplifier arrangements in which first and second quarter wavelength cascades are connected to the output node 15. A four-stage quarter wavelength cascade (i.e. first cascade comprising amplifier stages $10_1$ to $10_4$ coupled thereto) and a three-stage quarter wavelength cascade (i.e. second cascade comprising amplifier stages $10_5$ to $10_7$ coupled thereto) are configured to merge at the output node 15.

Figure 27A:
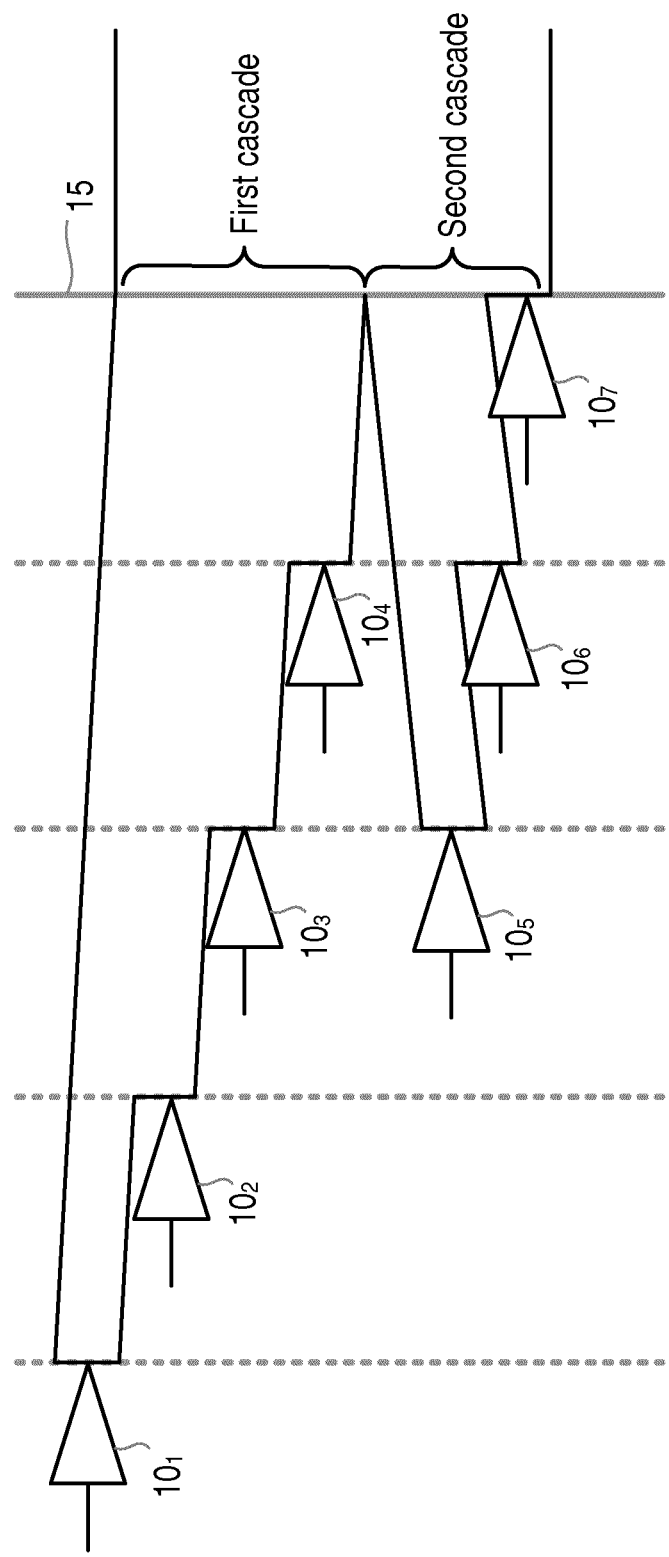

In FIG. 27a each of the amplifier stages is coupled directly to its respective junction, (with the seventh amplifier stage $10_7$ being coupled to the junction at the output).

Figure 27B:
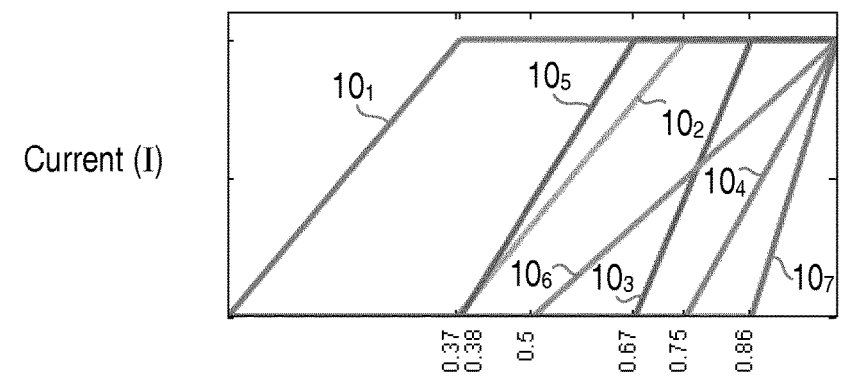

FIG. 27b shows a plot of current against output amplitude for the seven-stage embodiment of the present invention as shown in FIG. 27a. The order of the amplifier starting points in this example is amplifier $10_1$ starting at zero, amplifier $10_2$ starting at 0.37 of full output amplitude, amplifier $10_5$ starting at 0.38 of full output amplitude, amplifier $10_6$ starting at 0.5 of full output amplitude, amplifier $10_3$ starting at 0.67 of full output amplitude, amplifier $10_4$ starting at 0.75 of full output amplitude, and amplifier $10_7$ starting at 0.86 of full output amplitude.

Figure 27C:
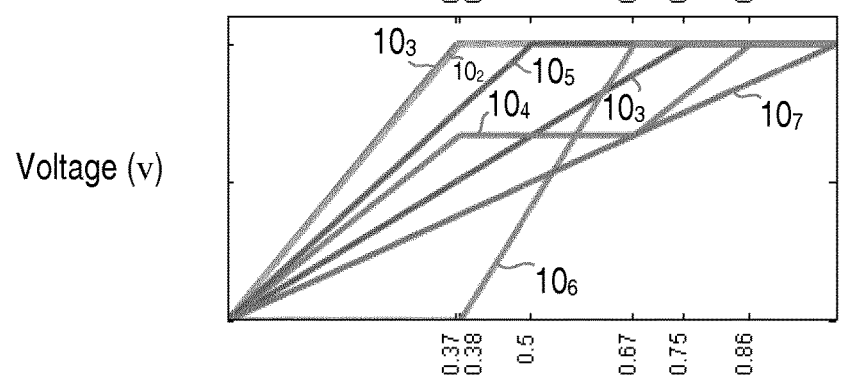
Figure 27D:
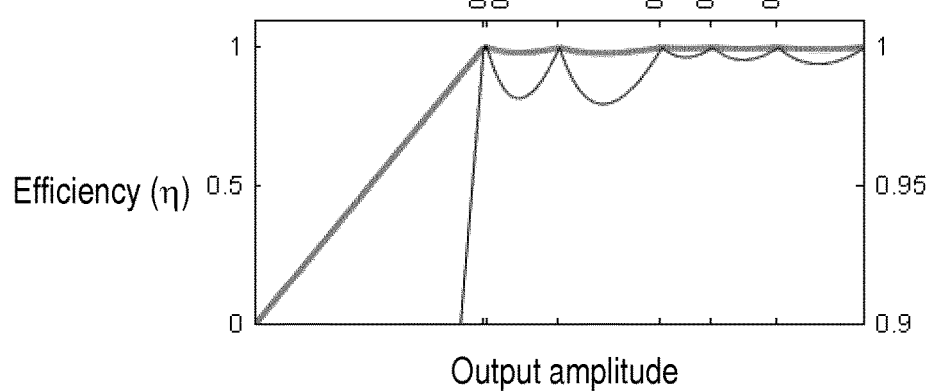

FIG. 27c shows a plot of voltage against output amplitude for the seven-stage embodiment of the present invention as shown in FIG. 27a. FIG. 27d shows a plot of efficiency against output amplitude for the seven-stage embodiment of the present invention as shown in FIG. 27a.

Figure 28A:
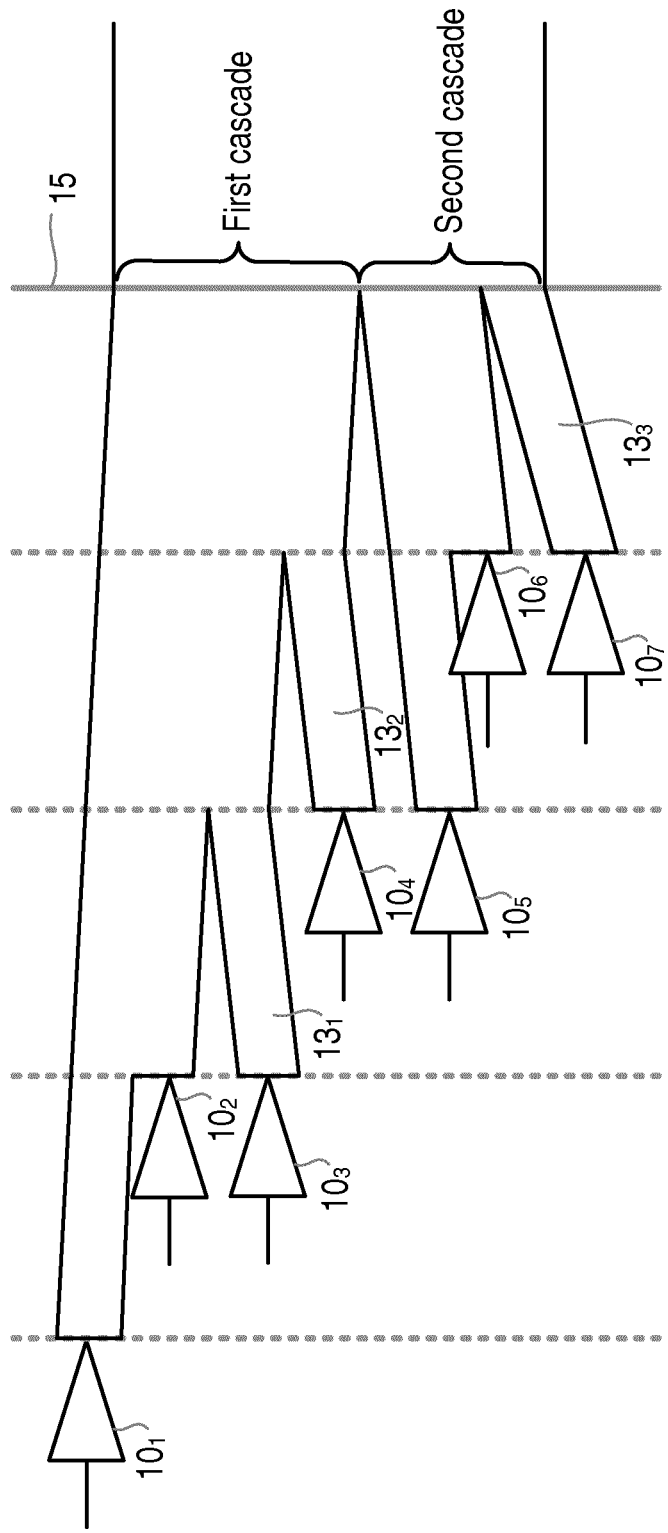

In FIG. 28a the third, fourth and seventh amplifier stages $10_3$, $10_4$ and $10_7$ are coupled to their respective junctions via connecting quarter wavelength transmission lines $13_1$, $13_2$ and $13_3$, (with the seventh amplifier stage $10_7$ being coupled to the junction at the output, via a connecting quarter wavelength transmission line $13_3$).

Figure 28B:
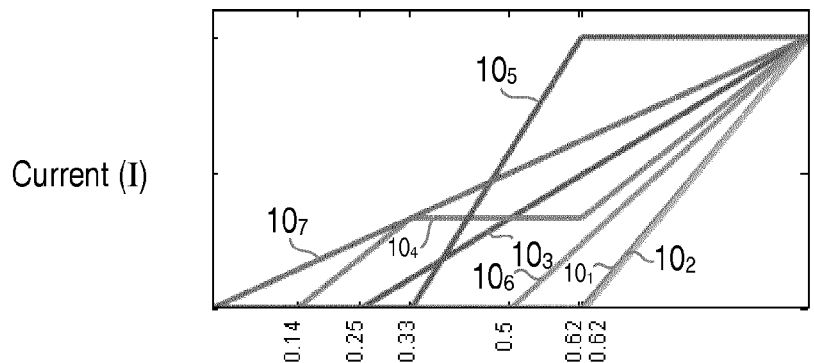

FIG. 28b shows a plot of current against output amplitude for the seven-stage embodiment of the present invention as shown in FIG. 28a. The order of the amplifier starting points in this example is amplifier $10_7$ starting at zero, amplifier $10_4$ starting at 0.14 of full output amplitude, amplifier $10_3$ starting at 0.25 of full output amplitude, amplifier $10_5$ starting at 0.33 of full output amplitude, amplifier $10_6$ starting at 0.5 of full output amplitude, amplifier $10_1$ starting at 0.62 of full output amplitude, and amplifier $10_2$ starting at 0.62 of full output amplitude.

Figure 28C:
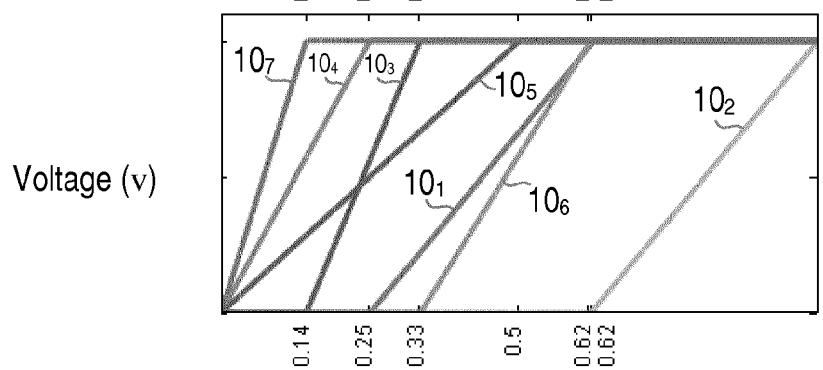
Figure 28D:
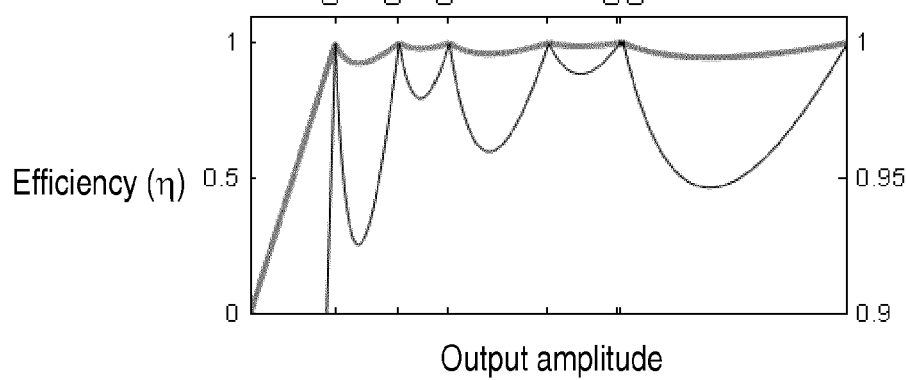

FIG. 28c shows a plot of voltage against output amplitude for the seven-stage embodiment of the present invention as shown in FIG. 28a. FIG. 28d shows a plot of efficiency against output amplitude for the seven-stage embodiment of the present invention as shown in FIG. 28a.

As can be seen from FIGS. 28b to 28d, the example of FIG. 28a has a good set of transition points for medium to high PAR amplitude distributions. However, it has its two highest transition points tightly clustered so it is effectively working like a six-stage amplifier with a double size peak transistor, rather than a seven-stage amplifier. This is in fact a possible way to use this amplifier structure (and others with close transition points, or where the last transition point is too high to influence efficiency very much). By feeding the same drive signal (that was originally used for the first amplifier stage) to both amplifier stages, with a quarter wavelength phase shift to the second amplifier stage relative to the first amplifier stage, it is possible to obtain the same performance and almost the same complexity of a good six-stage amplifier.

The following sixteen examples, shown in FIGS. 29 to 44 are of further embodiments of seven-stage amplifier structures in which both the first and second quarter wavelength cascades are connected to the output node 15. The examples shown in FIGS. 29 to 44 largely follow the same pattern as the six-stage amplifier arrangements described above.

Figure 29A:
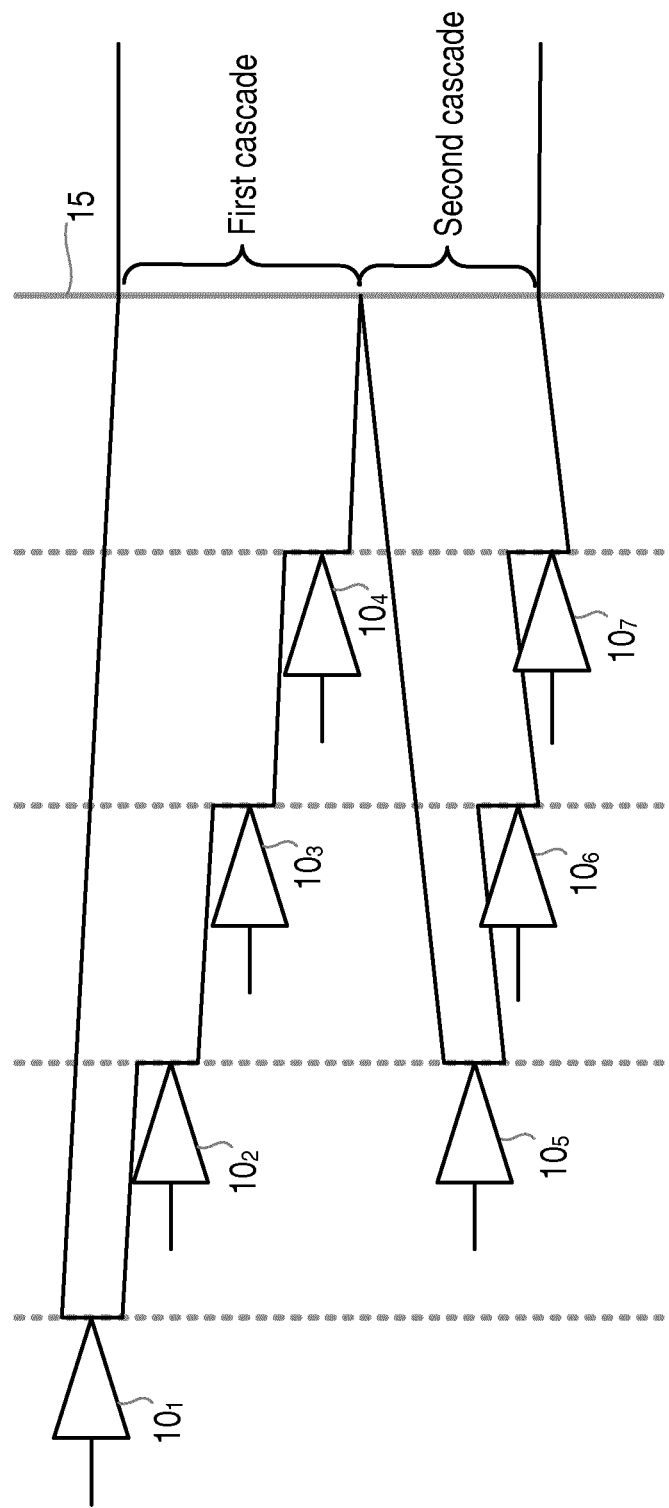

In FIG. 29a each of the amplifier stages is coupled directly to its respective junction, with the first cascade comprising four amplifier stages $10_1$ to $10_4$, and the second cascade comprising three amplifier stages $10_5$ to $10_7$.

Figure 29B:
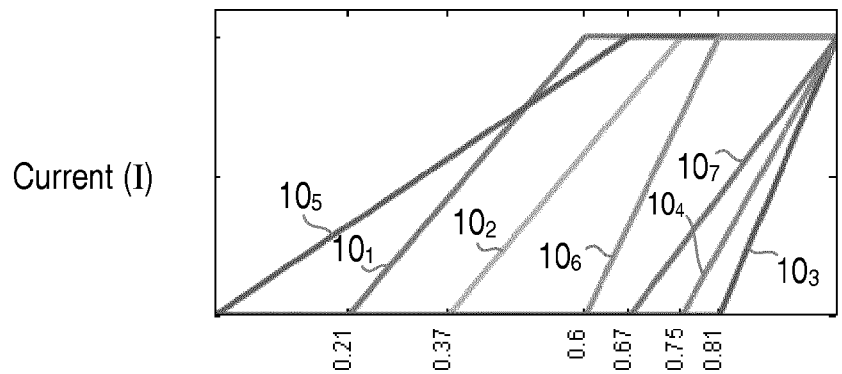

FIG. 29b shows a plot of current against output amplitude for the seven-stage embodiment of the present invention as shown in FIG. 29a. The order of the amplifier starting points in this example is amplifier $10_5$ starting at zero, amplifier $10_1$ starting at 0.21 of full output amplitude, amplifier $10_2$ starting at 0.37 of full output amplitude, amplifier $10_6$ starting at 0.6 of full output amplitude, amplifier $10_7$ starting at 0.67 of full output amplitude, amplifier $10_4$ starting at 0.75 of full output amplitude, and amplifier $10_3$ starting at 0.81 of full output amplitude.

Figure 29C:
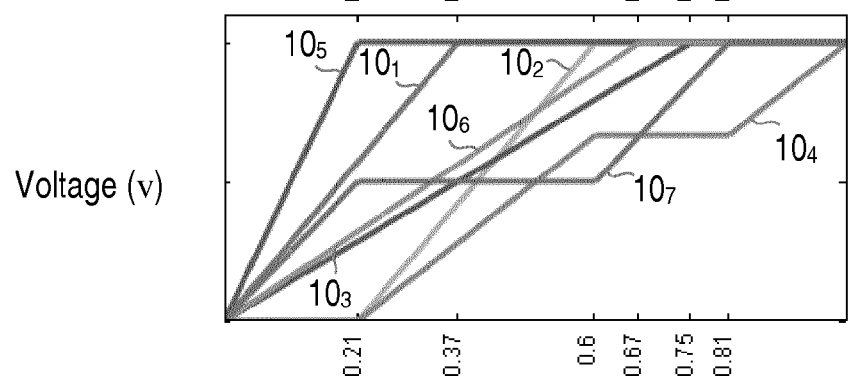
Figure 29D:
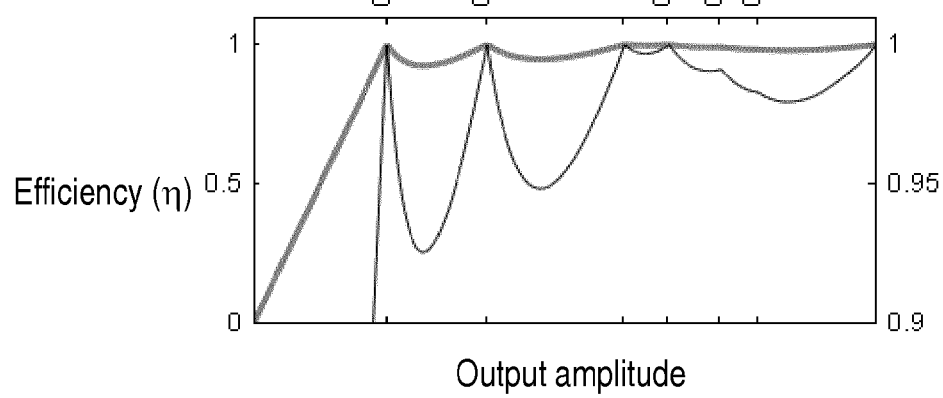

FIG. 29c shows a plot of voltage against output amplitude for the seven-stage embodiment of the present invention as shown in FIG. 29a. FIG. 29d shows a plot of efficiency against output amplitude for the seven-stage embodiment of the present invention as shown in FIG. 29a.

Figure 30A:
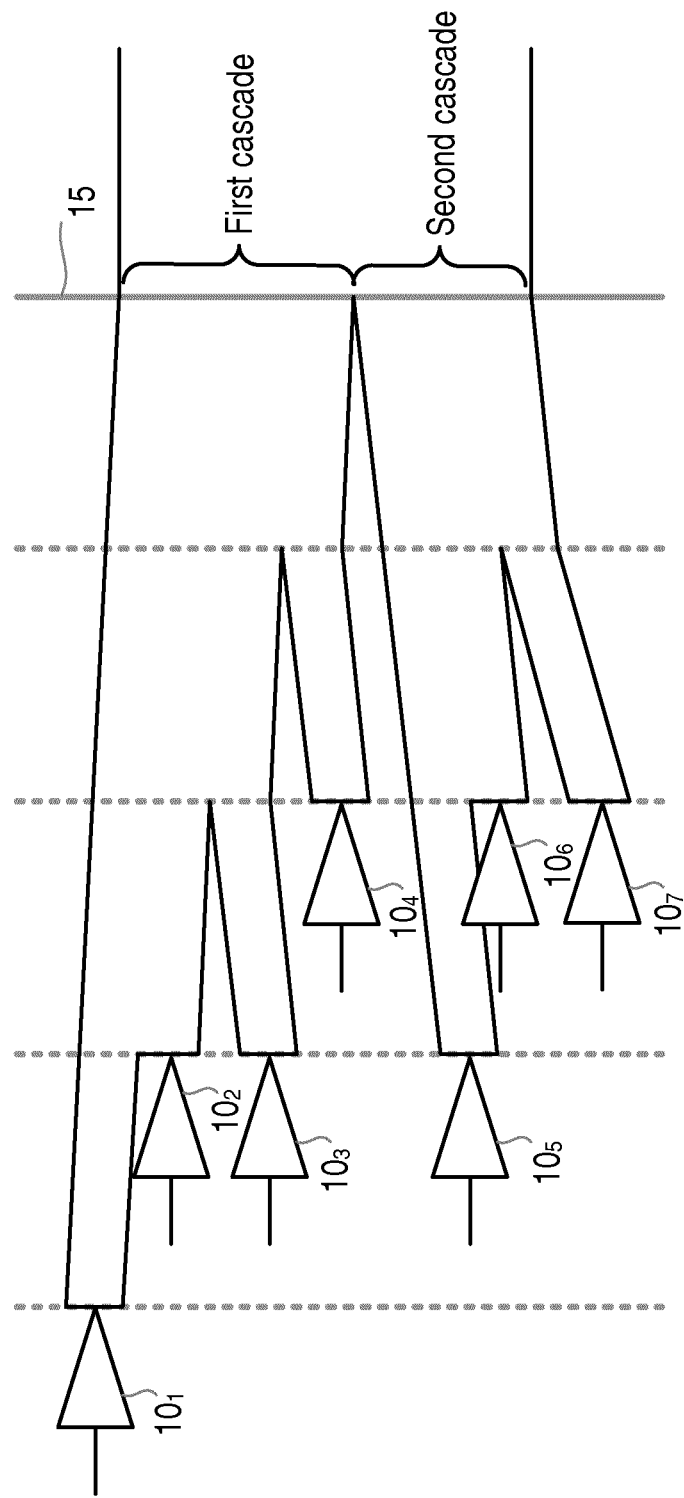

In FIG. 30a the first cascade comprises four amplifier stages $10_1$ to $10_4$ and the second cascade comprises three amplifier stages $10_5$ to $10_7$. Each of the amplifier stages is coupled directly to its respective junction, apart from the third, fourth and seventh amplifier stages $10_3$, $10_4$ and $10_7$, which are connected by a connecting quarter wavelength transmission line to their respective junctions.

Figure 30B:
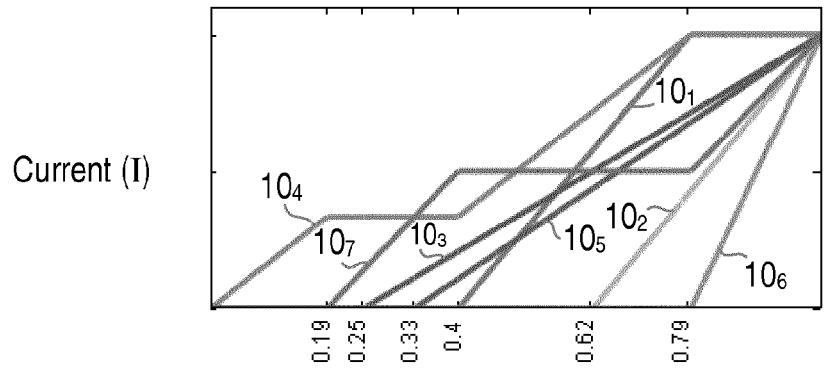

FIG. 30b shows a plot of current against output amplitude for the seven-stage embodiment of the present invention as shown in FIG. 30a. The order of the amplifier starting points in this example is amplifier $10_4$ starting at zero, amplifier $10_7$ starting at 0.19 of full output amplitude, amplifier $10_3$ starting at 0.25 of full output amplitude, amplifier $10_5$ starting at 0.33 of full output amplitude, amplifier $10_1$ starting at 0.4 of full output amplitude, amplifier $10_2$ starting at 0.62 of full output amplitude, and amplifier $10_6$ starting at 0.29 of full output amplitude.

Figure 30C:
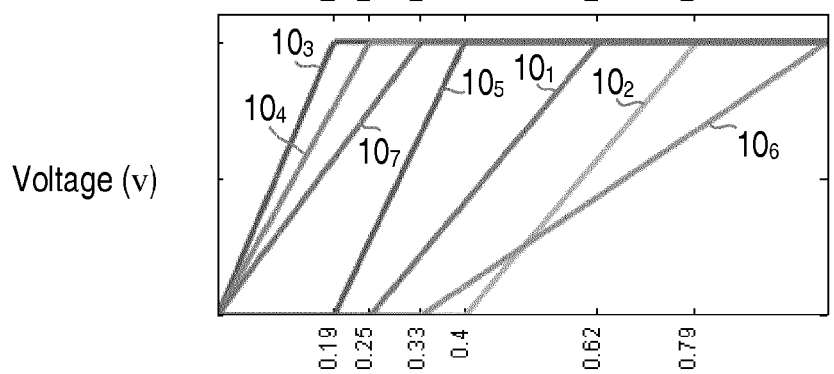
Figure 30D:
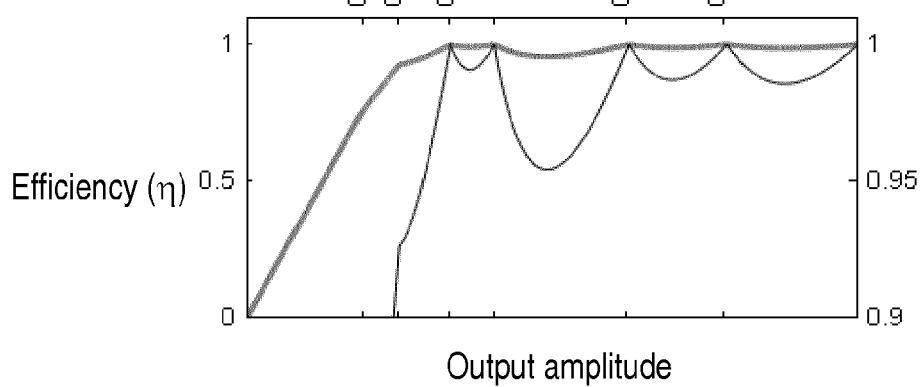

FIG. 30c shows a plot of voltage against output amplitude for the seven-stage embodiment of the present invention as shown in FIG. 30a. FIG. 30d shows a plot of efficiency against output amplitude for the seven-stage embodiment of the present invention as shown in FIG. 30a.

Figure 31A:
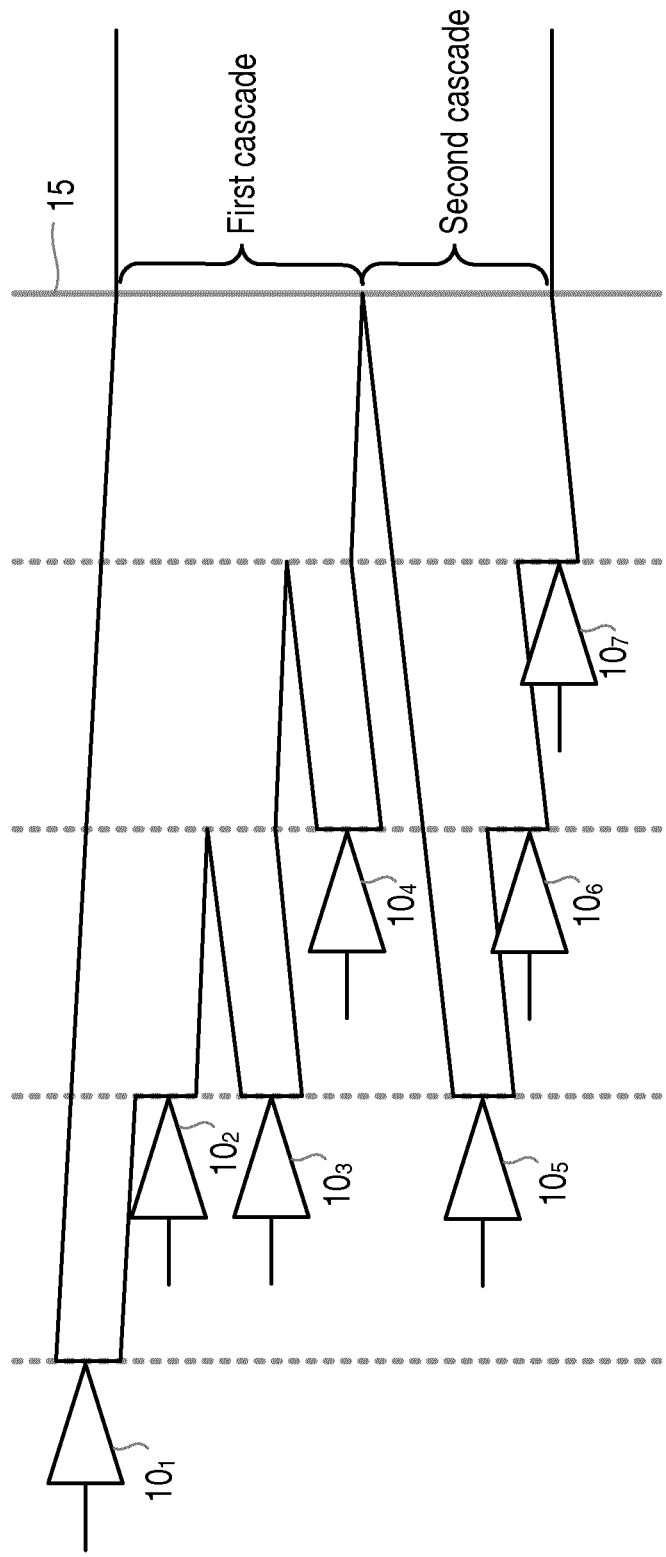

In FIG. 31a the first cascade comprises four amplifier stages $10_1$ to $10_4$ and the second cascade comprises three amplifier stages $10_5$ to $10_7$. Each of the amplifier stages is coupled directly to its respective junction, apart from the third and fourth amplifier stages $10_3$ and $10_4$, which are connected by a connecting quarter wavelength transmission line to their respective junctions.

Figure 31B:
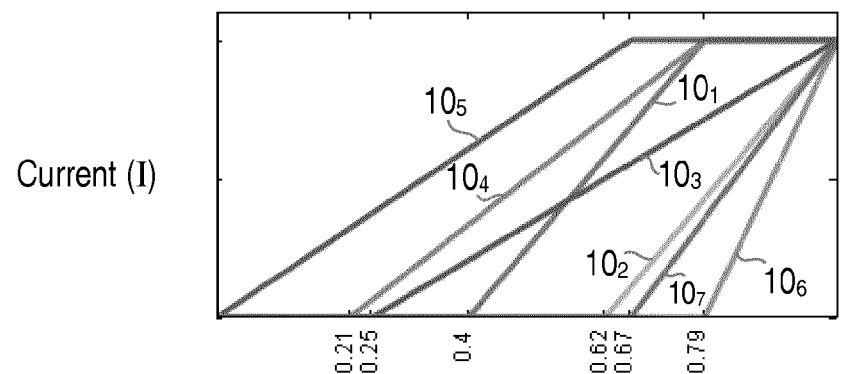

FIG. 31b shows a plot of current against output amplitude for the seven-stage embodiment of the present invention as shown in FIG. 31a. The order of the amplifier starting points in this example is amplifier $10_5$ starting at zero, amplifier $10_4$ starting at 0.21 of full output amplitude, amplifier $10_3$ starting at 0.25 of full output amplitude, amplifier $10_1$ starting at 0.4 of full output amplitude, amplifier $10_2$ starting at 0.62 of full output amplitude, amplifier $10_7$ starting at 0.67 of full output amplitude, and amplifier $10_6$ starting at 0.29 of full output amplitude.

Figure 31C:
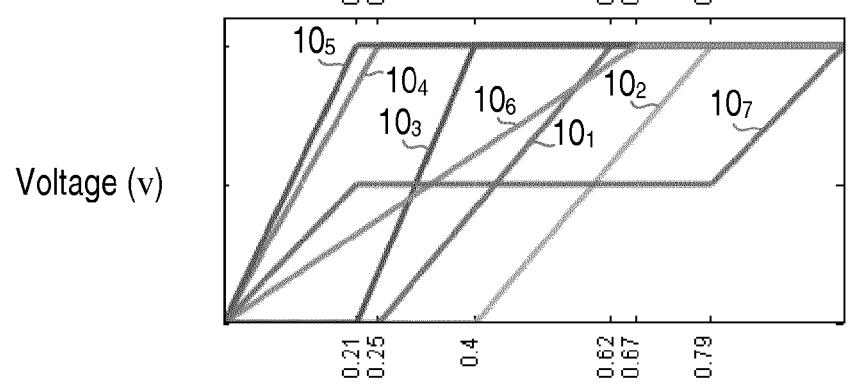
Figure 31D:
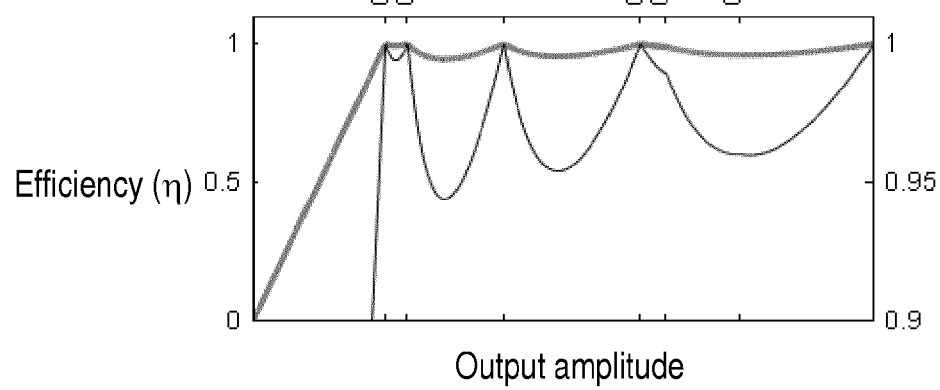

FIG. 31c shows a plot of voltage against output amplitude for the seven-stage embodiment of the present invention as shown in FIG. 31a. FIG. 31d shows a plot of efficiency against output amplitude for the seven-stage embodiment of the present invention as shown in FIG. 31a.

Figure 32A:
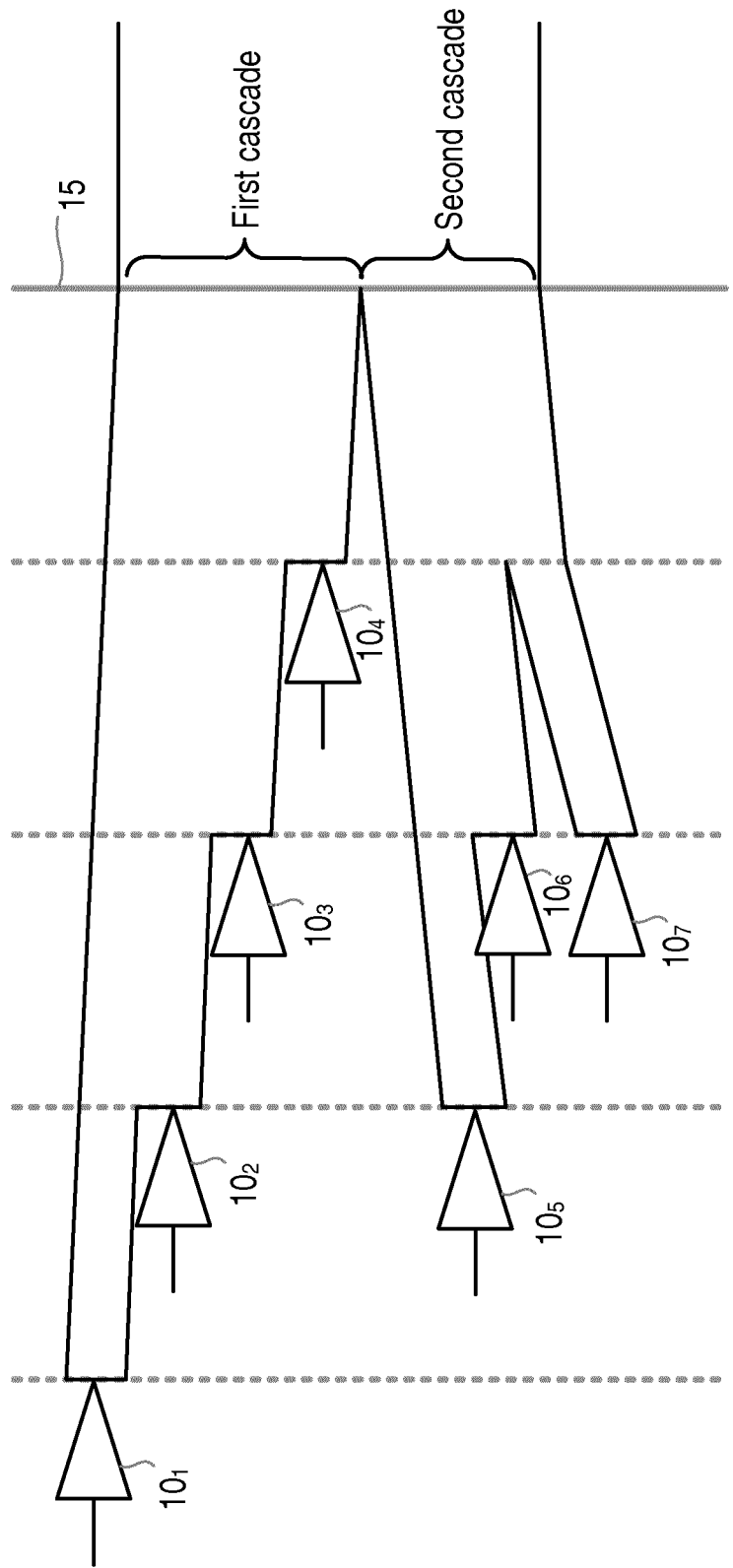

In FIG. 32a the first cascade comprises four amplifier stages $10_1$ to $10_4$, and the second cascade comprises three amplifier stages $10_5$ to $10_7$. Each of the amplifier stages is coupled directly to its respective junction, apart from the seventh amplifier stage $10_7$, which is connected by a connecting quarter wavelength transmission line to its respective junction.

Figure 32B:
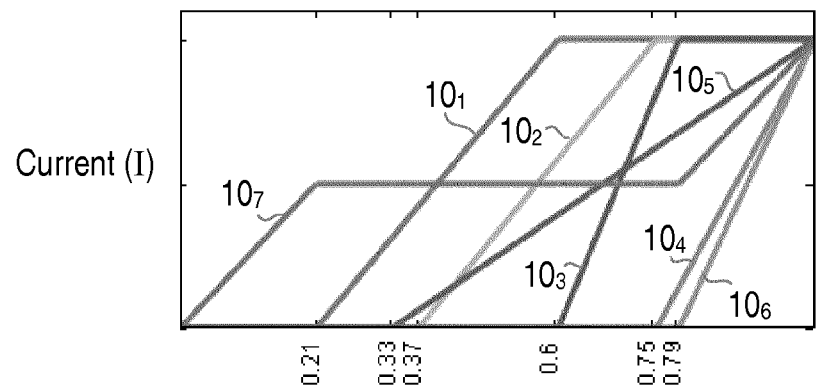

FIG. 32b shows a plot of current against output amplitude for the seven-stage embodiment of the present invention as shown in FIG. 32a. The order of the amplifier starting points in this example is amplifier $10_7$ starting at zero, amplifier $10_1$ starting at 0.21 of full output amplitude, amplifier $10_5$ starting at 0.33 of full output amplitude, amplifier $10_2$ starting at 0.37 of full output amplitude, amplifier $10_3$ starting at 0.6 of full output amplitude, amplifier $10_4$ starting at 0.75 of full output amplitude, and amplifier $10_6$ starting at 0.29 of full output amplitude.

Figure 32C:
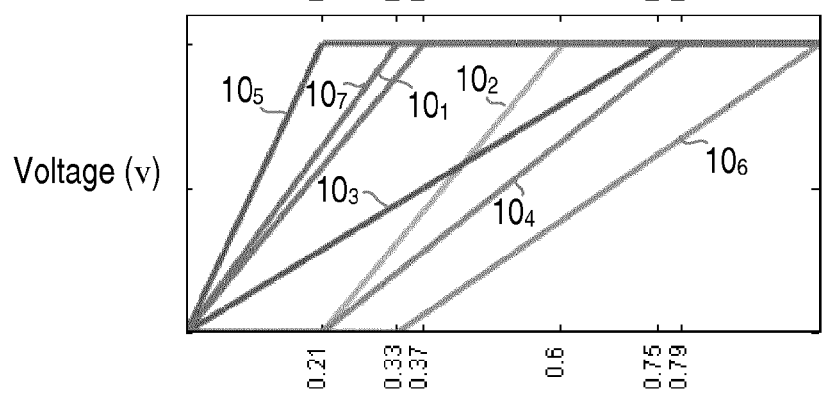
Figure 32D:
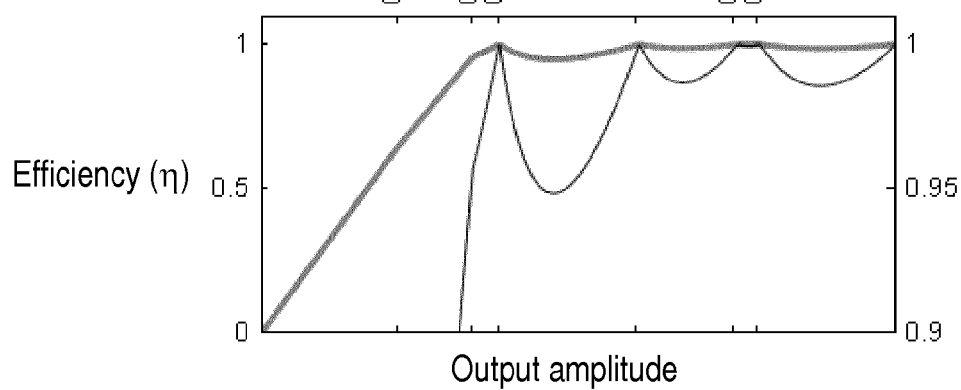

FIG. 32c shows a plot of voltage against output amplitude for the seven-stage embodiment of the present invention as shown in FIG. 32a. FIG. 32d shows a plot of efficiency against output amplitude for the seven-stage embodiment of the present invention as shown in FIG. 32a.

Figure 33A:
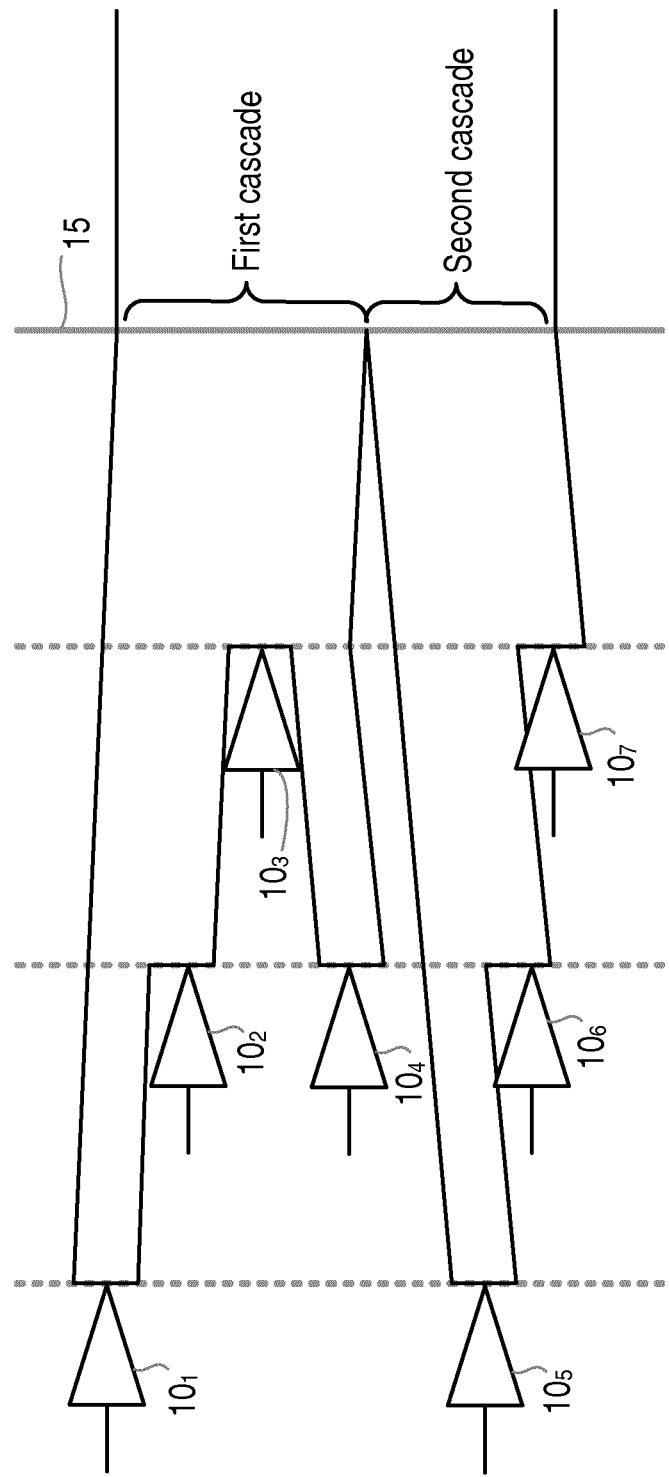

In FIG. 33a the first cascade comprises four amplifier stages $10_1$ to $10_4$, and the second cascade comprises three amplifier stages $10_5$ to $10_7$. Each of the amplifier stages is coupled directly to its respective junction, apart from the fourth amplifier stage $10_4$, which is connected by a connecting quarter wavelength transmission line to its respective junction.

Figure 33B:
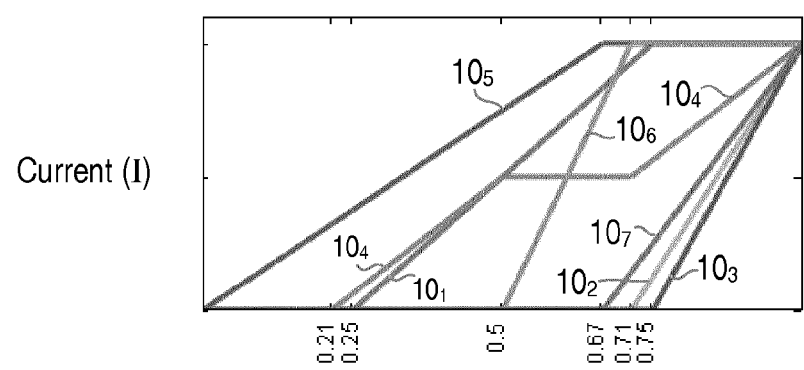

FIG. 33b shows a plot of current against output amplitude for the seven-stage embodiment of the present invention as shown in FIG. 33a. The order of the amplifier starting points in this example is amplifier $10_5$ starting at zero, amplifier $10_4$ starting at 0.21 of full output amplitude, amplifier $10_1$ starting at 0.25 of full output amplitude, amplifier $10_6$ starting at 0.5 of full output amplitude, amplifier $10_7$ starting at 0.67 of full output amplitude, amplifier $10_2$ starting at 0.71 of full output amplitude, and amplifier $10_3$ starting at 0.75 of full output amplitude.

Figure 33C:
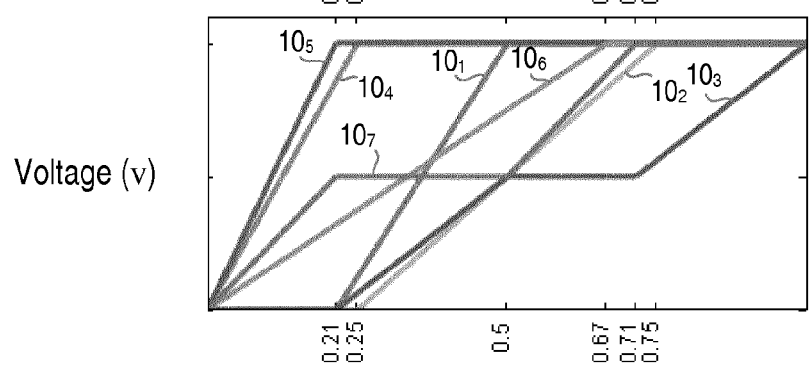
Figure 33D:
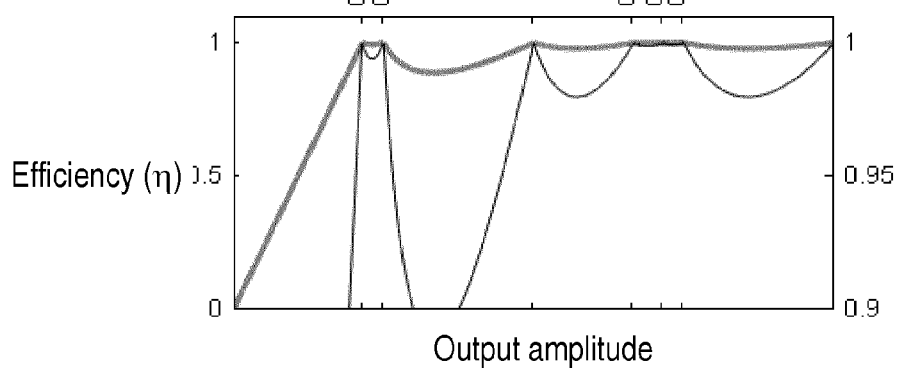

FIG. 33c shows a plot of voltage against output amplitude for the seven-stage embodiment of the present invention as shown in FIG. 33a. FIG. 33d shows a plot of efficiency against output amplitude for the seven-stage embodiment of the present invention as shown in FIG. 33a.

In FIG. 34a the first cascade comprises four amplifier stages $10_1$ to $10_4$, and the second cascade comprises three amplifier stages $10_5$ to $10_7$. Each of the amplifier stages is coupled directly to its respective junction, apart from the fourth and seventh amplifier stages $10_4$ and $10_7$, which are connected by a connecting quarter wavelength transmission line to their respective junctions.

Figure 34B:
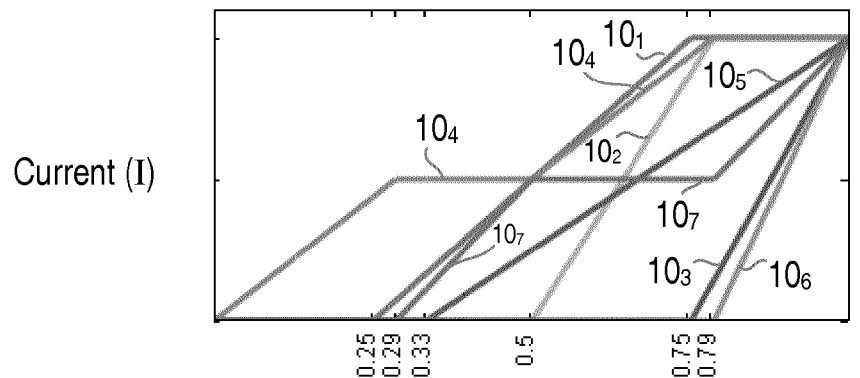

FIG. 34b shows a plot of current against output amplitude for the seven-stage embodiment of the present invention as shown in FIG. 34a. The order of the amplifier starting points in this example is amplifier $10_4$ starting at zero, amplifier $10_1$ starting at 0.25 of full output amplitude, amplifier $10_7$ starting at 0.29 of full output amplitude, amplifier $10_5$ starting at 0.33 of full output amplitude, amplifier $10_2$ starting at 0.5 of full output amplitude, amplifier $10_3$ starting at 0.75 of full output amplitude, and amplifier $10_6$ starting at 0.29 of full output amplitude.

Figure 34C:
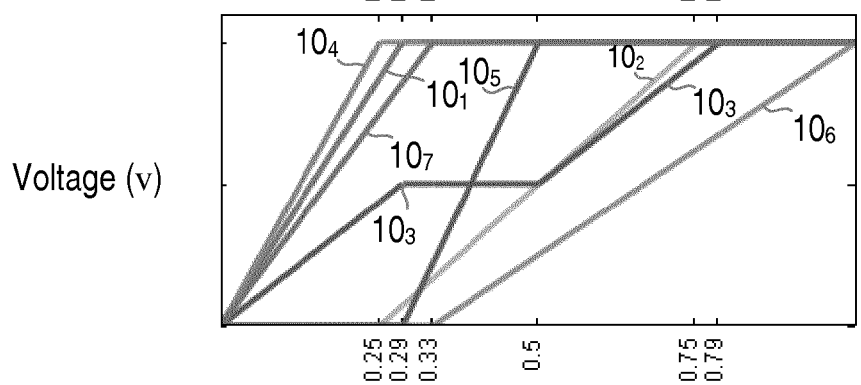
Figure 34D:
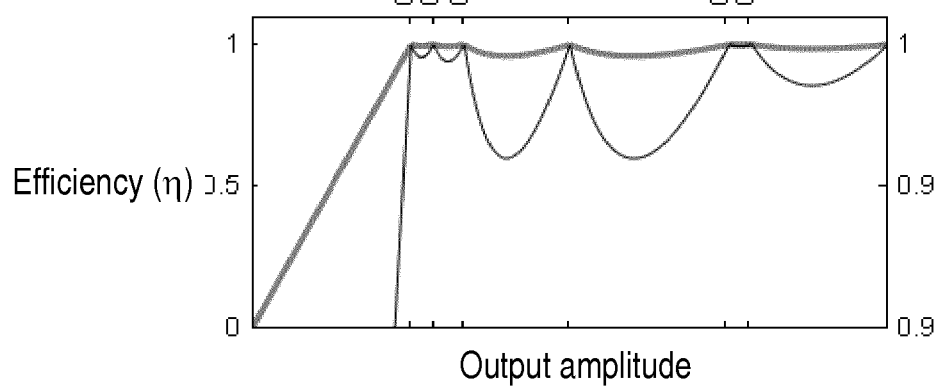

FIG. 34c shows a plot of voltage against output amplitude for the seven-stage embodiment of the present invention as shown in FIG. 34a. FIG. 34d shows a plot of efficiency against output amplitude for the seven-stage embodiment of the present invention as shown in FIG. 34a.

Figure 35A:
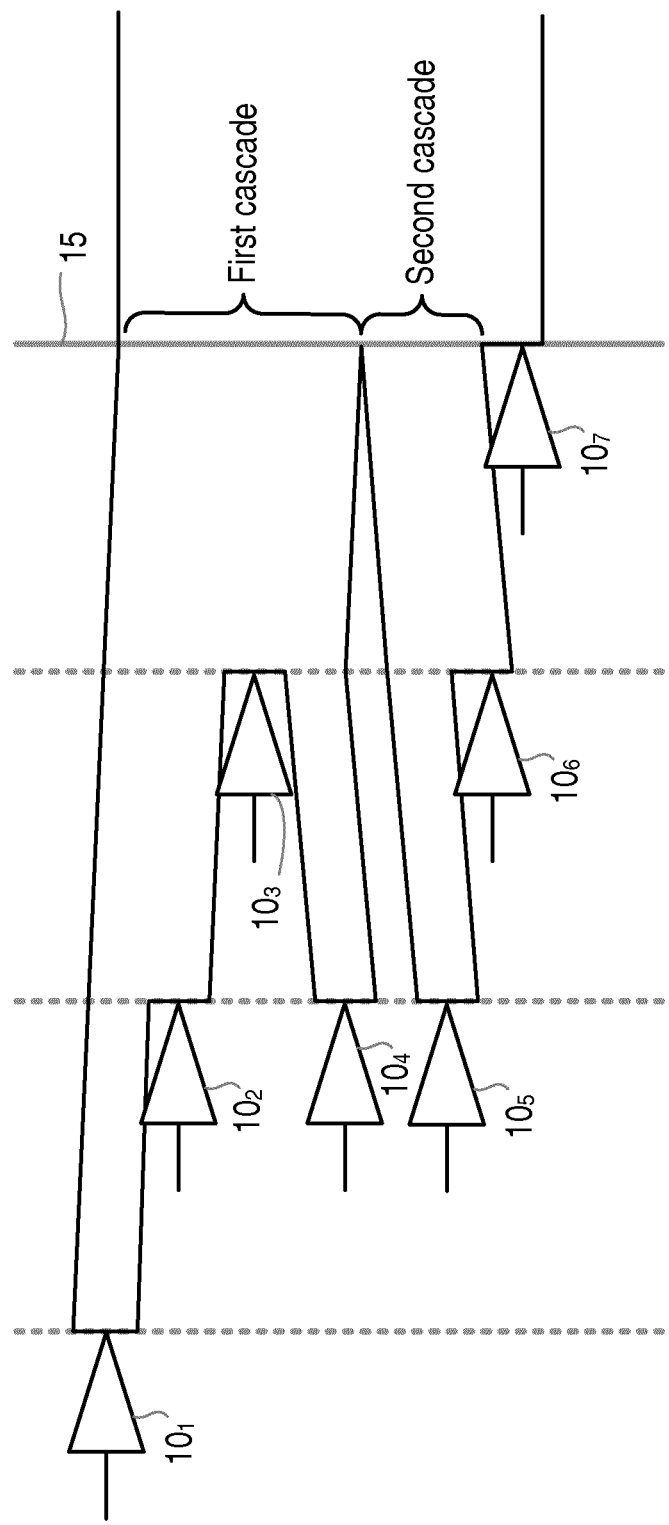

In FIG. 35a the first cascade comprises four amplifier stages $10_1$ to $10_4$, and the second cascade comprises two amplifier stages $10_5$ to $10_6$. Each of the amplifier stages is coupled directly to its respective junction, apart from the fourth amplifier stage $10_4$, which is connected by a connecting quarter wavelength transmission line to its respective junction. The seventh amplifier stage $10_7$ is coupled to the junction at the output (and is effectively a third cascade stage).

Figure 35B:
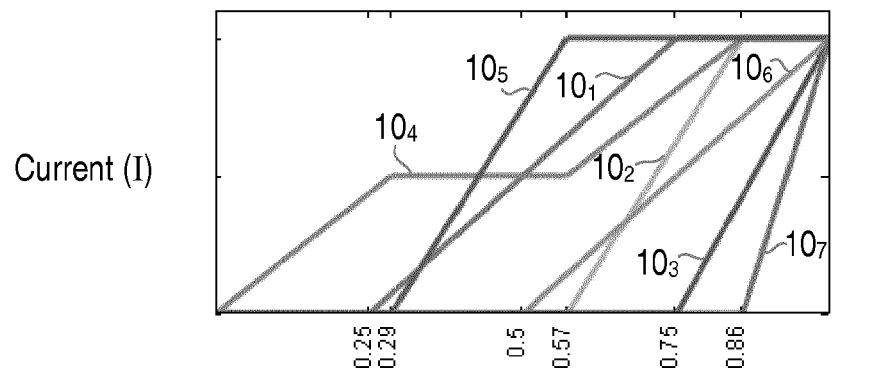

FIG. 35b shows a plot of current against output amplitude for the seven-stage embodiment of the present invention as shown in FIG. 35a. The order of the amplifier starting points in this example is amplifier $10_4$ starting at zero, amplifier $10_1$ starting at 0.25 of full output amplitude, amplifier $10_5$ starting at 0.29 of full output amplitude, amplifier $10_6$ starting at 0.5 of full output amplitude, amplifier $10_2$ starting at 0.57 of full output amplitude, amplifier $10_3$ starting at 0.75 of full output amplitude, and amplifier $10_7$ starting at 0.86 of full output amplitude.

Figure 35C:
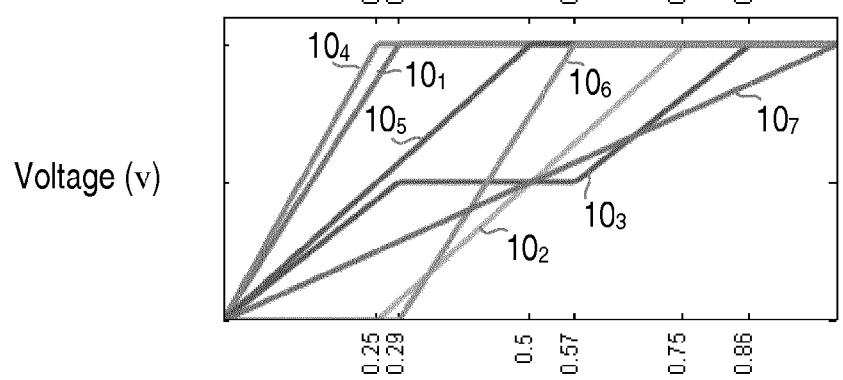
Figure 35D:
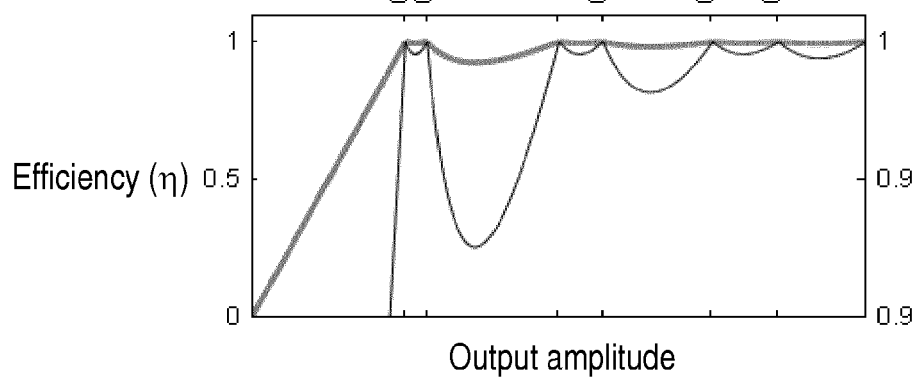

FIG. 35c shows a plot of voltage against output amplitude for the seven-stage embodiment of the present invention as shown in FIG. 35a. FIG. 35d shows a plot of efficiency against output amplitude for the seven-stage embodiment of the present invention as shown in FIG. 35a.

Figure 36A:
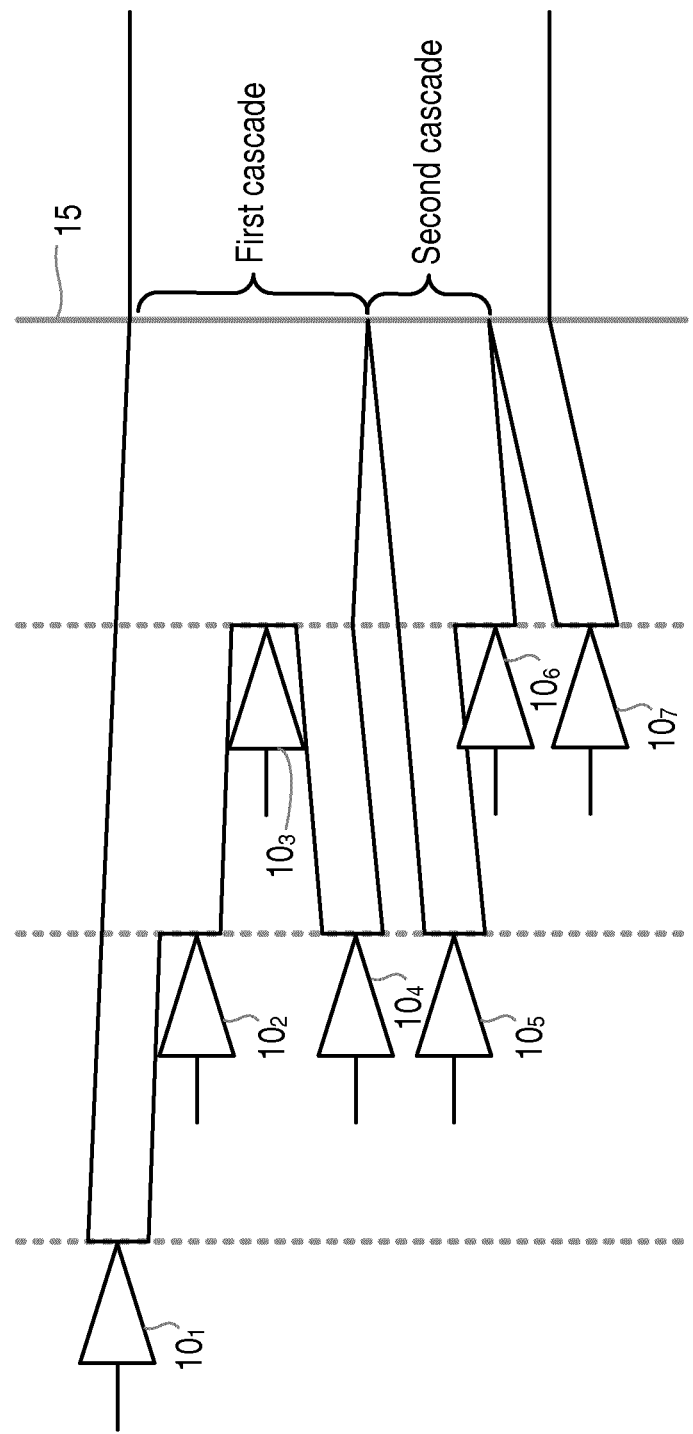

In FIG. 36a the first cascade comprises four amplifier stages $10_1$ to $10_4$ and the second cascade comprises two amplifier stages $10_5$ to $10_6$, with a seventh amplifier stage $10_7$ (effectively a third cascade stage) being coupled to the junction at the output via a connecting quarter wavelength transmission line. Each of the amplifier stages is coupled directly to its respective junction, apart from the third and seventh amplifier stages $10_3$ and $10_7$, which are connected by a connecting quarter wavelength transmission line to their respective junctions.

Figure 36B:
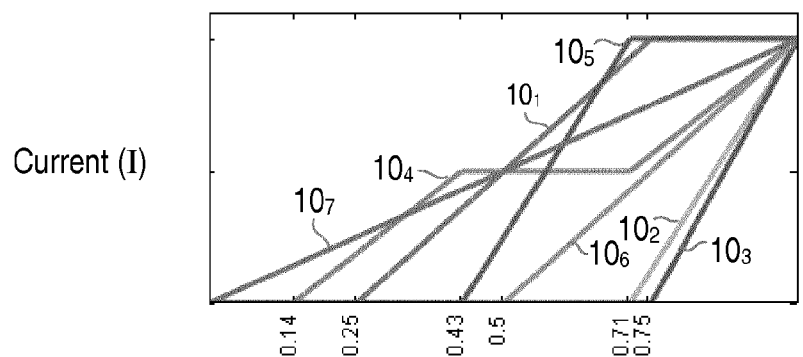

FIG. 36b shows a plot of current against output amplitude for the seven-stage embodiment of the present invention as shown in FIG. 36a. The order of the amplifier starting points in this example is amplifier $10_7$ starting at zero, amplifier $10_4$ starting at 0.14 of full output amplitude, amplifier $10_1$ starting at 0.25 of full output amplitude, amplifier $10_5$ starting at 0.43 of full output amplitude, amplifier $10_6$ starting at 0.5 of full output amplitude, amplifier $10_2$ starting at 0.71 of full output amplitude, and amplifier $10_3$ starting at 0.75 of full output amplitude.

Figure 36C:
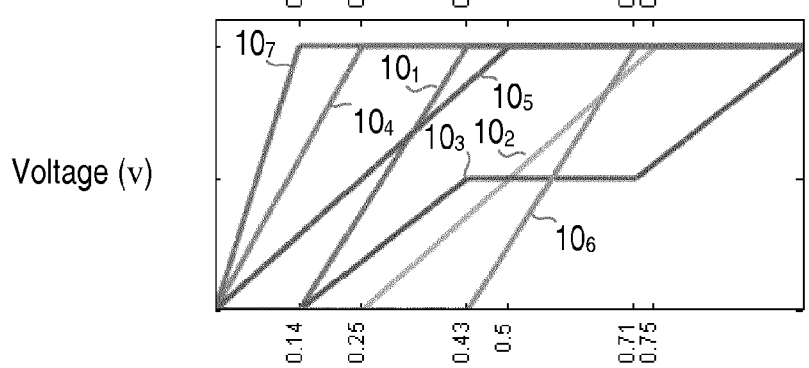
Figure 36D:
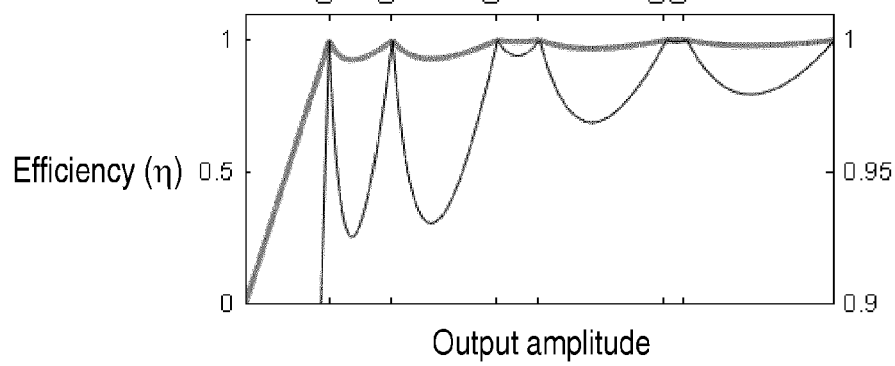

FIG. 36c shows a plot of voltage against output amplitude for the seven-stage embodiment of the present invention as shown in FIG. 36a. FIG. 36d shows a plot of efficiency against output amplitude for the seven-stage embodiment of the present invention as shown in FIG. 36a.

Figure 37A:
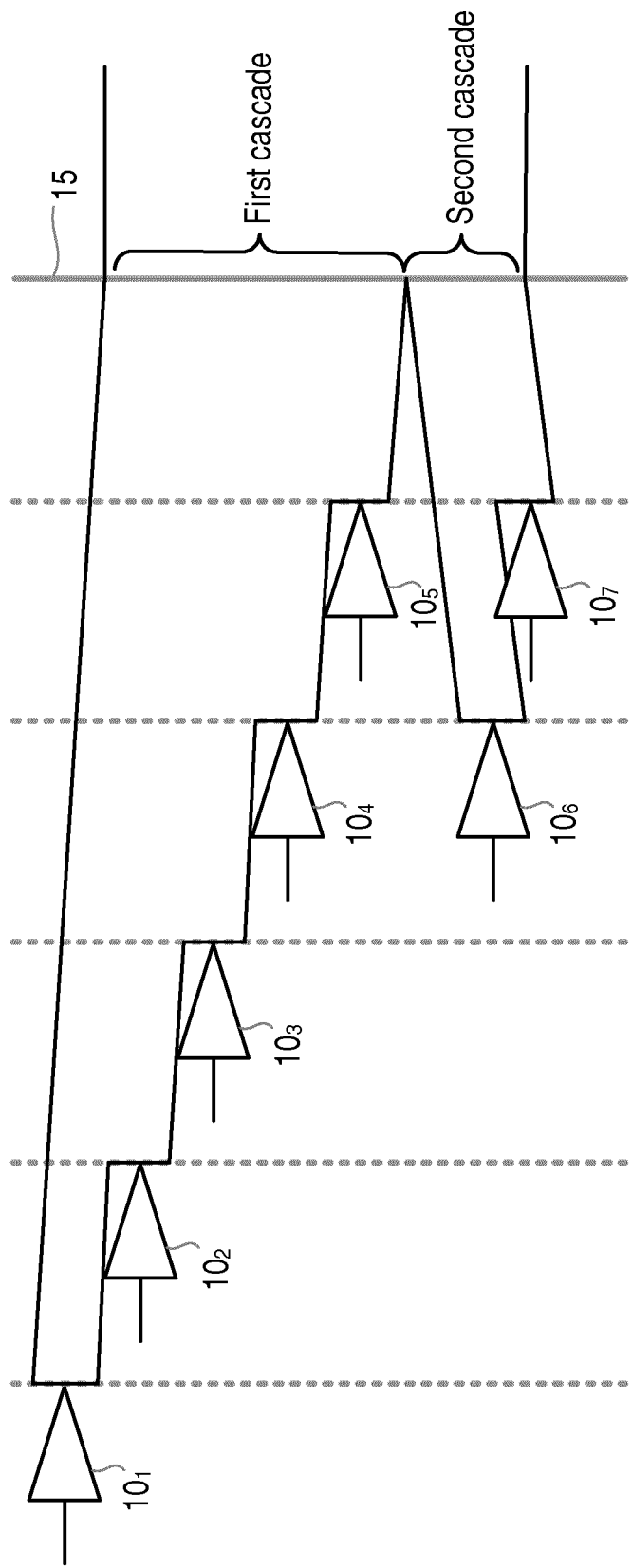

In FIG. 37a the first cascade comprises five amplifier stages $10_1$ to $10_5$, and the second cascade comprises two amplifier stages $10_6$ to $10_7$. Each of the amplifier stages is coupled directly to its respective junction.

Figure 37B:
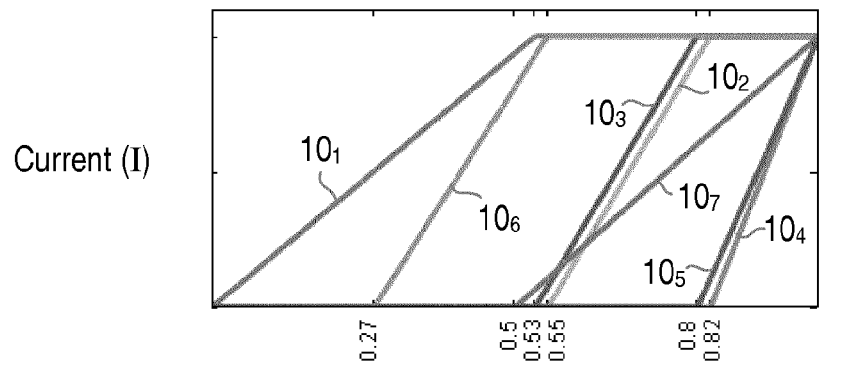

FIG. 37b shows a plot of current against output amplitude for the seven-stage embodiment of the present invention as shown in FIG. 37a. The order of the amplifier starting points in this example is amplifier $10_1$ starting at zero, amplifier $10_6$ starting at 0.27 of full output amplitude, amplifier $10_7$ starting at 0.5 of full output amplitude, amplifier $10_3$ starting at 0.53 of full output amplitude, amplifier $10_2$ starting at 0.55 of full output amplitude, amplifier $10_5$ starting at 0.8 of full output amplitude, and amplifier $10_4$ starting at 0.82 of full output amplitude.

Figure 37C:
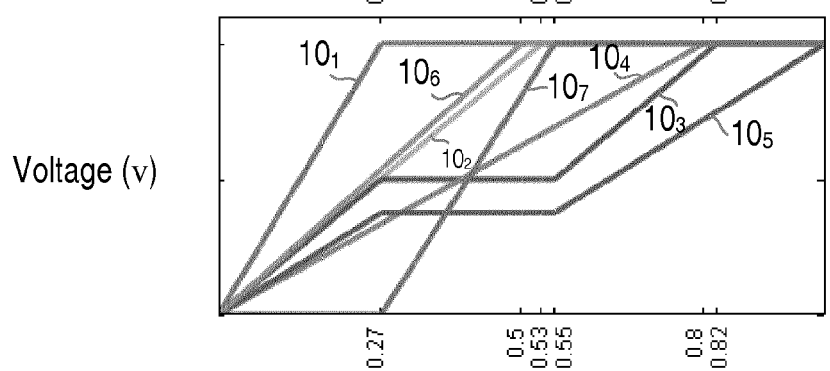
Figure 37D:
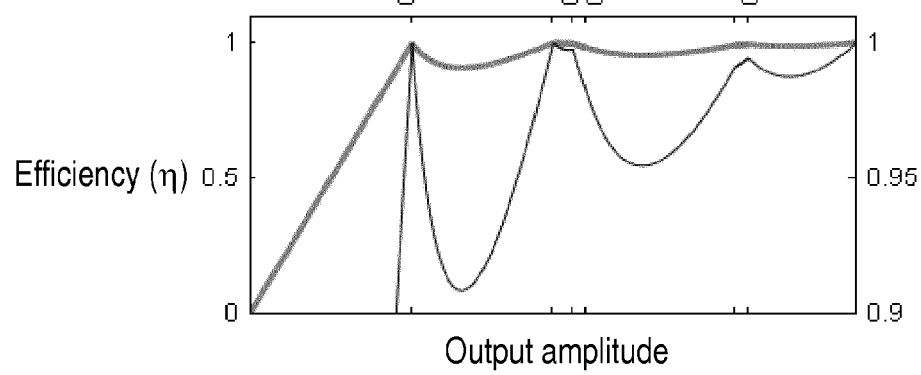

FIG. 37c shows a plot of voltage against output amplitude for the seven-stage embodiment of the present invention as shown in FIG. 37a. FIG. 37d shows a plot of efficiency against output amplitude for the seven-stage embodiment of the present invention as shown in FIG. 37a.

Figure 38A:
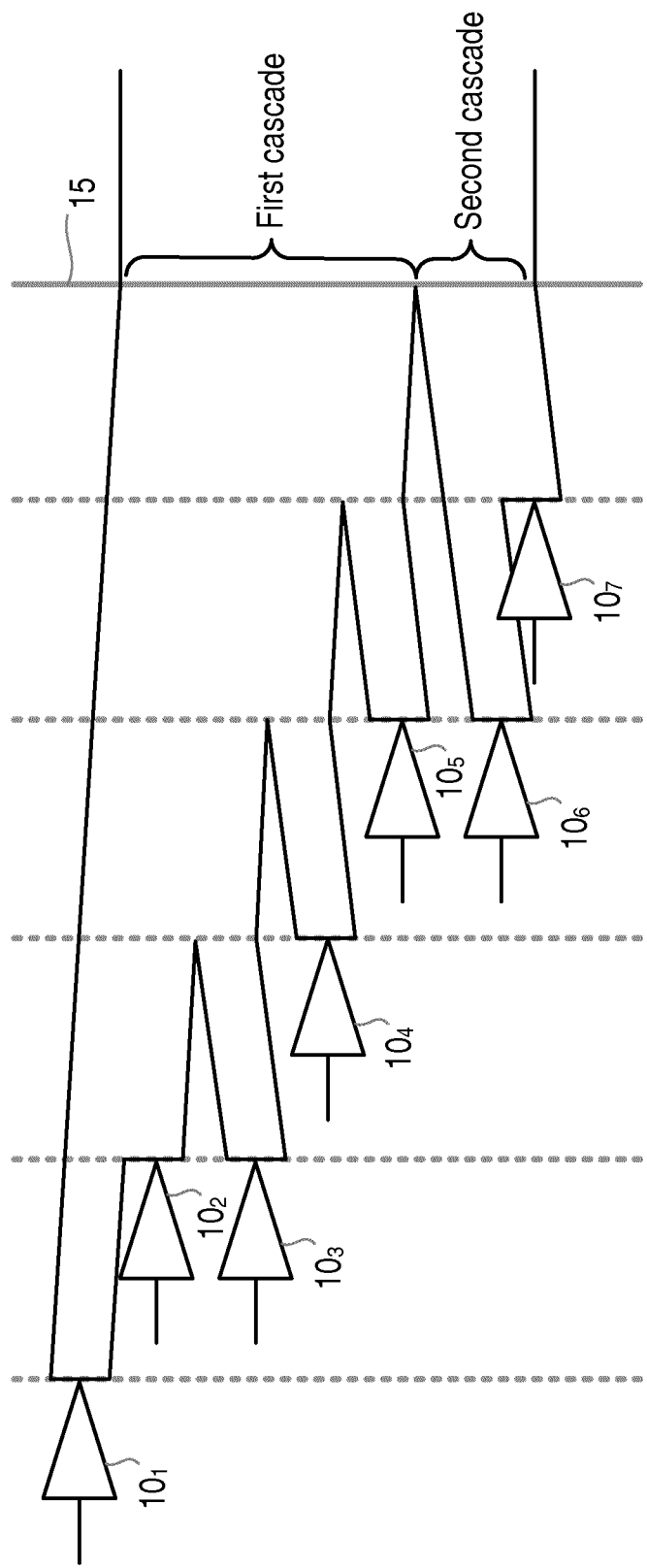

In FIG. 38a the first cascade comprises five amplifier stages $10_1$ to $10_5$, and the second cascade comprises two amplifier stages $10_6$ to $10_7$. Each of the amplifier stages is coupled directly to its respective junction, apart from the third, fourth and fifth amplifier stages $10_3$, $10_4$ and $10_5$, which are connected by a connecting quarter wavelength transmission line to their respective junctions.

Figure 38B:
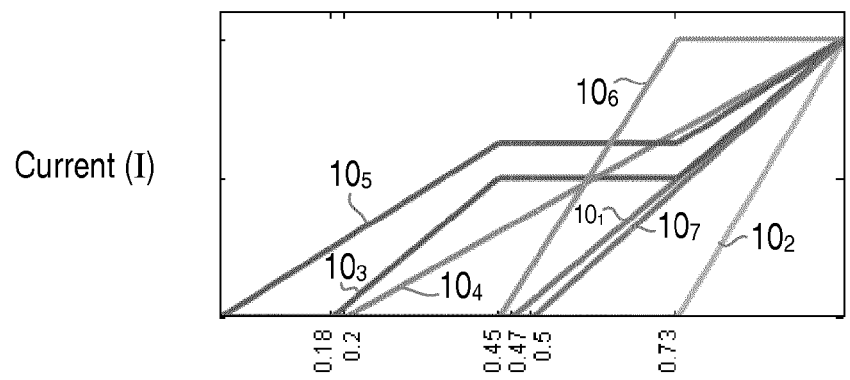

FIG. 38b shows a plot of current against output amplitude for the seven-stage embodiment of the present invention as shown in FIG. 38a. The order of the amplifier starting points in this example is amplifier $10_5$ starting at zero, amplifier $10_3$ starting at 0.18 of full output amplitude, amplifier $10_4$ starting at 0.2 of full output amplitude, amplifier $10_6$ starting at 0.45 of full output amplitude, amplifier $10_1$ starting at 0.47 of full output amplitude, amplifier $10_7$ starting at 0.5 of full output amplitude, and amplifier $10_2$ starting at 0.73 of full output amplitude.

Figure 38C:
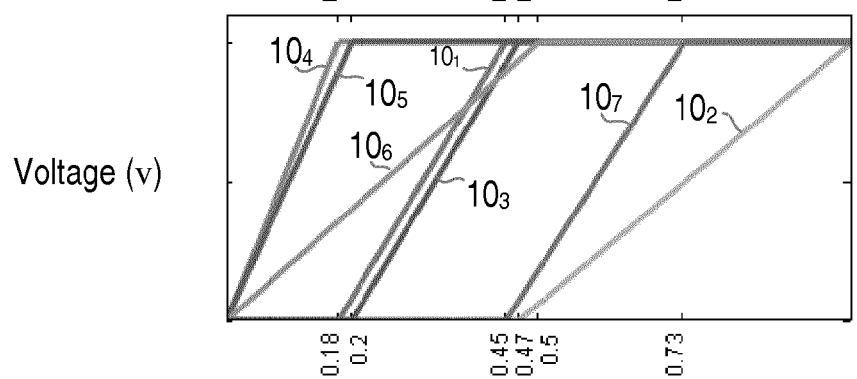
Figure 38D:
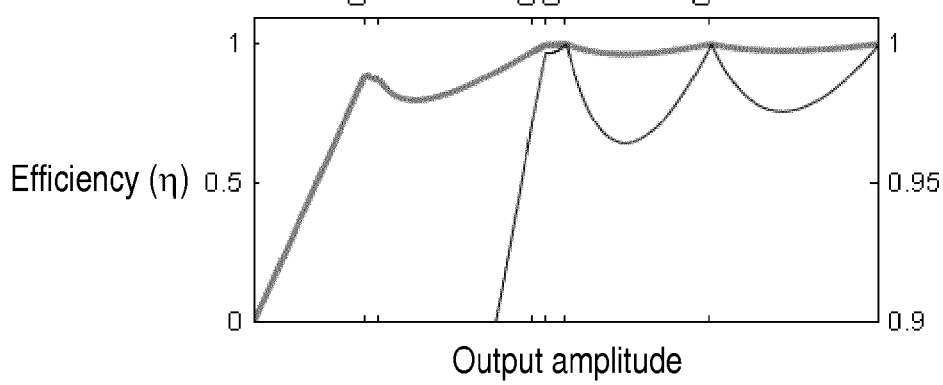

FIG. 38c shows a plot of voltage against output amplitude for the seven-stage embodiment of the present invention as shown in FIG. 38a. FIG. 38d shows a plot of efficiency against output amplitude for the seven-stage embodiment of the present invention as shown in FIG. 38a.

Figure 39A:
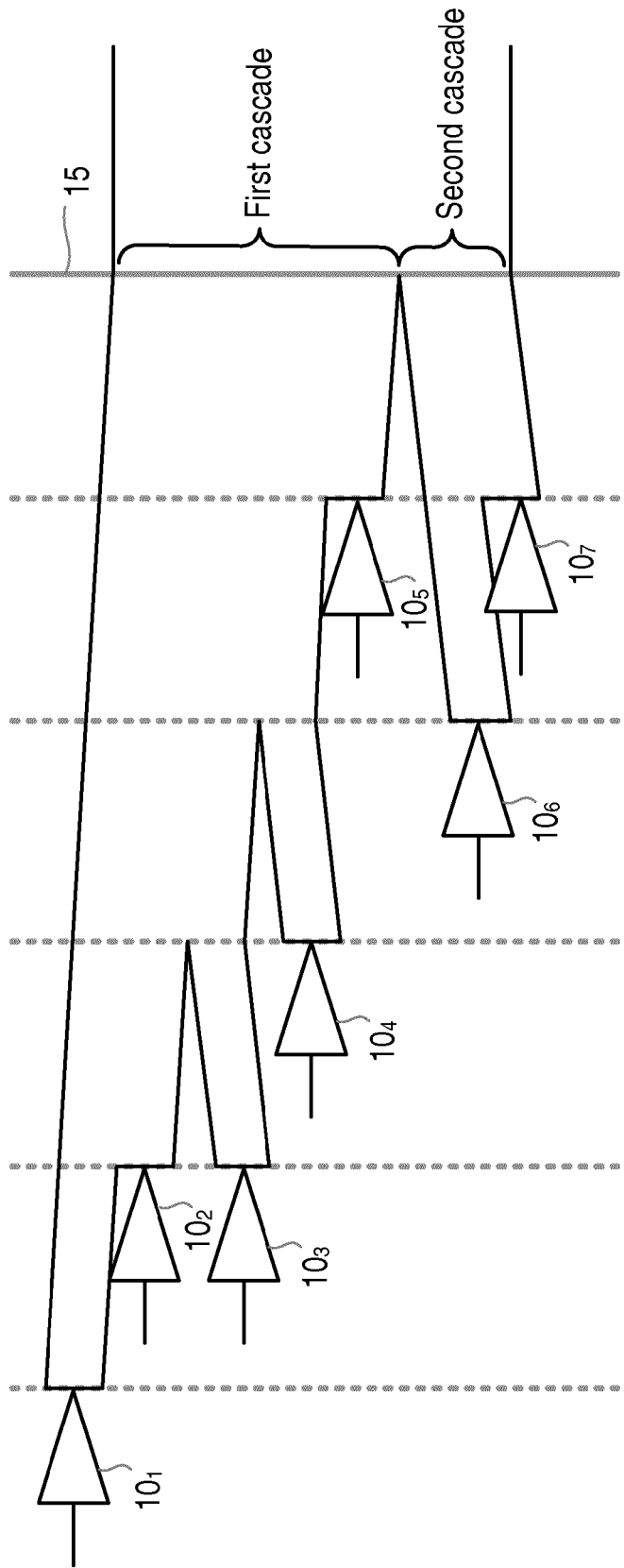

In FIG. 39a the first cascade comprises five amplifier stages $10_1$ to $10_5$, and the second cascade comprises two amplifier stages $10_6$ to $10_7$. Each of the amplifier stages is coupled directly to its respective junction, apart from the third and fourth amplifier stages $10_3$ and $10_4$, which are connected by a connecting quarter wavelength transmission line to their respective junctions.

Figure 39B:
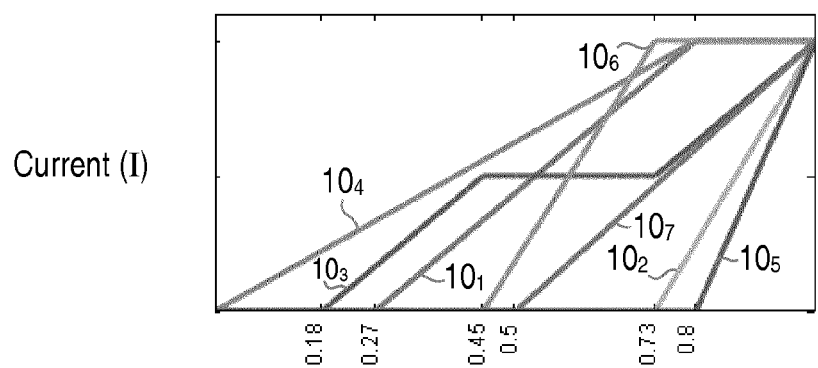

FIG. 39b shows a plot of current against output amplitude for the seven-stage embodiment of the present invention as shown in FIG. 39a. The order of the amplifier starting points in this example is amplifier $10_4$ starting at zero, amplifier $10_3$ starting at 0.18 of full output amplitude, amplifier $10_1$ starting at 0.27 of full output amplitude, amplifier $10_6$ starting at 0.45 of full output amplitude, amplifier $10_7$ starting at 0.5 of full output amplitude, amplifier $10_2$ starting at 0.73 of full output amplitude, and amplifier $10_5$ starting at 0.8 of full output amplitude.

Figure 39C:
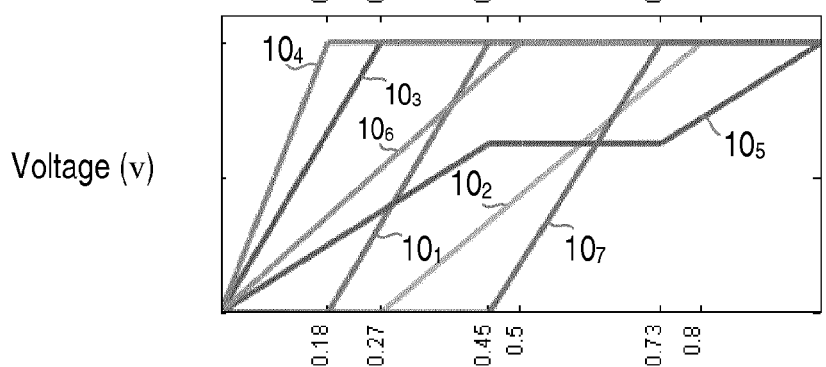
Figure 39D:
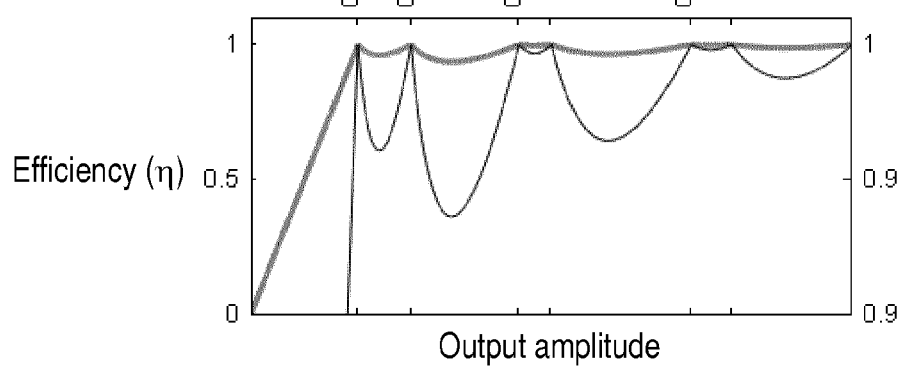

FIG. 39c shows a plot of voltage against output amplitude for the seven-stage embodiment of the present invention as shown in FIG. 39a. FIG. 39d shows a plot of efficiency against output amplitude for the seven-stage embodiment of the present invention as shown in FIG. 39a.

Figure 40A:
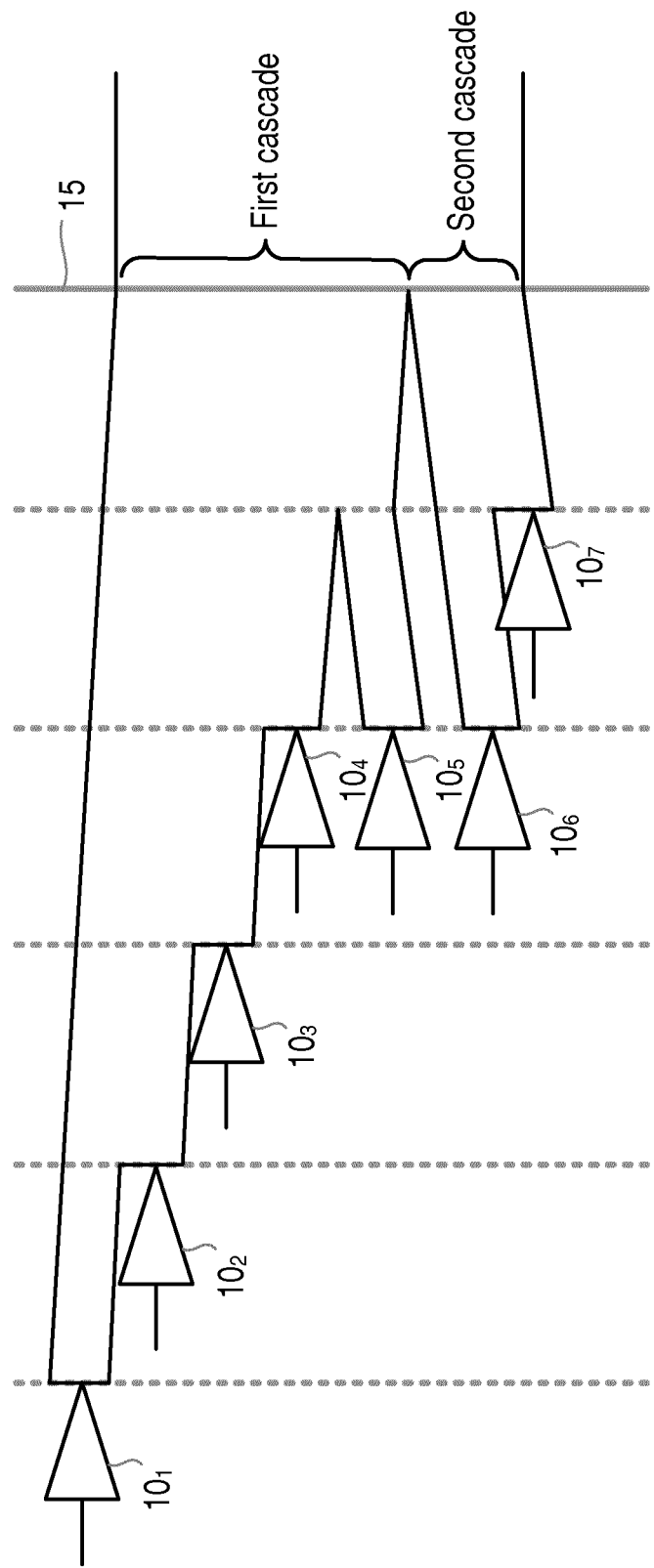

In FIG. 40a the first cascade comprises five amplifier stages $10_1$ to $10_5$, and the second cascade comprises two amplifier stages $10_6$ to $10_7$. Each of the amplifier stages is coupled directly to its respective junction, apart from the fifth amplifier stage $10_5$, which is connected by a connecting quarter wavelength transmission line to its respective junction.

Figure 40B:
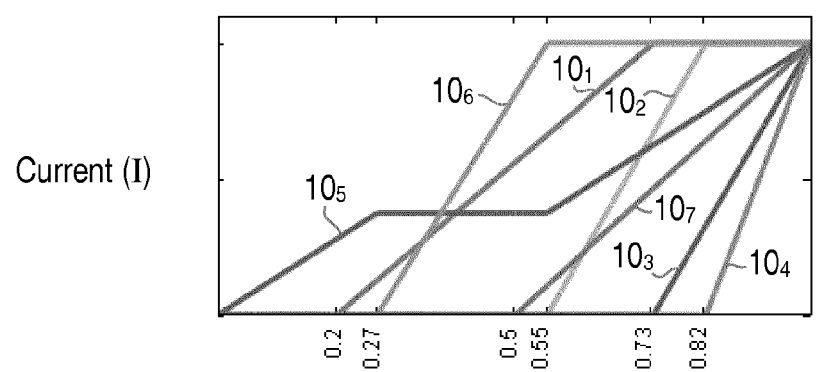

FIG. 40b shows a plot of current against output amplitude for the seven-stage embodiment of the present invention as shown in FIG. 40a. The order of the amplifier starting points in this example is amplifier $10_5$ starting at zero, amplifier $10_1$ starting at 0.2 of full output amplitude, amplifier $10_6$ starting at 0.27 of full output amplitude, amplifier $10_7$ starting at 0.5 of full output amplitude, amplifier $10_2$ starting at 0.55 of full output amplitude, amplifier $10_3$ starting at 0.73 of full output amplitude, and amplifier $10_4$ starting at 0.82 of full output amplitude.

Figure 40C:
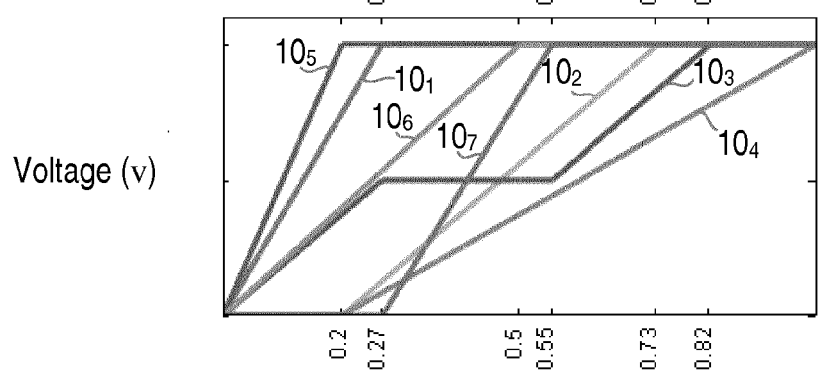
Figure 40D:
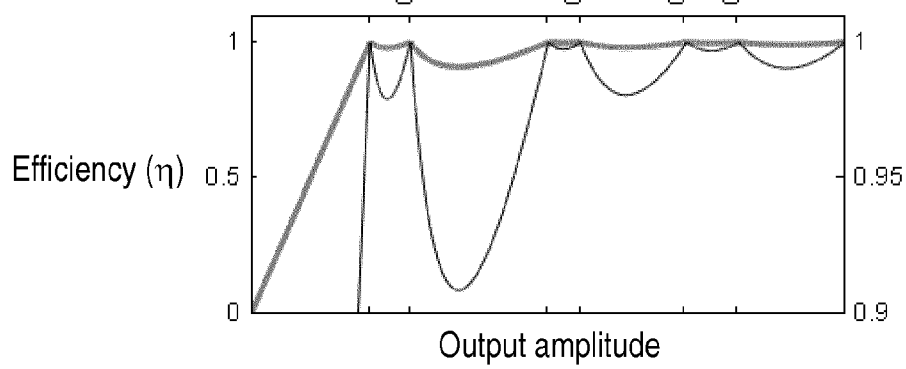

FIG. 40c shows a plot of voltage against output amplitude for the seven-stage embodiment of the present invention as shown in FIG. 40a. FIG. 40d shows a plot of efficiency against output amplitude for the seven-stage embodiment of the present invention as shown in FIG. 40a.

Figure 41A:
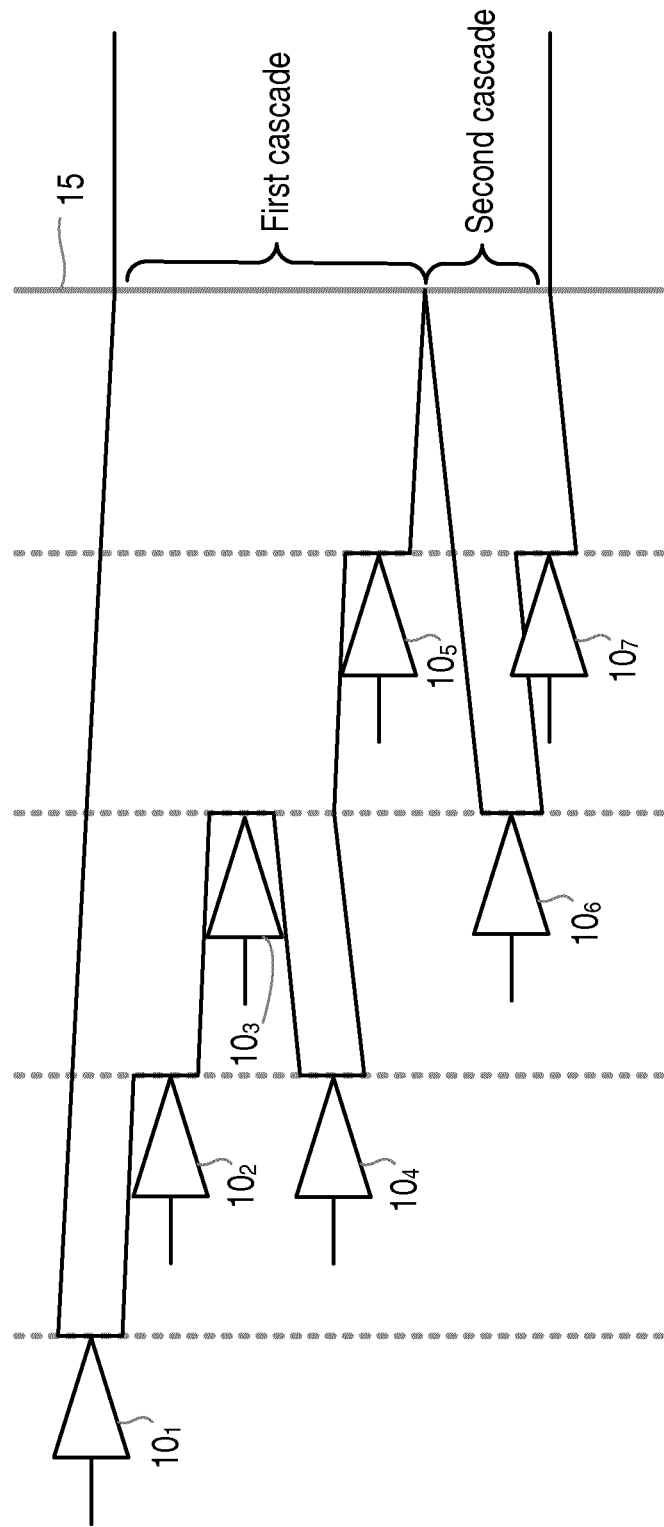

In FIG. 41a the first cascade comprises five amplifier stages $10_1$ to $10_5$, and the second cascade comprises two amplifier stages $10_6$ to $10_7$. Each of the amplifier stages is coupled directly to its respective junction, apart from the fourth amplifier stage $10_4$, which is connected by a connecting quarter wavelength transmission line to its respective junction.

Figure 41B:
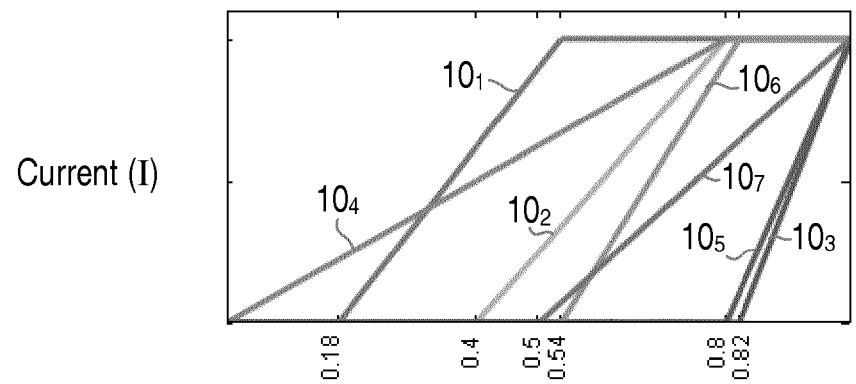

FIG. 41b shows a plot of current against output amplitude for the seven-stage embodiment of the present invention as shown in FIG. 41a. The order of the amplifier starting points in this example is amplifier $10_4$ starting at zero, amplifier $10_1$ starting at 0.18 of full output amplitude, amplifier $10_2$ starting at 0.4 of full output amplitude, amplifier $10_7$ starting at 0.5 of full output amplitude, amplifier $10_6$ starting at 0.54 of full output amplitude, amplifier $10_5$ starting at 0.8 of full output amplitude, and amplifier $10_3$ starting at 0.82 of full output amplitude.

Figure 41C:
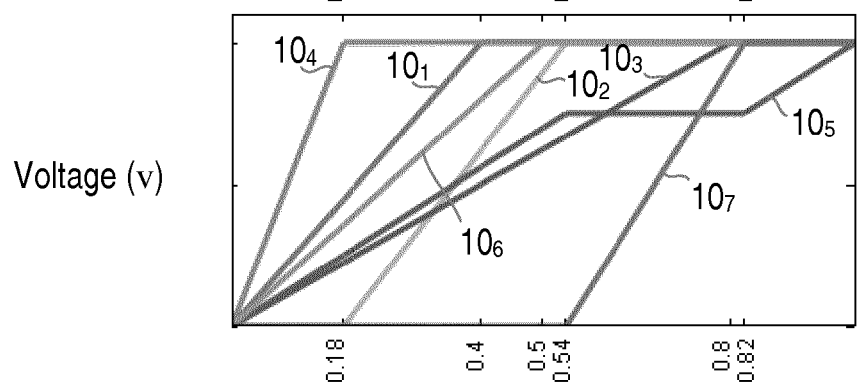
Figure 41D:
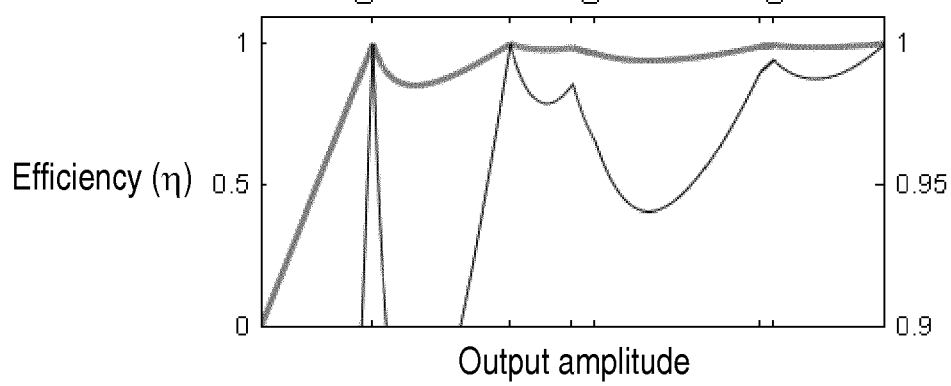

FIG. 41c shows a plot of voltage against output amplitude for the seven-stage embodiment of the present invention as shown in FIG. 41a. FIG. 41d shows a plot of efficiency against output amplitude for the seven-stage embodiment of the present invention as shown in FIG. 41a.

Figure 42A:
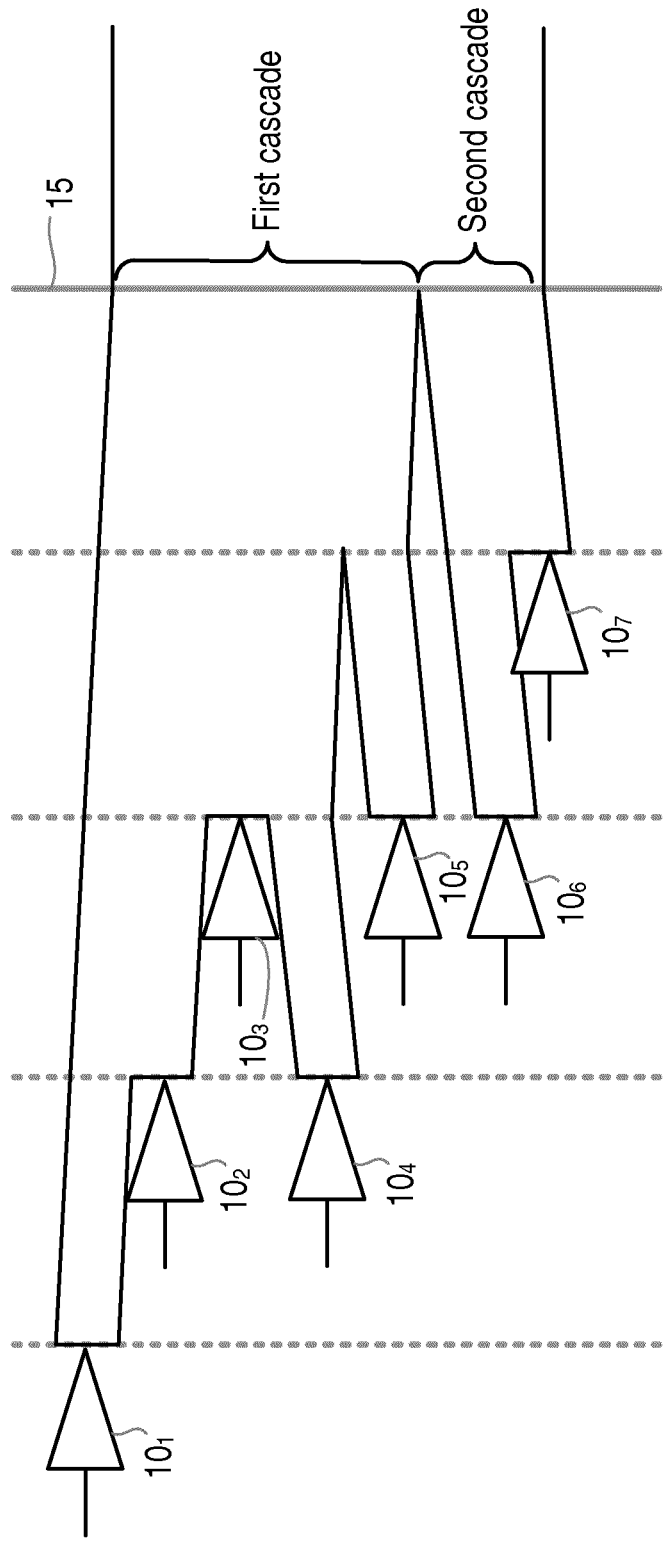

In FIG. 42a the first cascade comprises five amplifier stages $10_1$ to $10_5$, and the second cascade comprises two amplifier stages $10_6$ to $10_7$. Each of the amplifier stages is coupled directly to its respective junction, apart from the fourth and fifth amplifier stages $10_4$ and $10_5$, which are connected by connecting quarter wavelength transmission lines to their respective junctions.

Figures 42B, 42C, 42D:
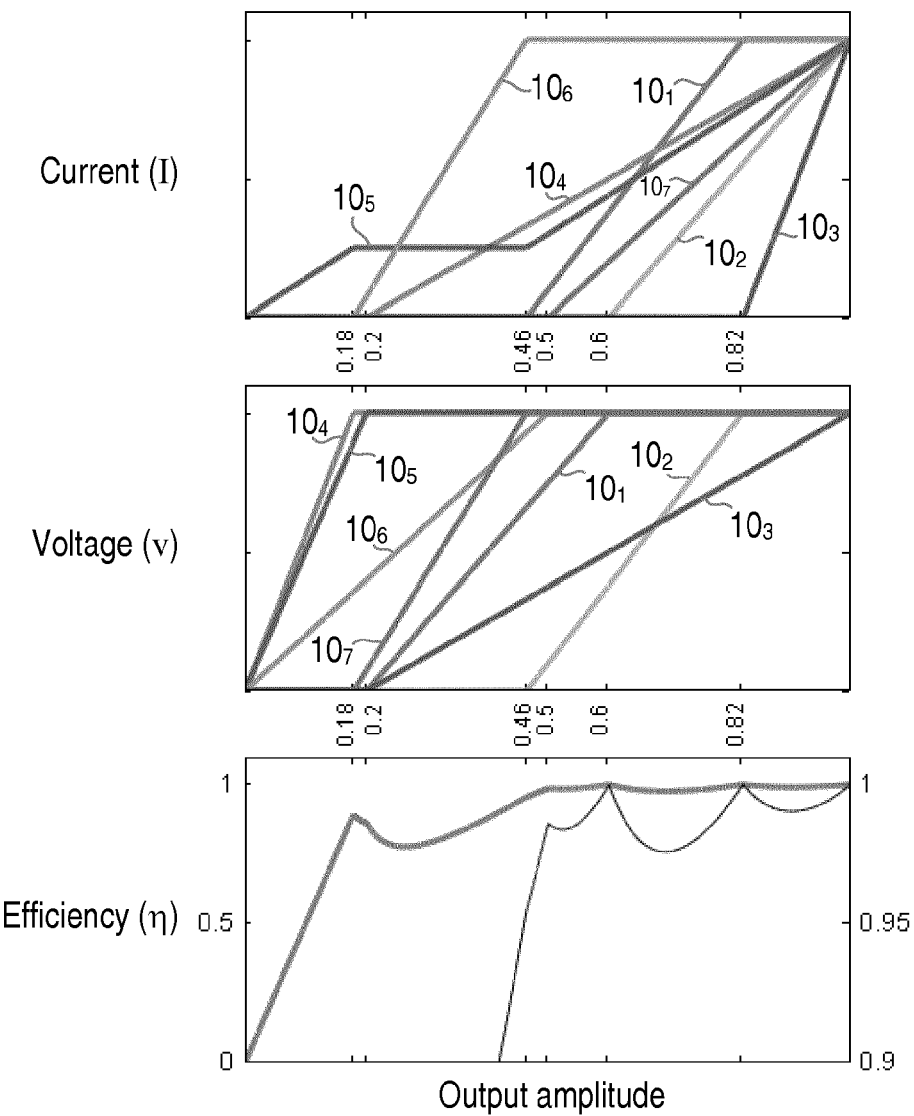

FIG. 42b shows a plot of current against output amplitude for the seven-stage embodiment of the present invention as shown in FIG. 42a. The order of the amplifier starting points in this example is amplifier $10_5$ starting at zero, amplifier $10_6$ starting at 0.18 of full output amplitude, amplifier $10_4$ starting at 0.2 of full output amplitude, amplifier $10_1$ starting at 0.46 of full output amplitude, amplifier $10_7$ starting at 0.5 of full output amplitude, amplifier $10_2$ starting at 0.6 of full output amplitude, and amplifier $10_3$ starting at 0.82 of full output amplitude.

FIG. 42c shows a plot of voltage against output amplitude for the seven-stage embodiment of the present invention as shown in FIG. 42a. FIG. 42d shows a plot of efficiency against output amplitude for the seven-stage embodiment of the present invention as shown in FIG. 42a.

Figure 43A:
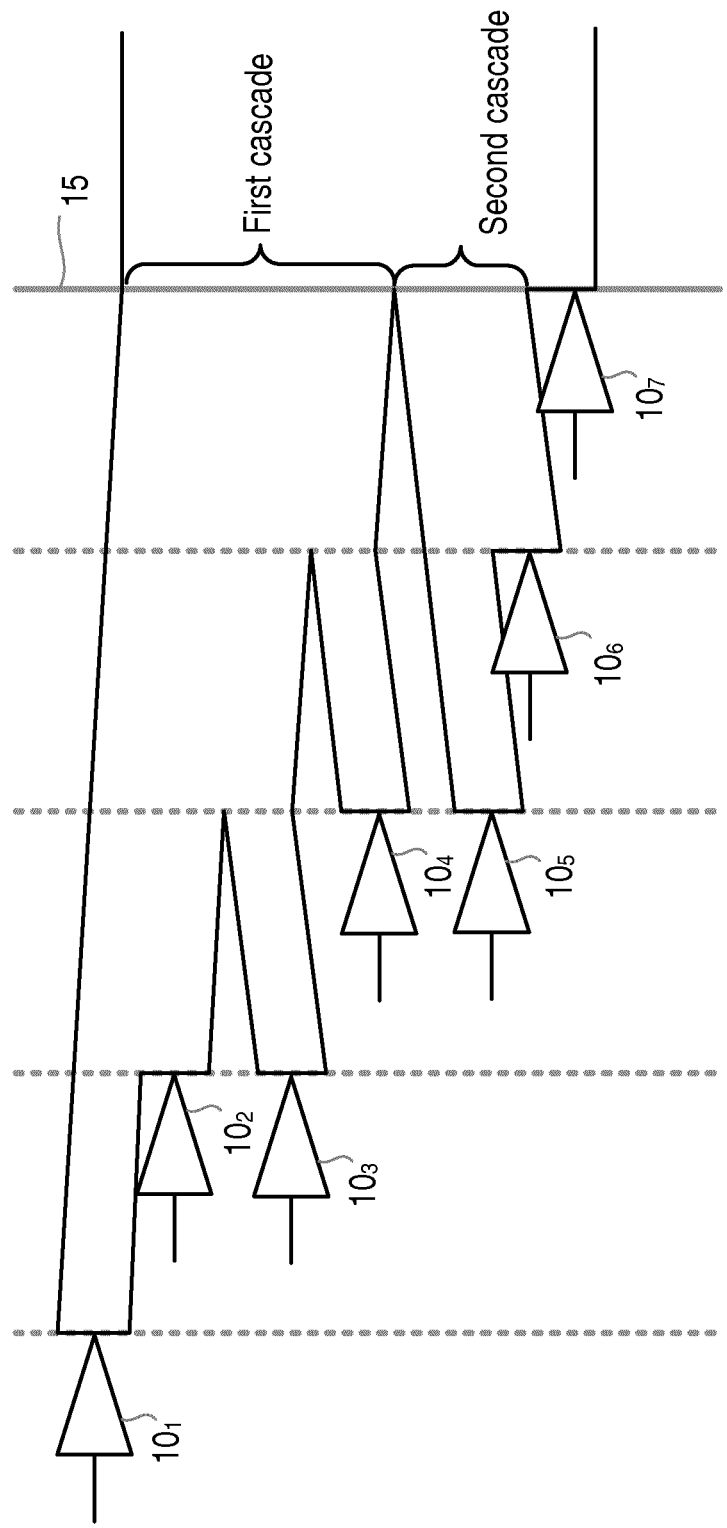

In FIG. 43a the first cascade comprises four amplifier stages $10_1$ to $10_4$, and the second cascade comprises two amplifier stages $10_5$ to $10_6$, with the seventh amplifier stage $10_7$ (effectively a third cascade stage) being coupled to the junction at the output. Each of the amplifier stages is coupled directly to its respective junction, apart from the third and fourth amplifier stages $10_3$ and $10_4$, which are connected by connecting quarter wavelength transmission lines to their respective junctions.

Figure 43B:
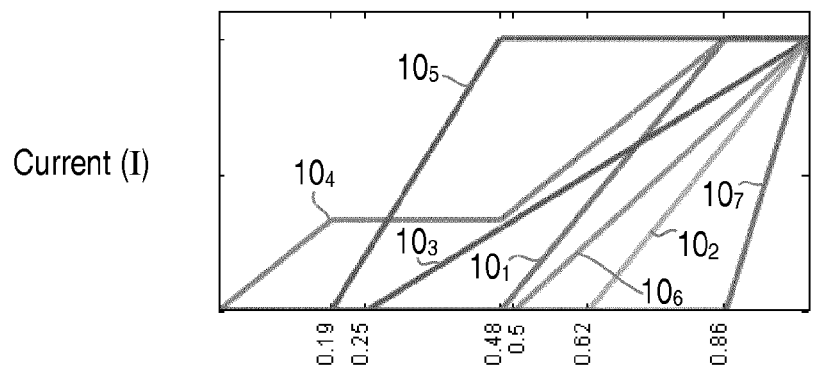

FIG. 43b shows a plot of current against output amplitude for the seven-stage embodiment of the present invention as shown in FIG. 43a. The order of the amplifier starting points in this example is amplifier $10_4$ starting at zero, amplifier $10_5$ starting at 0.19 of full output amplitude, amplifier $10_3$ starting at 0.25 of full output amplitude, amplifier $10_1$ starting at 0.48 of full output amplitude, amplifier $10_6$ starting at 0.5 of full output amplitude, amplifier $10_2$ starting at 0.62 of full output amplitude, and amplifier $10_7$ starting at 0.86 of full output amplitude.

Figure 43C:
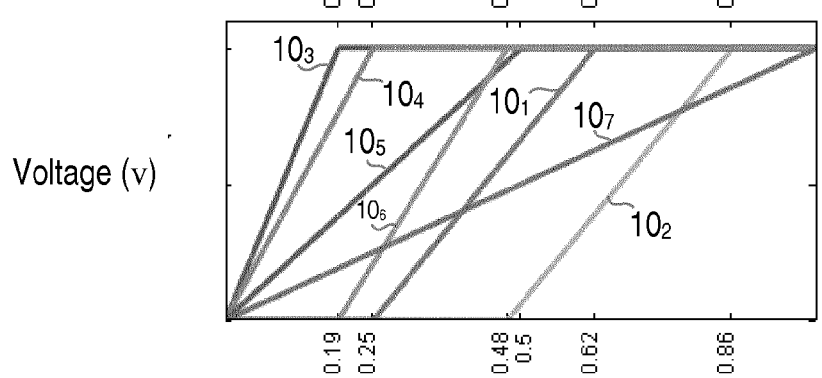
Figure 43D:
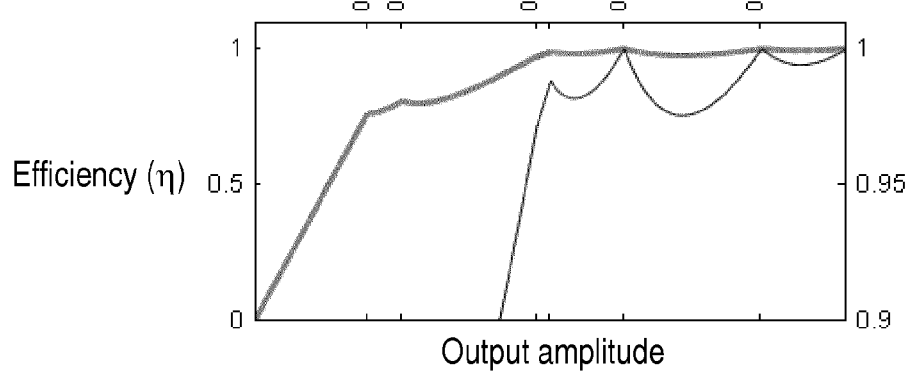

FIG. 43c shows a plot of voltage against output amplitude for the seven-stage embodiment of the present invention as shown in FIG. 43a. FIG. 43d shows a plot of efficiency against output amplitude for the seven-stage embodiment of the present invention as shown in FIG. 43a.

Figure 44A:
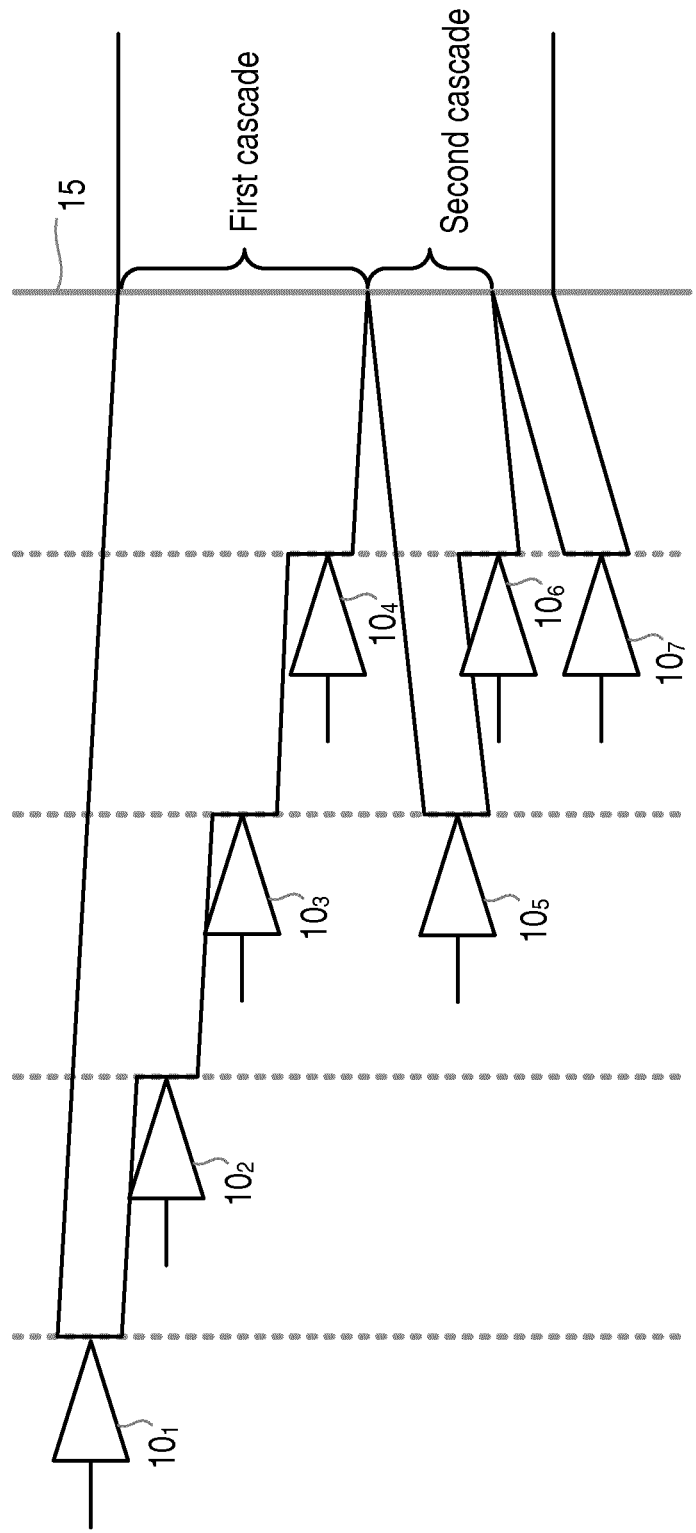

In FIG. 44a the first cascade comprises four amplifier stages $10_1$ to $10_4$, and the second cascade comprises two amplifier stages $10_5$ to $10_6$, with the seventh amplifier stage $10_7$ (effectively a third cascade stage) being coupled to the junction at the output via a connecting quarter wavelength transmission line. Each of the amplifier stages is coupled directly to its respective junction, apart from the seventh amplifier stage $10_7$, which is connected by a connecting quarter wavelength transmission line to its respective junction.

Figure 44B:
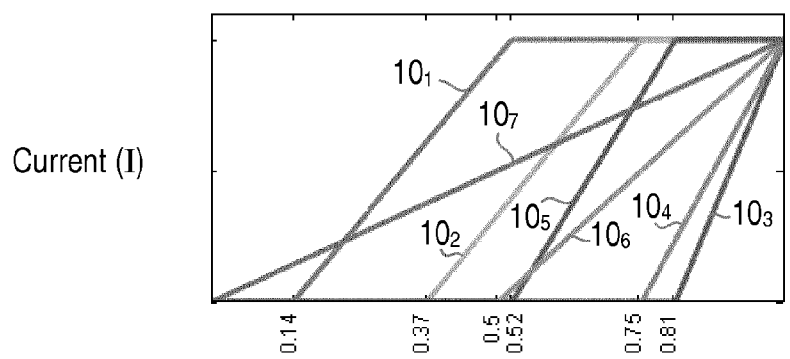

FIG. 44b shows a plot of current against output amplitude for the seven-stage embodiment of the present invention as shown in FIG. 44a. The order of the amplifier starting points in this example is amplifier $10_7$ starting at zero, amplifier $10_1$ starting at 0.14 of full output amplitude, amplifier $10_2$ starting at 0.37 of full output amplitude, amplifier $10_6$ starting at 0.5 of full output amplitude, amplifier $10_5$ starting at 0.52 of full output amplitude, amplifier $10_4$ starting at 0.75 of full output amplitude, and amplifier $10_3$ starting at 0.81 of full output amplitude.

Figure 44C:
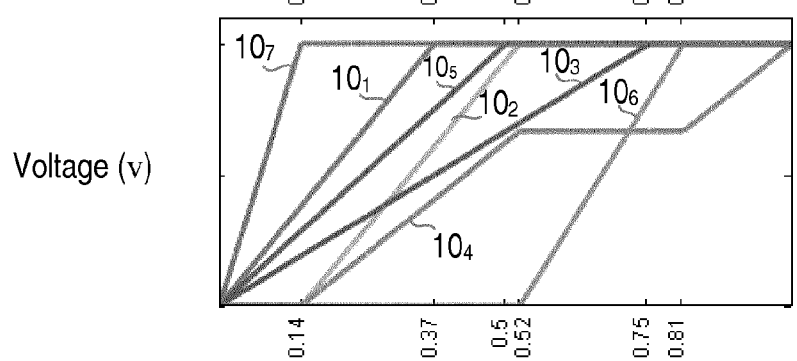
Figure 44D:
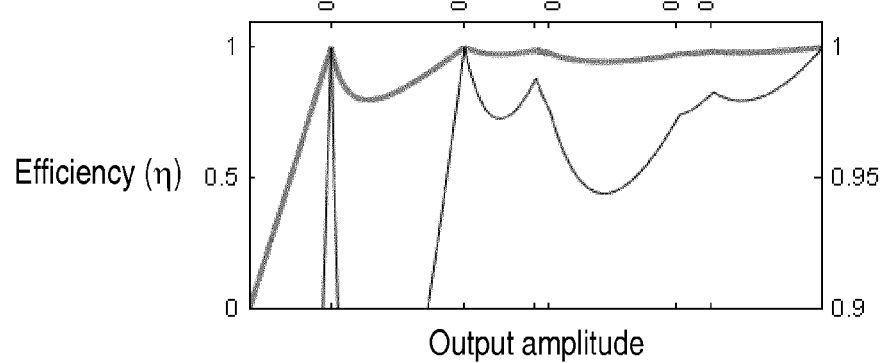

FIG. 44c shows a plot of voltage against output amplitude for the seven-stage embodiment of the present invention as shown in FIG. 44a. FIG. 44d shows a plot of efficiency against output amplitude for the seven-stage embodiment of the present invention as shown in FIG. 44a.

It is noted that embodiments of the present invention can be extended to any number of amplifiers stages, and the number of possible implementations expands enormously. An example of an 11-stage implementation is shown in FIG. 45a, to illustrate how an example of a 11-stage implementation may be provided.

Figure 45A:
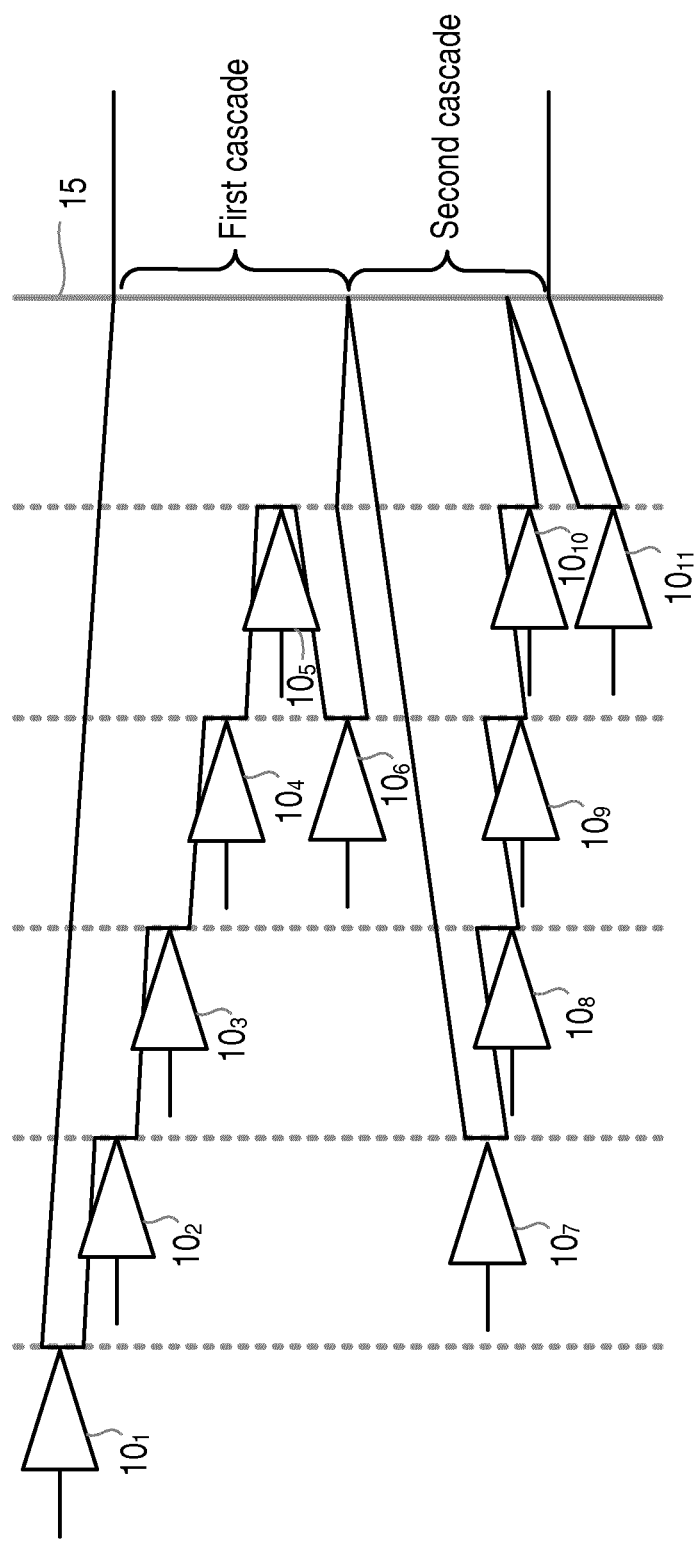
FIG. 45a shows an example of a eleven-stage amplifier arrangement according to another embodiment of the present invention.

In FIG. 45a a first cascade comprises six amplifier stages $10_1$ to $10_6$, and a second cascade comprises four amplifier stages $10_7$ to $10_{10}$, with the eleventh amplifier stage $10_{11}$ (effectively a third cascade stage) being coupled to the junction at the output. Each of the amplifier stages is coupled directly to its respective junction, apart from the sixth and eleventh amplifier stages $10_6$ and $10_{11}$ in this example, which are connected by connecting quarter wavelength transmission lines to their respective junctions.

Figures 45B, 45C, 45D:
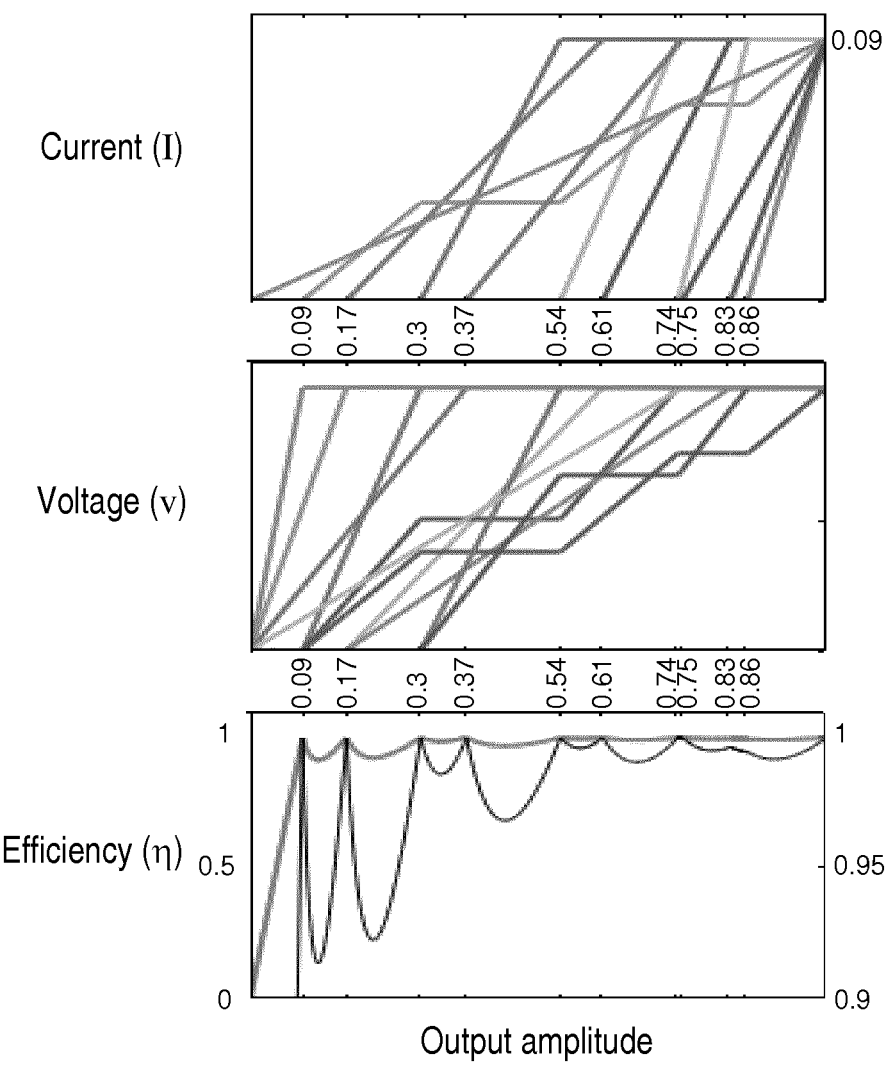

FIG. 45b shows a plot of current against output amplitude for the eleven-stage embodiment of the present invention as shown in FIG. 45a. FIG. 45c shows a plot of voltage against output amplitude for the eleven-stage embodiment of the present invention as shown in FIG. 45a. FIG. 45d shows a plot of efficiency against output amplitude for the eleven-stage embodiment of the present invention as shown in FIG. 45a. An interesting feature with this embodiment is that there are both a voltage and a current with two flat-amplitude regions.

It can be noted from the examples described above that some of the efficiency curves of the examples with all-equal-sized amplifiers stages provide good average efficiency with the medium to high PAR amplitude distributions encountered in communications systems. However, other examples have transition points that are more clustered that would be desired, thus making inefficient use of the number of amplifier stages, or having transition points where the efficiency have not yet reached maximum.

An optimal transition point (efficiency peak) distribution can be achieved by allowing any combination of maximum output powers and corresponding transmission line impedances. This is nearly achievable for example in some MMIC implementations, wherein the smallest transistor size difference is determined by the output power of a unity cell of which usually a large number are combined to make a full transistor.

When designing power amplifiers with prefabricated transistors only a small selection of transistor sizes is generally available, either packaged from the manufacturer or by paralleling by the designer.

An advantageous feature of the present invention is the large number of different embodiments that may be realized (especially for larger numbers of amplifier stages), which means that there are many possibilities for finding an amplifier structure that matches a set of transistor/amplifier sizes to give a good efficiency curve.

The following examples provide an illustration of what may be achieved where a selection of only two different (integer related) amplifier sizes are available. It is noted that more than two different sized amplifier stages may be used, if desired, without departing from the scope of the invention as defined in the appended claims.

Figure 46A:
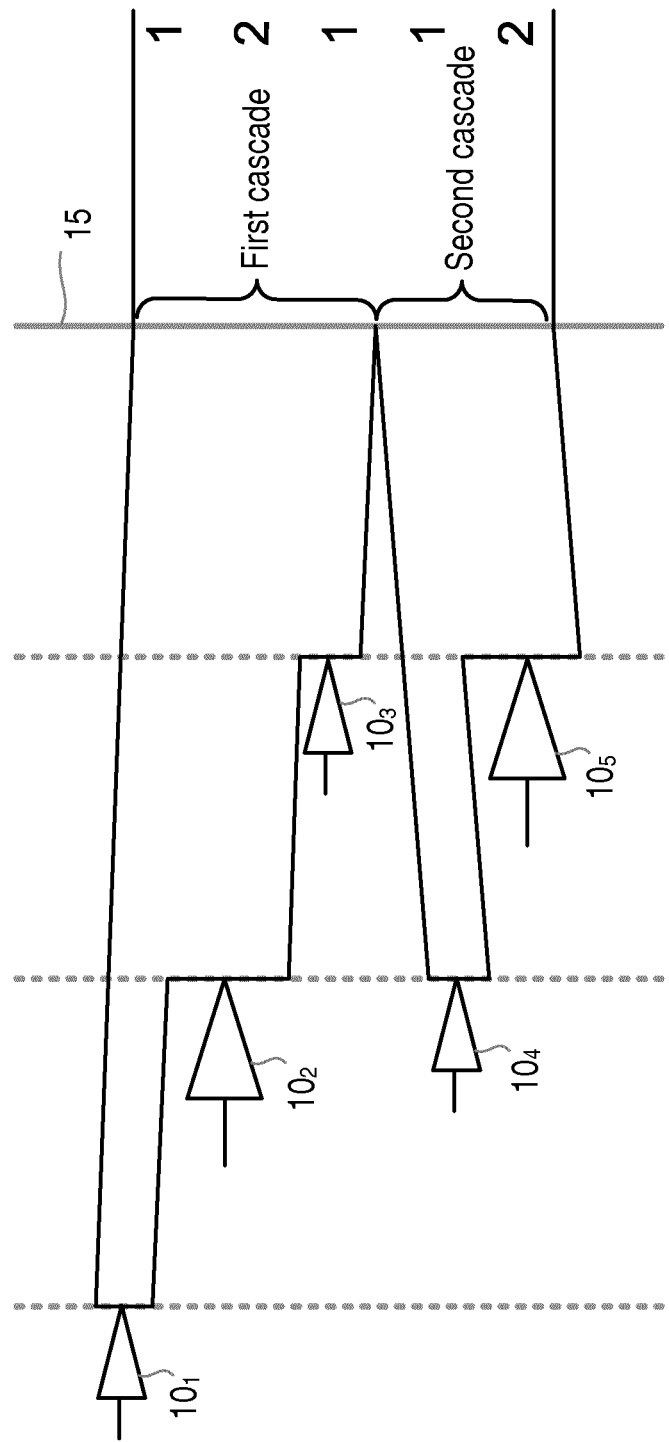
Figure 47A:
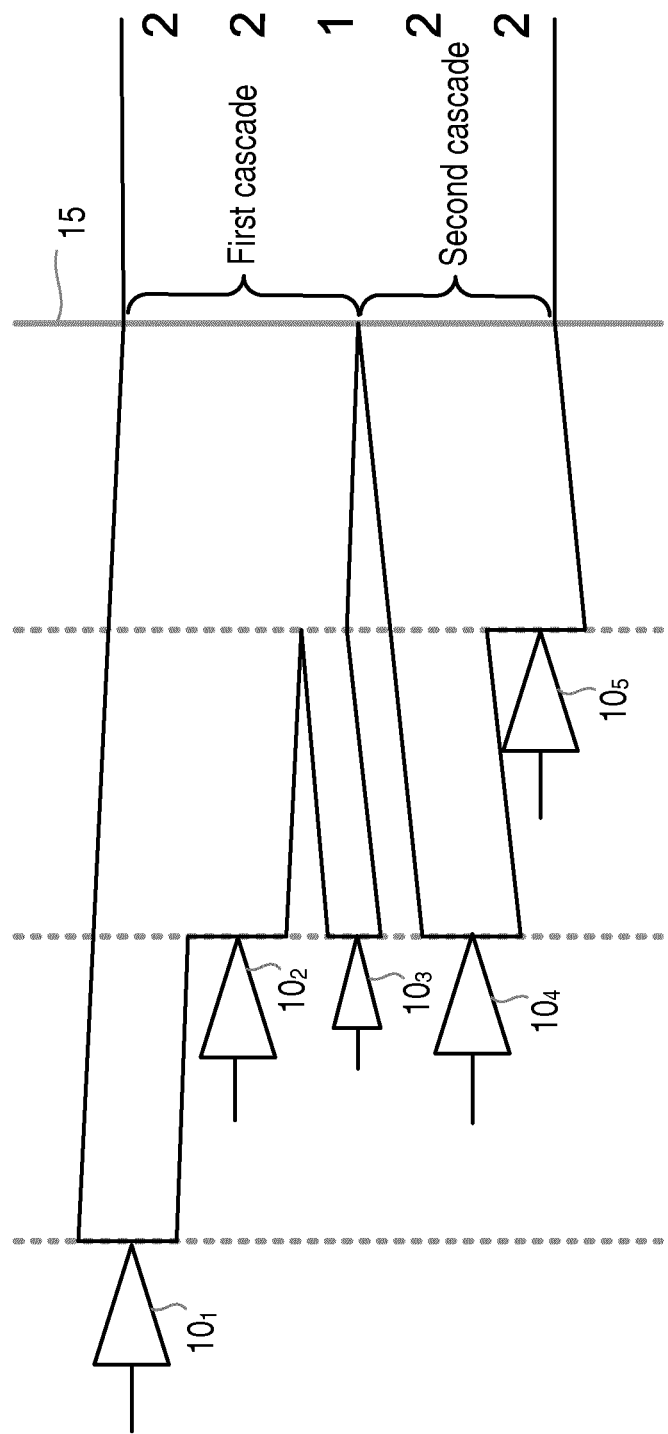

FIGS. 46a and 47a illustrate examples of five-stage amplifier structures that work well with transistor sizes (or parallel combinations) with a 1-to-2 size relationship.

In FIG. 46a this example uses three smaller sized amplifiers (transistors), i.e. amplifier stages $10_1$, $10_3$ and $10_4$, and two larger sized amplifiers (transistors) sizes, i.e. amplifier stages $10_2$ and $10_5$. It is noted that the characteristic impedance of the quarter wavelength cascade is altered to match the different transistor sizes, as shown by the different thicknesses (illustrated by references "1" and "2" to shows the relevant thicknesses).

As such, at least one amplifier stage is reduced in size compared to the other amplifier stages by a predetermined ratio, and wherein a characteristic impedance of a corresponding quarter wavelength transmission line and/or connecting quarter wavelength transmission line is increased by a corresponding ratio compared to the characteristic impedance of each of the other quarter wavelength transmission lines and/or connecting quarter wavelength transmission lines.

Figure 46B:
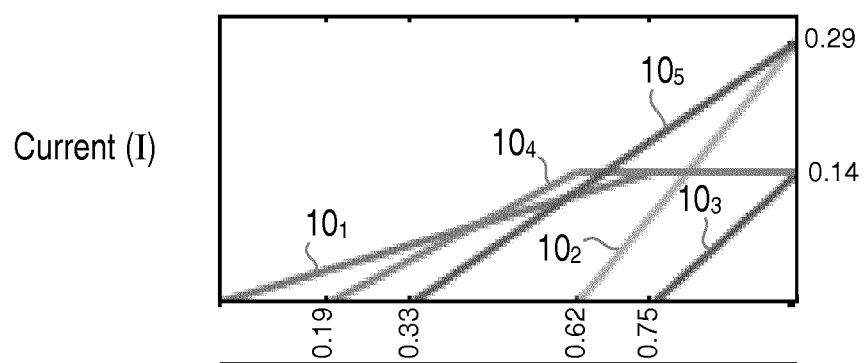

FIG. 46b shows a plot of current against output amplitude for the five-stage embodiment of the present invention as shown in FIG. 46a. The order of the amplifier starting points in this example is amplifier $10_1$ starting at zero, amplifier $10_4$ starting at 0.19 of full output amplitude, amplifier $10_5$ starting at 0.33 of full output amplitude, amplifier $10_2$ starting at 0.62 of full output amplitude, and amplifier $10_3$ starting at 0.75 of full output amplitude.

Figure 46C:
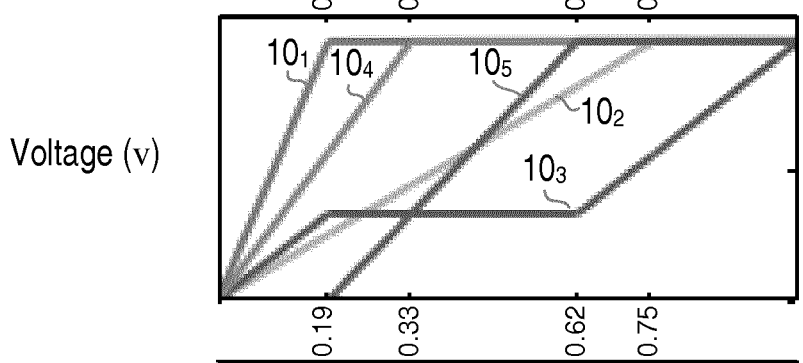
Figure 46D:
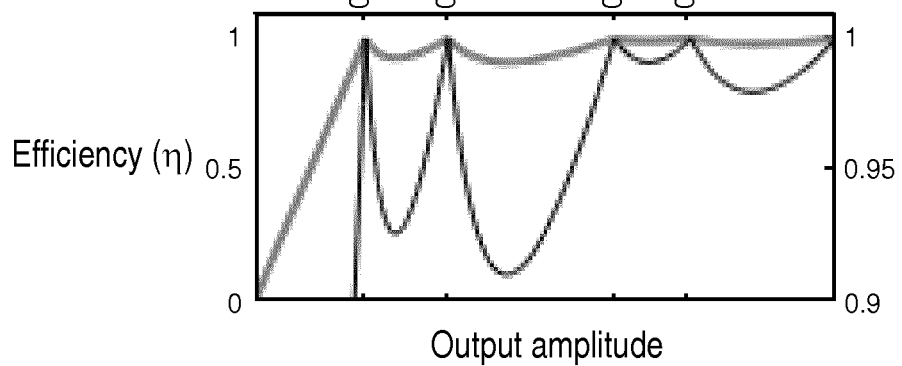

FIG. 46c shows a plot of voltage against output amplitude for the five-stage embodiment of the present invention as shown in FIG. 46a. FIG. 46d shows a plot of efficiency against output amplitude for the five-stage embodiment of the present invention as shown in FIG. 46a.

In FIG. 47a this example uses one transistor half the size of the others (the third amplifier stage $10_3$). As above, the characteristic impedance of the quarter wavelength cascade is altered to match the different transistor sizes, as shown by the different thicknesses (illustrated by references "1" and "2" to shows the relevant thicknesses).

Figure 47B:
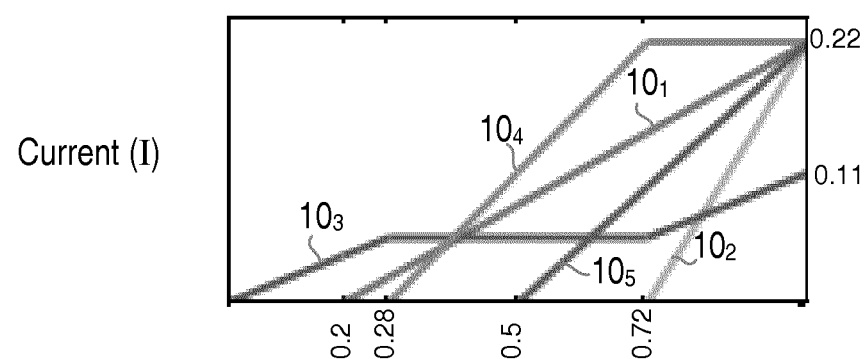

FIG. 47b shows a plot of current against output amplitude for the five-stage embodiment of the present invention as shown in FIG. 47a. The order of the amplifier starting points in this example is amplifier $10_3$ starting at zero, amplifier $10_1$ starting at 0.2 of full output amplitude, amplifier $10_4$ starting at 0.28 of full output amplitude, amplifier $10_5$ starting at 0.5 of full output amplitude, and amplifier $10_2$ starting at 0.72 of full output amplitude.

Figure 47C:
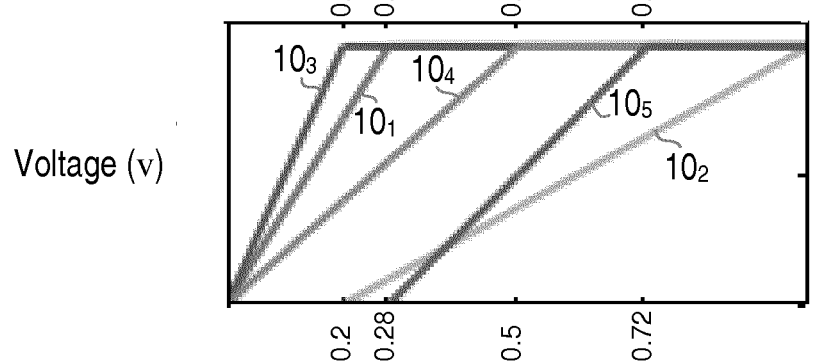
Figure 47D:
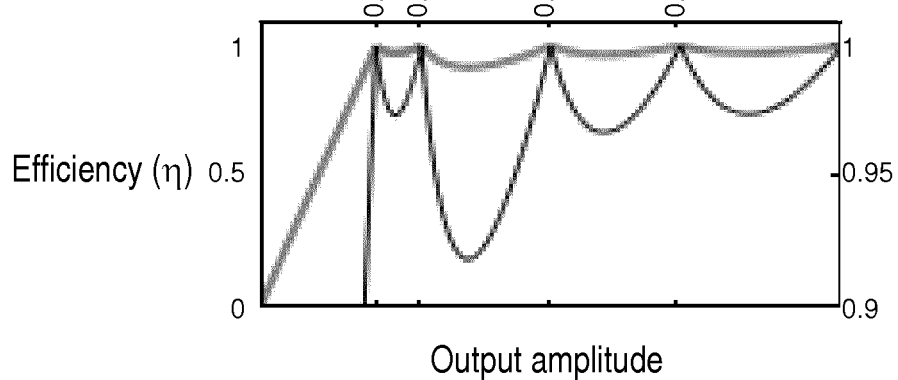

FIG. 47c shows a plot of voltage against output amplitude for the five-stage embodiment of the present invention as shown in FIG. 47a. FIG. 47d shows a plot of efficiency against output amplitude for the five-stage embodiment of the present invention as shown in FIG. 47a.

Different sized amplifiers can be used with any number of amplifier stages, for example having rations other than 1-to-2.

Figure 48A:
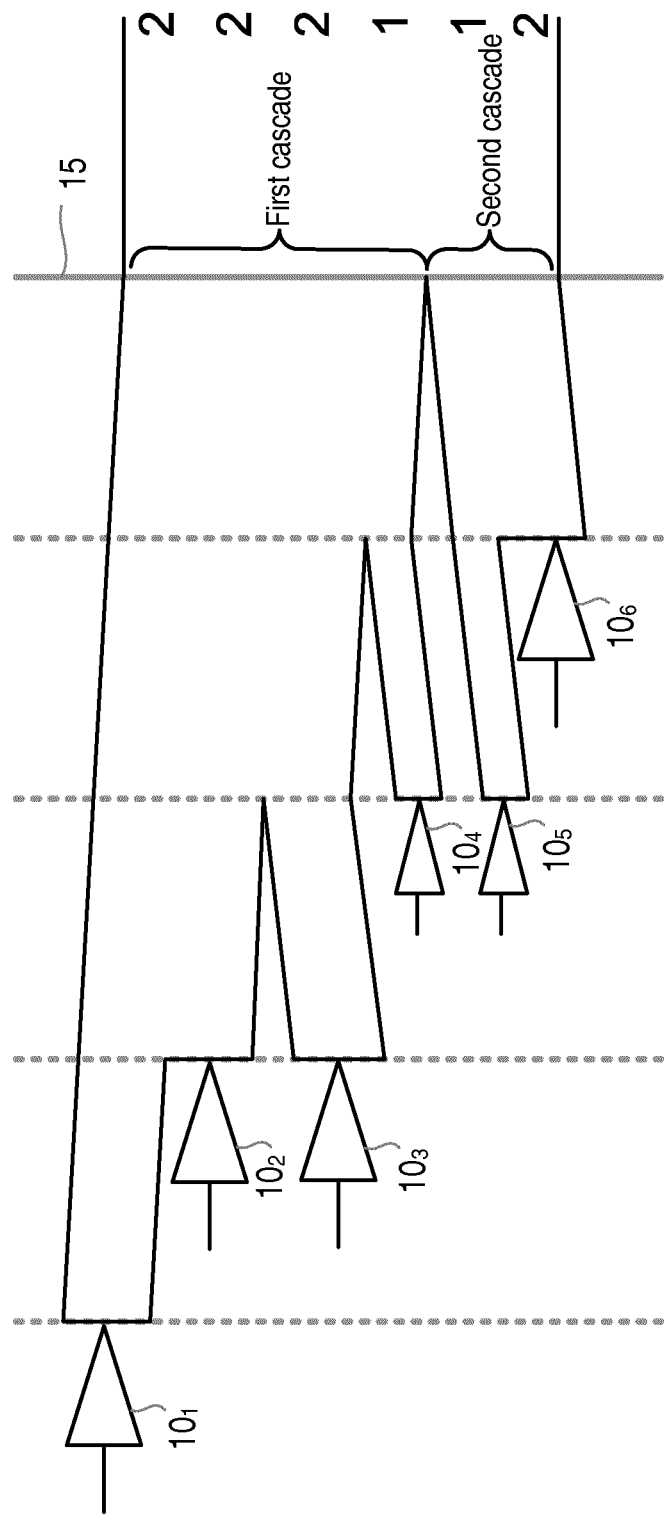
Figure 49A:
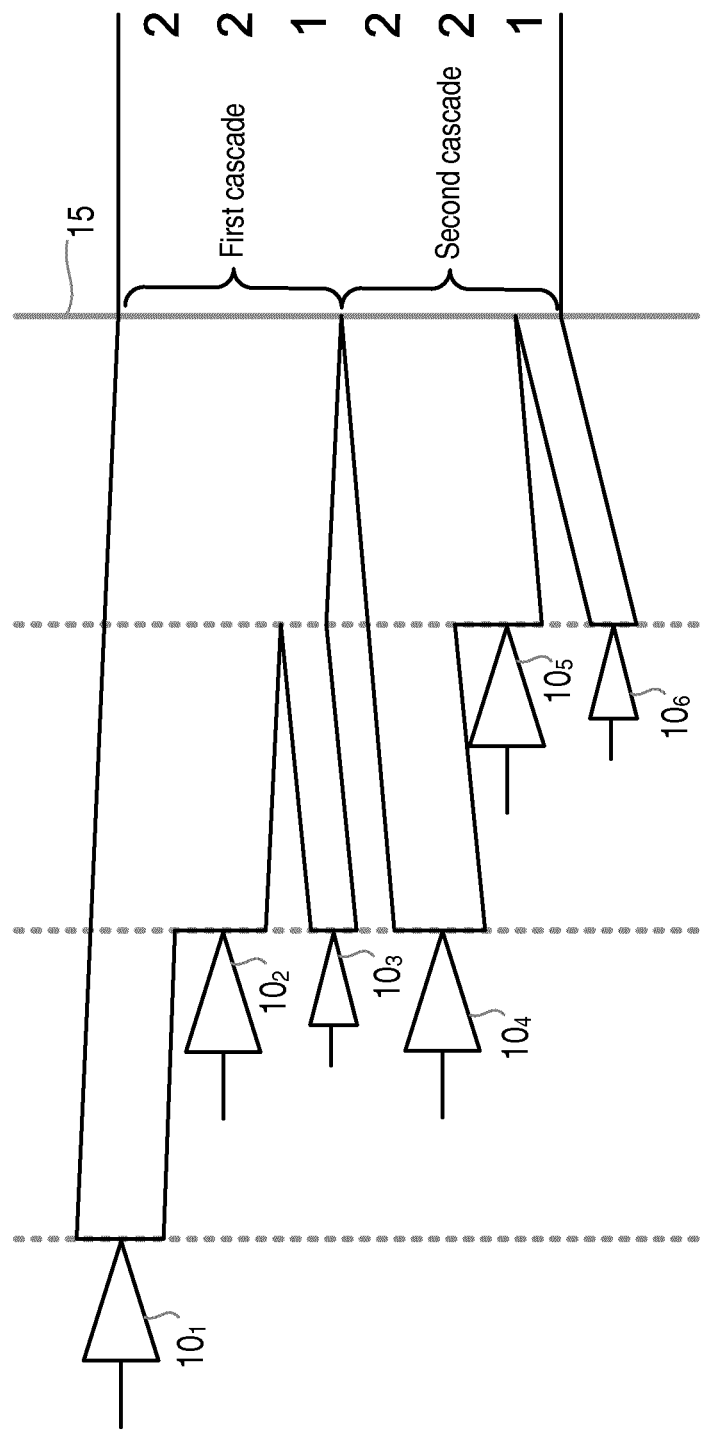

FIGS. 48a and 49a are just two examples of six-stage amplifier structures according to further embodiments of the invention. These examples having amplifier stages in a 2-to-1 size relation have been found to be particularly advantageous when using two small amplifiers and four large amplifiers, although other combinations may also be used.

In the example of FIG. 48a the fourth and fifth amplifier stages $10_4$ and $10_5$ are smaller than the other amplifier stages (with those sections of the cascade of quarter wavelength transmission lines having their characteristic impedance increased accordingly, i.e. doubled, as shown by the thinner lines for amplifier stages $10_4$ and $10_5$). It is noted that the embodiment of FIG. 48a is suitable for operation with around 10 dB PAR Rayleigh distributed amplitudes.

FIG. 48b shows a plot of current against output amplitude for the six-stage embodiment of the present invention as shown in FIG. 48a. The order of the amplifier starting points in this example is amplifier $10_4$ starting at zero, amplifier $10_3$ starting at 0.14 of full output amplitude, amplifier $10_5$ starting at 0.23 of full output amplitude, amplifier $10_6$ starting at 0.33 of full output amplitude, amplifier $10_1$ starting at 0.53 of full output amplitude, and amplifier $10_2$ starting at 0.57 of full output amplitude.

FIG. 48c shows a plot of voltage against output amplitude for the six-stage embodiment of the present invention as shown in FIG. 48a. FIG. 48d shows a plot of efficiency against output amplitude for the six-stage embodiment of the present invention as shown in FIG. 48a.

In the example of FIG. 49a the third and sixth amplifier stages $10_3$ and $10_6$ are smaller than the other amplifier stages (with those sections of the cascade of quarter wavelength transmission lines having their characteristic impedance increased accordingly, i.e. by the same factor, e.g. doubled in this example, as shown by the thinner lines for amplifier stages $10_3$ and $10_6$). It is noted that the embodiment of FIG. 49a operates with good efficiency over a large span of PAR values.

Figure 49B:
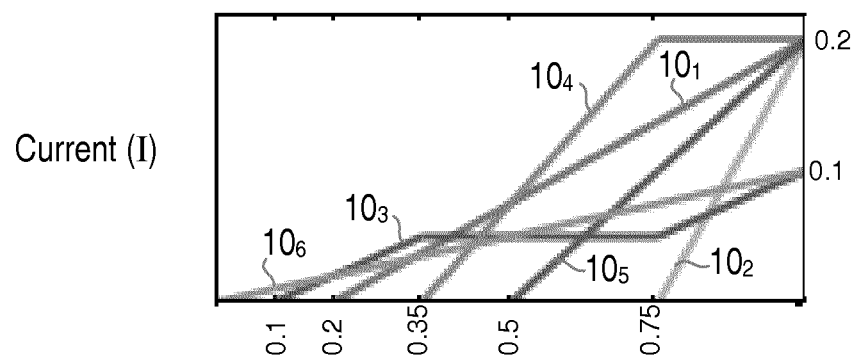

FIG. 49b shows a plot of current against output amplitude for the six-stage embodiment of the present invention as shown in FIG. 49a. The order of the amplifier starting points in this example is amplifier $10_6$ starting at zero, amplifier $10_3$ starting at 0.1 of full output amplitude, amplifier $10_1$ starting at 0.2 of full output amplitude, amplifier $10_4$ starting at 0.35 of full output amplitude, amplifier $10_5$ starting at 0.5 of full output amplitude, and amplifier $10_2$ starting at 0.75 of full output amplitude.

Figure 49C:
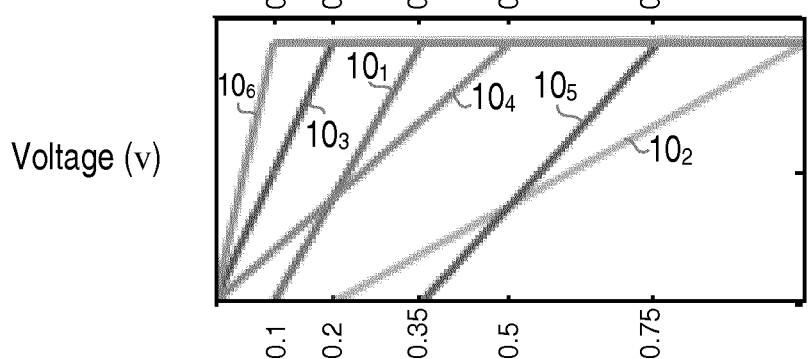
Figure 49D:
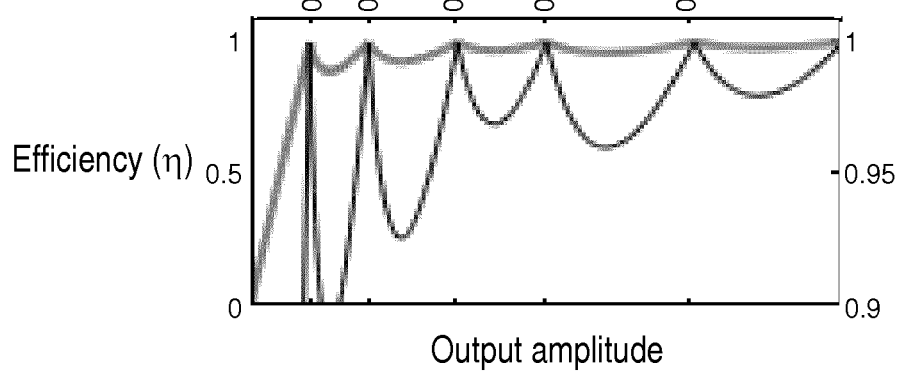

FIG. 49c shows a plot of voltage against output amplitude for the six-stage embodiment of the present invention as shown in FIG. 49a. FIG. 49d shows a plot of efficiency against output amplitude for the six-stage embodiment of the present invention as shown in FIG. 49a.

Figure 50A:
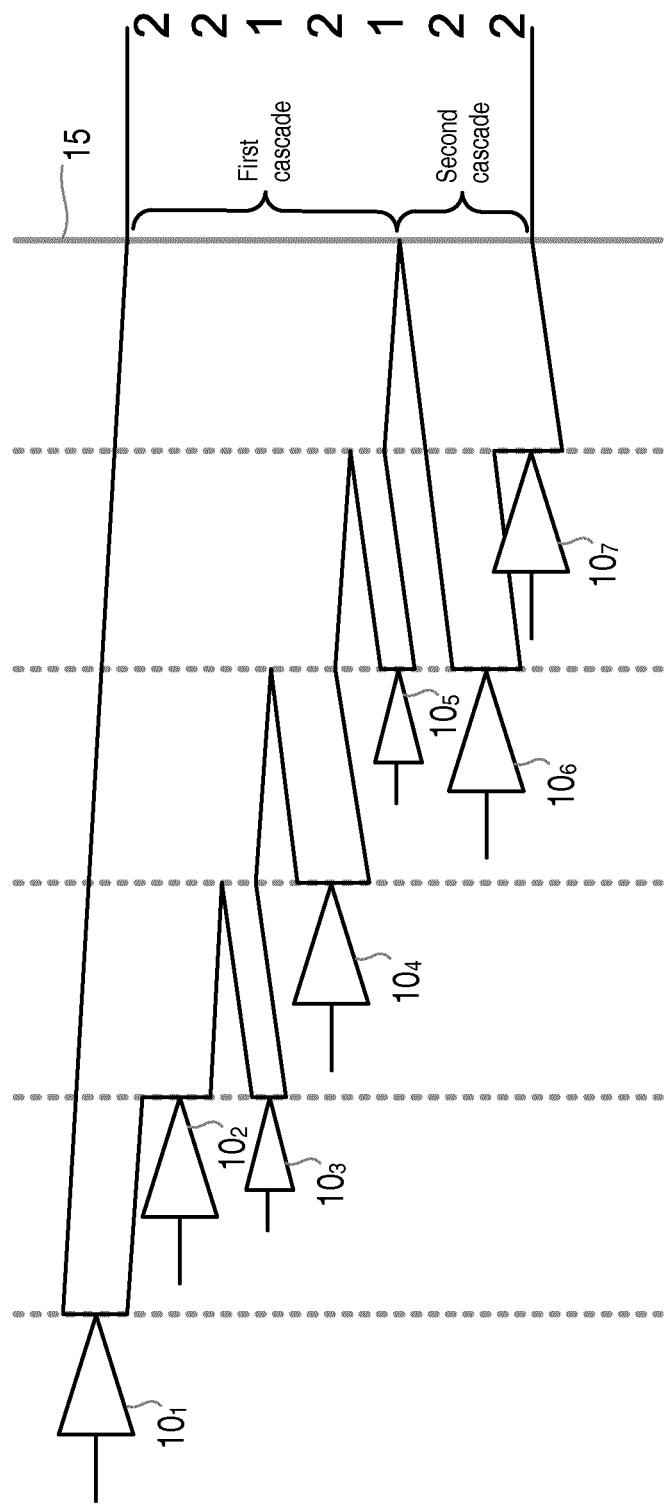
Figure 51A:
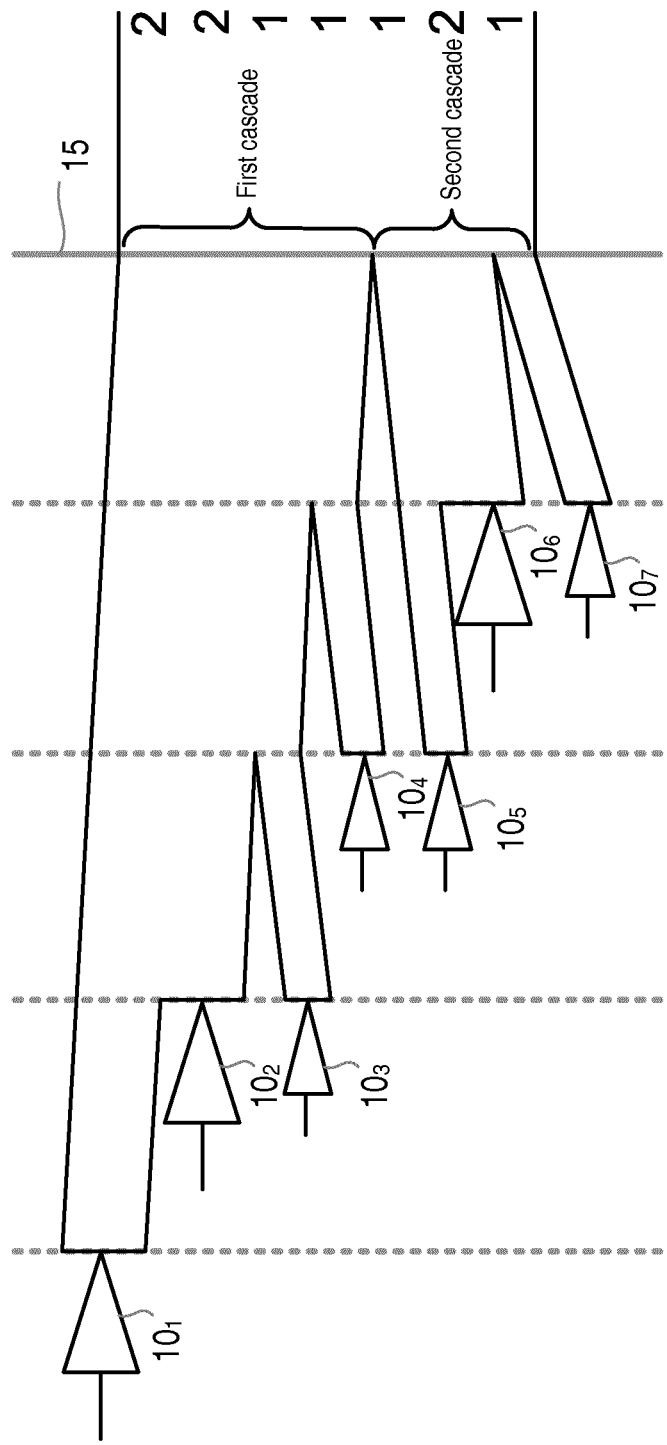

FIGS. 50a and 51a are just two further examples of seven-stage amplifier structures, according to embodiments of the invention. These examples having amplifier stages in a 2-to-1 size relation have been found to be advantageous when using the combinations shown in FIGS. 50a and 51a, although other variations of seven-stage arrangements are also intended to be embraced by the present invention.

In the example of FIG. 50a the third and fifth amplifier stages $10_3$ and $10_5$ are smaller than the other amplifier stages, e.g. halved (with those sections of the cascade of quarter wavelength transmission lines having their characteristic impedance increased accordingly by the same factor, e.g. doubled, as shown by the thinner lines for amplifier stages $10_3$ and $10_5$). It is noted that the embodiment of FIG. 50a provides a fairly even distribution of transition points, as shown below.

Figures 50B, 50C, 50D:
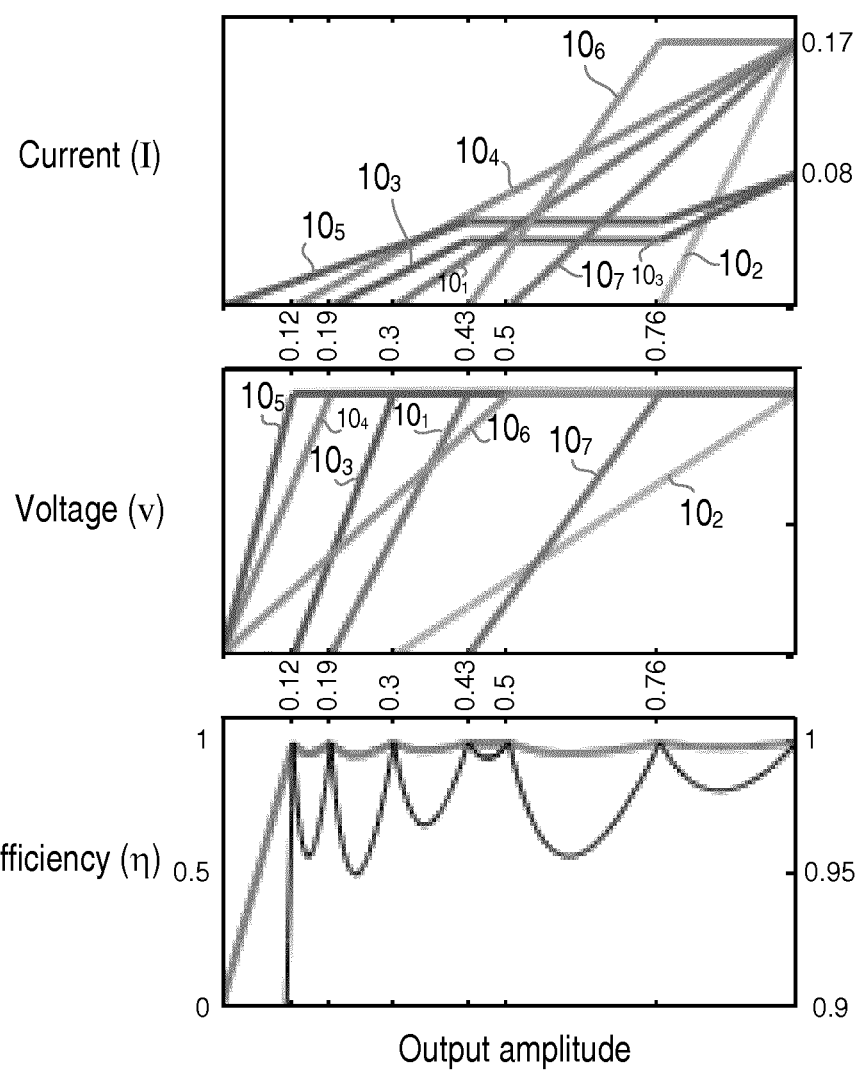

FIG. 50b shows a plot of current against output amplitude for the seven-stage embodiment of the present invention as shown in FIG. 50a. The order of the amplifier starting points in this example is amplifier $10_5$ starting at zero, amplifier $10_4$ starting at 0.12 of full output amplitude, amplifier $10_3$ starting at 0.19 of full output amplitude, amplifier $10_1$ starting at 0.3 of full output amplitude, amplifier $10_6$ starting at 0.43 of full output amplitude, amplifier $10_7$ starting at 0.5 of full output amplitude, and amplifier $10_2$ starting at 0.76 of full output amplitude.

FIG. 50c shows a plot of voltage against output amplitude for the seven-stage embodiment of the present invention as shown in FIG. 50a. FIG. 50d shows a plot of efficiency against output amplitude for the seven-stage embodiment of the present invention as shown in FIG. 50a.

In the example of FIG. 51a the third, fourth, fifth and seventh amplifier stages $10_3$, $10_4$, $10_5$ and $10_7$ are smaller than the other amplifier stages, e.g. halved, (with those sections of the cascade of quarter wavelength transmission lines having their characteristic impedance increased accordingly, e.g. doubled, as shown by the thinner lines for amplifier stages $10_3$, $10_4$, $10_5$ and $10_7$). FIG. 51a therefore has four of the smaller and three of the bigger transistors.

Figures 51B, 51C, 51D:
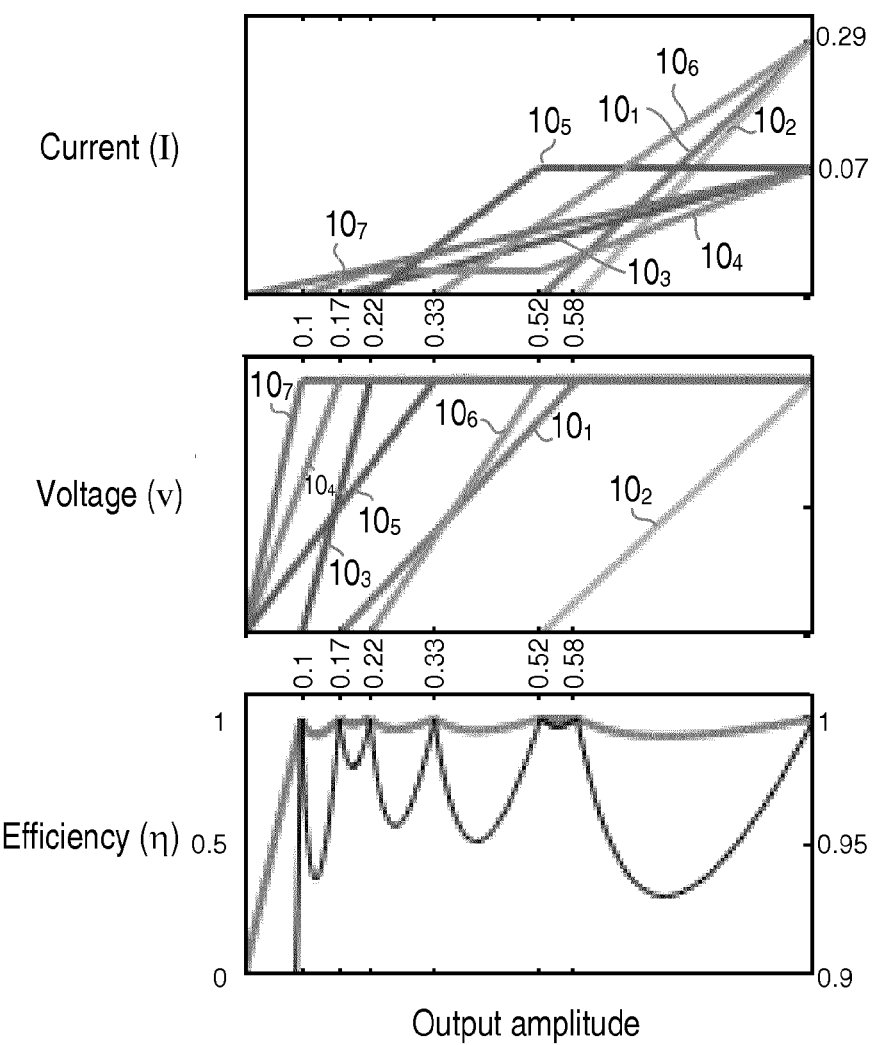

FIG. 51b shows a plot of current against output amplitude for the seven-stage embodiment of the present invention as shown in FIG. 51a. The order of the amplifier starting points in this example is amplifier $10_7$ starting at zero, amplifier $10_4$ starting at 0.11 of full output amplitude, amplifier $10_3$ starting at 0.17 of full output amplitude, amplifier $10_5$ starting at 0.22 of full output amplitude, amplifier $10_6$ starting at 0.33 of full output amplitude, amplifier $10_1$ starting at 0.52 of full output amplitude, and amplifier $10_2$ starting at 0.58 of full output amplitude.

FIG. 51c shows a plot of voltage against output amplitude for the seven-stage embodiment of the present invention as shown in FIG. 51a. FIG. 51d shows a plot of efficiency against output amplitude for the seven-stage embodiment of the present invention as shown in FIG. 51a.

Good efficiency peak distributions can also be achieved with a factor of 4-to-1 size relationship between the amplifier stages.

Figure 52A:
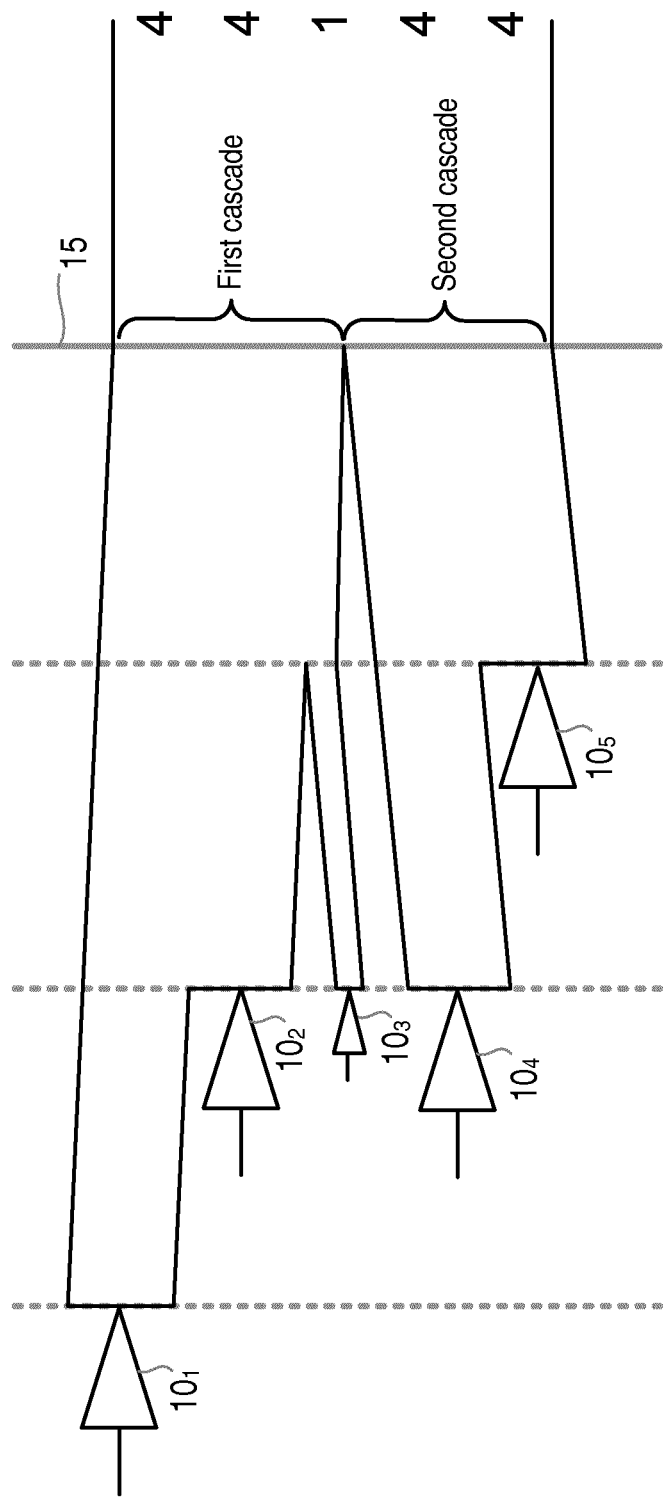

For example, in FIG. 52a there is shown an example of a five-stage amplifier in which the starting amplifier (the third amplifier stage $10_3$) is a fourth of the size of the four other amplifier stages (with the section of the cascade of quarter wavelength transmission lines having its characteristic impedance increased accordingly, i.e. quadrupled, as shown by the thinner quarter wavelength transmission line associated with amplifier stage $10_3$).

Figures 52B, 52C, 52D:
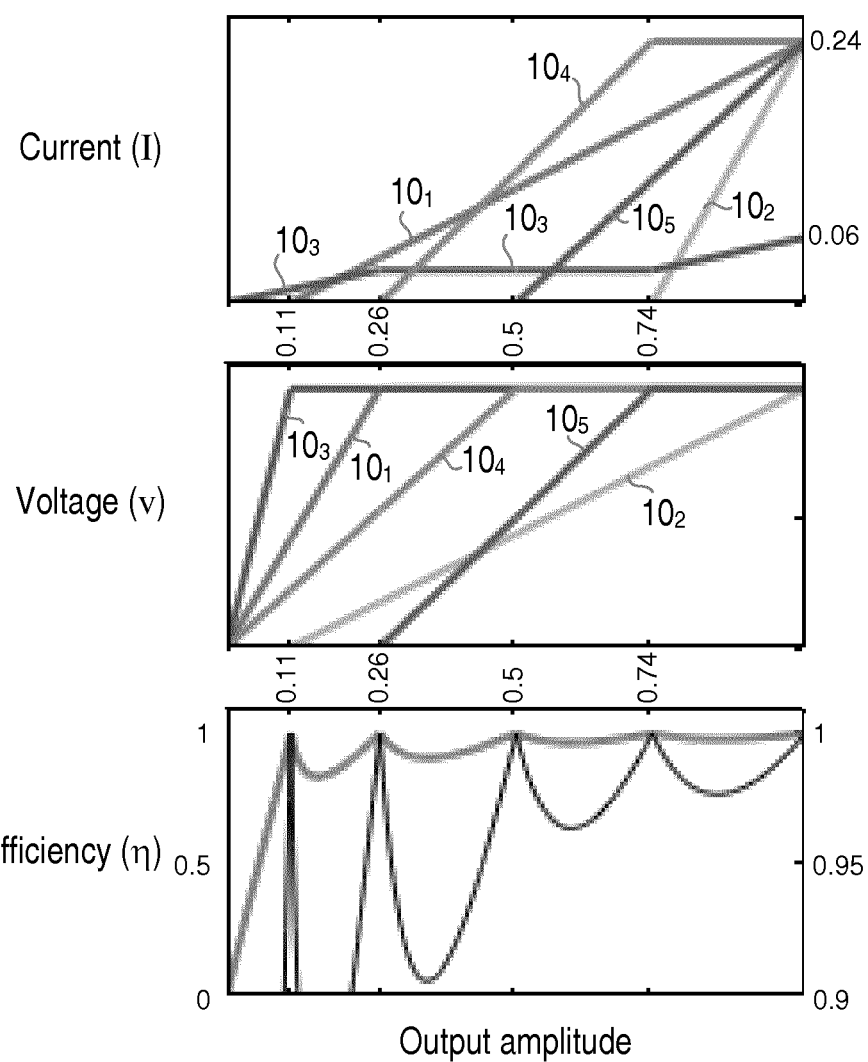

FIG. 52b shows a plot of current against output amplitude for the five-stage embodiment of the present invention as shown in FIG. 52a. The order of the amplifier starting points in this example is amplifier $10_3$ starting at zero, amplifier $10_1$ starting at 0.11 of full output amplitude, amplifier $10_4$ starting at 0.26 of full output amplitude, amplifier $10_5$ starting at 0.5 of full output amplitude, and amplifier $10_2$ starting at 0.74 of full output amplitude.

FIG. 52c shows a plot of voltage against output amplitude for the five-stage embodiment of the present invention as shown in FIG. 52a. FIG. 52d shows a plot of efficiency against output amplitude for the five-stage embodiment of the present invention as shown in FIG. 52a.

Figure 53A:
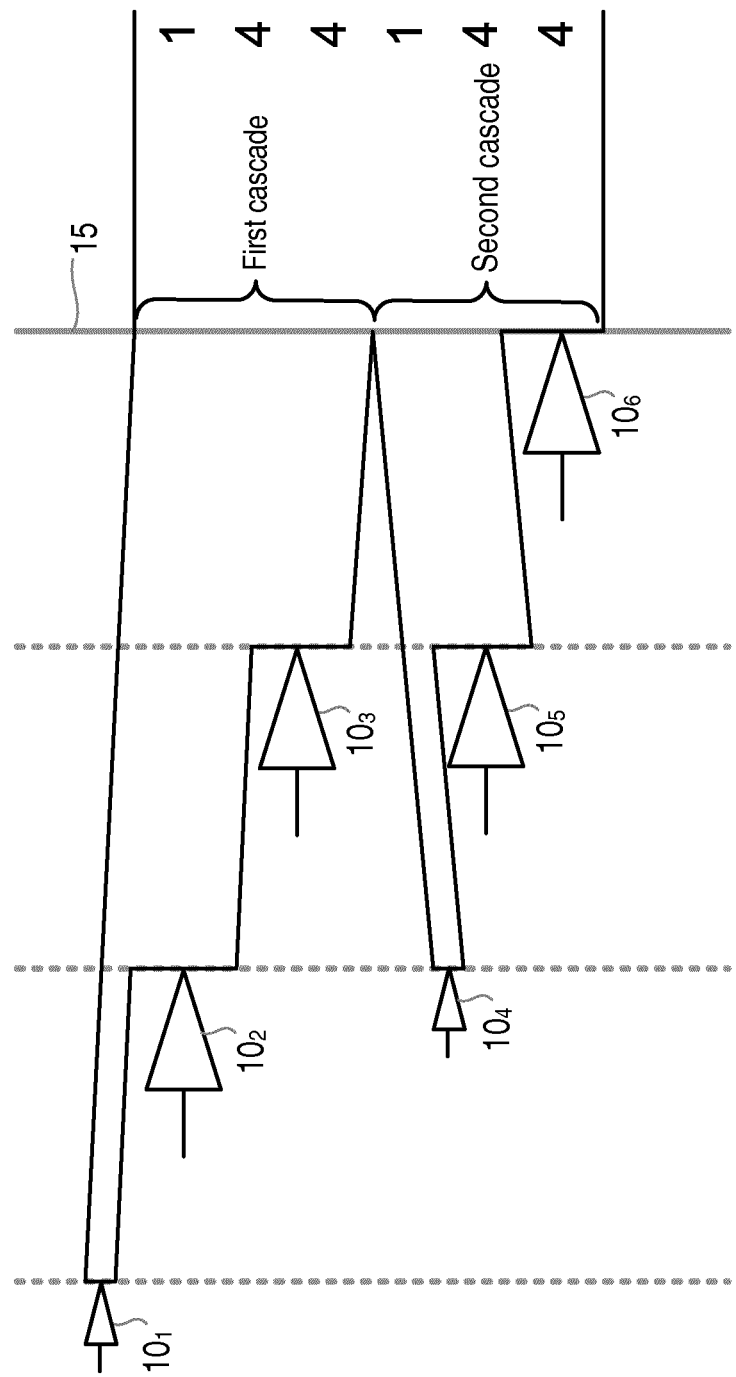

In the example of FIG. 53a there is shown a six-stage amplifier in which the first and fourth amplifier stages $10_1$ and $10_4$ are a fourth of the size of the four other amplifier stages (with those sections of the cascade of quarter wavelength transmission lines having their characteristic impedance increased accordingly, i.e. quadrupled, as shown by the thinner quarter wavelength transmission lines associated with amplifier stages $10_1$ and $10_4$).

Figures 53B, 53C, 53D:
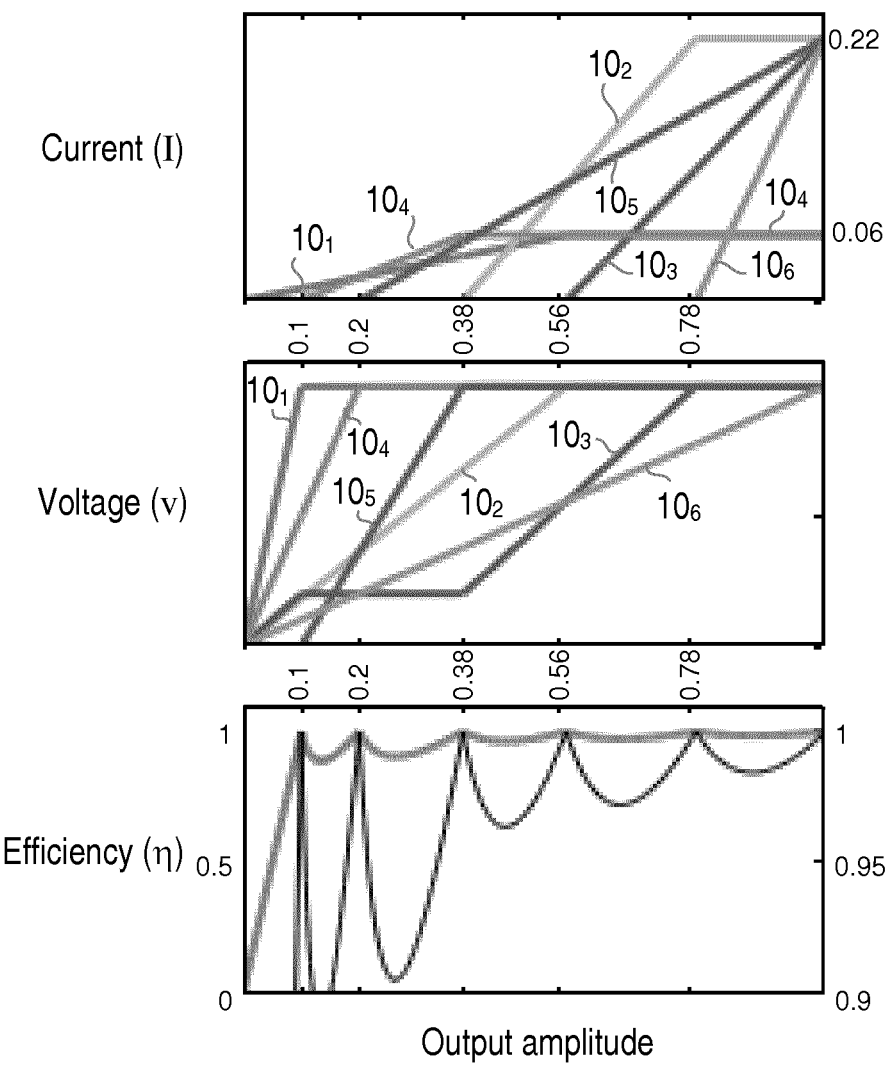

FIG. 53b shows a plot of current against output amplitude for the six-stage embodiment of the present invention as shown in FIG. 53a. The order of the amplifier starting points in this example is amplifier $10_1$ starting at zero, amplifier $10_4$ starting at 0.1 of full output amplitude, amplifier $10_5$ starting at 0.2 of full output amplitude, amplifier $10_2$ starting at 0.38 of full output amplitude, amplifier $10_3$ starting at 0.56 of full output amplitude, and amplifier $10_6$ starting at 0.78 of full output amplitude.

FIG. 53c shows a plot of voltage against output amplitude for the six-stage embodiment of the present invention as shown in FIG. 53a. FIG. 53d shows a plot of efficiency against output amplitude for the six-stage embodiment of the present invention as shown in FIG. 53a.

Figure 54A:
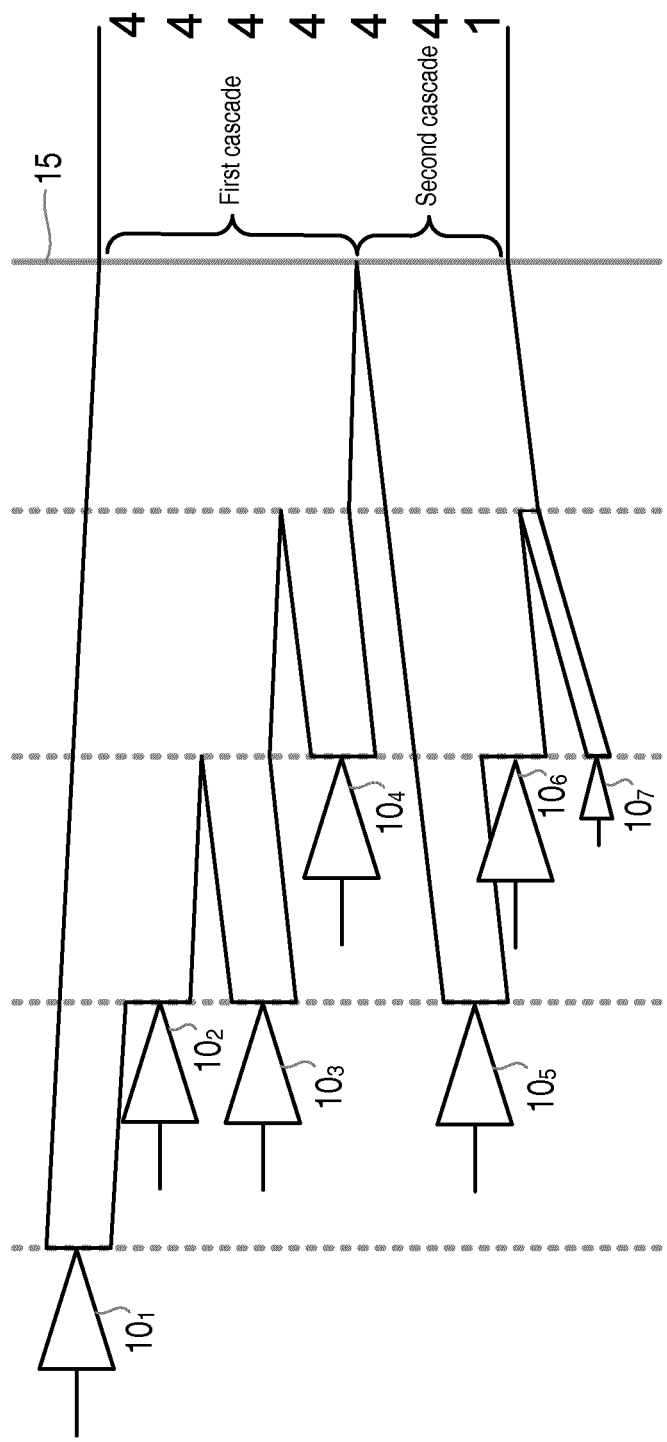
Figure 55A:
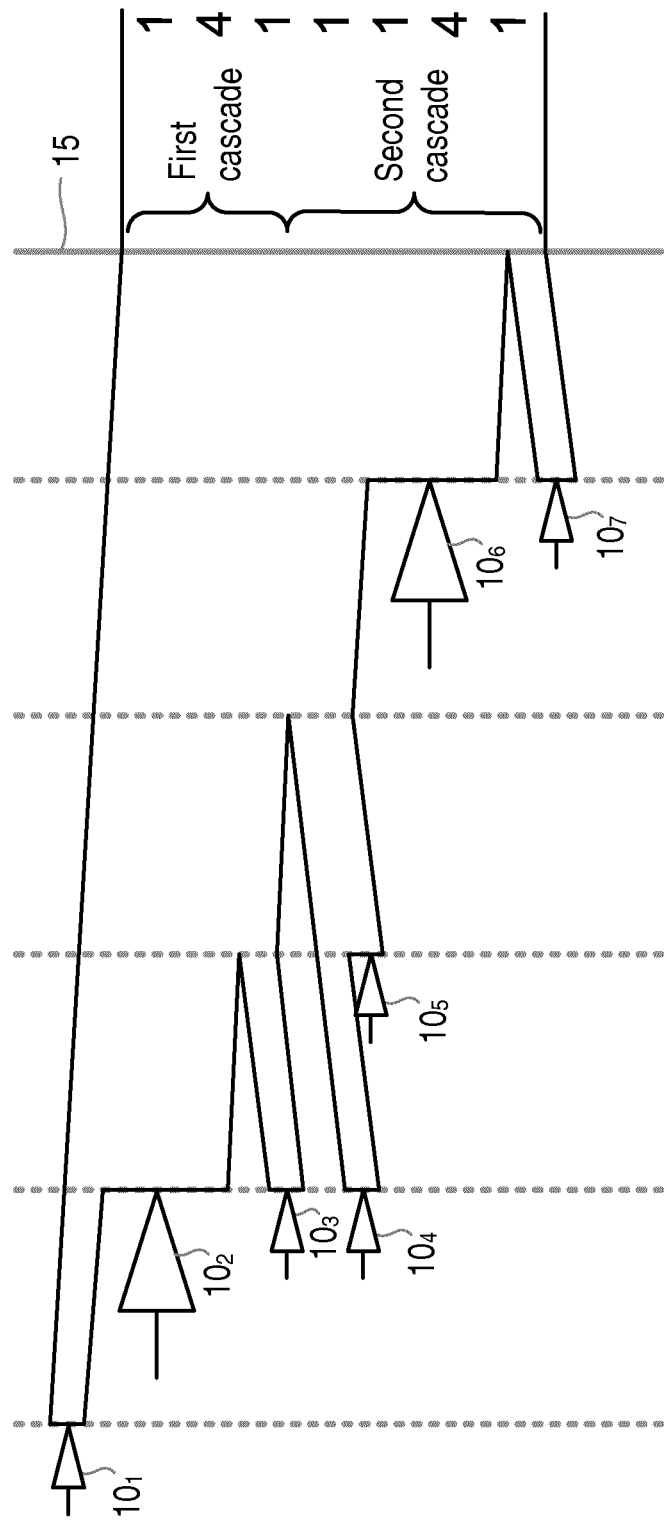

FIGS. 54a and 55a shows two further examples of seven-stage amplifier arrangements with 4-to-1 size relationships between amplifier stages, according to further embodiments of the present invention.

In the example of FIG. 54a there is shown a seven-stage amplifier in which the seventh amplifier stage $10_7$ is a fourth of the size of the six other amplifier stages (with that section of the cascade of quarter wavelength transmission lines having its characteristic impedance increased accordingly, i.e. quadrupled, as shown by the thinner line for amplifier stage $10_7$).

Figures 54B, 54C, 54D:
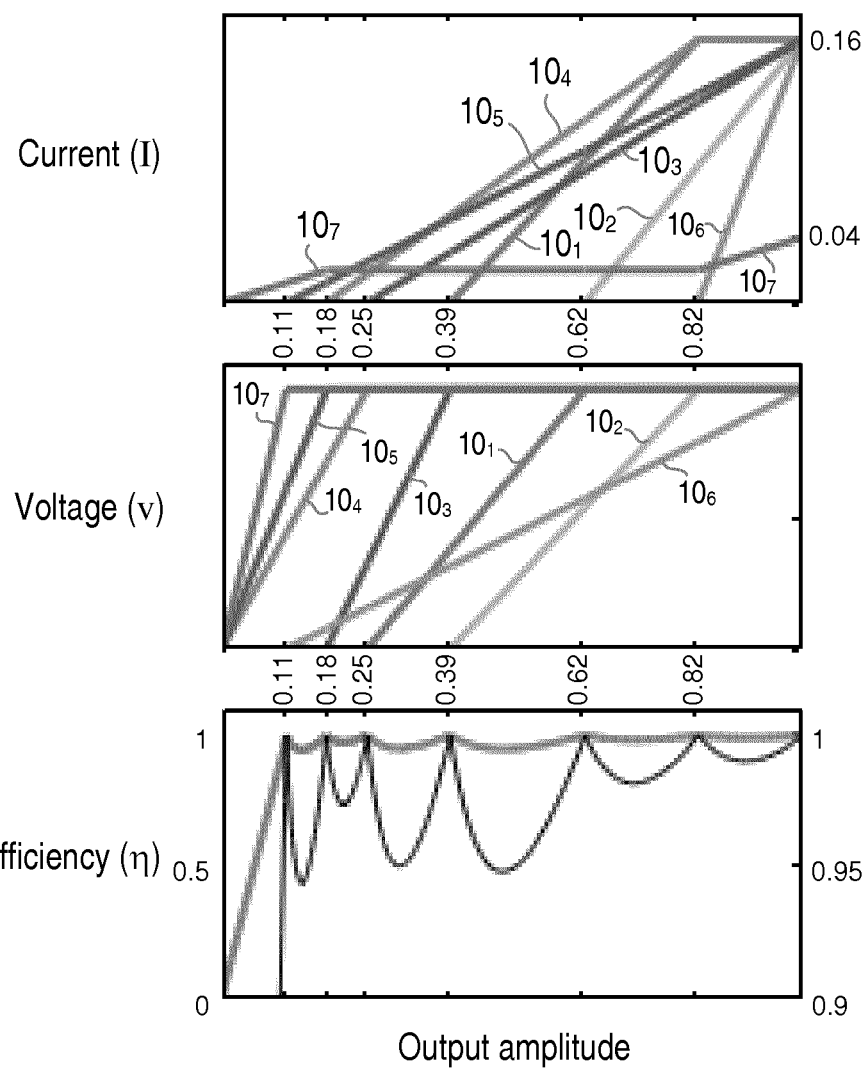

FIG. 54b shows a plot of current against output amplitude for the seven-stage embodiment of the present invention as shown in FIG. 54a. The order of the amplifier starting points in this example is amplifier $10_7$ starting at zero, amplifier $10_5$ starting at 0.11 of full output amplitude, amplifier $10_4$ starting at 0.18 of full output amplitude, amplifier $10_3$ starting at 0.25 of full output amplitude, amplifier $10_1$ starting at 0.39 of full output amplitude, amplifier $10_2$ starting at 0.52 of full output amplitude, and amplifier $10_6$ starting at 0.82 of full output amplitude.

FIG. 54c shows a plot of voltage against output amplitude for the seven-stage embodiment of the present invention as shown in FIG. 54a. FIG. 54d shows a plot of efficiency against output amplitude for the seven-stage embodiment of the present invention as shown in FIG. 54a.

In the example of FIG. 55a there is shown a seven-stage amplifier in which the first, third, fourth, fifth and seventh amplifier stages $10_1$, $10_3$, $10_4$, $10_5$ and $10_7$ are a fourth of the size of the two other amplifier stages (with those sections of the cascade of quarter wavelength transmission lines having their characteristic impedances increased accordingly, i.e. quadrupled, as shown by the thinner lines for amplifier stages $10_1$, $10_3$, $10_4$, $10_5$ and $10_7$).

FIG. 55b shows a plot of current against output amplitude for the seven-stage embodiment of the present invention as shown in FIG. 55a. The order of the amplifier starting points in this example is amplifier $10_7$ starting at zero, amplifier $10_1$ starting at 0.08 of full output amplitude, amplifier $10_3$ starting at 0.11 of full output amplitude, amplifier $10_4$ starting at 0.22 of full output amplitude, amplifier $10_5$ starting at 0.33 of full output amplitude, amplifier $10_2$ starting at 0.45 of full output amplitude, and amplifier $10_6$ starting at 0.67 of full output amplitude.

FIG. 55c shows a plot of voltage against output amplitude for the seven-stage embodiment of the present invention as shown in FIG. 55a. FIG. 55d shows a plot of efficiency against output amplitude for the seven-stage embodiment of the present invention as shown in FIG. 55a.

From the various examples described above it can be seen that the embodiments of the invention can be configured to have different numbers of cascades connected in parallel to a common node, each cascade having a different number of amplifier stages connected thereto, and with each amplifier stage either being coupled directly to its respective junction in a cascade, of coupled via a connecting quarter wavelength transmission line.

It is noted that the amplifiers described in the embodiments above follow the same general rules as other multistage Doherty amplifiers when it comes to drive signals.

Essentially, with increasing amplitude, a new amplifier needs to start delivering current only when a previous amplifier has reached its maximum voltage (saturation). As for all Doherty amplifiers, the RF output voltages and currents at the output node of an amplifier stage (e.g. drain in the case of a FET transistor) are always in phase in the ideal implementation (and at center frequency). The relative phases of the drive signals to the amplifiers are easily found by inspection of the electrical length from each amplifier to the common output (i.e. time delay over the lengths of transmission line). Any extra half wavelength inserted for practical reasons must also be included.

Transistors in general act as controlled RF current sources, so the shape of the amplitudes and phases (relative to that of the output) of the RF currents as functions of the output amplitude also suggest the shaping that must be performed to the input signals to the transistors, i.e. the gate drive voltages. The actual shapes may, according to some examples, be adapted to take into account that the voltage-to-current conversion (transconductance) in the transistors is more or less nonlinear, and that the RF voltage swing can influence the output current as well (especially via saturation when close to the upper limit). Causing a transistor to "turn on" and start delivering RF current at higher amplitude is often done by lowering the gate bias to the transistor, i.e. operating in some degree of class C. Less large-scale amplitude shaping then needs to be done earlier in the processing chain, albeit often at the cost of lower gain and lower maximum output power.

It is noted that any quarterwave transmission line in the Doherty amplifiers described above can double as an impedance transformer, i.e. the impedance and corresponding maximum RF voltage swings can be individually adjusted for each transistor. This can be useful if one or more of the amplifiers/transistors are made with a different technology having different voltage rating. It can also be beneficial to use these transformations to accommodate different load impedances, instead of making this transformation outside of the Doherty amplifier which would require extra impedance transformers. Apart from these considerations, it is usually best to have as little extra impedance transformations as possible in the Doherty network, since this generally gives high bandwidth and low sensitivity.

It is noted that any or all of the transmission lines in the examples described herein can be wholly or partially replaced by combinations of lumped elements. For example, the quarterwave lines can be replaced by LC pi- or T-networks with inductors (L) and capacitors (C) with reactance equal in magnitude to the characteristic impedance of the replaced quarterwave line.

It is also noted that references herein to a "directly" coupled amplifier may be replaced by an amplifier connected by a half wavelength line (or whole, etc) or equivalent circuit thereof. It is also noted that references to "quarter wavelength transmission lines" may use any odd number of quarter wavelengths. Thus, a general rule for both of these situations is that it is possible to insert a half wavelength into the circuit and achieve the same behaviour (except an inversion of the drive signal; 180 degree phase shift) at center frequency.

The amplifiers described in the embodiments above have new current, voltage and efficiency curve behaviors compared to prior art multistage Doherty amplifiers. The large number of different embodiments means that there are many possibilities for finding a structure that matches a limited set of transistor/sub-amplifier sizes to give a good efficiency curve.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. An amplifier arrangement comprising N amplifier stages, wherein N is an integer equal to or greater than five, the amplifier arrangement comprising:
   a first cascade of quarter wavelength transmission line segments coupled to a first set of amplifier stages; and
   at least a second cascade of quarter wavelength transmission line segments coupled to a second set of amplifier stages;
   wherein the first cascade and second cascade are connected to a common node in the amplifier arrangement; and
   wherein the amplifier arrangement comprises six amplifier stages, and wherein the amplifier arrangement comprises:
      the first cascade of quarter wavelength transmission line segments coupled to four amplifier stages;
      the second cascade of quarter wavelength transmission line segments coupled to two amplifier stages; and
      wherein the first cascade and the second cascade are coupled to a common output node of the amplifier arrangement.

2. An amplifier arrangement comprising N amplifier stages, wherein N is an integer equal to or greater than five, the amplifier arrangement comprising:
   a first cascade of quarter wavelength transmission line segments coupled to a first set of amplifier stages; and
   at least a second cascade of quarter wavelength transmission line segments coupled to a second set of amplifier stages;
   wherein the first cascade and second cascade are connected to a common node in the amplifier arrangement; and
   wherein the amplifier arrangement comprises seven amplifier stages, and wherein the amplifier arrangement comprises:
      the first cascade of quarter wavelength transmission line segments coupled to three amplifier stages;
      the second cascade of quarter wavelength transmission line segments coupled to two amplifier stages;
      a sixth amplifier stage; and
      a seventh amplifier stage;
      wherein the sixth amplifier stage and the seventh amplifier stage are coupled to a common output node of the amplifier arrangement either directly or via a connecting quarter wavelength transmission line; and
      wherein the first cascade and the second cascade are coupled to a node preceding the common output node.

3. An amplifier arrangement comprising N amplifier stages, wherein N is an integer equal to or greater than five, the amplifier arrangement comprising:

a first cascade of quarter wavelength transmission line segments coupled to a first set of amplifier stages; and at least a second cascade of quarter wavelength transmission line segments coupled to a second set of amplifier stages;

wherein the first cascade and second cascade are connected to a common node in the amplifier arrangement; and wherein the amplifier arrangement comprises seven amplifier stages, and wherein the amplifier arrangement comprises:

the first cascade of quarter wavelength transmission line segments coupled to three amplifier stages;

the second cascade of quarter wavelength transmission line segments coupled to three amplifier stages; and a seventh amplifier stage;

wherein the seventh amplifier stage is coupled to a common output node of the amplifier arrangement either directly or via a connecting quarter wavelength transmission line; and wherein the first cascade and the second cascade are coupled to a node preceding the common output node.

4. An amplifier arrangement comprising N amplifier stages, wherein N is an integer equal to or greater than five, the amplifier arrangement comprising:

a first cascade of quarter wavelength transmission line segments coupled to a first set of amplifier stages; and at least a second cascade of quarter wavelength transmission line segments coupled to a second set of amplifier stages;

wherein the first cascade and second cascade are connected to a common node in the amplifier arrangement; and wherein the amplifier arrangement comprises seven amplifier stages, and wherein the amplifier arrangement comprises:

the first cascade of quarter wavelength transmission line segments coupled to three amplifier stages;

the second cascade of quarter wavelength transmission line segments coupled to two amplifier stages; and a third cascade of quarter wavelength transmission line segments coupled to two amplifier stages;

wherein the third cascade is coupled to a common output node of the amplifier arrangement; and wherein the first cascade and the second cascade are coupled to a node preceding the common output node.

5. An amplifier arrangement comprising N amplifier stages, wherein N is an integer equal to or greater than five, the amplifier arrangement comprising:

a first cascade of quarter wavelength transmission line segments coupled to a first set of amplifier stages; and at least a second cascade of quarter wavelength transmission line segments coupled to a second set of amplifier stages;

wherein the first cascade and second cascade are connected to a common node in the amplifier arrangement; and wherein the amplifier arrangement comprises seven amplifier stages, and wherein the amplifier arrangement comprises:

the first cascade of quarter wavelength transmission line segments coupled to four amplifier stages;

the second cascade of quarter wavelength transmission line segments coupled to three amplifier stages; and wherein the first cascade and the second cascade are coupled to a common output node of the amplifier arrangement.

6. An amplifier arrangement comprising N amplifier stages, wherein N is an integer equal to or greater than five, the amplifier arrangement comprising:

a first cascade of quarter wavelength transmission line segments coupled to a first set of amplifier stages; and at least a second cascade of quarter wavelength transmission line segments coupled to a second set of amplifier stages;

wherein the first cascade and second cascade are connected to a common node in the amplifier arrangement; and wherein each amplifier stage is coupled directly to a corresponding junction of its cascade of quarter wavelength transmission line segments.

7. An amplifier arrangement comprising N amplifier stages, wherein N is an integer equal to or greater than five, the amplifier arrangement comprising:

a first cascade of quarter wavelength transmission line segments coupled to a first set of amplifier stages; and at least a second cascade of quarter wavelength transmission line segments coupled to a second set of amplifier stages;

wherein the first cascade and second cascade are connected to a common node in the amplifier arrangement; and wherein each amplifier stage is substantially of equal size, and wherein a characteristic impedance of each successive segment in the cascade of quarter wavelength transmission line segments is reduced towards a common output node in relation to the parallel combination of preceding transmission lines, whereby the characteristic impedance of each successive segment is reduced to 1/M of the impedance of the transmission line from a single amplifier, whereby M relates to the number of preceding amplifiers.

8. An amplifier arrangement comprising N amplifier stages, wherein N is an integer equal to or greater than five, the amplifier arrangement comprising:

a first cascade of quarter wavelength transmission line segments coupled to a first set of amplifier stages; and at least a second cascade of quarter wavelength transmission line segments coupled to a second set of amplifier stages;

wherein the first cascade and second cascade are connected to a common node in the amplifier arrangement; and wherein at least one amplifier stage is reduced in size compared to the other amplifier stages by a predetermined ratio, and wherein a characteristic impedance of a corresponding quarter wavelength transmission line and/or connecting quarter wavelength transmission line is increased by a corresponding ratio compared to the characteristic impedance of each of the other quarter wavelength transmission lines and/or connecting quarter wavelength transmission lines.

9. An amplifier arrangement comprising N amplifier stages, wherein N is an integer equal to or greater than five, the amplifier arrangement comprising:

a first cascade of quarter wavelength transmission line segments coupled to a first set of amplifier stages; and at least a second cascade of quarter wavelength transmission line segments coupled to a second set of amplifier stages;

wherein the first cascade and second cascade are connected to a common node in the amplifier arrangement; and wherein only one of the at least first and second quarter wavelength cascades connected to the common node comprises a low impedance at the common node.

* * * * *